US012622167B2

(12) United States Patent
Doh et al.

(10) Patent No.: US 12,622,167 B2
(45) Date of Patent: May 5, 2026

(54) ORGANIC ELECTROLUMINESCENT DEVICE

(71) Applicant: ROHM AND HAAS ELECTRONIC MATERIALS KOREA LTD., Chungcheongnam-do (KR)

(72) Inventors: Yoo-Jin Doh, Gyeonggi-do (KR); Soo-Yong Lee, Gyeonggi-do (KR); Chi-Sik Kim, Gyeonggi-do (KR); Seung-Hoon Yoo, Gyeonggi-do (KR); Dong-Hyung Lee, Gyeonggi-do (KR); Doo-Hyeon Moon, Gyeonggi-do (KR); Soo-Jin Hwang, Gyeonggi-do (KR)

(73) Assignee: DuPont Specialty Materials Korea Ltd. (KR)

( * ) Notice: Subject to any disclaimer, the term of this patent is extended or adjusted under 35 U.S.C. 154(b) by 697 days.

(21) Appl. No.: 17/466,372

(22) Filed: Sep. 3, 2021

(65) Prior Publication Data

US 2022/0077406 A1 Mar. 10, 2022

(51) Int. Cl.

| | |
|---|---|
| ***H10K 85/60*** | (2023.01) |
| ***H10K 30/80*** | (2023.01) |
| ***H10K 50/11*** | (2023.01) |
| ***H10K 101/10*** | (2023.01) |

(52) U.S. Cl.

CPC ....... *H10K 85/626* (2023.02); *H10K 85/6574* (2023.02); *H10K 85/658* (2023.02); *H10K 30/865* (2023.02); *H10K 50/11* (2023.02); *H10K 2101/10* (2023.02)

(58) Field of Classification Search

CPC ........... H10K 85/6574; H10K 85/6576; H10K 85/626; H10K 85/658; H10K 50/18; H10K 85/615; H10K 85/262; H10K 85/657; H10K 85/6572

See application file for complete search history.

(56) References Cited

U.S. PATENT DOCUMENTS

| | | | | |
|---|---|---|---|---|
| 2005/0064235 | A1 | 3/2005 | Liao et al. | |
| 2015/0236274 | A1 | 8/2015 | Hatakeyama et al. | |
| 2016/0351817 | A1* | 12/2016 | Kim | H10K 85/6576 |
| 2017/0054086 | A1 | 2/2017 | Lee et al. | |
| 2017/0133604 | A1* | 5/2017 | Lee | H10K 85/6574 |
| 2018/0301629 | A1* | 10/2018 | Hatakeyama | H10K 85/657 |

(Continued)

FOREIGN PATENT DOCUMENTS

| | | | | |
|---|---|---|---|---|
| CN | 112094170 A | * 12/2020 | | C07C 13/567 |
| JP | 2010-34548 A | * 2/2010 | | H01L 51/50 |

(Continued)

OTHER PUBLICATIONS

Machine-generated English-language translation of JP-2010-34548-A.*

(Continued)

*Primary Examiner* — Vu A Nguyen

(74) *Attorney, Agent, or Firm* — G. Creston Campbell

(57) ABSTRACT

The present disclosure relates to an organic electroluminescent device. The organic electroluminescent device according to the present disclosure may exhibit low voltage, high efficiency, and/or long lifespan by including a light-emitting layer and an electron buffer layer comprising a specific organic electroluminescent material.

9 Claims, 2 Drawing Sheets

100

(56) References Cited

U.S. PATENT DOCUMENTS

| | | | |
|---|---|---|---|
| 2020/0058882 | A1 | 2/2020 | Lee et al. |
| 2020/0176679 | A1 | 6/2020 | Jeong et al. |
| 2021/0395215 | A1 | 12/2021 | Kim et al. |
| 2022/0006019 | A1 | 1/2022 | Kim et al. |

FOREIGN PATENT DOCUMENTS

| | | | | | |
|---|---|---|---|---|---|
| JP | 2010034548 | A | | 2/2010 | |
| JP | 2016150920 | A | * | 8/2016 | |
| WO | 2015009076 | A1 | | 1/2015 | |
| WO | WO-2020085829 | A1 | * | 4/2020 | ............. C09K 11/06 |
| WO | WO-2020085845 | A1 | * | 4/2020 | ........... C07D 307/91 |
| WO | WO-2020232655 | A1 | * | 11/2020 | ........... C07D 209/86 |

OTHER PUBLICATIONS

Machine-generated English-language translation of CN-112094170-A.*

Machine-generated English-language translation of JP-2016150920-A.*

Request for the Submission of an Opinion from Korea Intellectual Patent Office for Korea patent application No. 10-2020-0112926; Application Date: Sep. 4, 2020.

Cited Reference from Japan Patent Office, Application No. 2021-144416, Filing Date: Sep. 6, 2021.

Search Report from China National Intellectual Property Administration, Application No. 202111031425.5, Filing Date: Sep. 3, 2021.

* cited by examiner

200

ORGANIC ELECTROLUMINESCENT DEVICE

TECHNICAL FIELD

The present disclosure relates to an organic electroluminescent device.

BACKGROUND ART

An organic electroluminescent device (OLED) changes electric energy into light by applying electricity to an organic electroluminescent material, and its basic structure was first reported by Eastman Kodak in 1987. The OLED commonly comprises an anode, a cathode, and an organic layer formed between the two electrodes. The organic layer of the OLED may comprise a hole injection layer, a hole transport layer, an electron blocking layer, a light-emitting layer (containing host and dopant materials), an electron buffer layer, a hole blocking layer, an electron transport layer, an electron injection layer, etc. The materials used in the organic layer can be classified into a hole injection material, a hole transport material, an electron blocking material, a light-emitting material, an electron buffer material, a hole blocking material, an electron transport material, an electron injection material, etc., depending on their functions.

In such an OLED, holes from the anode and electrons from the cathode are injected into a light-emitting layer by the application of electric voltage, and excitons having high energy are produced by the recombination of the holes and electrons. The organic light-emitting compound moves into an excited state by the energy and emits light from energy when the organic light-emitting compound returns to the ground state from the excited state.

In recent years, due to the potential of flat panel displays and general lighting devices, the development of new materials for this is continuously required. The development of excellent high-performance materials and more desirable device structures is required in order to improve the performance required in medium and large-sized OLED panels.

Unlike red and green high-efficiency phosphorescent materials which have already been commercialized among the light-emitting materials of the OLED, it has been pointed out that a blue phosphorescent material is not suitable for long-term use such as several years or more, since the blue phosphorescent material has short lifespan and high driving voltage, and thus, a fluorescent material is used.

As such, conventional materials have not been able to satisfy the light-emitting characteristics of the OLED, and thus development of an OLED including an organic electroluminescent material having excellent performance is required.

KR 2015-0118269 and KR 2017-0053796 A disclose an OLED in that an anthracene-based compound substituted with a dibenzofuran derivative is comprised in a buffer layer. However, said references do not specifically disclose an OLED including a combination of organic electroluminescent materials specified herein.

DISCLOSURE OF THE INVENTION

Technical Problem

The object of the present disclosure is to provide an organic electroluminescent material which is able to produce an organic electroluminescent device having low voltage, high efficiency, and long lifespan, and an organic electroluminescent device comprising the same.

Solution to Problem

As a result of intensive studies to solve the technical problem above, the present inventors found that the aforementioned objective can be achieved by an organic electroluminescent device comprising a first electrode; a second electrode facing the first electrode; a light-emitting layer between the first electrode and the second electrode; and an electron buffer layer and an electron transport zone between the light-emitting layer and the second electrode, wherein the electron buffer layer comprises a compound represented by the following formula 1, so that the present invention was completed.

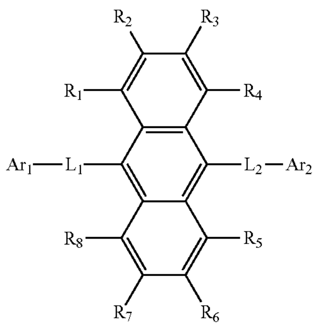

(1)

In formula 1, $L_1$ and $L_2$ each independently represent a single bond, a substituted or unsubstituted (C6-C30)arylene, or a substituted or unsubstituted (3- to 30-membered)heteroarylene;

$Ar_1$ and $Ar_2$ each independently represent a substituted or unsubstituted (C6-C30)aryl or a substituted or unsubstituted (3- to 30-membered)heteroaryl; and $R_1$ to $R_6$ each independently represent hydrogen or deuterium;

provided that $Ar_1$, $Ar_2$, $L_1$, and $L_2$ do not include a compound represented by the following formula a.

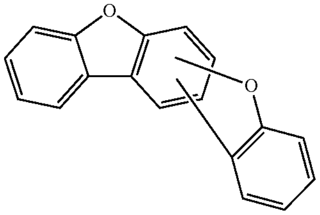

(a)

Advantageous Effects of Invention

By using an organic electroluminescent material according to the present disclosure, an organic electroluminescent device having low voltage, high efficiency and long lifespan can be provided.

MODE FOR THE INVENTION

Figure 1:
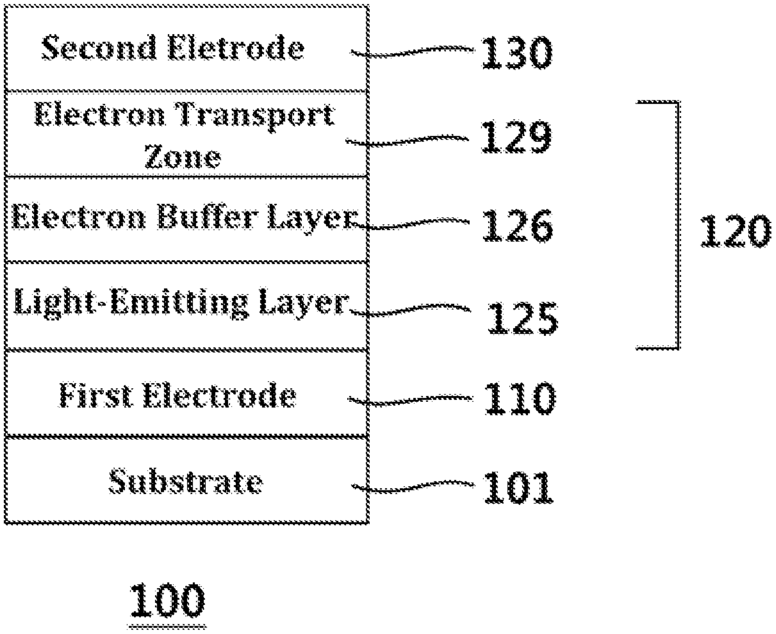
FIG. 1 shows an example of an organic electroluminescent device according to one embodiment of the present disclosure.

Hereinafter, the present disclosure will be described in detail. However, the following description is intended to explain the invention, and is not meant in any way to restrict the scope of the invention.

The present disclosure relates to an organic electroluminescent device comprising a first electrode; a second electrode facing the first electrode; a light-emitting layer between the first electrode and the second electrode; and and an electron buffer layer and an electron transport zone between the light-emitting layer and the second electrode.

The present disclosure relates to an organic electroluminescent device comprising an electron buffer layer including a compound represented by formula 1 and a light-emitting layer including a compound represented by formula 2 and/or formula 3.

The term "organic electroluminescent material" in the present disclosure means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material (containing host and dopant materials), an electron buffer material, a hole blocking material, an electron transport material, an electron injection material, etc.

The "electron transport zone" in the present disclosure means a zone where electrons move between the light-emitting layer and the second electrode. For example, the electron transport zone may include at least one of a hole blocking layer, an electron transport layer, and an electron injection layer, preferably an electron transport layer and an electron injection layer. The hole blocking layer serves to prevent holes from entering the cathode through the light-emitting layer in driving the organic electroluminescent device.

The "hole transport zone" in the present disclosure means a zone where holes move between the first electrode and the light-emitting layer. For example, the hole transport zone may include at least one of a hole injection layer, a hole transport layer, a hole auxiliary layer, a light-emitting auxiliary layer, and an electron blocking layer. Each of the hole injection layer, a hole transport layer, a hole auxiliary layer, a light-emitting auxiliary layer, and an electron blocking layer can be a single layer or a multi-layer of which two or more layers are stacked.

The term "(C1-C30)alkyl" in the present disclosure is meant to be a linear or branched alkyl having 1 to 30 carbon atoms constituting the chain, in which the number of carbon atoms is preferably 1 to 20, and more preferably 1 to 10. The above alkyl may include methyl, ethyl, n-propyl, isopropyl, n-butyl, isobutyl, tert-butyl, sec-butyl, etc. The term "(C3-C30)cycloalkyl" in the present disclosure is meant to be a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, cyclopentylmethyl, cyclohexylmethyl, etc. The term "(C6-C30)aryl(ene)" in the present disclosure is a monocyclic or fused ring radical derived from an aromatic hydrocarbon having 6 to 30 ring backbone carbon atoms, in which the number of the ring backbone carbon atoms is preferably 6 to 20, more preferably 6 to 15, and may be partially saturated. The aryl may comprise a spiro structure. Examples of the aryl specifically include phenyl, biphenyl, terphenyl, quaterphenyl, naphthyl, binaphthyl, phenylnaphthyl, naphthylphenyl, fluorenyl, phenylfluorenyl, dimethylfluorenyl, diphenylfluorenyl, benzofluorenyl, diphenylbenzofluorenyl, dibenzofluorenyl, phenanthrenyl, benzophenanthrenyl, phenylphenanthrenyl, anthracenyl, benzanthracenyl, indenyl, triphenylenyl, pyrenyl, tetracenyl, perylenyl, chrysenyl, benzochrysenyl, naphthacenyl, fluoranthenyl, benzofluoranthenyl, tolyl, xylyl, mesityl, cumenyl, spiro[fluorene-fluorene]yl, spiro[fluorene-benzofluorene]yl, azulenyl, tetramethyl-dihydrophenanthrenyl, etc. More specifically, the aryl may be o-tolyl, m-tolyl, p-tolyl, 2,3-xylyl, 3,4-xylyl, 2,5-xylyl, mesityl, o-cumenyl, m-cumenyl, p-cumenyl, p-t-butylphenyl, p-(2-phenylpropyl)phenyl, 4'-methylbiphenyl, 4"-t-butyl-p-terphenyl-4-yl, o-biphenyl, m-biphenyl, p-biphenyl, o-terphenyl, m-terphenyl-4-yl, m-terphenyl-3-yl, m-terphenyl-2-yl, p-terphenyl-4-yl, p-terphenyl-3-yl, p-terphenyl-2-yl, m-quaterphenyl, 1-naphthyl, 2-naphthyl, 1-fluorenyl, 2-fluorenyl, 3-fluorenyl, 4-fluorenyl, 9-fluorenyl, 9,9-dimethyl-1-fluorenyl, 9,9-dimethyl-2-fluorenyl, 9,9-dimethyl-3-fluorenyl, 9,9-dimethyl-4-fluorenyl, 9,9-diphenyl-1-fluorenyl, 9,9-diphenyl-2-fluorenyl, 9,9-diphenyl-3-fluorenyl, 9,9-diphenyl-4-fluorenyl, 1-anthryl, 2-anthryl, 9-anthryl, 1-phenanthryl, 2-phenanthryl, 3-phenanthryl, 4-phenanthryl, 9-phenanthryl, 1-chrysenyl, 2-chrysenyl, 3-chrysenyl, 4-chrysenyl, 5-chrysenyl, 6-chrysenyl, benzo[c]phenanthryl, benzo[g]chrysenyl, 1-triphenylenyl, 2-triphenylenyl, 3-triphenylenyl, 4-triphenylenyl, 3-fluoranthenyl, 4-fluoranthenyl, 8-fluoranthenyl, 9-fluoranthenyl, benzofluoranthenyl, 11,11-dimethyl-1-benzo[a]fluorenyl, 11,11-dimethyl-2-benzo[a]fluorenyl, 11,11-dimethyl-3-benzo[a]fluorenyl, 11,11-dimethyl-4-benzo[a]fluorenyl, 11,11-dimethyl-5-benzo[a]fluorenyl, 11,11-dimethyl-6-benzo[a]fluorenyl, 11,11-dimethyl-7-benzo[a]fluorenyl, 11,11-dimethyl-8-benzo[a]fluorenyl, 11,11-dimethyl-9-benzo[a]fluorenyl, 11,11-dimethyl-10-benzo[a]fluorenyl, 11,11-dimethyl-1-benzo[b]fluorenyl, 11,11-dimethyl-2-benzo[b]fluorenyl, 11,11-dimethyl-3-benzo[b]fluorenyl, 11,11-dimethyl-4-benzo[b]fluorenyl, 11,11-dimethyl-5-benzo[b]fluorenyl, 11,11-dimethyl-6-benzo[b]fluorenyl, 11,11-dimethyl-7-benzo[b]fluorenyl, 11,11-dimethyl-8-benzo[b]fluorenyl, 11,11-dimethyl-9-benzo[b]fluorenyl, 11,11-dimethyl-10-benzo[b]fluorenyl, 11,11-dimethyl-1-benzo[c]fluorenyl, 11,11-dimethyl-2-benzo[c]fluorenyl, 11,11-dimethyl-3-benzo[c]fluorenyl, 11,11-dimethyl-4-benzo[c]fluorenyl, 11,11-dimethyl-5-benzo[c]fluorenyl, 11,11-dimethyl-6-benzo[c]fluorenyl, 11,11-dimethyl-7-benzo[c]fluorenyl, 11,11-dimethyl-8-benzo[c]fluorenyl, 11,11-dimethyl-9-benzo[c]fluorenyl, 11,11-dimethyl-10-benzo[c]fluorenyl, 11,11-diphenyl-1-benzo[a]fluorenyl, 11,11-diphenyl-2-benzo[a]fluorenyl, 11,11-diphenyl-3-benzo[a]fluorenyl, 11,11-diphenyl-4-benzo[a]fluorenyl, 11,11-diphenyl-5-benzo[a]fluorenyl, 11,11-diphenyl-6-benzo[a]fluorenyl, 11,11-diphenyl-7-benzo[a]fluorenyl, 11,11-diphenyl-8-benzo[a]fluorenyl, 11,11-diphenyl-9-benzo[a]fluorenyl, 11,11-diphenyl-10-benzo[a]fluorenyl, 11,11-diphenyl-1-benzo[b]fluorenyl, 11,11-diphenyl-2-benzo[b]fluorenyl, 11,11-diphenyl-3-benzo[b]fluorenyl, 11,11-diphenyl-4-benzo[b]fluorenyl, 11,11-diphenyl-5-benzo[b]fluorenyl, 11,11-diphenyl-6-benzo[b]fluorenyl, 11,11-diphenyl-7-benzo[b]fluorenyl, 11,11-diphenyl-8-benzo[b]

fluorenyl, 11,11-diphenyl-9-benzo[b]fluorenyl, 11,11-diphenyl-10-benzo[b]fluorenyl, 11,11-diphenyl-1-benzo[c]fluorenyl, 11,11-diphenyl-2-benzo[c]fluorenyl, 11,11-diphenyl-3-benzo[c]fluorenyl, 11,11-diphenyl-4-benzo[c]fluorenyl, 11,11-diphenyl-5-benzo[c]fluorenyl, 11,11-diphenyl-6-benzo[c]fluorenyl, 11,11-diphenyl-7-benzo[c]fluorenyl, 11,11-diphenyl-8-benzo[c]fluorenyl, 11,11-diphenyl-9-benzo[c]fluorenyl, 11,11-diphenyl-10-benzo[c]fluorenyl, 9,9,10,10-tetramethyl-9,10-dihydro-1-phenanthrenyl, 9,9,10,10-tetramethyl-9,10-dihydro-2-phenanthrenyl, 9,9,10,10-tetramethyl-9,10-dihydro-3-phenanthrenyl, 9,9,10,10-tetramethyl-9,10-dihydro-4-phenanthrenyl, etc. The term "(3- to 30-membered)heteroaryl(ene)" in the present disclosure is an aryl having 3 to 30 ring backbone atoms including at least one, preferably 1 to 4 heteroatoms selected from the group consisting of B, N, O, S, Si, P, Se, and Ge, in which the number of ring backbone atoms is preferably 3 to 30, more preferably 5 to 20. The above heteroaryl or heteroarylene may be a monocyclic ring, or a fused ring condensed with at least one benzene ring; and may be partially saturated. Also, the above heteroaryl or heteroarylene in the present disclosure may be one formed by linking at least one heteroaryl or aryl group to a heteroaryl group via a single bond(s) and may comprise a spiro structure. Examples of the heteroaryl specifically may include a monocyclic ring-type heteroaryl including furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl including benzofuranyl, benzothiophenyl, isobenzofuranyl, dibenzofuranyl, dibenzothiophenyl, dibenzoselenophenyl, benzofuroquinolinyl, benzofuroquinazolinyl, benzofuronaphthiridinyl, benzofuropyrimidinyl, naphthofuropyrimidinyl, benzothienoquinolinyl, benzothienoquinazolinyl, benzothienonaphthiridinyl, benzothienopyrimidinyl, naphthothienopyrimidinyl, pyrimidoindolyl, benzopyrimidoindolyl, benzofuropyrazinyl, naphthofuropyrazinyl, benzothienopyrazinyl, naphthothienopyrazinyl, pyrazinoindolyl, benzopyrazinoindolyl, benzoimidazolyl, benzothiazolyl, benzoisothiazolyl, benzoisoxazolyl, benzoxazolyl, imidazopyridinyl, isoindolyl, indolyl, benzoindolyl, indazolyl, benzothiadiazolyl, quinolyl, isoquinolyl, cinnolinyl, quinazolinyl, quinoxalinyl, carbazolyl, azacarbazolyl, benzocarbazolyl, dibenzocarbazolyl, phenoxazinyl, phenanthridinyl, benzodioxolyl, indolizidinyl, acridinyl, silafluorenyl, germafluorenyl, benzotriazolyl, phenazinyl, imidazopyridinyl, chromenoquinazolinyl, thiochromenoquinazolinyl, dimethylbenzopyrimidinyl, indolocarbazolyl, indenocarbazolyl, etc. More specifically, the heteroaryl may be 1-pyrrolyl, 2-pyrrolyl, 3-pyrrolyl, 2-pyridinyl, 3-pyridinyl, 4-pyridinyl, 2-pyrimidinyl, 4-pyrimidinyl, 5-pyrimidinyl, 6-pyrimidinyl, 1,2,3-triazin-4-yl, 1,2,4-triazin-3-yl, 1,3,5-triazin-2-yl, 1-imidazolyl, 2-imidazolyl, 1-pyrazolyl, 1-indolizidinyl, 2-indolizidinyl, 3-indolizidinyl, 5-indolizidinyl, 6-indolizidinyl, 7-indolizidinyl, 8-indolizidinyl, 2-imidazopyridinyl, 3-imidazopyridinyl, 5-imidazopyridinyl, 6-imidazopyridinyl, 7-imidazopyridinyl, 8-imidazopyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, azacarbazol-1-yl, azacarbazol-2-yl, azacarbazol-3-yl, azacarbazol-4-yl, azacarbazol-5-yl, azacarbazol-6-yl, azacarbazol-7-yl, azacarbazol-8-yl, azacarbazol-9-yl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-t-butylpyrrol-4-yl, 3-(2-phenylpropyl) pyrrol-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl, 4-t-butyl-3-indolyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-naphtho-[1,2-b]-benzofuranyl, 2-naphtho-[1,2-b]-benzofuranyl, 3-naphtho-[1,2-b]-benzofuranyl, 4-naphtho-[1,2-b]-benzofuranyl, 5-naphtho-[1,2-b]-benzofuranyl, 6-naphtho-[1,2-b]-benzofuranyl, 7-naphtho-[1,2-b]-benzofuranyl, 8-naphtho-[1,2-b]-benzofuranyl, 9-naphtho-[1,2-b]-benzofuranyl, 10-naphtho-[1,2-b]-benzofuranyl, 1-naphtho-[2,3-b]-benzofuranyl, 2-naphtho-[2,3-b]-benzofuranyl, 3-naphtho-[2,3-b]-benzofuranyl, 4-naphtho-[2,3-b]-benzofuranyl, 5-naphtho-[2,3-b]-benzofuranyl, 6-naphtho-[2,3-b]-benzofuranyl, 7-naphtho-[2,3-b]-benzofuranyl, 8-naphtho-[2,3-b]-benzofuranyl, 9-naphtho-[2,3-b]-benzofuranyl, 10-naphtho-[2,3-b]-benzofuranyl, 1-naphtho-[2,1-b]-benzofuranyl, 2-naphtho-[2,1-b]-benzofuranyl, 3-naphtho-[2,1-b]-benzofuranyl, 4-naphtho-[2,1-b]-benzofuranyl, 5-naphtho-[2,1-b]-benzofuranyl, 6-naphtho-[2,1-b]-benzofuranyl, 7-naphtho-[2,1-b]-benzofuranyl, 8-naphtho-[2,1-b]-benzofuranyl, 9-naphtho-[2,1-b]-benzofuranyl, 10-naphtho-[2,1-b]-benzofuranyl, 1-naphtho-[1,2-b]-benzothiophenyl, 2-naphtho-[1,2-b]-benzothiophenyl, 3-naphtho-[1,2-b]-benzothiophenyl, 4-naphtho-[1,2-b]-benzothiophenyl, 5-naphtho-[1,2-b]-benzothiophenyl, 6-naphtho-[1,2-b]-benzothiophenyl, 7-naphtho-[1,2-b]-benzothiophenyl, 8-naphtho-[1,2-b]-benzothiophenyl, 9-naphtho-[1,2-b]-benzothiophenyl, 10-naphtho-[1,2-b]-benzothiophenyl, 1-naphtho-[2,3-b]-benzothiophenyl, 2-naphtho-[2,3-b]-benzothiophenyl, 3-naphtho-[2,3-b]-benzothiophenyl, 4-naphtho-[2,3-b]-benzothiophenyl, 5-naphtho-[2,3-b]-benzothiophenyl, 1-naphtho-[2,1-b]-benzothiophenyl, 2-naphtho-[2,1-b]-benzothiophenyl, 3-naphtho-[2,1-b]-benzothiophenyl, 4-naphtho-[2,1-b]-benzothiophenyl, 5-naphtho-[2,1-b]-benzothiophenyl, 6-naphtho-[2,1-b]-benzothiophenyl, 7-naphtho-[2,1-b]-benzothiophenyl, 8-naphtho-[2,1-b]-benzothiophenyl, 9-naphtho-[2,1-b]-benzothiophenyl, 10-naphtho-[2,1-b]-benzothiophenyl, 2-benzofuro[3,2-d]pyrimidinyl, 6-benzofuro[3,2-d]pyrimidinyl, 7-benzofuro[3,2-d]pyrimidinyl, 8-benzofuro[3,2-d]pyrimidinyl, 9-benzofuro[3,2-d]pyrimidinyl, 2-benzothio[3,2-d]pyrimidinyl, 6-benzothio[3,2-d]pyrimidinyl, 7-benzothio[3,2-d]pyrimidinyl, 8-benzothio[3,2-d]pyrimidinyl, 9-benzothio[3,2-d]pyrimidinyl, 2-benzofuro[3,2-d]pyrazinyl, 6-benzofuro[3,2-d]pyrazinyl, 7-benzofuro[3,2-d]pyrazinyl, 8-benzofuro[3,2-d]pyrazinyl, 9-benzofuro[3,2-d]pyrazinyl, 2-benzothio[3,2-d]pyrazinyl, 6-benzothio[3,2-d]pyrazinyl, 7-benzothio[3,2-d]pyrazinyl, 8-benzothio[3,2-d]pyrazinyl, 9-benzothio[3,2-d]pyrazinyl, 1-silafluorenyl, 2-silafluorenyl, 3-silafluorenyl, 4-silafluorenyl, 1-germafluorenyl, 2-germafluorenyl, 3-germafluorenyl, 4-germafluorenyl, 1-dibenzoselenophenyl, 2-dibenzoselenophenyl, 3-dibenzoselenophenyl, 4-dibenzoselenophenyl, etc. The term “a fused ring of (C3-C30) aliphatic ring and (C6-C30) aromatic ring” in the present disclosure means a ring formed by fusing at least one aliphatic ring having 3 to 30 ring backbone carbon atoms in which the number of the carbon atoms is preferably 3 to 25, more preferably 3 to 18, and at least one aromatic ring having 6 to 30 ring backbone carbon atoms in which the number of the carbon atoms is preferably 6 to 25, more preferably 6 to 18. For example, the fused ring may be a fused ring of at least one benzene and at least one cyclohexane, or a fused ring of at least one naphthalene and at least one cyclopentane, etc. The carbon atoms in the fused ring of (C3-C30) aliphatic ring and (C6-C30) aromatic ring of the present disclosure may be replaced with at least one heteroatoms selected from B, N, O, S, Si and P, preferably at least one heteroatoms selected from N, O and S. The term “Halogen” in the present disclosure includes F, Cl, Br, and I.

In addition, “ortho (o).” “meta (m),” and “para (p)” in the present disclosure are meant to signify the substitution position of all substituents. Ortho position is a compound with substituents, which are adjacent to each other, i.e., at the 1 and 2 positions on benzene. Meta position is the next substitution position of the immediately adjacent substitution position, i.e., a compound with substituents at the 1 and 3 positions on benzene. Para position is the next substitution position of the meta position, i.e., a compound with substituents at the 1 and 4 positions on benzene.

The term “a ring formed in linking to an adjacent substituent” in the present disclosure means a substituted or unsubstituted (3- to 50-membered) mono- or polycyclic, alicyclic, aromatic ring, or a combination thereof, formed by linking or fusing two or more adjacent substituents, preferably, may be a substituted or unsubstituted (5- to 40-membered) mono- or polycyclic, alicyclic, aromatic ring, or a combination thereof. Further, the formed ring may include at least one heteroatom selected from the group consisting of B, N, O, S, Si and P, preferably, at least one heteroatom selected from N, O and S. According to one embodiment of the present disclosure, the number of atoms in the ring skeleton is 5 to 35; according to another embodiment of the present disclosure, the number of atoms in the ring skeleton is 5 to 30. In one embodiment, the fused ring may be, for example, a substituted or unsubstituted fluorene ring, a substituted or unsubstituted dibenzothiophene ring, a substituted or unsubstituted dibenzofuran ring, a substituted or unsubstituted naphthalene ring, a substituted or unsubstituted phenanthrene ring, a substituted or unsubstituted benzofluorene ring, a substituted or unsubstituted benzothiophene ring, a substituted or unsubstituted benzofuran ring, a substituted or unsubstituted indole ring, a substituted or unsubstituted indene ring, a substituted or unsubstituted benzene ring, or a substituted or unsubstituted carbazole ring, etc.

In addition, “substituted” in the expression “substituted or unsubstituted” means that a hydrogen atom in a certain functional group is replaced with another atom or functional group, i.e., a substituent, and substituted with a group to which two or more substituents are connected among the substituents. For example, “a substituent to which two or more substituents are connected” may be pyridine-triazine. That is, pyridine-triazine may be heteroaryl or may be interpreted as a substituent in which two heteroaryls are connected. Preferably, the substituents of the substituted alkyl, the substituted alkenyl, the substituted aryl(ene), the substituted heteroaryl(ene), the substituted cycloalkyl, the substituted alkoxy, the substituted trialkylsilyl, the substituted dialkylarylsilyl, the substituted alkyldiarylsilyl, the substituted triarylsilyl, or the substituted fused ring of aliphatic ring and aromatic ring in the formulas of the present disclosure, each independently are at least one selected from the group consisting of deuterium, halogen, cyano, carboxyl, nitro, hydroxy, phosphine oxide; (C1-C30)alkyl, halo(C1-C30)alkyl, (C2-C30)alkenyl, (C2-C30)alkynyl, (C1-C30) alkoxy, (C1-C30)alkylthio, (C3-C30)cycloalkyl, (C3-C30) cycloalkenyl, (3- to 7-membered)heterocycloalkyl, (C6-C30)aryloxy, (C6-C30)arylthio, (5- to 30-membered) heteroaryl unsubstituted or substituted with (C6-C30)aryl, (C6-C30)aryl unsubstituted or substituted with (5- to 30-membered)heteroaryl, tri(C1-C30)alkylsilyl, tri(C6-C30) arylsilyl, di(C1-C30)alkyl(C6-C30)arylsilyl, (C1-C30)alkyldi(C6-C30)arylsilyl, amino, mono- or di-(C1-C30)alkylamino, mono- or di-(C6-C30)arylamino unsubstituted or substituted with (C1-C30)alkyl, (C1-C30)alkyl(C6-C30) arylamino, (C1-C30)alkylcarbonyl, (C1-C30)alkoxycarbonyl, (C6-C30)arylcarbonyl, (C6-C30)arylphosphinyl, di(C6-C30)arylboronyl, di(C1-C30)alkylboronyl. (C1-C30)alkyl (C6-C30)arylboronyl, (C6-C30)ar(C1-C30)alkyl, and (C1-C30)alkyl(C6-C30)aryl. For example, the substituent may be at least one of deuterium; methyl; tert-butyl; phenyl unsubstituted or substituted with at least one of methyl, pyridinyl, carbazolyl, dibenzofuranyl, diphenylamino, phenoxazinyl, phenothiazinyl, and acridinyl substituted with methyl; naphthyl; biphenyl; terphenyl; triphenylenyl; dimethylfluorenyl; phenylfluorenyl; diphenylfluorenyl; phenanthrenyl; pyridinyl; triazinyl substituted with at least one of phenyl and naphthyl; indolyl substituted with diphenyl; benzoimidazolyl substituted with phenyl; quinolyl; isoquinolyl; quinazolinyl substituted with phenyl; carbazolyl unsubstituted or substituted with phenyl; dibenzofuranyl; dibenzothiophenyl; benzocarbazolyl substituted unsubstituted or with phenyl; dibenzocarbazolyl; benzophenanthrothiophenyl; phenoxazinyl; phenothiazinyl; acridinyl substituted with one or more methyl; xanthenyl substituted with one or more methyl; diphenylamino unsubstituted or substituted with at least one of methyl and diphenylamino; dimethylfluorenylphenylamino; phenylnaphthylamino; phenylamino substituted with phenylcarbazolyl or dibenzofuranyl; and a substituted or unsubstituted (16- to 33-membered) heteroaryl containing at least one of N, O, and S.

In formulas of the present disclosure, when a plurality of substituents represented by the same symbol are present, each of the substituents represented by the same symbol may be the same or different.

Hereinafter, an organic electroluminescent device according to one embodiment will be described.

In one embodiment, an organic electroluminescent device comprising a compound represented by formula 1 above is provided. Specifically, an organic electroluminescent device according to one embodiment comprises a first electrode; a second electrode facing the first electrode; a light-emitting layer between the first electrode and the second electrode; and an electron buffer layer and an electron transport zone between the light-emitting layer and the second electrode, wherein the electron buffer layer comprises a compound represented by formula 1 above.

Compared to the red or green phosphorescent host, the blue phosphorescent host requires a larger band gap, which makes it difficult to obtain a highly efficient device because charge carrier injection and exciton confinement are inefficient. However, the organic electroluminescent device according to the present disclosure exhibits significantly improved lifetime characteristics due to the light-emitting layer containing an anthracene-based compound and an electron buffer layer containing an anthracene-based compound having an aryl group and/or a heteroaryl group. This is because the electron injection barrier is reduced due to the electron buffer layer including the anthracene-based compound, and thus charge carriers are more easily combined in the light-emitting layer.

In one embodiment, $L_1$ and $L_2$ each independently may be a single bond, a substituted or unsubstituted (C6-C30) arylene, or a substituted or unsubstituted (5- to 30-membered)heteroarylene, preferably, a single bond, a substituted or unsubstituted (C6-C25)arylene, or a substituted or unsubstituted (5- to 25-membered)heteroarylene, more preferably, a single bond, a substituted or unsubstituted (C6-C18) arylene, or a substituted or unsubstituted (5- to 18-membered)heteroarylene. For example, $L_1$ and $L_2$ each independently may be a single bond, a substituted or unsubstituted phenylene, a substituted or unsubstituted m-biphenylene, a substituted or unsubstituted p-biphenylene, a substituted or unsubstituted naphthalenylene, a substituted or unsubstituted carbazolylene, or a substituted or unsubstituted benzocarbazolylene.

In one embodiment, $Ar_1$ and $Ar_2$ each independently may be a substituted or unsubstituted (C6-C30)aryl or a substituted or unsubstituted (5- to 30-membered)heteroaryl, preferably, a substituted or unsubstituted (C6-C25)aryl or a substituted or unsubstituted (5- to 25-membered)heteroaryl, more preferably, a substituted or unsubstituted (C6-C25)aryl or a substituted or unsubstituted (5- to 20-membered)heteroaryl. For example, $Ar_1$ and $Ar_2$ each independently may be a substituted or unsubstituted phenyl, a substituted or unsubstituted naphthyl, a substituted or unsubstituted m-biphenyl, a substituted or unsubstituted p-biphenyl, a substituted or unsubstituted m-terphenyl, a substituted or unsubstituted p-terphenyl, a substituted or unsubstituted triphenylenyl, a substituted or unsubstituted phenanthrenyl, a substituted or unsubstituted fluorenyl, a substituted or unsubstituted benzofluorenyl, a substituted or unsubstituted spirobifluorenyl, a substituted or unsubstituted indenofluorenyl, a substituted or unsubstituted furanyl, a substituted or unsubstituted benzofuranyl, a substituted or unsubstituted dibenzofuranyl, a substituted or unsubstituted benzonaphthofuranyl, a substituted or unsubstituted dinaphthofuranyl, a substituted or unsubstituted dibenzothiophenyl, a substituted or unsubstituted benzonaphthothiophenyl, a substituted or unsubstituted benzocarbazolyl, a substituted or unsubstituted benzofurocarbazolyl, a substituted or unsubstituted benzothienocarbazolyl, a substituted or unsubstituted benzobisbenzofuranyl, a substituted or unsubstituted oxathiaindenofluorenyl, a substituted or unsubstituted dibenzocarbazolyl, a substituted unsubstituted benzobisbenzothiophenyl, a substituted or unsubstituted carbazolyl, a substituted or unsubstituted indolocarbazolyl, a substituted or unsubstituted benzoxazolyl, a substituted or unsubstituted naphthooxazolyl, a substituted or unsubstituted phenanthrooxazolyl, a substituted or unsubstituted benzothiazolyl, or a substituted or unsubstituted naphthothiazolyl.

In the compound of formula 1 according to one embodiment, $Ar_1$, $Ar_2$, $L_1$, and $L_2$ do not include a compound represented by the following formula a:

(a)

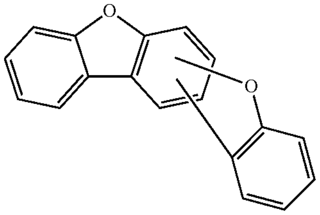

The compound of formula 1 according to one embodiment may be represented by the following formula 1-1:

(1-1)

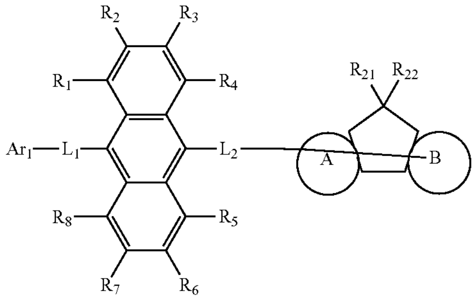

In formula 1-1, $Ar_1$, $L_1$, $L_2$, and $R_1$ to $R_6$ are as defined in formula 1 above;

Ring A and Ring B each independently represent a substituted or unsubstituted benzene ring or a substituted or unsubstituted naphthalene ring; and $R_{21}$ and $R_{22}$ each independently represent hydrogen, deuterium, a substituted or unsubstituted (C1-C30)alkyl, a substituted or unsubstituted (C6-C30)aryl, a substituted or unsubstituted (3- to 30-membered)heteroaryl, or a substituted or unsubstituted (C3-C30)cycloalkyl; or may be linked to the adjacent substituent to form a ring(s).

In one embodiment, $R_{21}$ and $R_{22}$ each independently may be a substituted or unsubstituted (C1-C30)alkyl, or a substituted or unsubstituted (C6-C30)aryl; or may be linked to the adjacent substituent to form a substituted or unsubstituted (5- to 30-membered) monocyclic or polycyclic, alicyclic or aromatic ring, or a combination thereof, preferably, a substituted or unsubstituted (C1-C10)alkyl, or a substituted or unsubstituted (C6-C25)aryl; or may be linked to the adjacent substituent to form a substituted or unsubstituted (5- to 25-membered) monocyclic or polycyclic, alicyclic or aromatic ring, or a combination thereof, more preferably, a substituted or unsubstituted (C1-C4)alkyl, or a substituted or unsubstituted (C6-C18)aryl; or may be linked to the adjacent substituent to form a substituted or unsubstituted (5- to 18-membered) monocyclic or polycyclic, alicyclic or aromatic ring, or a combination thereof. For example, $R_{21}$ and $R_{22}$ each independently may be a substituted or unsubstituted methyl, a substituted or unsubstituted phenyl, or may be linked to each other to form a fused fluorene ring.

In one embodiment,

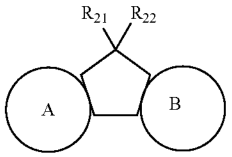

may be selected from the following Group 1.

[Group 1]

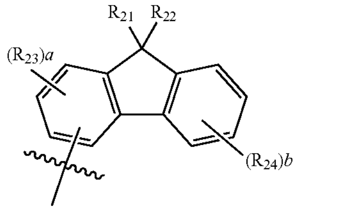

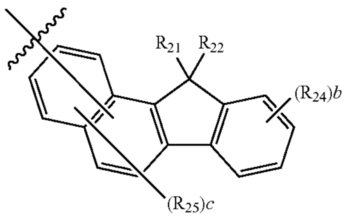

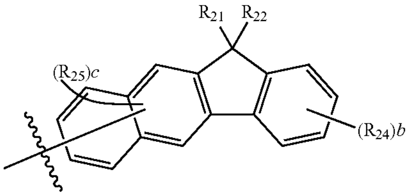

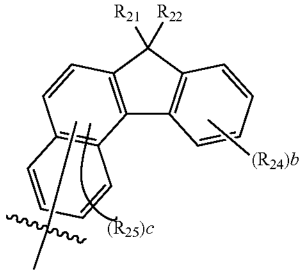

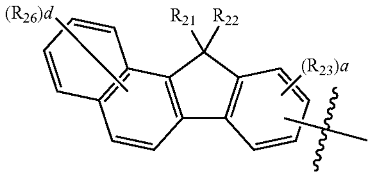

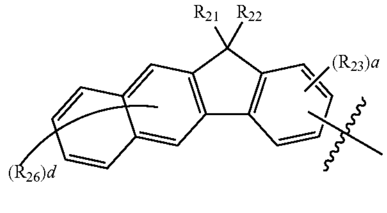

-continued

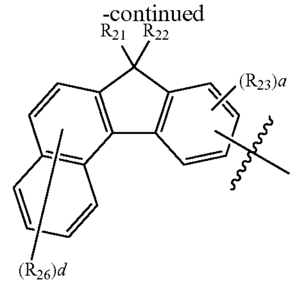

In Group 1, $R_{21}$ and $R_{22}$ are as defined in formula 1-1 above;

$R_{23}$ to $R_{26}$ each independently represent hydrogen, deuterium, halogen, cyano, a substituted or unsubstituted (C1-C30)alkyl, a substituted or unsubstituted (C6-C50) aryl, a substituted or unsubstituted (3- to 30-membered) heteroaryl, or a substituted or unsubstituted (C3-C30) cycloalkyl; or may be linked to the adjacent substituent to form a ring(s);

a represent an integer of 1 to 3, b represents an integer of 1 to 4, c represents an integer of 1 to 5, and d represents an integer of 1 to 6; and when a to d are an integer of 2 or more, each of $R_{25}$ to $R_{26}$ may be the same or different.

In one embodiment, $R_{23}$ to $R_{26}$ each independently may be hydrogen or deuterium.

The compound of formula 1 according to another embodiment may be represented by the following formula 1-2:

(1-2)

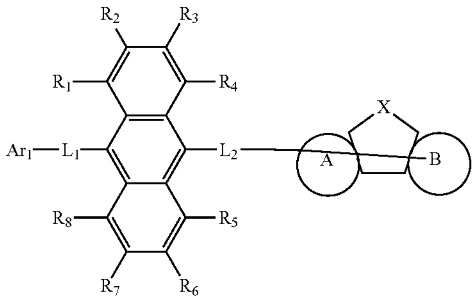

In formula 1-2, $Ar_1$, $L_1$, $L_2$, and $R_1$ to $R_8$ are as defined in formula 1-1 above;

X represents O or S; and

Ring A or Ring B each independently represent a substituted or unsubstituted benzene ring or a substituted or unsubstituted naphthalene ring.

In one embodiment,

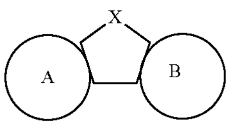

may be selected from the following Group 2.

[Group 2]

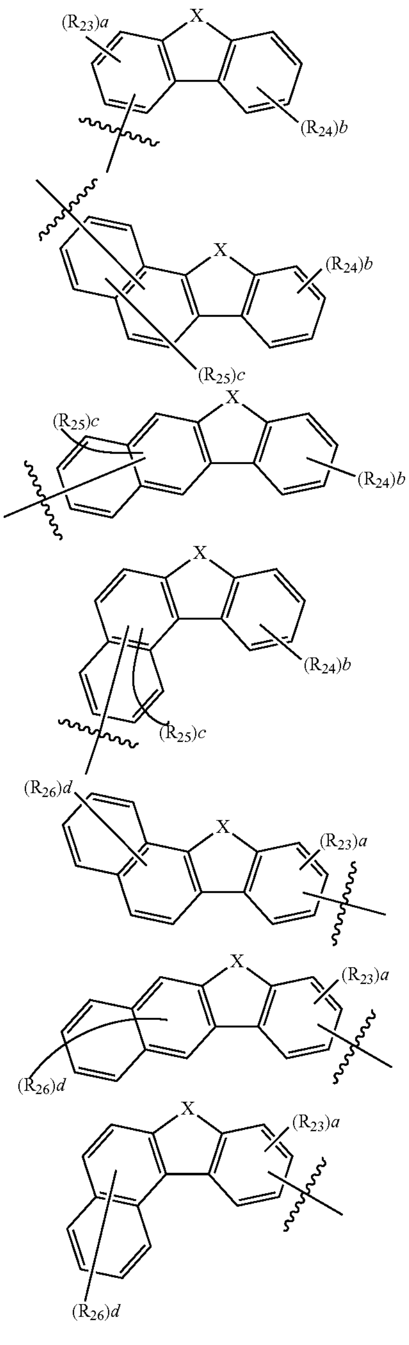

In Group 2,

X is as defined in formula 1-2 above;

$R_{23}$ to $R_{26}$ each independently represent hydrogen, deuterium, halogen, cyano, a substituted or unsubstituted (C1-C30)alkyl, a substituted or unsubstituted (C6-C50) aryl, a substituted or unsubstituted (3- to 30-membered) heteroaryl, or a substituted or unsubstituted (C3-C30) cycloalkyl; or may be linked to the adjacent substituent to form a ring(s);

a represents an integer of 1 to 3, b represents an integer of 1 to 4, c represents an integer of 1 to 5, and d represents an integer of 1 to 6; and when a to d are an integer of 2 or more, each of $R_{23}$ to $R_{26}$ may be the same or different.

The compound of formula 1 according to other embodiment may be represented by the following formula 1-3:

(1-3)

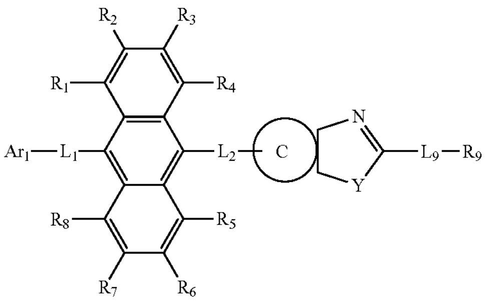

In formula 1-3, $Ar_1$, $L_1$, $L_2$, and $R_1$ to $R_8$ are as defined in formula 1 above;

Y represents O or S;

Ring C represents a substituted or unsubstituted benzene ring, a substituted or unsubstituted naphthalene ring, or a substituted or unsubstituted phenanthrene ring;

$L_9$ represents a single bond, a substituted or unsubstituted (C6-C30)arylene, or a substituted or unsubstituted (3- to 30-membered)heteroarylene; and $R_9$ represents a substituted or unsubstituted (C6-C30)aryl or a substituted or unsubstituted (3- to 30-membered) heteroaryl.

In one embodiment, $L_9$ may be a single bond.

In one embodiment, $R_9$ may be a substituted or unsubstituted (C6-C30)aryl, preferably, a substituted or unsubstituted (C6-C25)aryl, more preferably, a substituted or unsubstituted (C6-C18)aryl. For example, $R_9$ may be a substituted or unsubstituted phenyl.

According to one embodiment, the compound represented by formula 1 above may be more specifically illustrated by the following compounds, but is not limited thereto.

H1-1

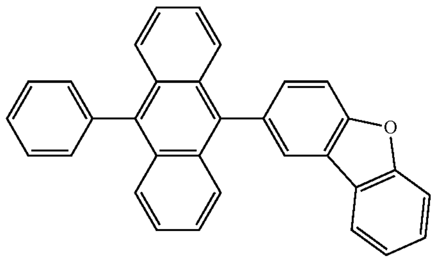

H1-2

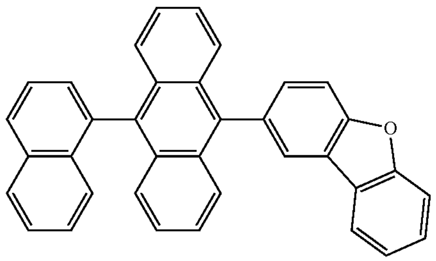

-continued
H1-3
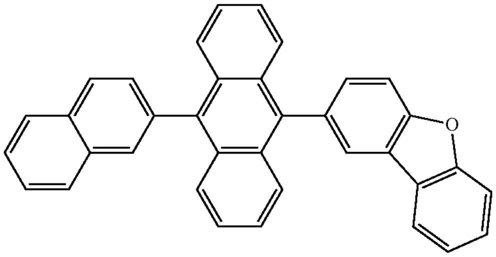
H1-4
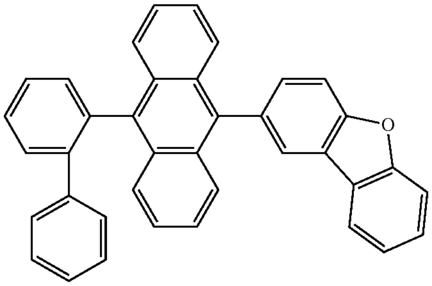
H1-5
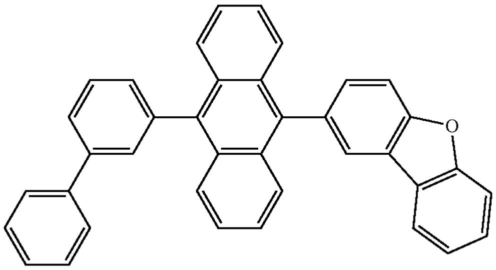
H1-6
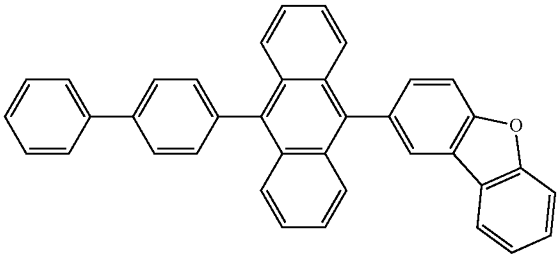
H1-7
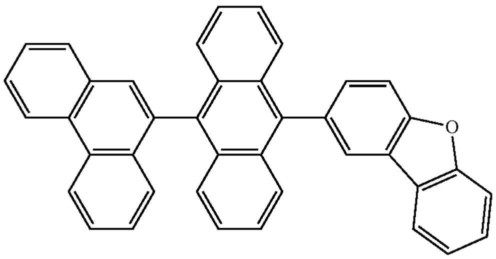
-continued
H1-8
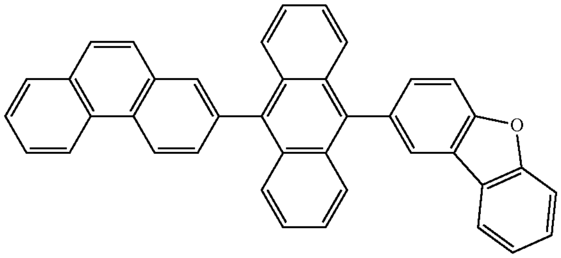
H1-9
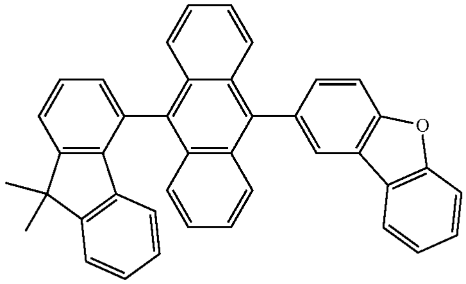
H1-10
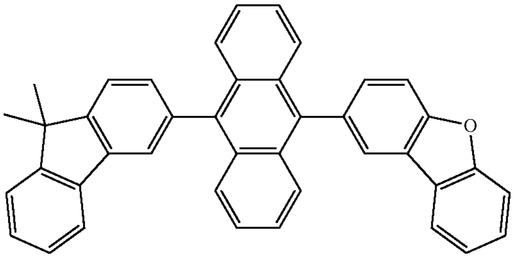
H1-11
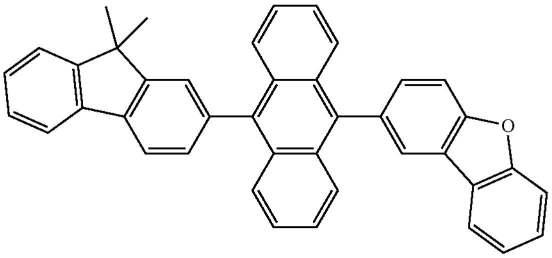
H1-12
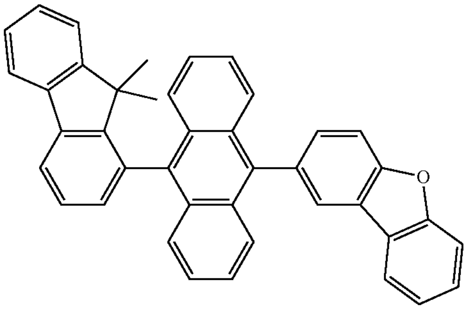

-continued
H1-13
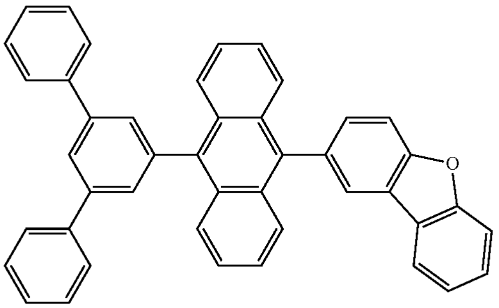
H1-14
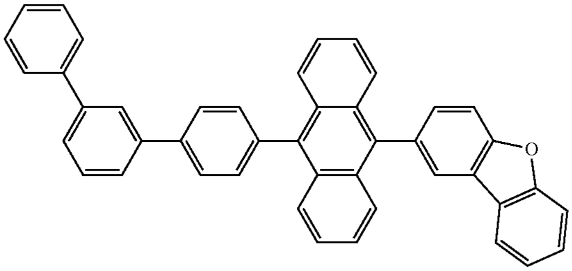
H1-15
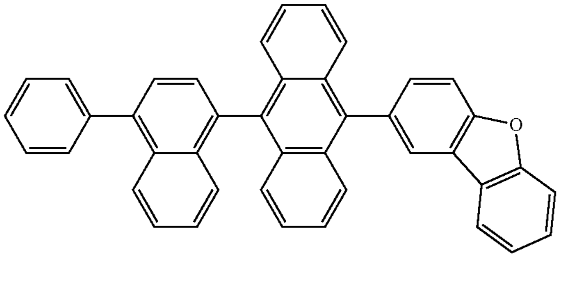
H1-16
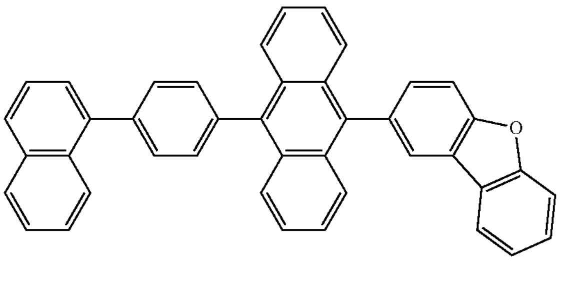
H1-17
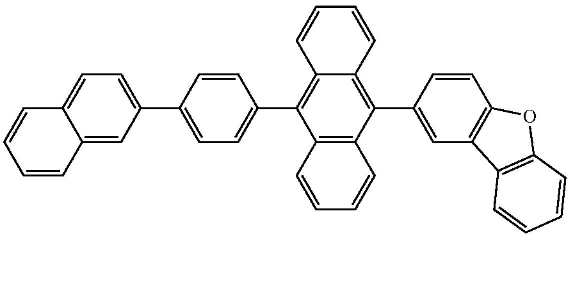
-continued
H1-18
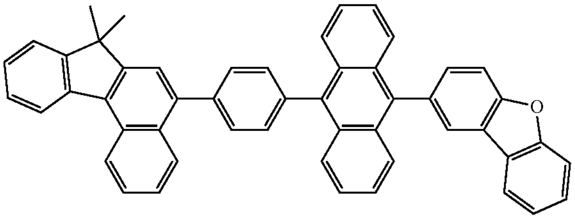
H1-19
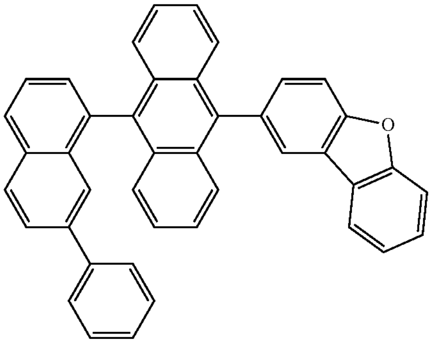
H1-20
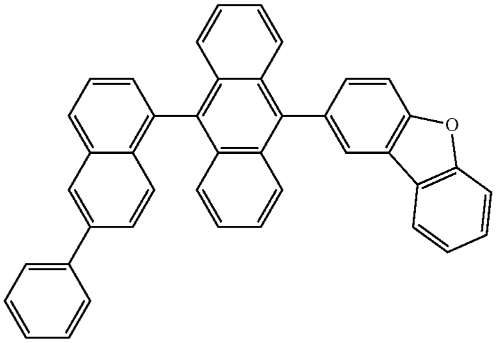
H1-21
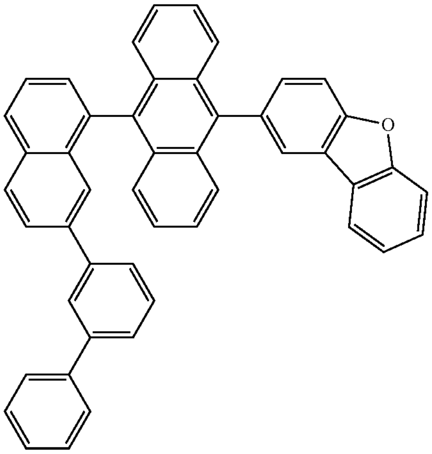

-continued
H1-22
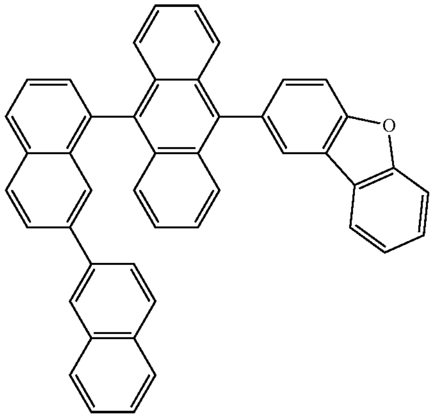
H1-23
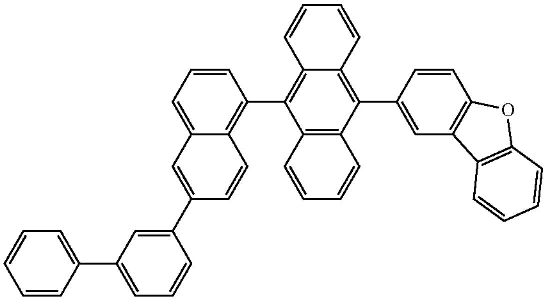
H1-24
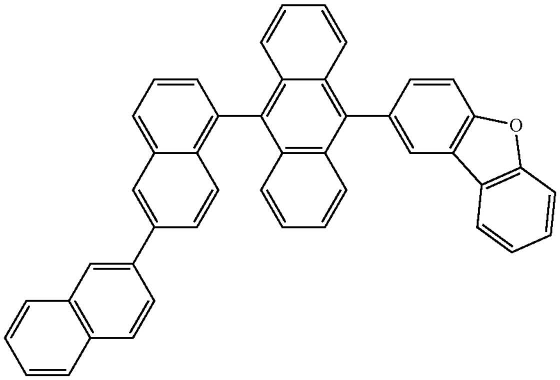
H1-25
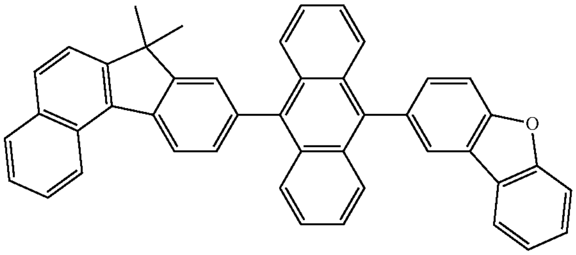
-continued
H1-26
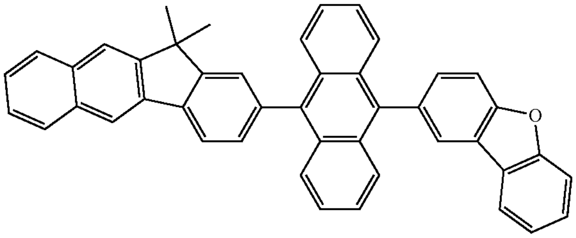
H1-27
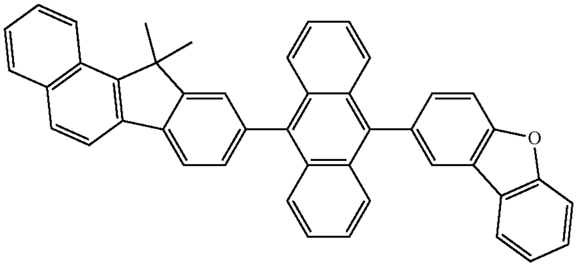
H1-28
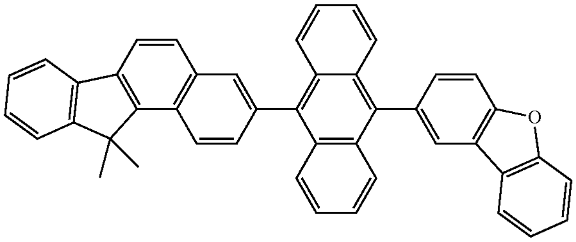
H1-29
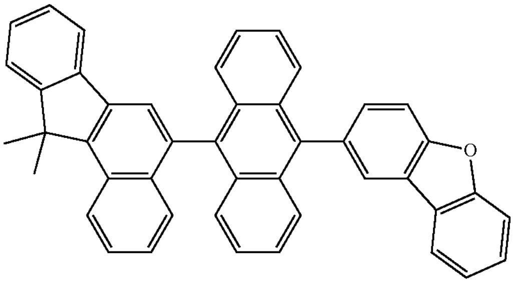
H1-30
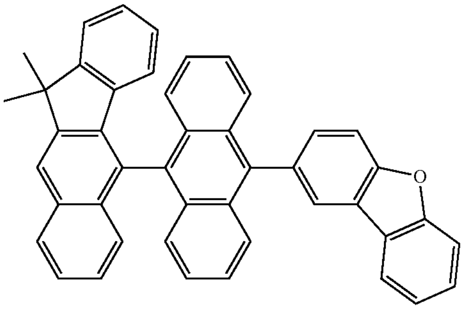

-continued
H1-31
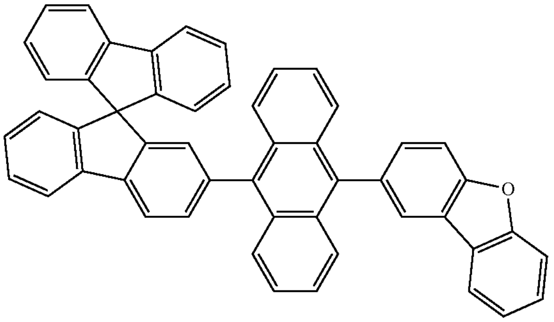
H1-32
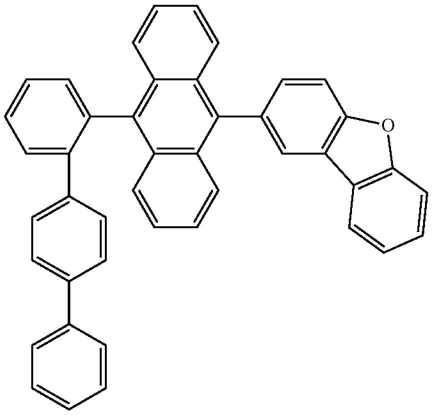
H1-33
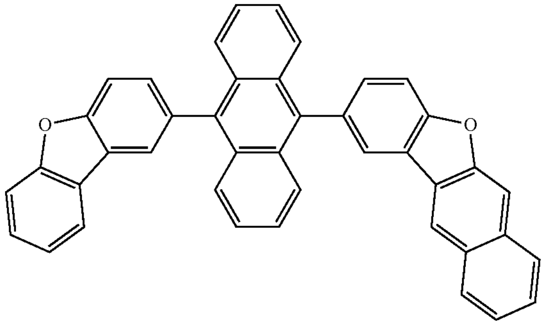
H1-34
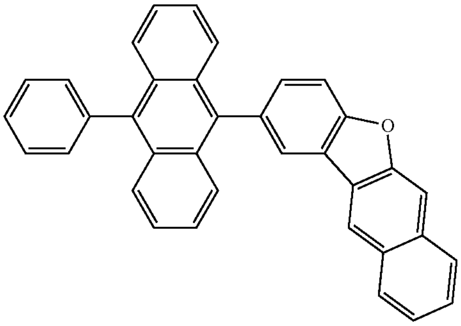
-continued
H1-35
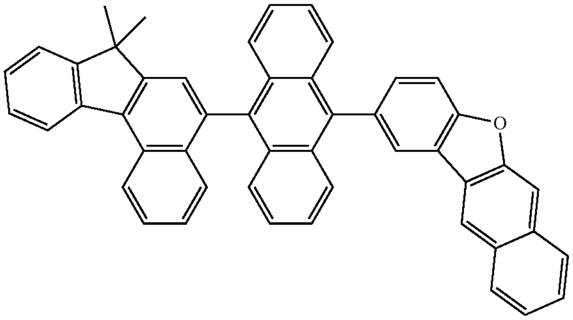
H1-36
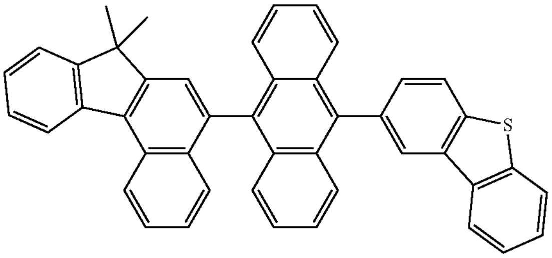
H1-37
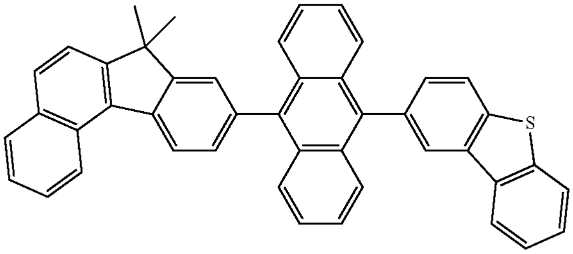
H1-38
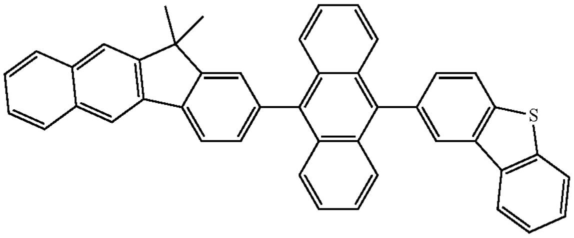
H1-39
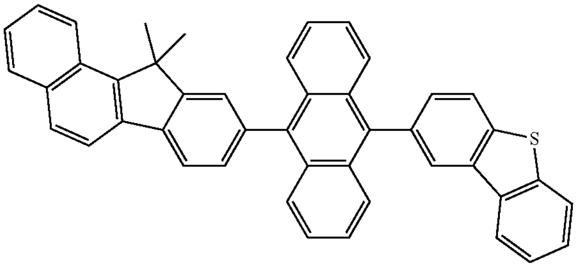

-continued
H1-40
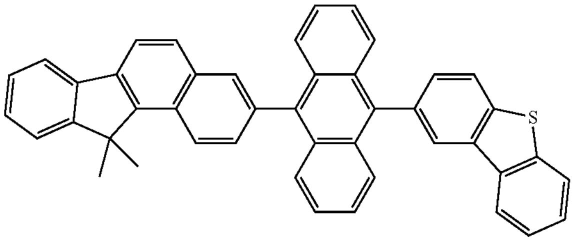
H1-41
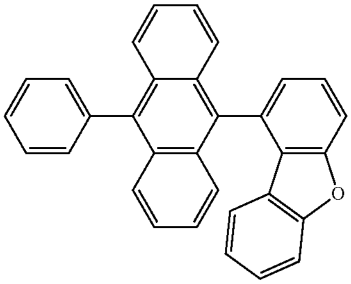
H1-42
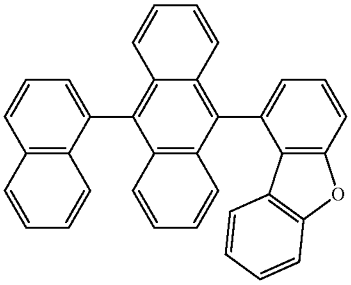
H1-43
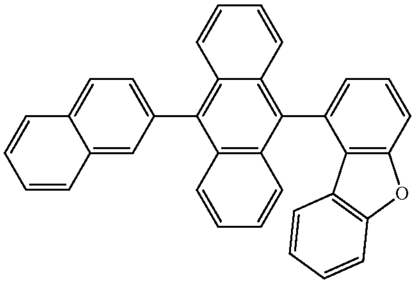
H1-44
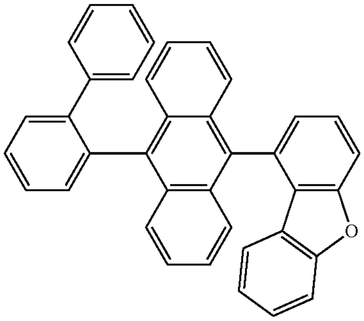
-continued
H1-45
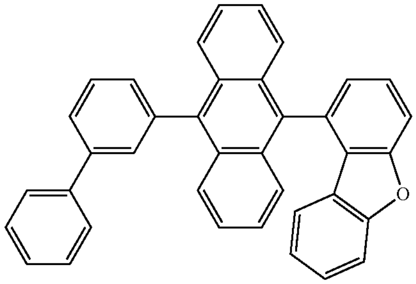
H1-46
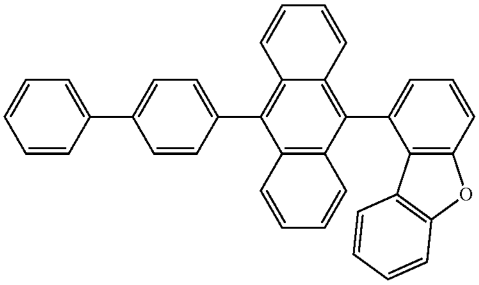
H1-47
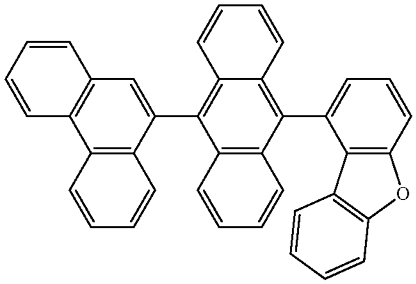
H1-48
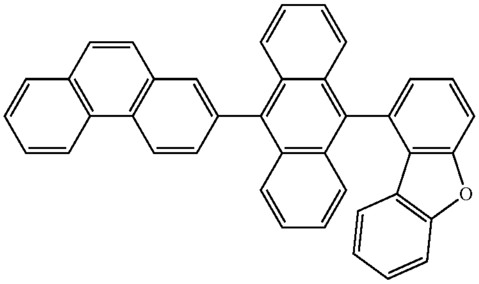
H1-49
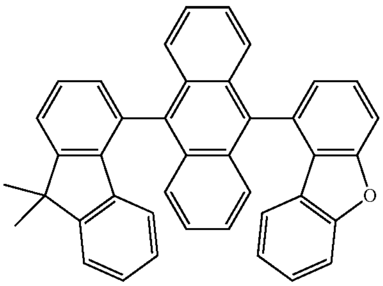

-continued
H1-50
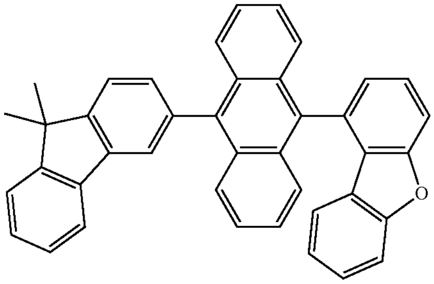
H1-51
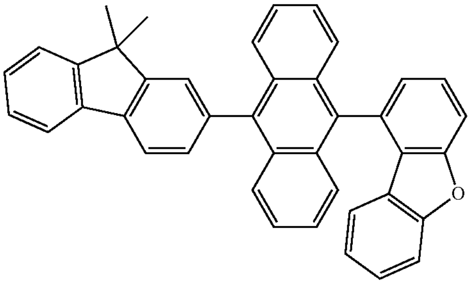
H1-52
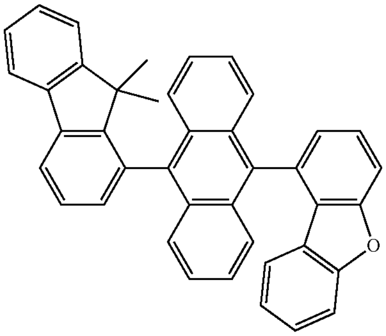
H1-53
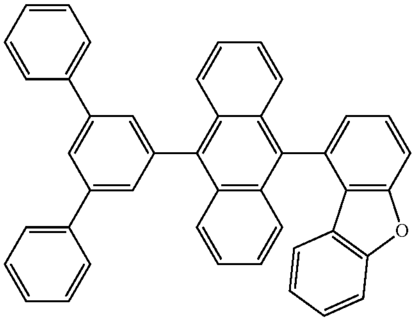
H1-54
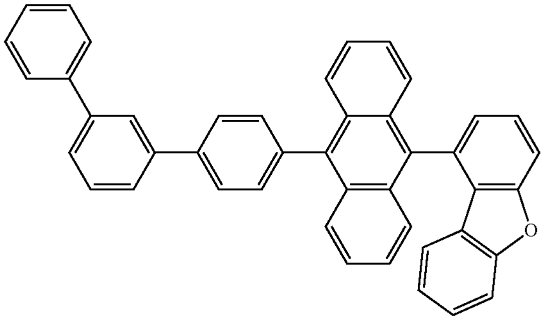
-continued
H1-55
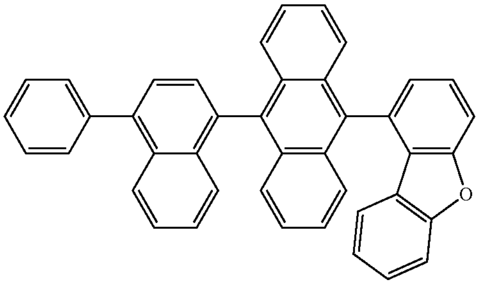
H1-56
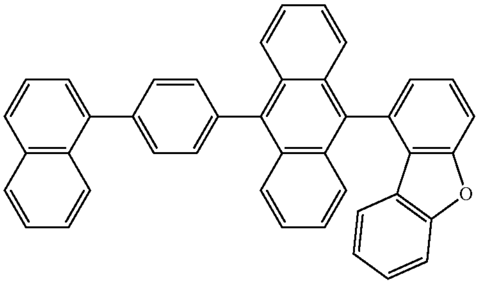
H1-57
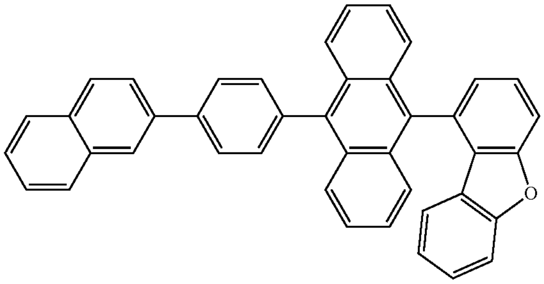
H1-58
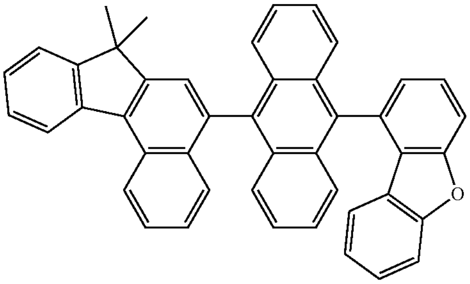
H1-59
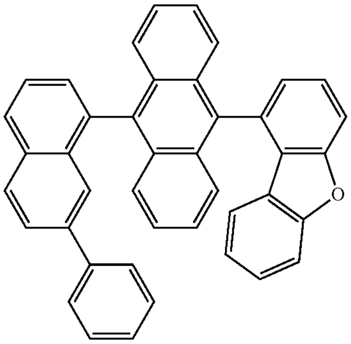

-continued
H1-60
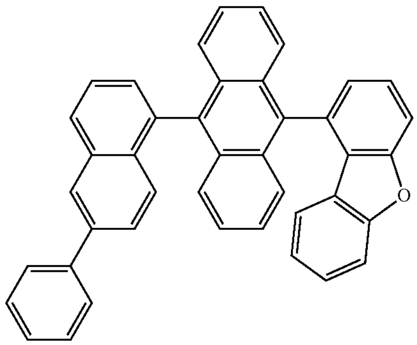
H1-61
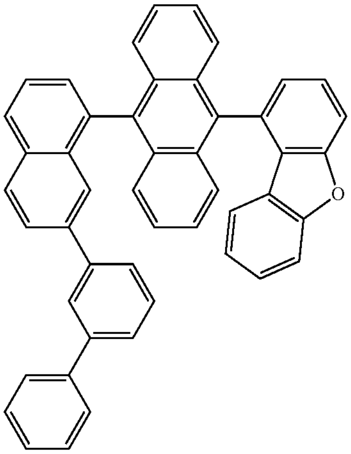
H1-62
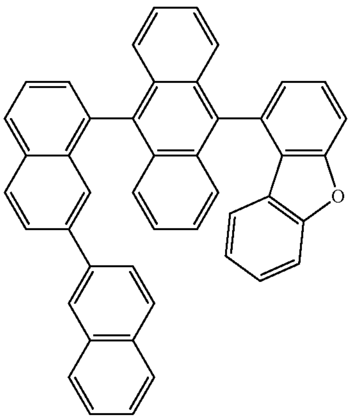
H1-63
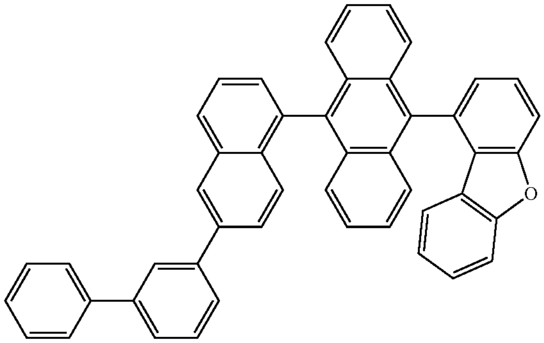
-continued
H1-64
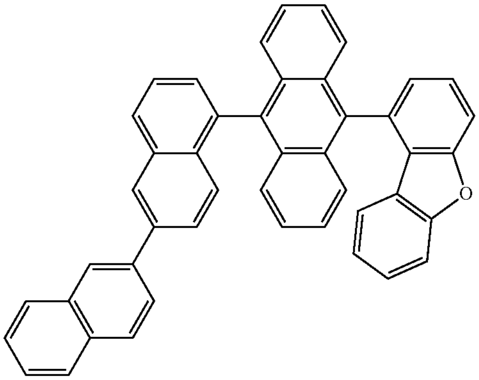
H1-65
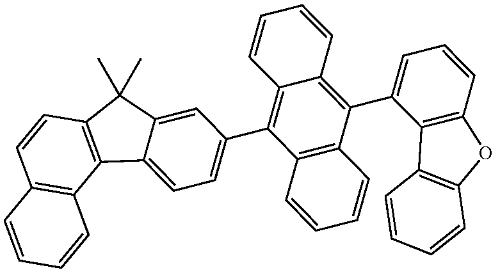
H1-66
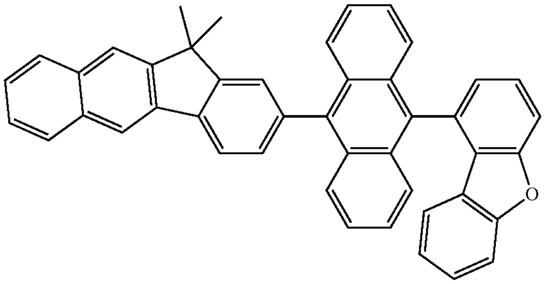
H1-67
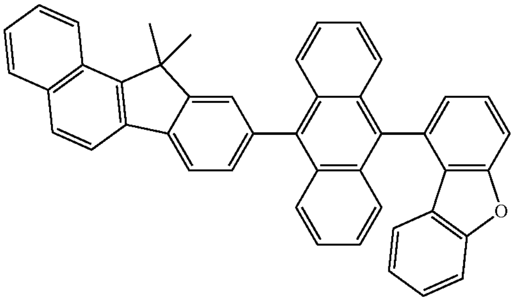
H1-68
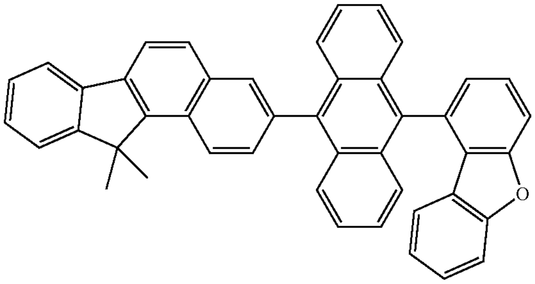

-continued
H1-69
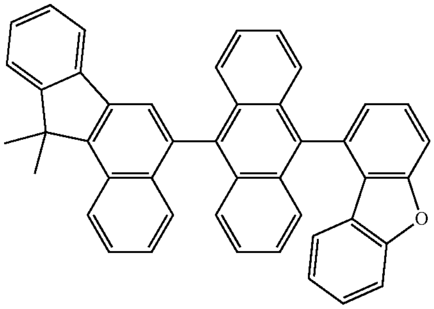
H1-70
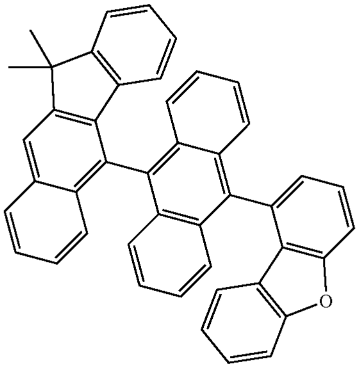
H1-71
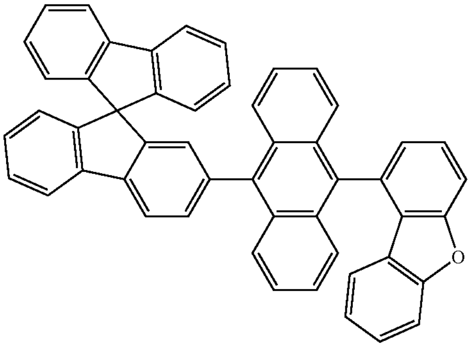
H1-72
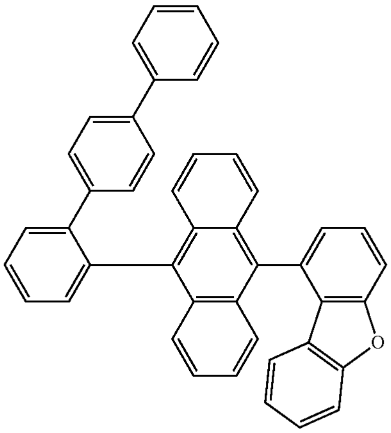
-continued
H1-73
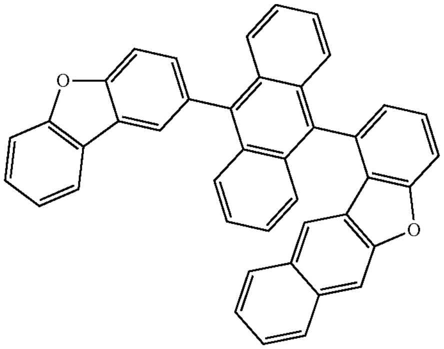
H1-74
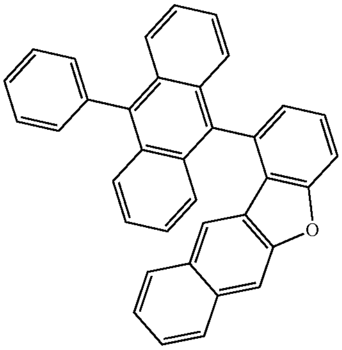
H1-75
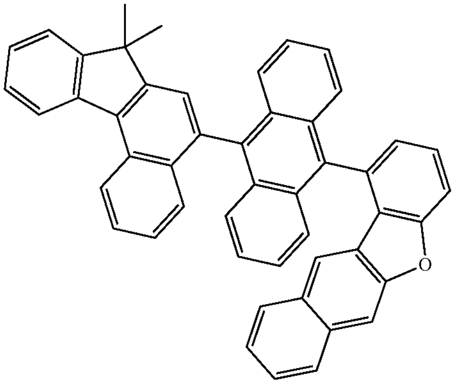
H1-76
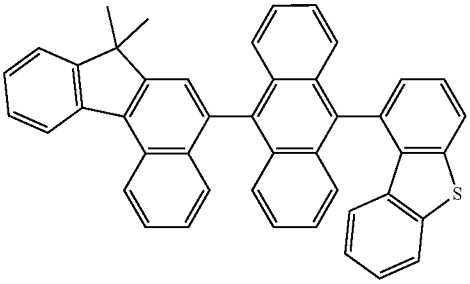

-continued
H1-77
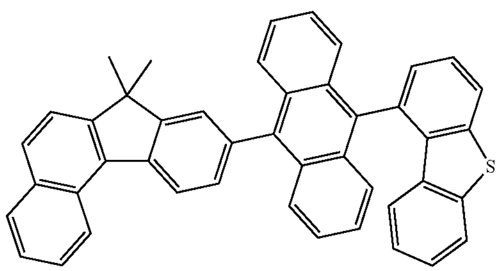
H1-78
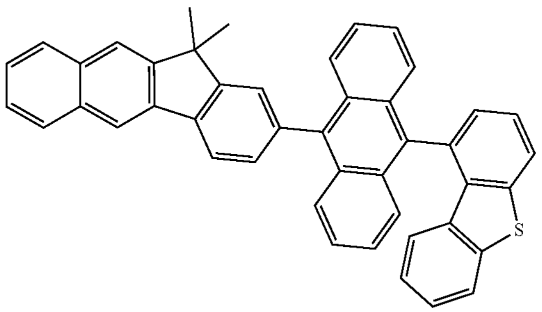
H1-79
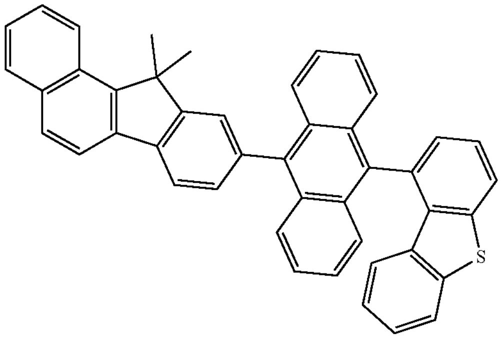
H1-80
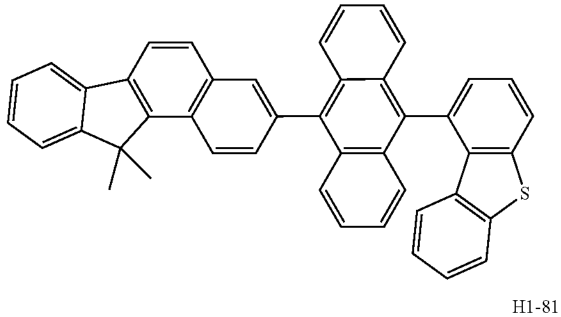
H1-81
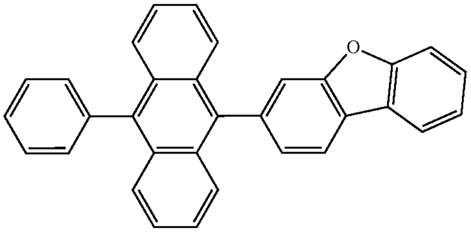
-continued
H1-82
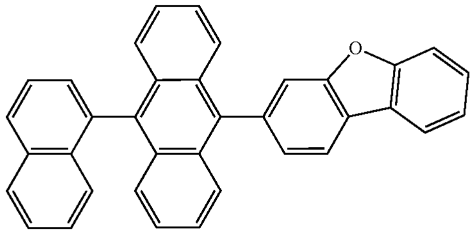
H1-83
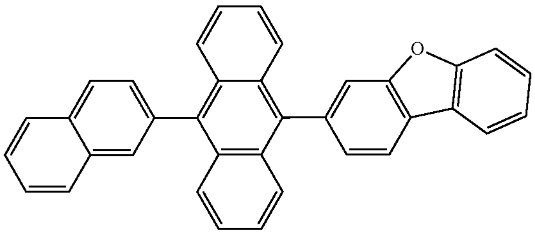
H1-84
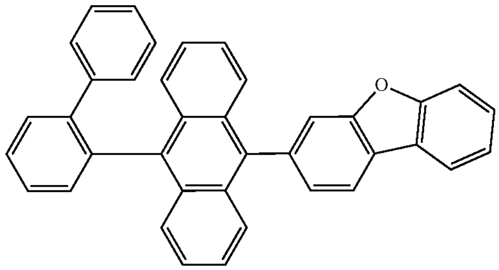
H1-85
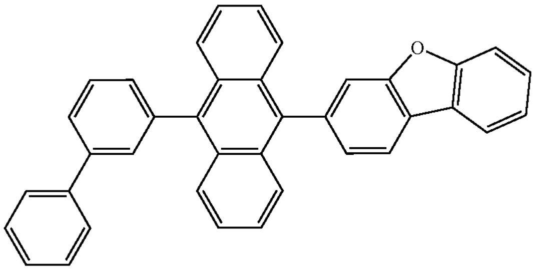
H1-86
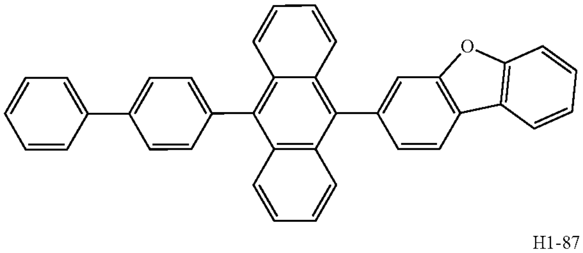
H1-87
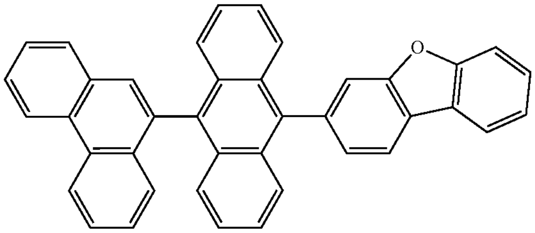

-continued
H1-88
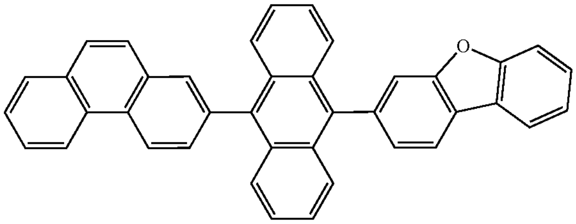
H1-89
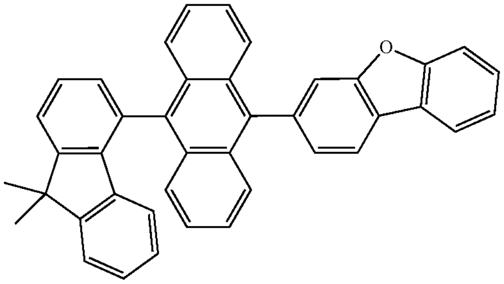
H1-90
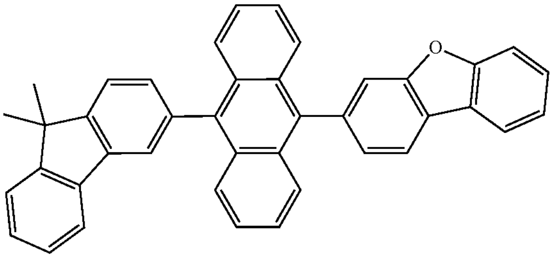
H1-91
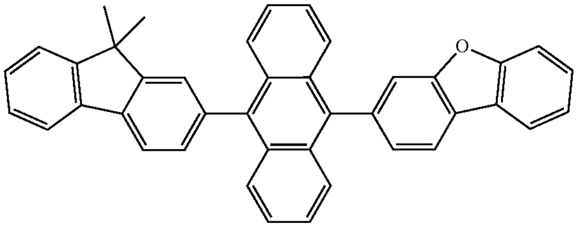
H1-92
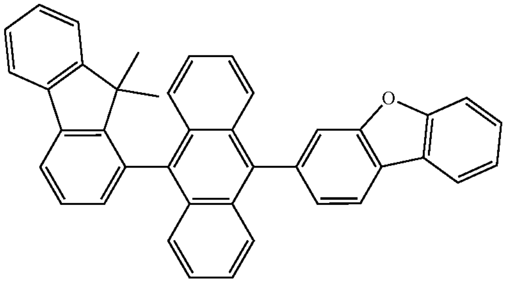
-continued
H1-93
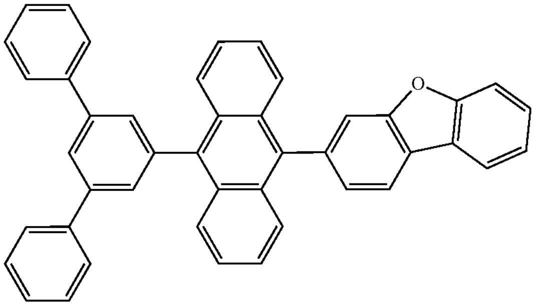
H1-94
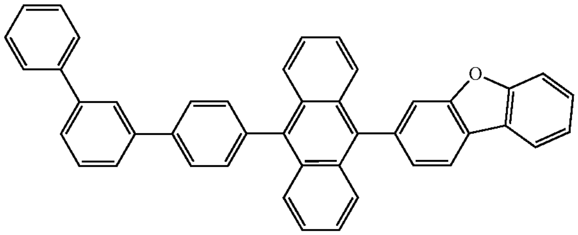
H1-95
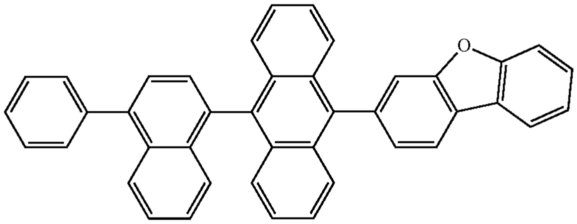
H1-96
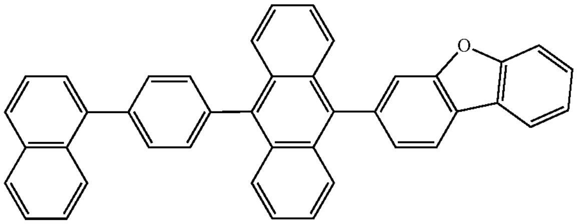
H1-97
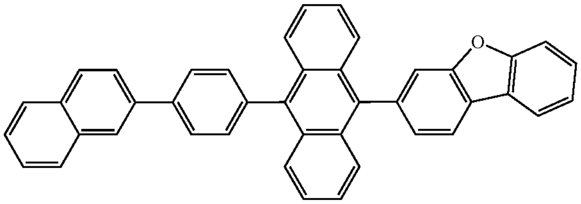
H1-98
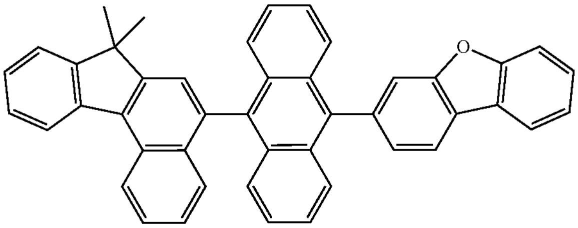

-continued
H1-99
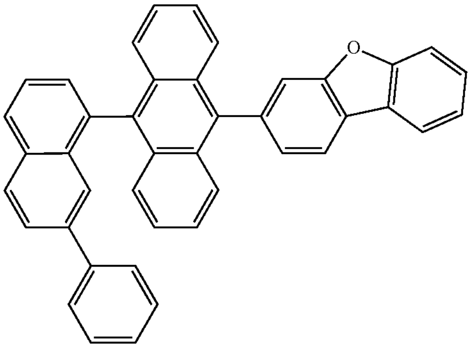
H1-100
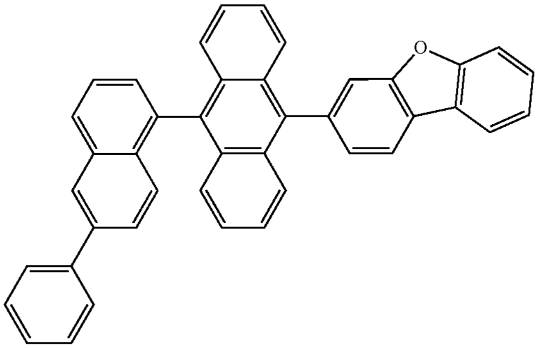
H1-101
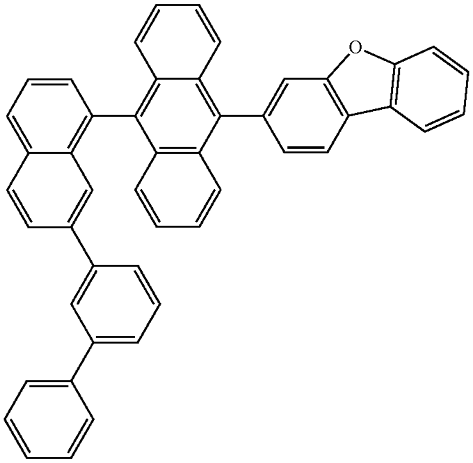
H1-102
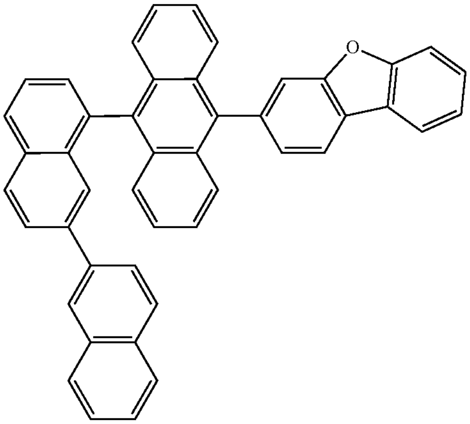
-continued
H1-103
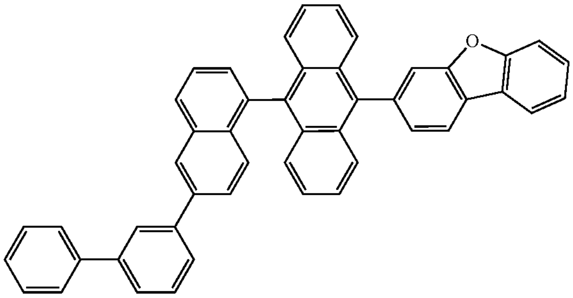
H1-104
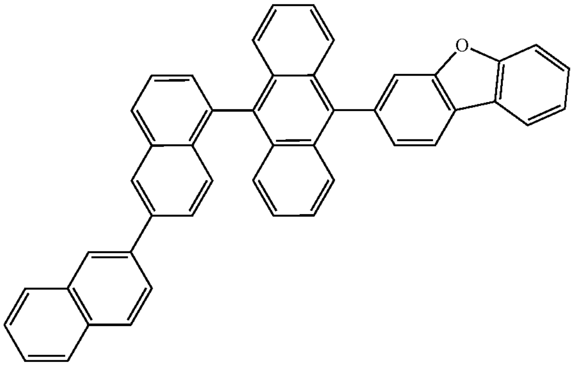
H1-105
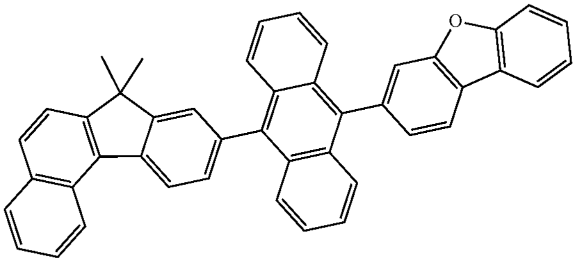
H1-106
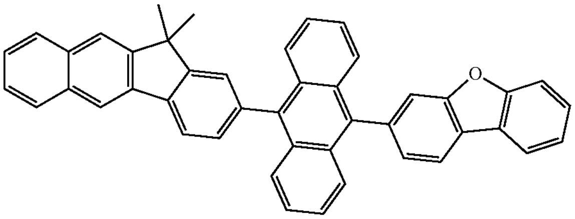
H1-107
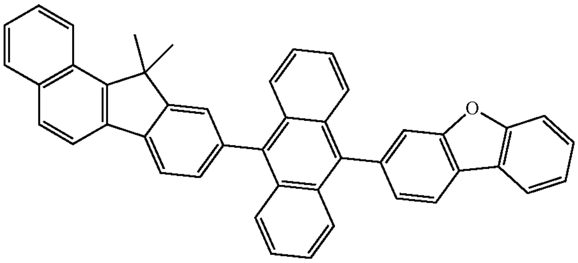

-continued
H1-108
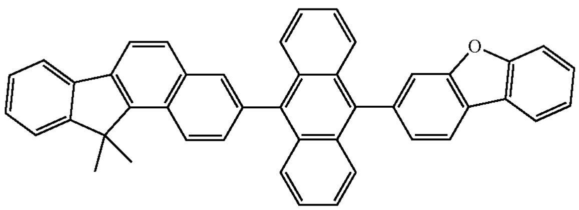
H1-109
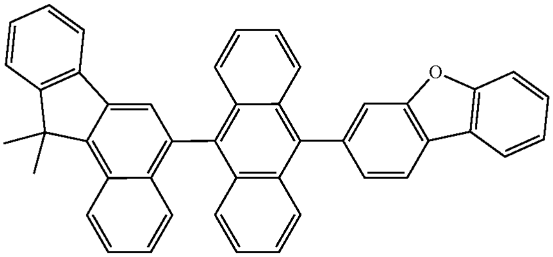
H1-110
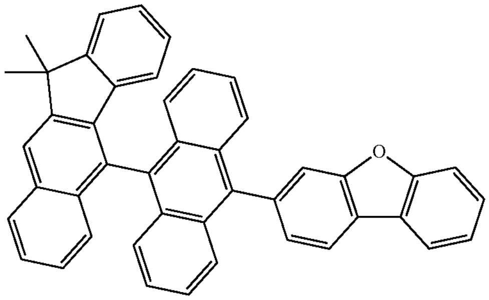
H1-111
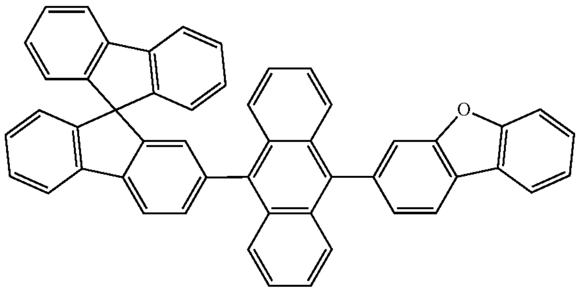
H1-112
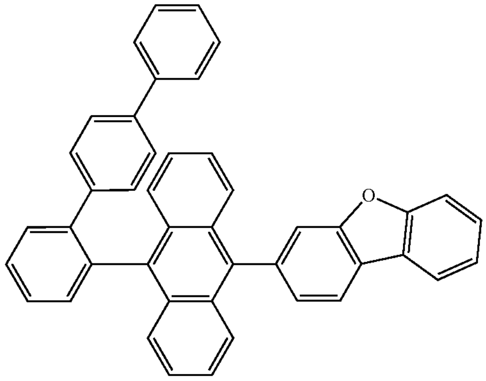
-continued
H1-113
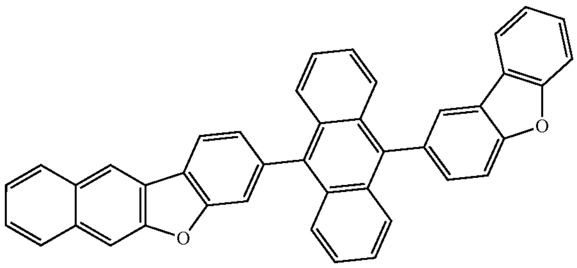
H1-114
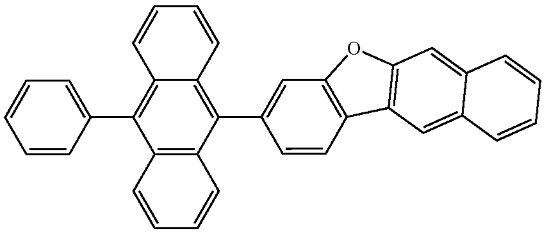
H1-115
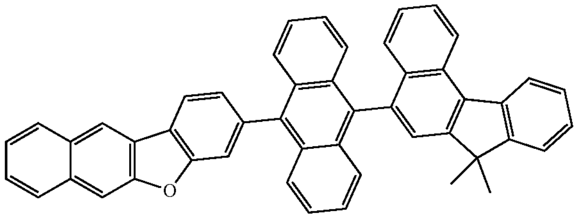
H1-116
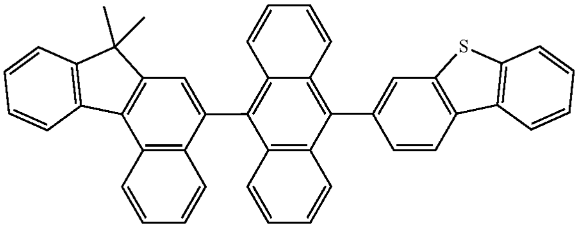
H1-117
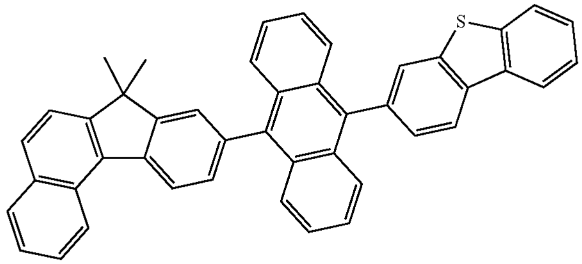
H1-118
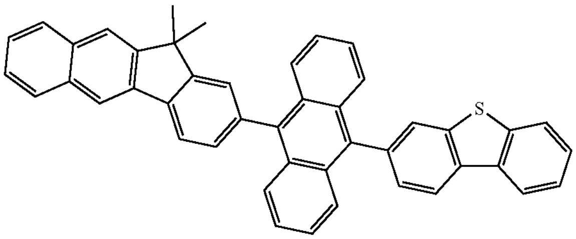

-continued
H1-119
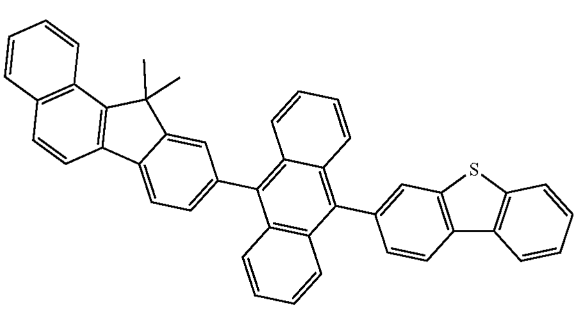
H1-120
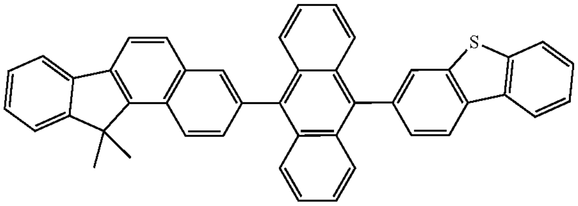
H1-121
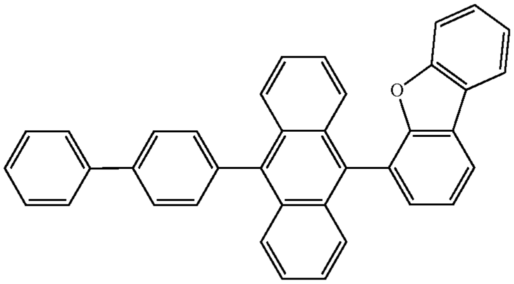
H1-122
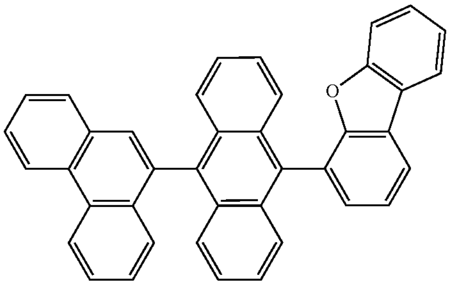
H1-123
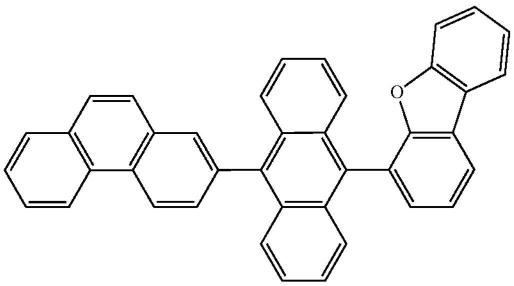
-continued
H1-124
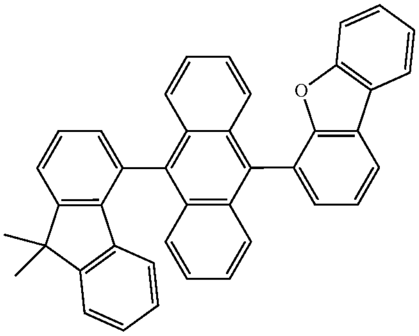
H1-125
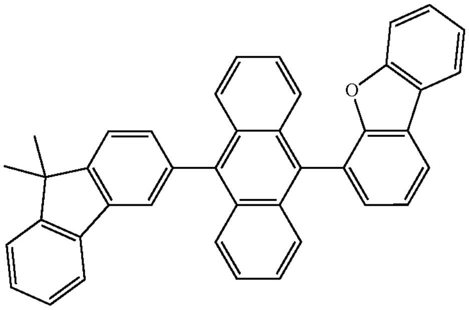
H1-126
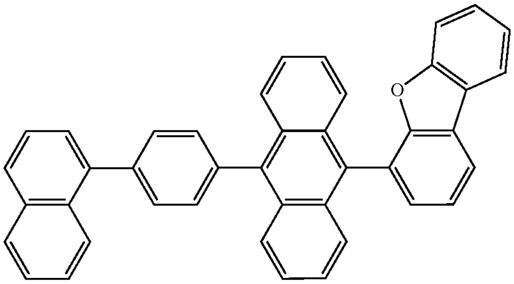
H1-127
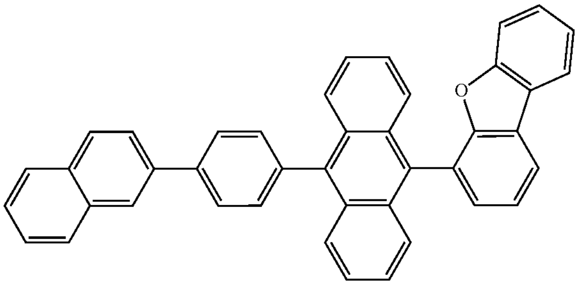
H1-128
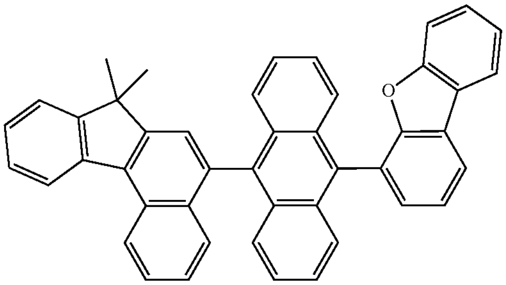

-continued
H1-129
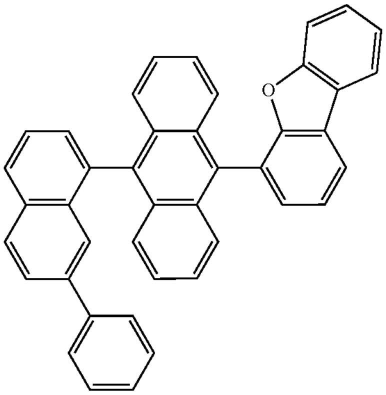
H1-130
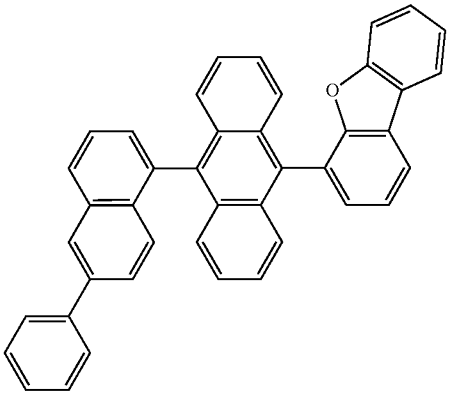
H1-131
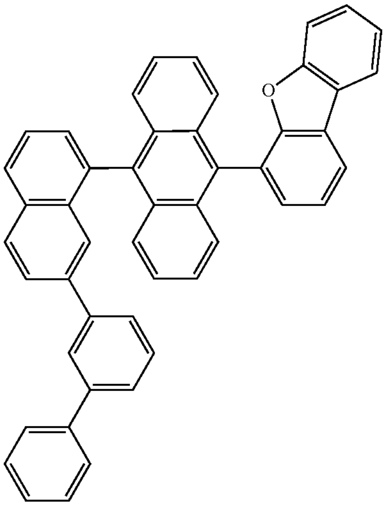
-continued
H1-132
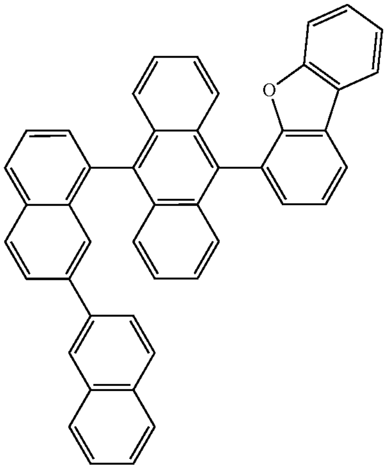
H1-133
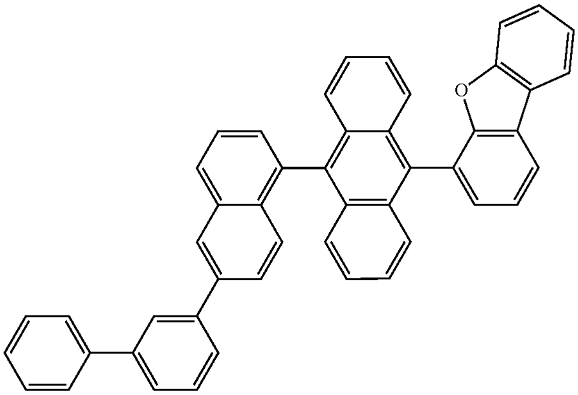
H1-134
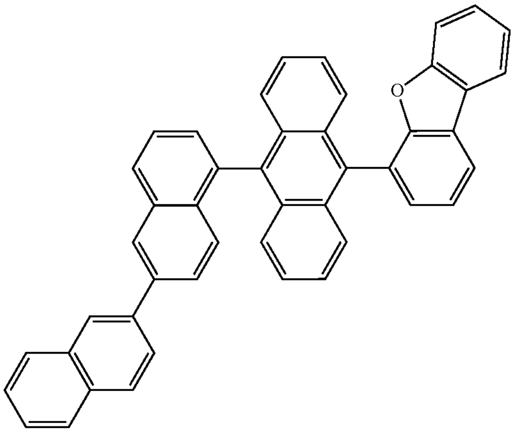

H1-135
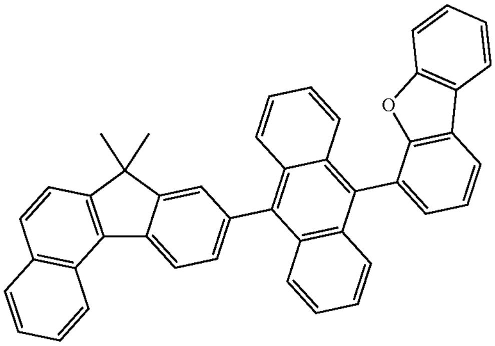
H1-136
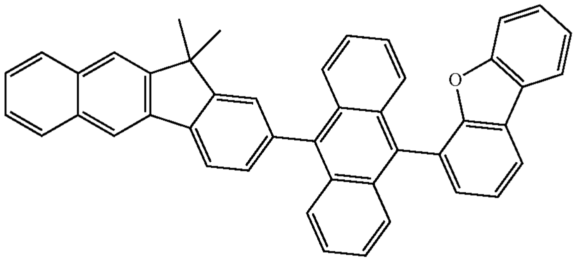
H1-137
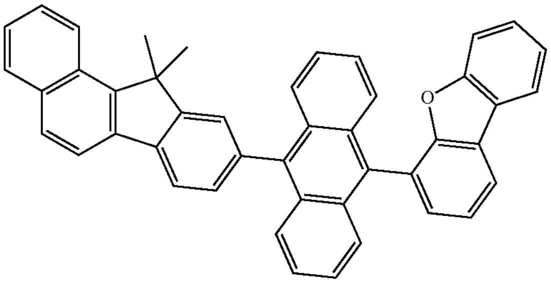
H1-138
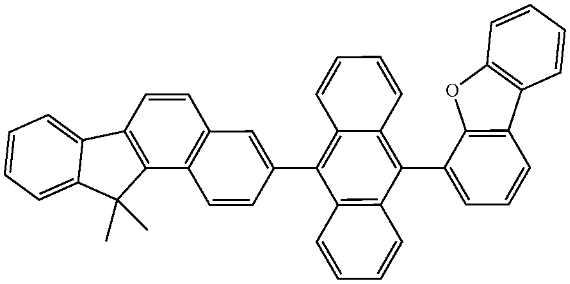
H1-139
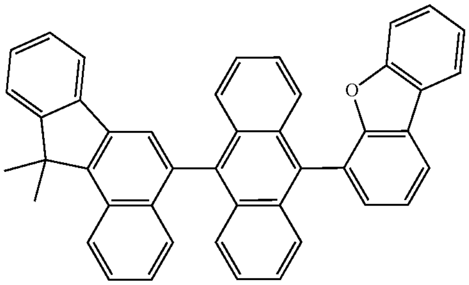
H1-140
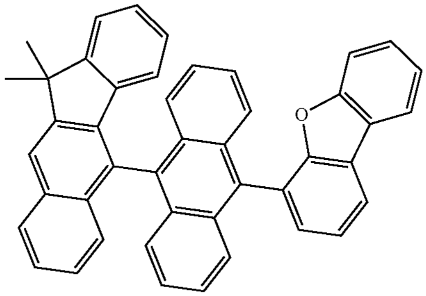
H1-141
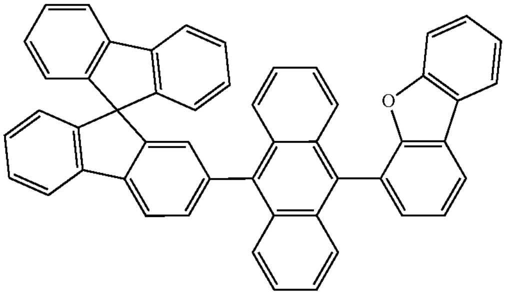
H1-142
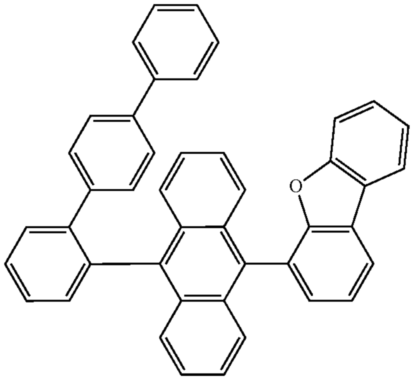
H1-143
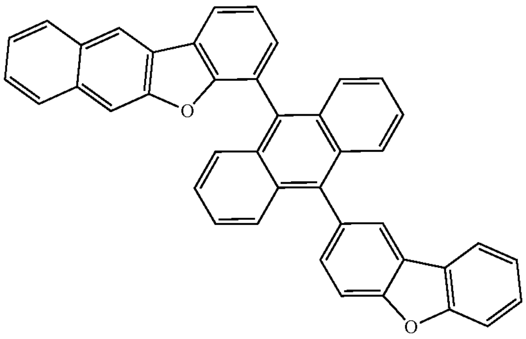

-continued
H1-144
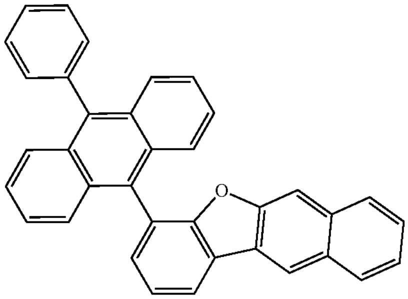
H1-145
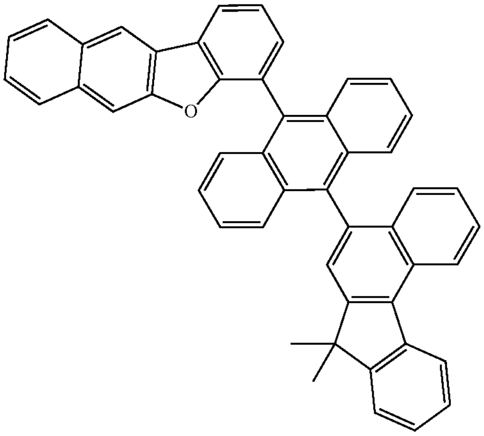
H1-146
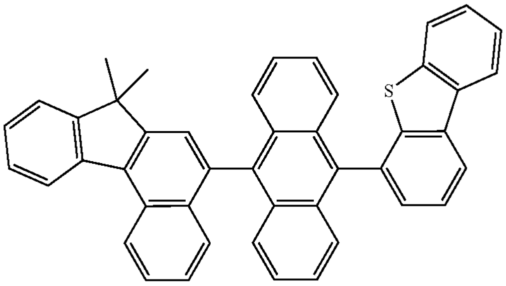
H1-147
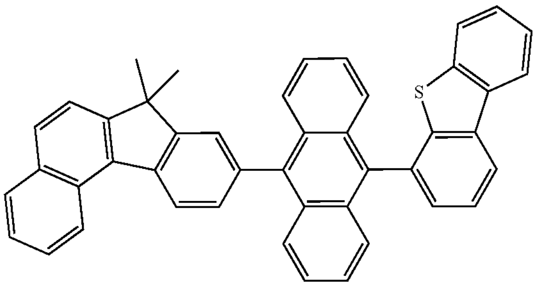
-continued
H1-148
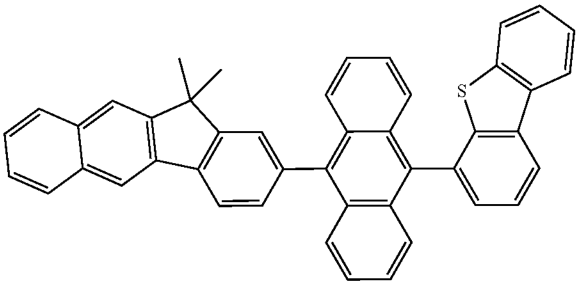
H1-149
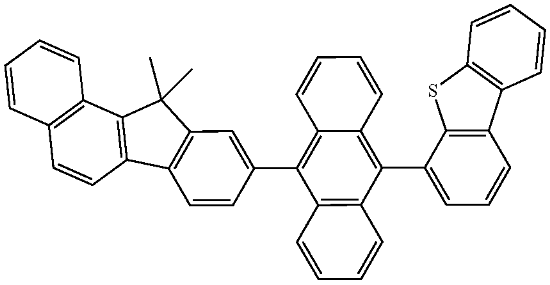
H1-150
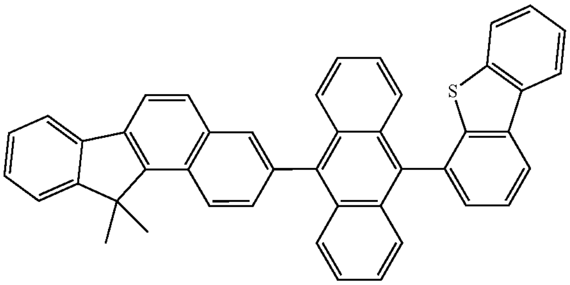
H1-151
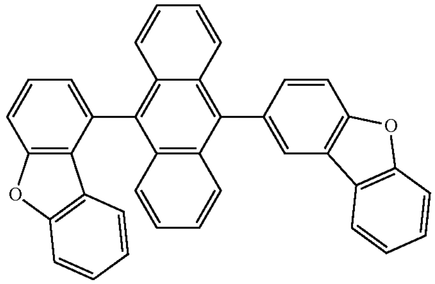
H1-52
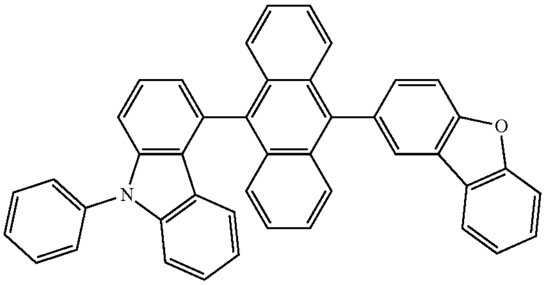

-continued
H-153
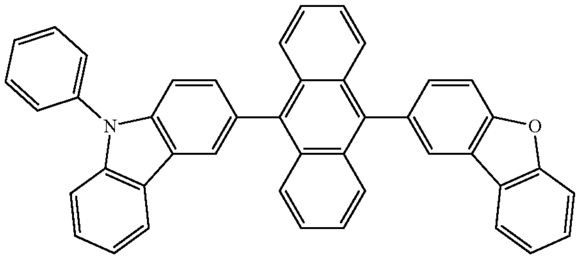
H-154
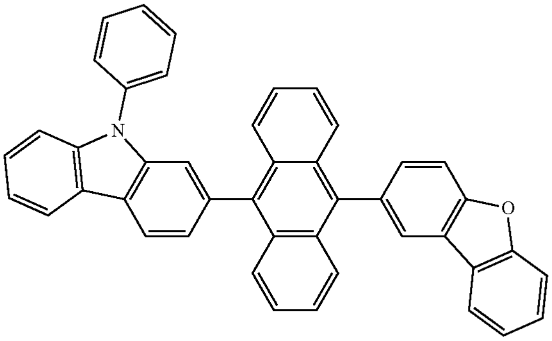
H1-155
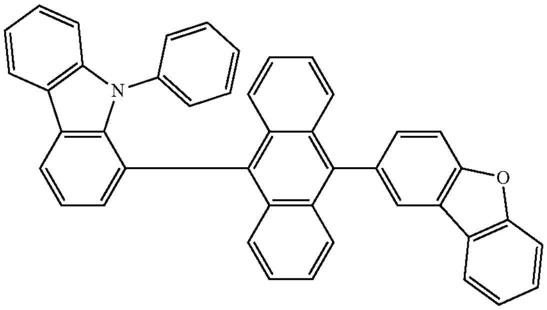
H1-156
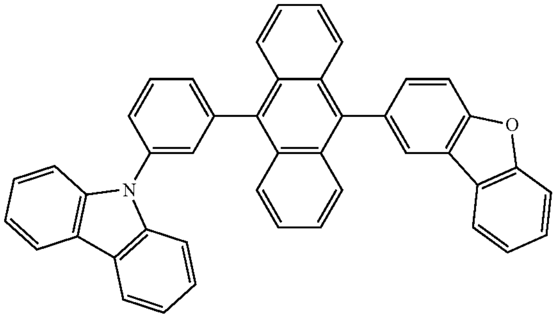
H1-157
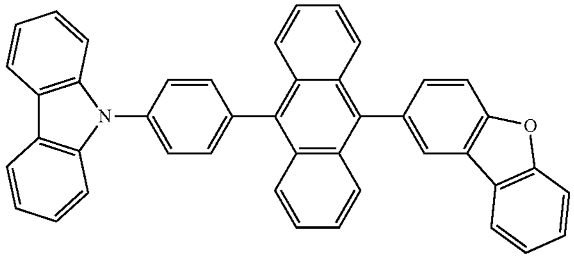
-continued
H1-158
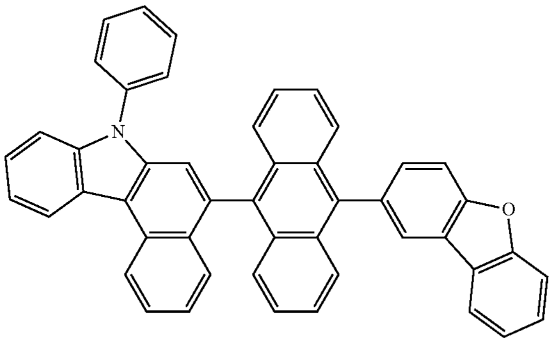
H1-159
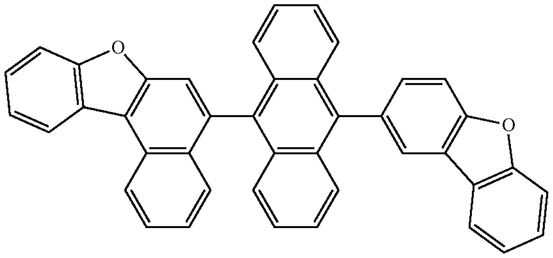
H1-160
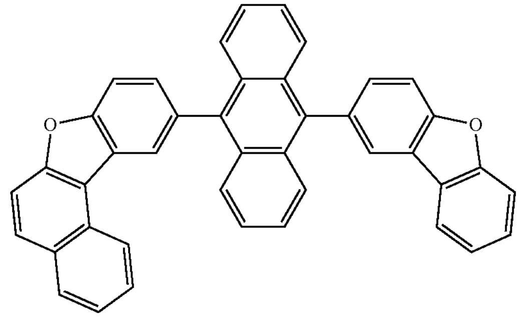
H1-161
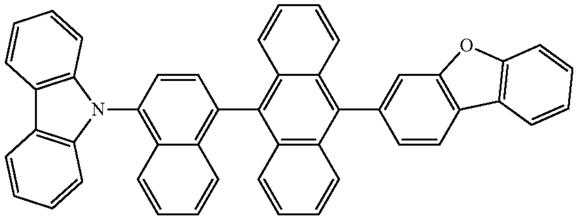
H1-162
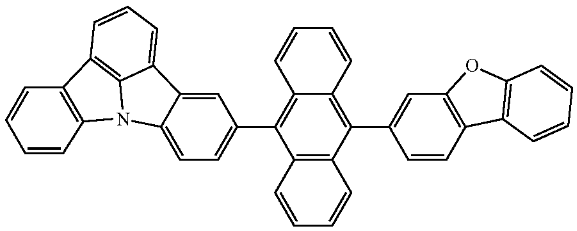

-continued
H1-163
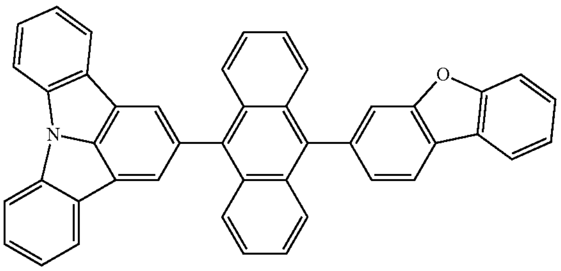
H1-164
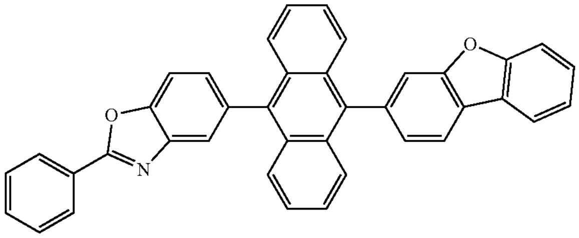
H1-165
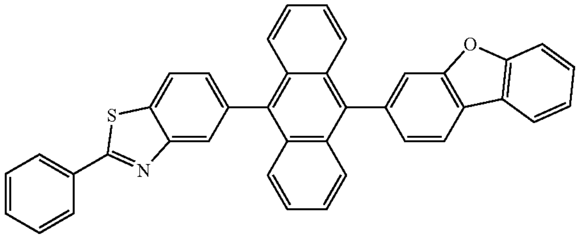
H1-166
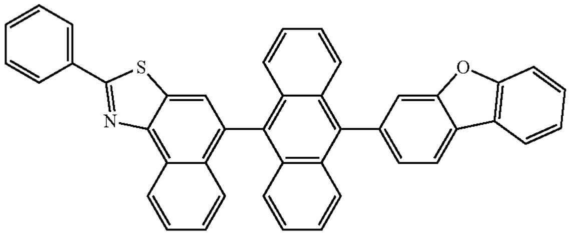
H1-167
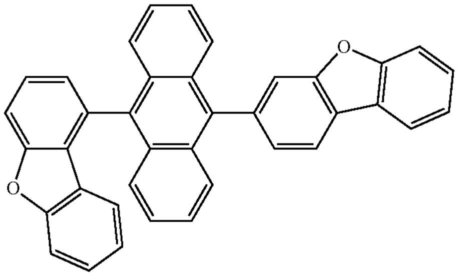
-continued
H1-168
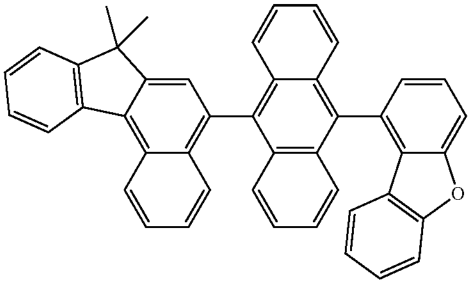
H1-169
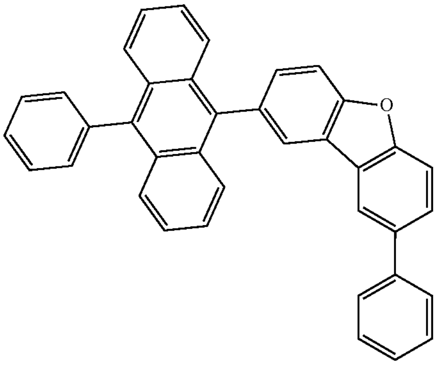
H1-170
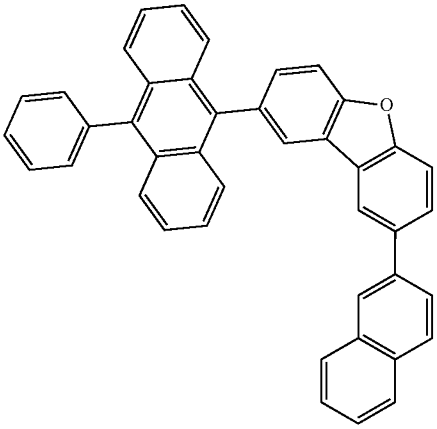
H1-171
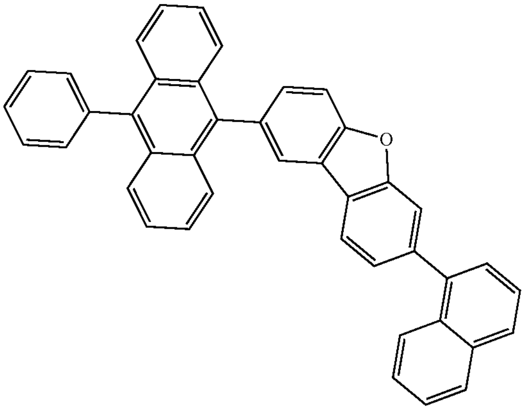

-continued
H1-172
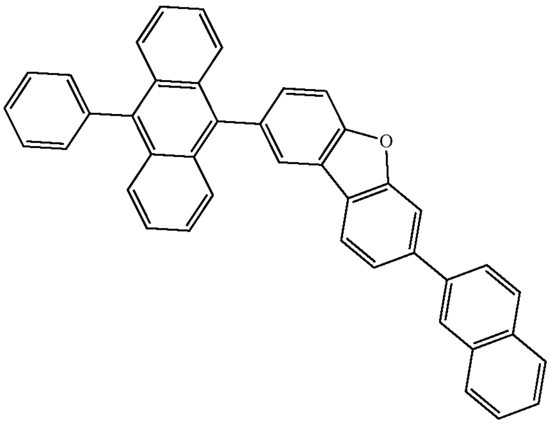
H1-173
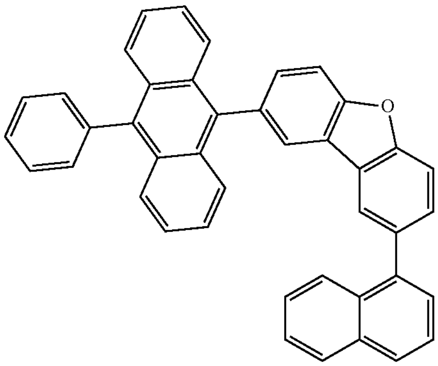
H1-174
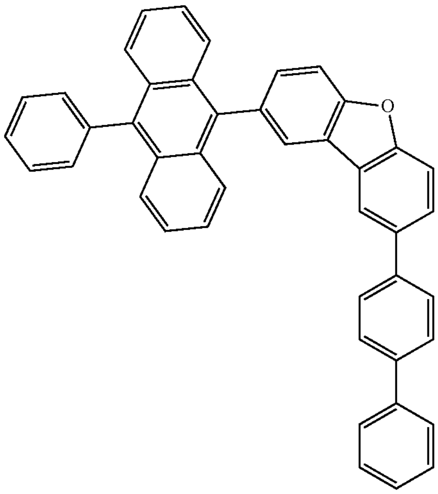
-continued
H1-175
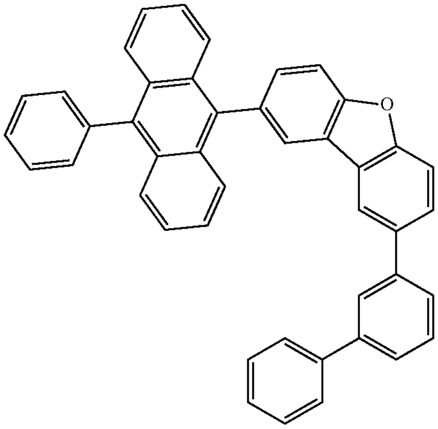
H1-176
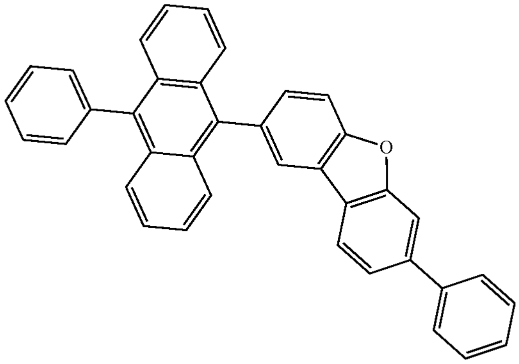
H1-177
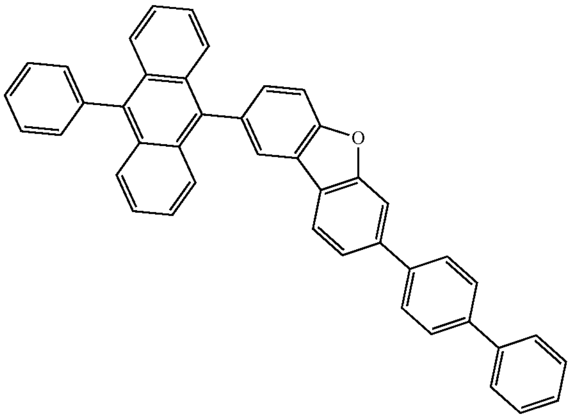

-continued
H1-178
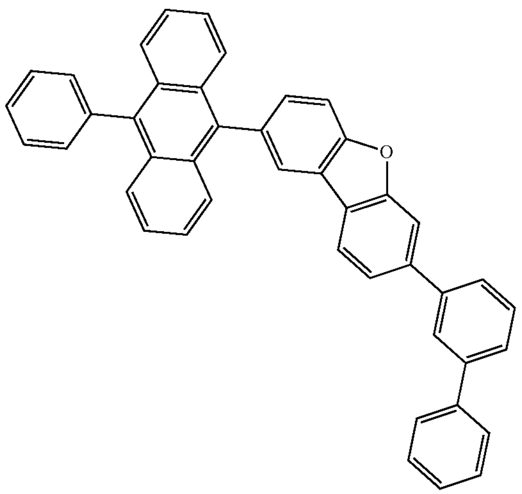
H1-179
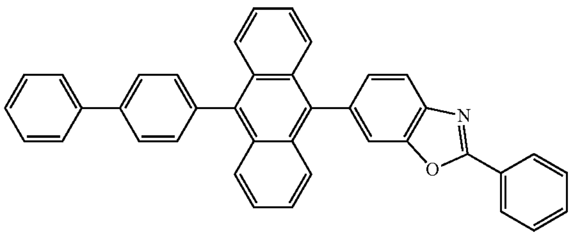
H1-180
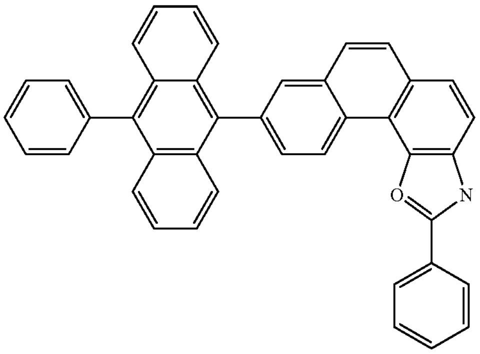
H1-181
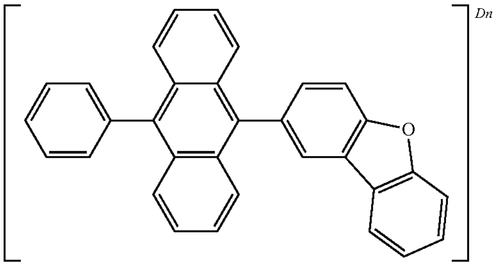
-continued
H1-182
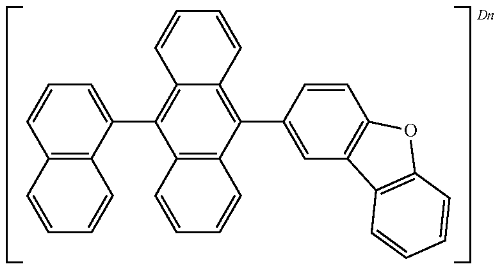
H1-183
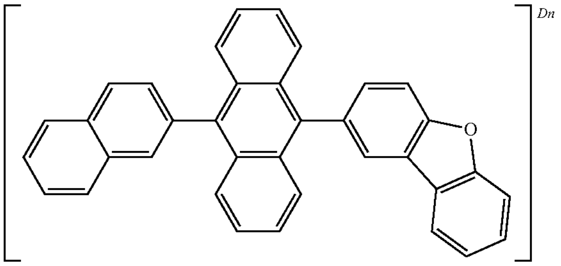
H1-184
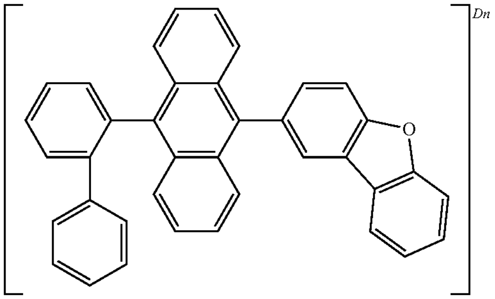
H1-185
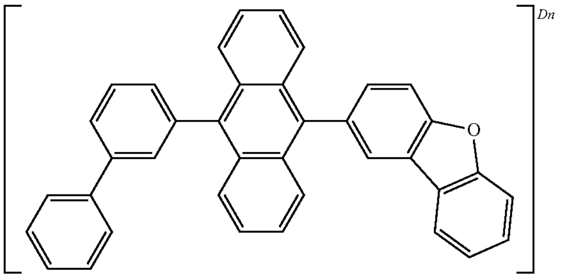
H1-186
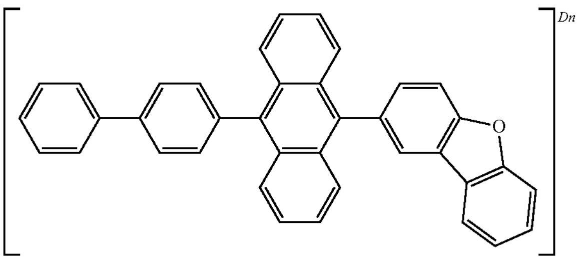

-continued
H1-187
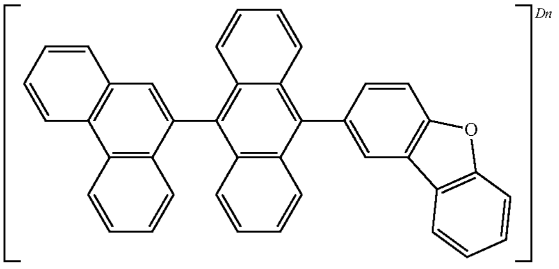
H1-188
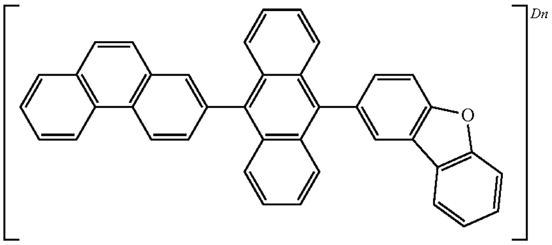
H1-189
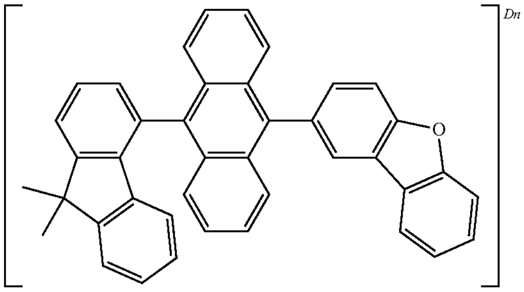
H1-191
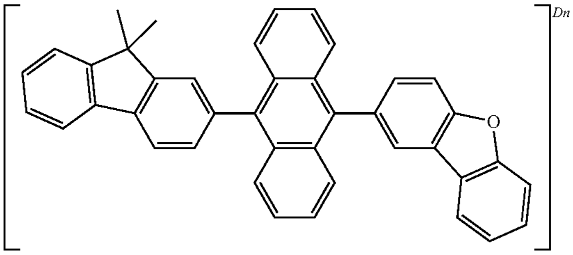
H1-192
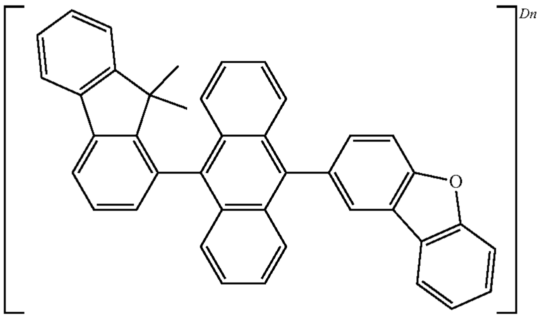
-continued
H1-193
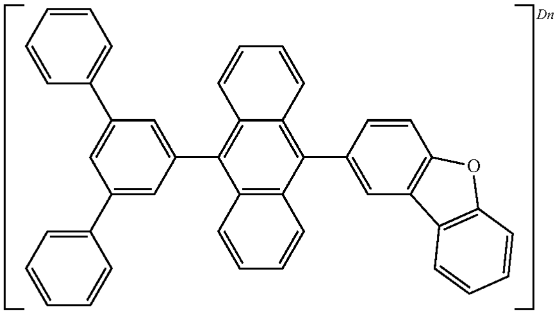
H1-194
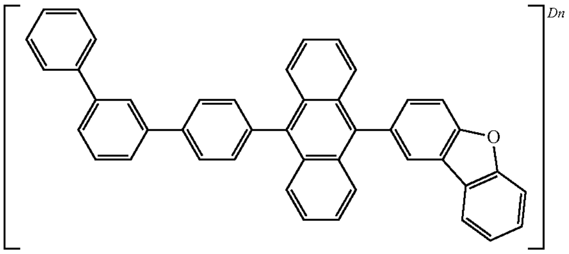
H1-195
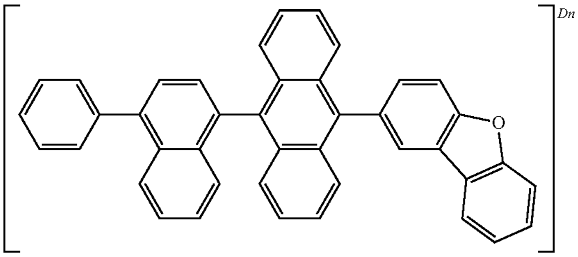
H1-196
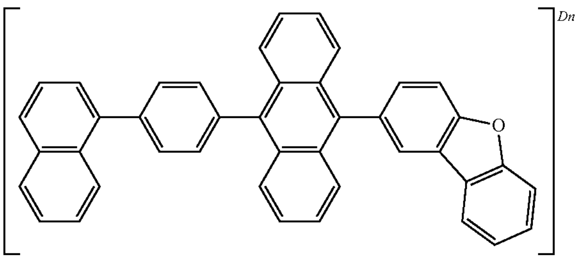
H1-197
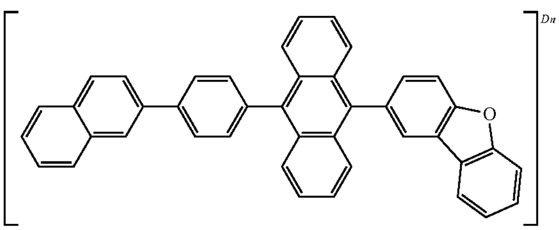

-continued
H1-198
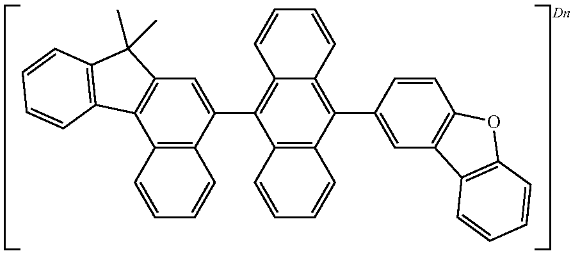
H1-199
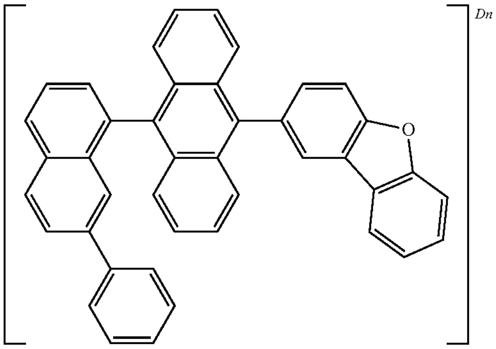
H1-200
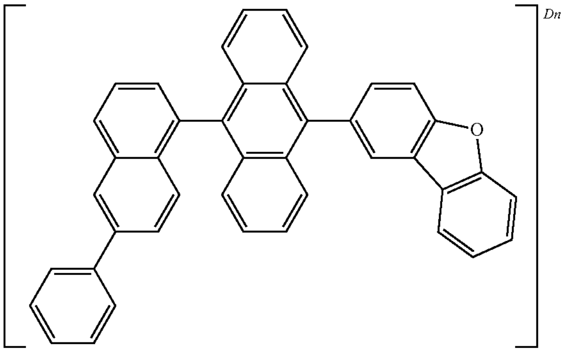
H1-201
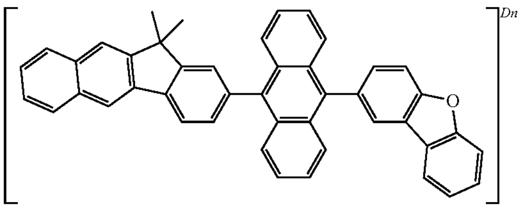
H1-202
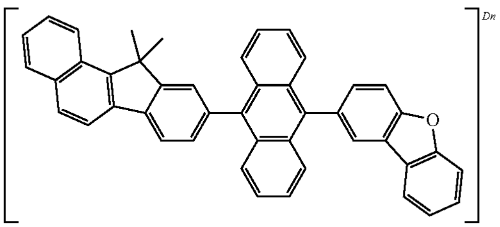
-continued
H1-203
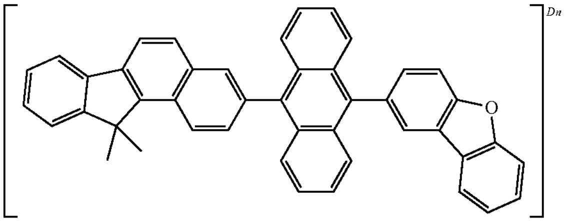
H1-204
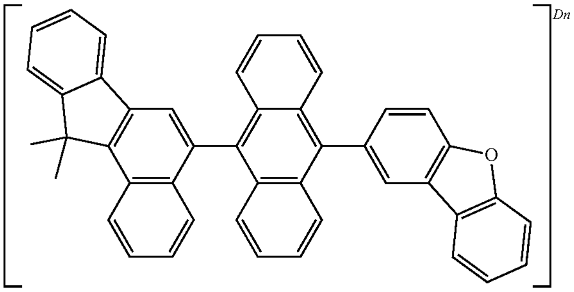
H1-205
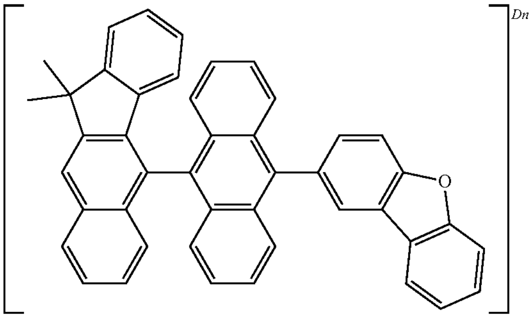
H1-206
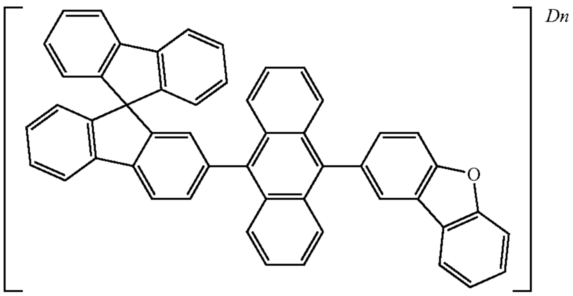

-continued
H1-207
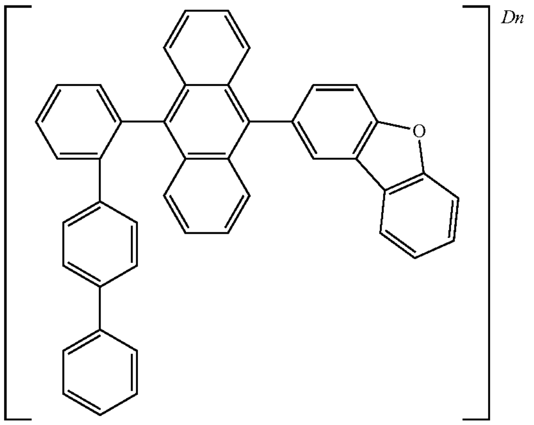
H1-208
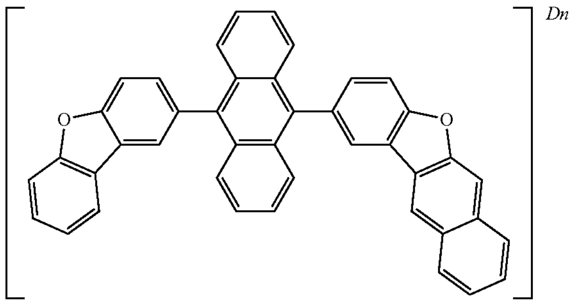
H1-209
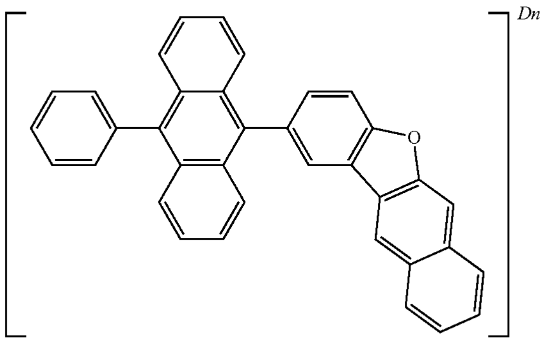
H1-210
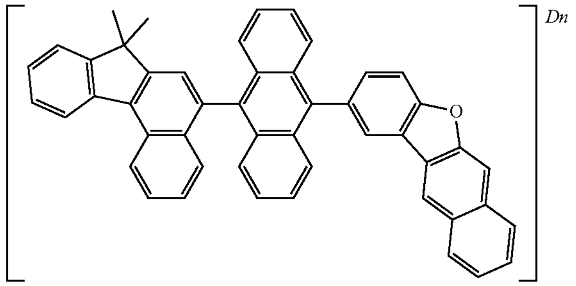
-continued
H1-211
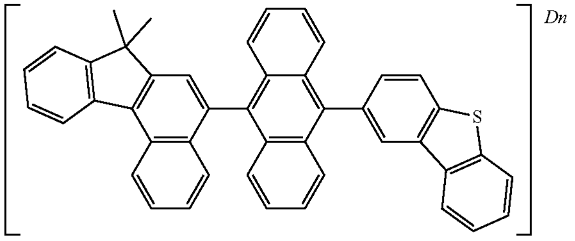
H1-212
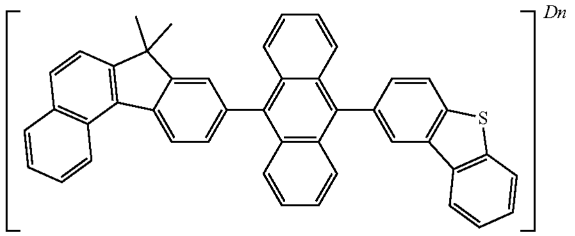
H1-213
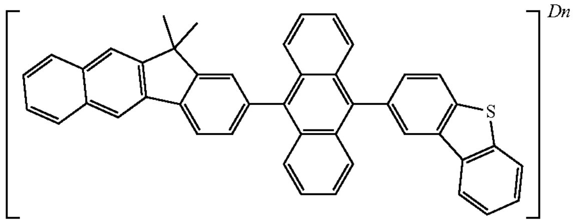
H1-214
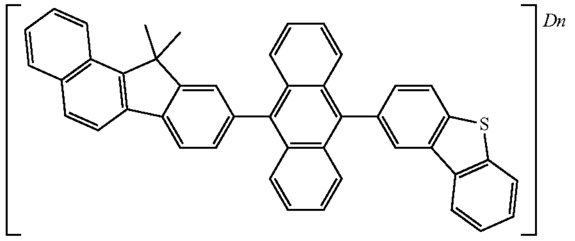
H1-215
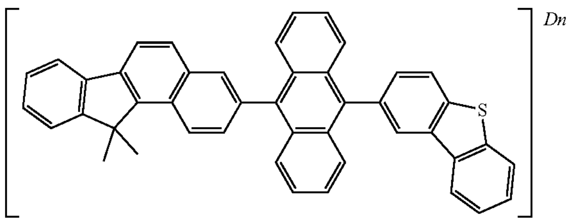
H1-216
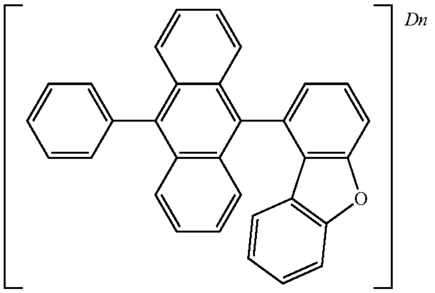

-continued
H1-217
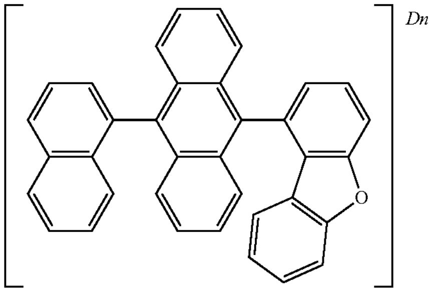
H1-218
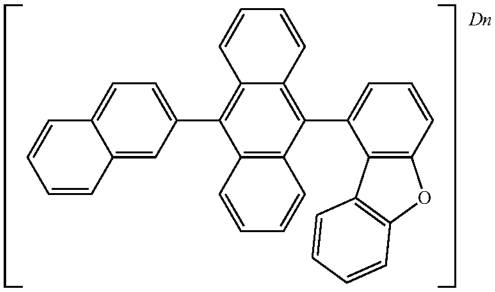
H1-219
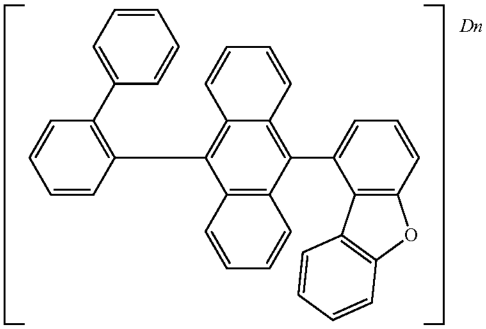
H1-220
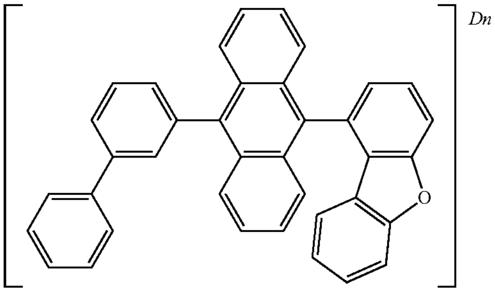
H1-221
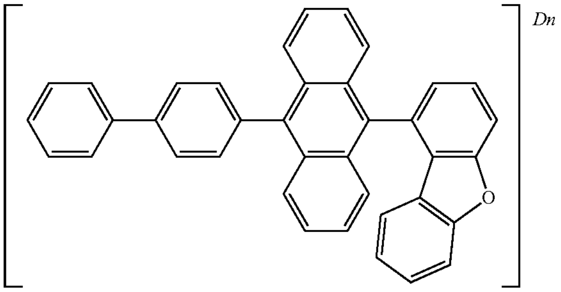
-continued
H1-222
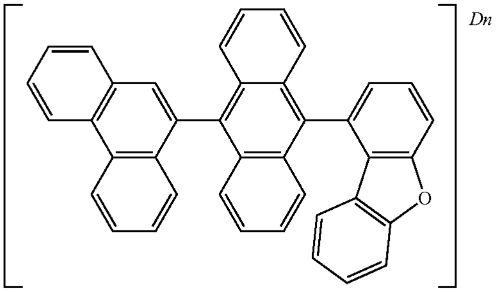
H1-223
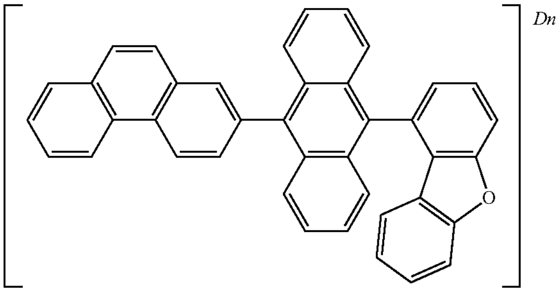
H1-224
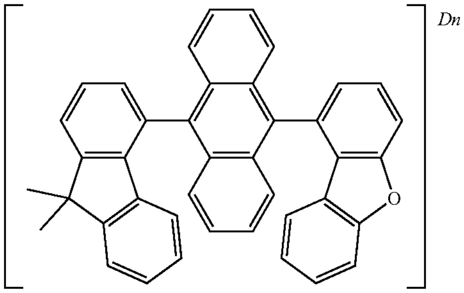
H1-225
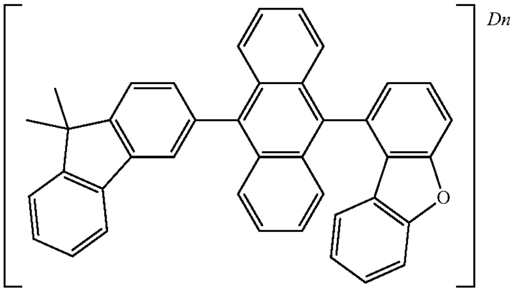
H1-226
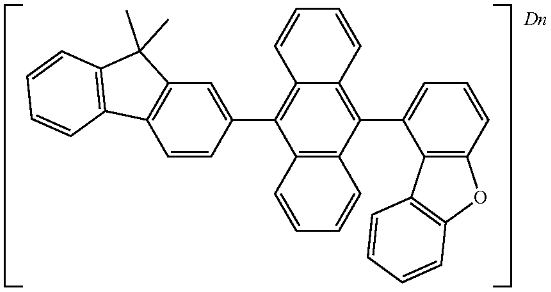

-continued
H1-227
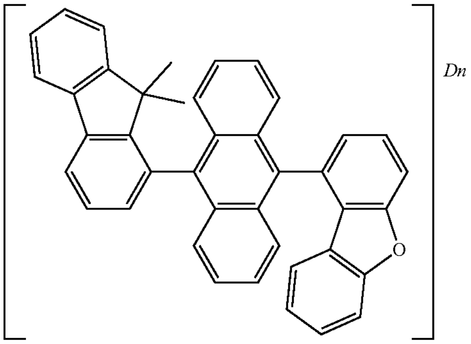
H1-228
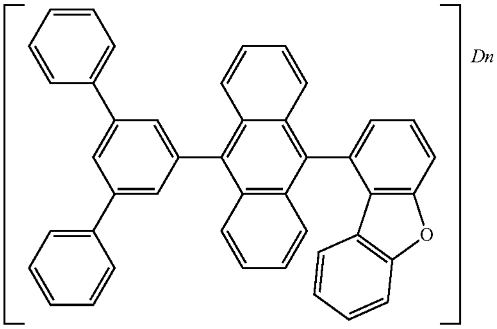
H1-229
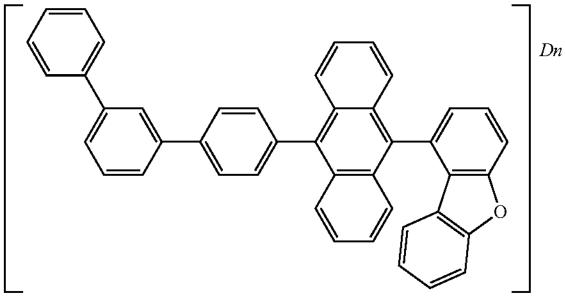
H1-230
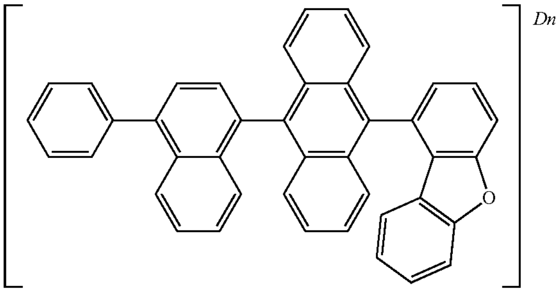
-continued
H1-231
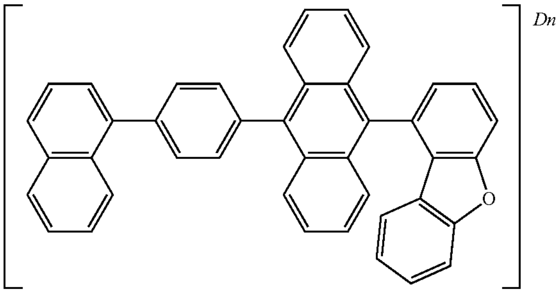
H1-232
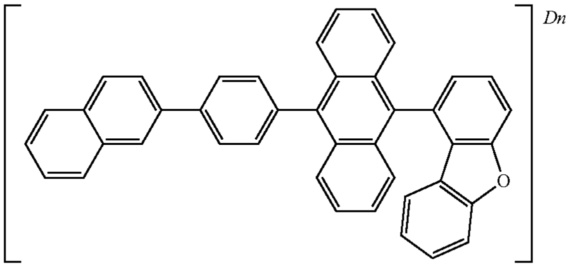
H1-233
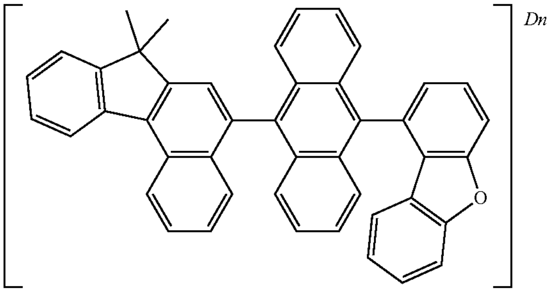
H1-234
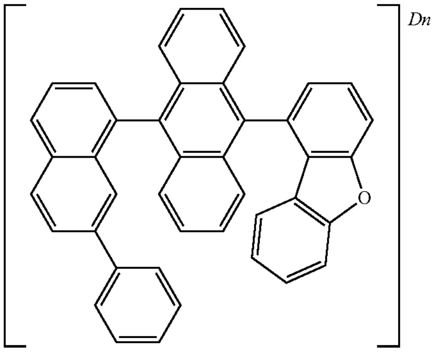

-continued
H1-235
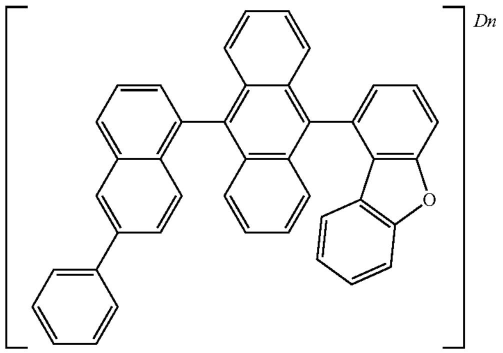
H1-236
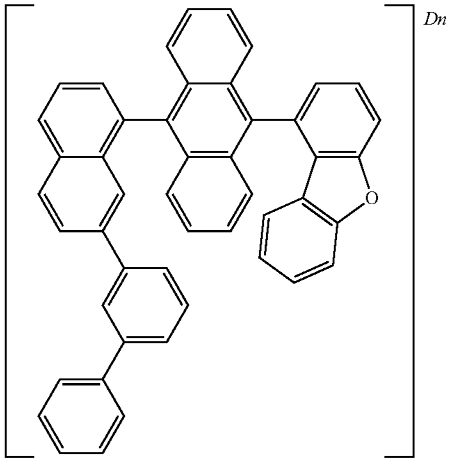
H1-237
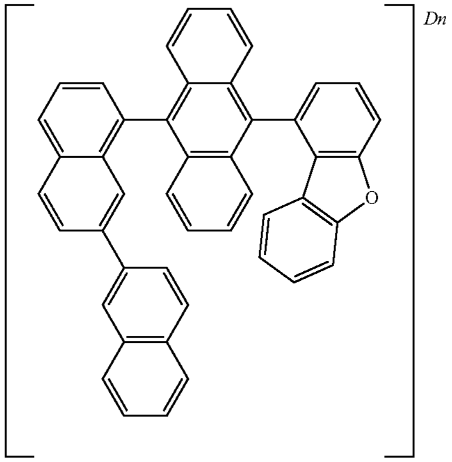
H1-238
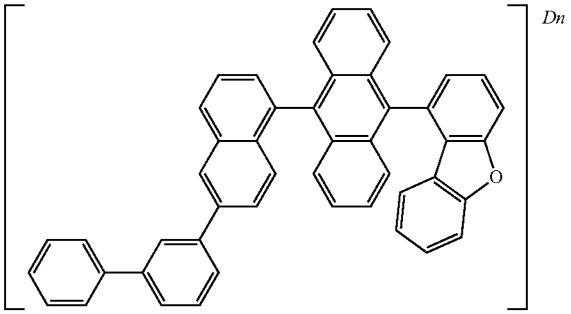
-continued
H1-239
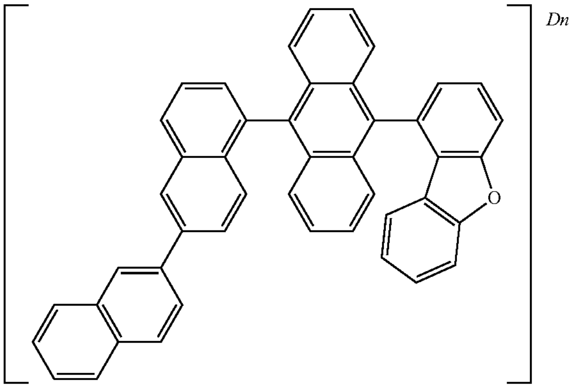
H1-240
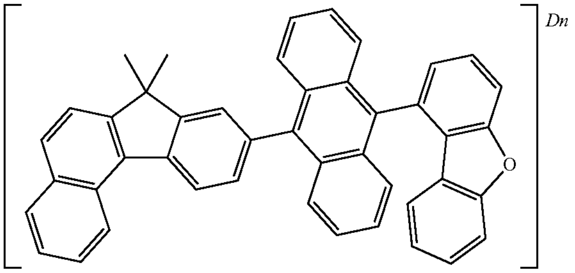
H1-241
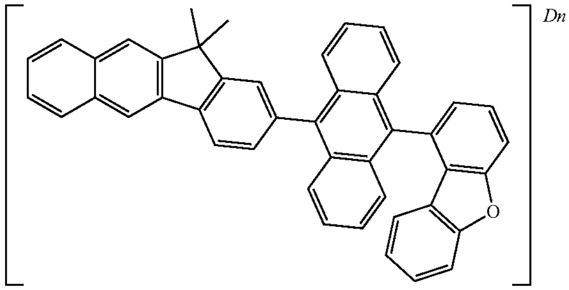
H1-242
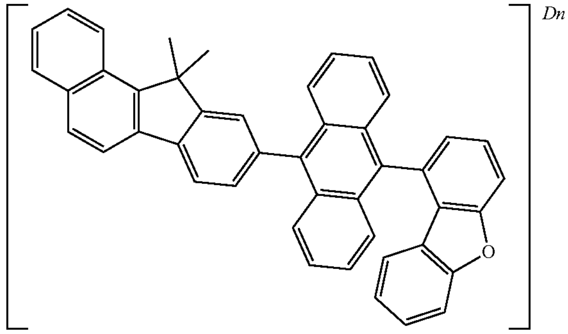

-continued
H1-243
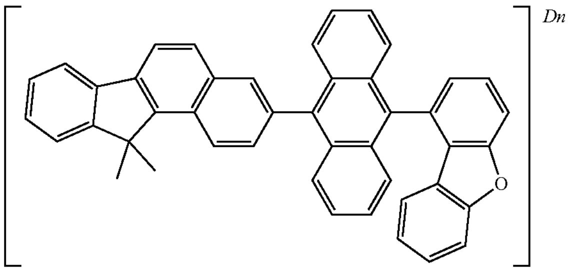
H1-244
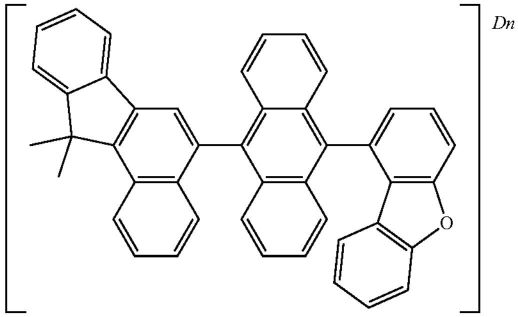
H1-245
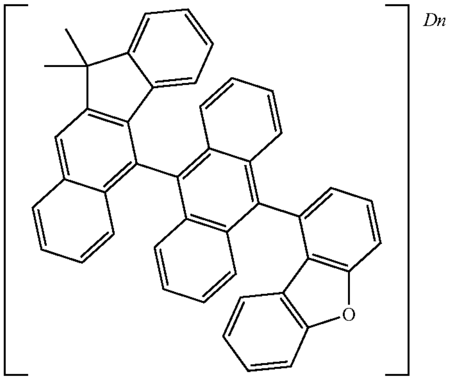
H1-246
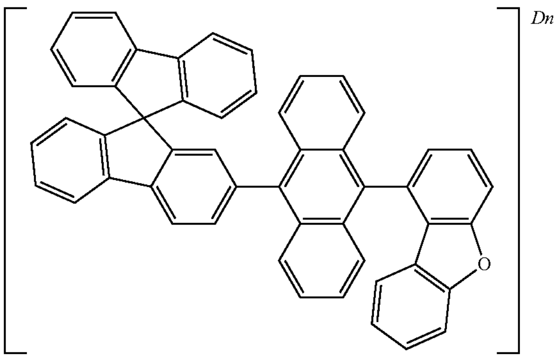
-continued
H1-247
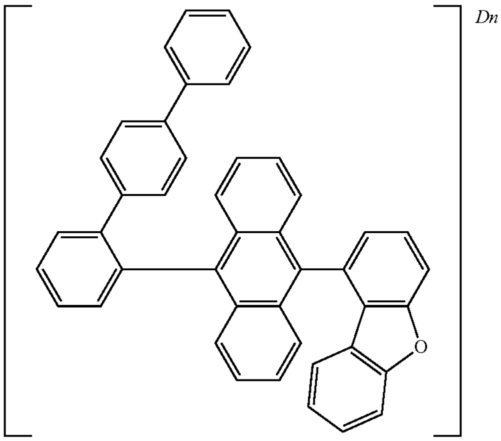
H1-248
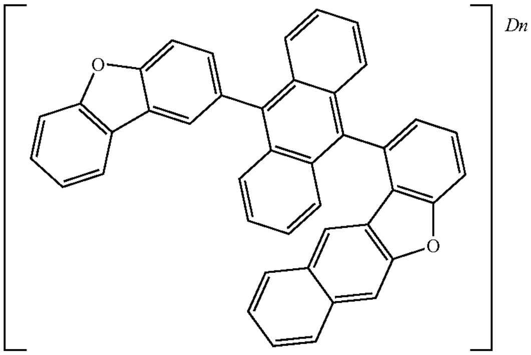
H1-249
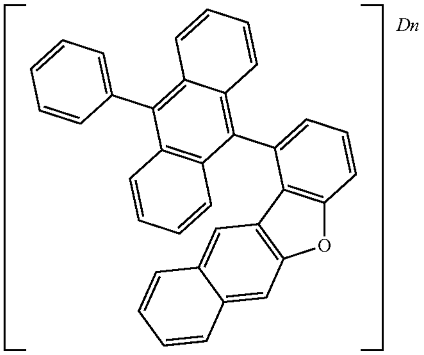
H1-250
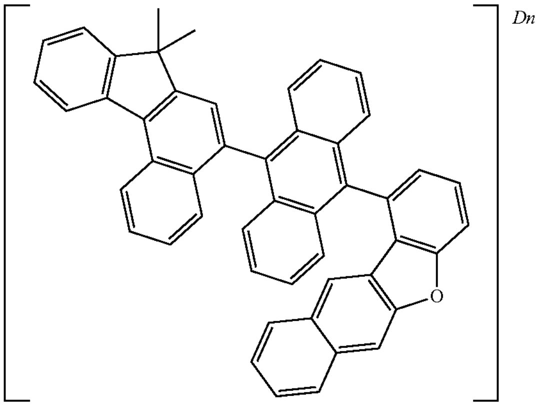

-continued
H1-251
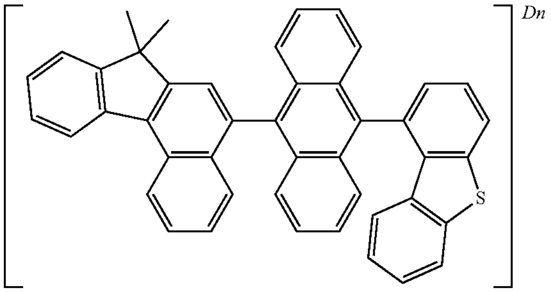
H1-252
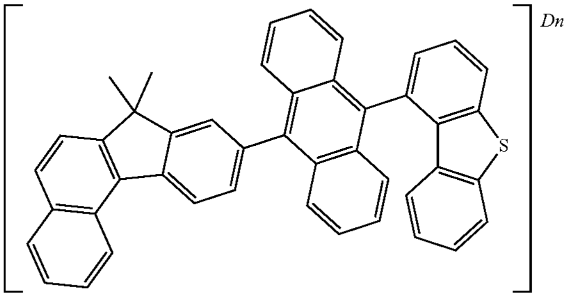
H1-253
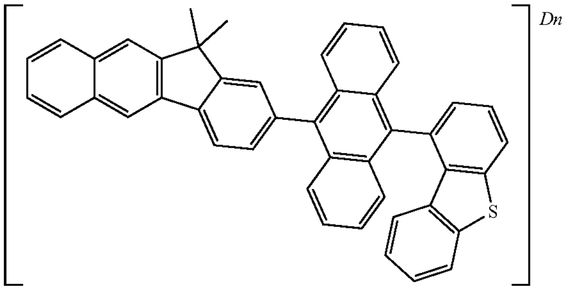
H1-254
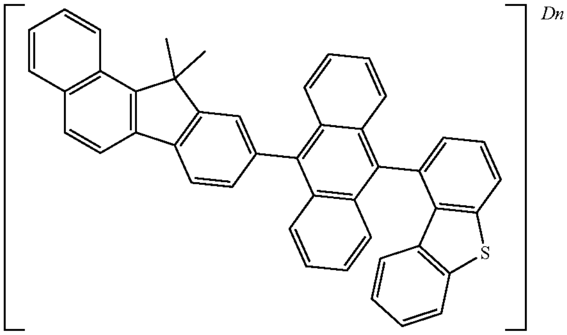
H1-255
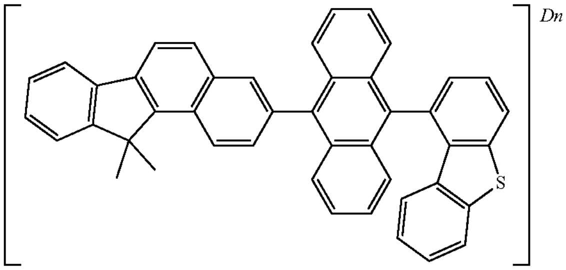
-continued
H1-256
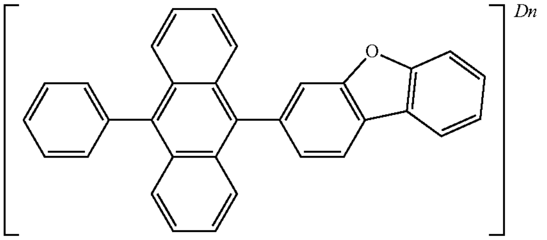
H1-257
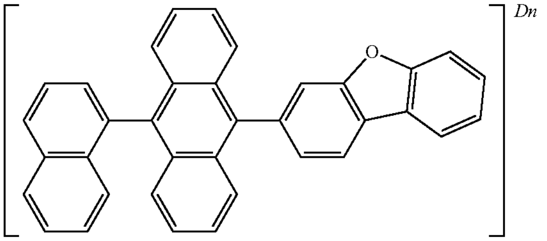
H1-258
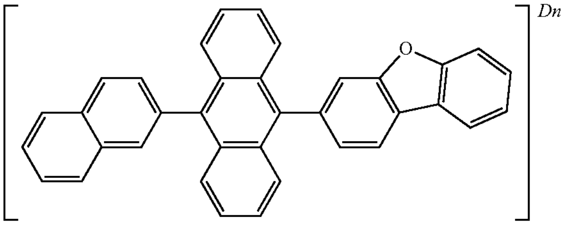
H1-259
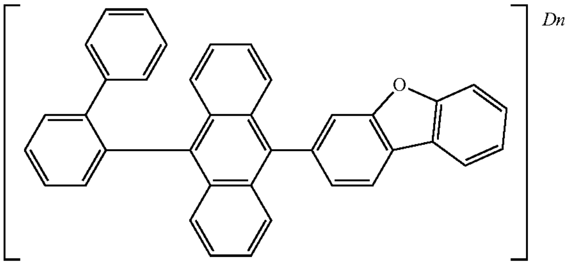
H1-260
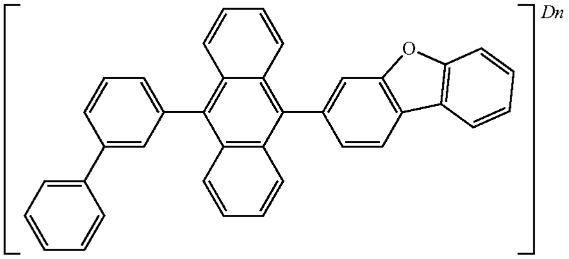
H1-261
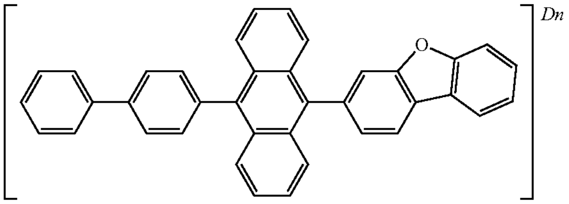

-continued
H1-262
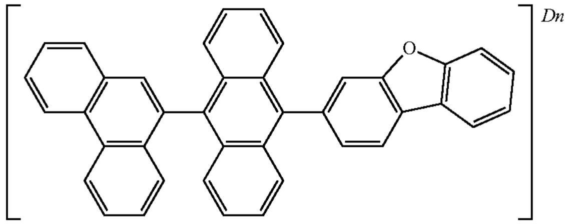
H1-263
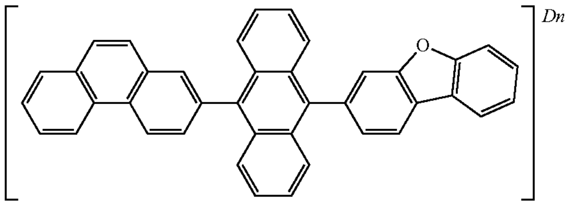
H1-264
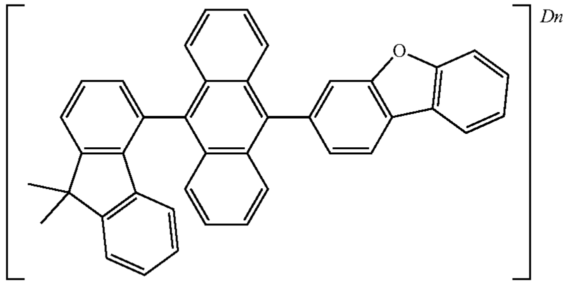
H1-265
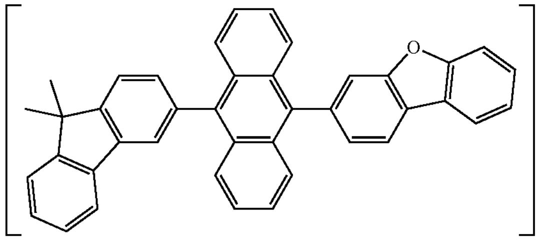
H1-266
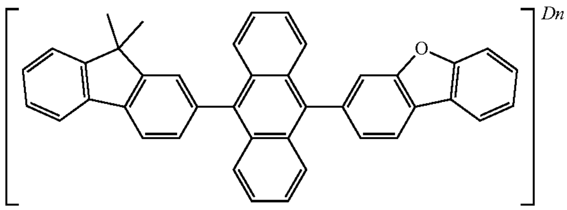
H1-267
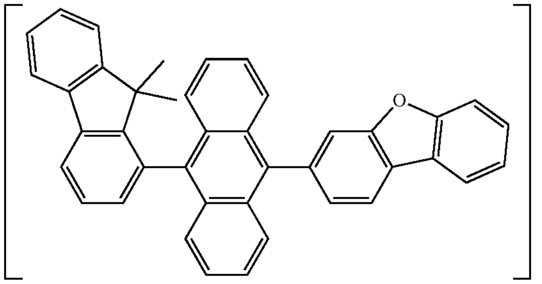
-continued
H1-268
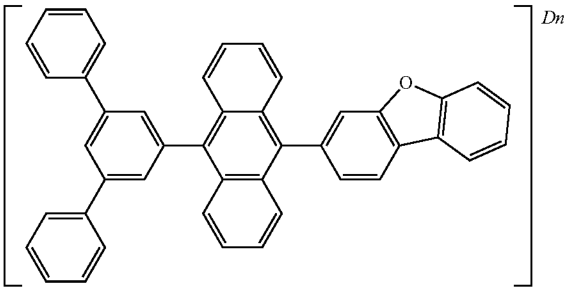
H1-269
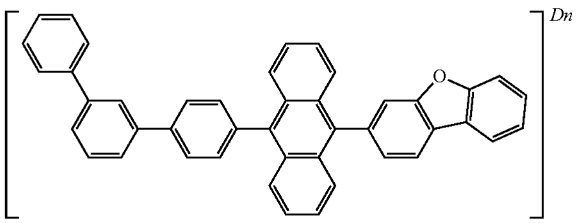
H1-270
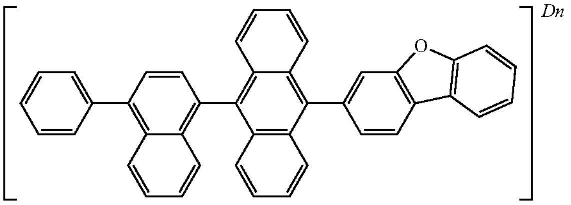
H1-271
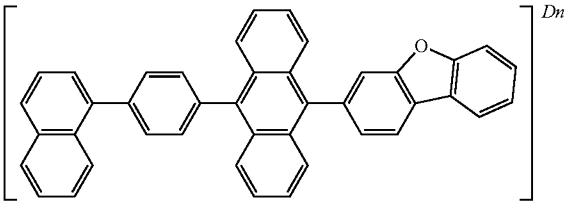
H1-272
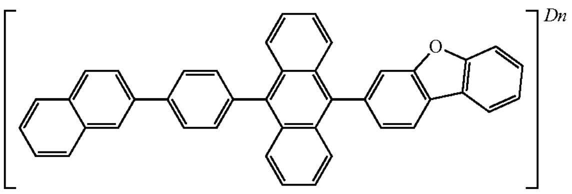
H1-273
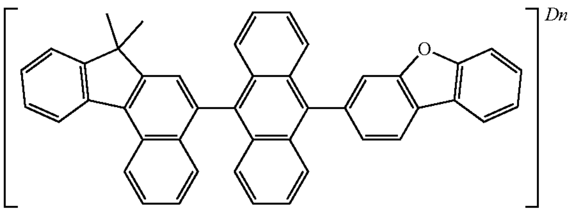

-continued
H1-274
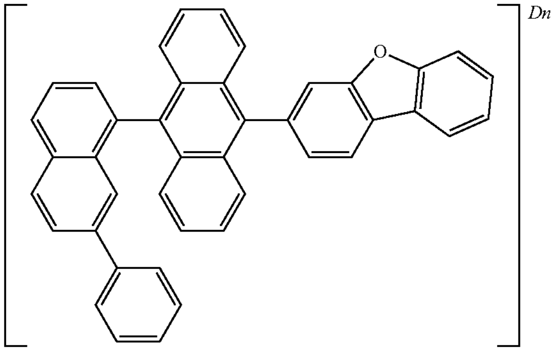
H1-275
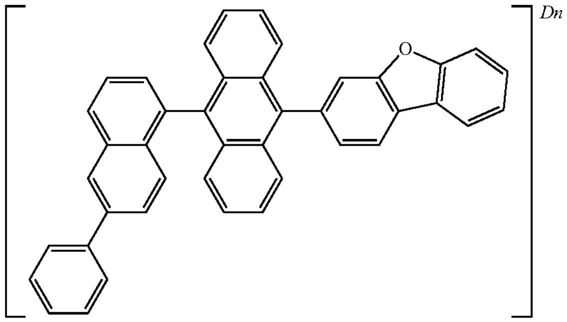
H1-276
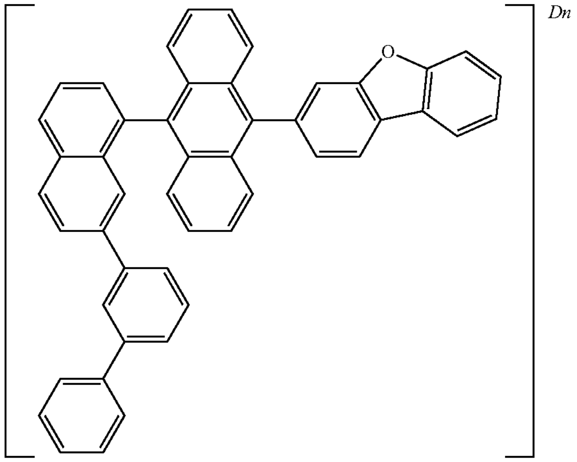
-continued
H1-277
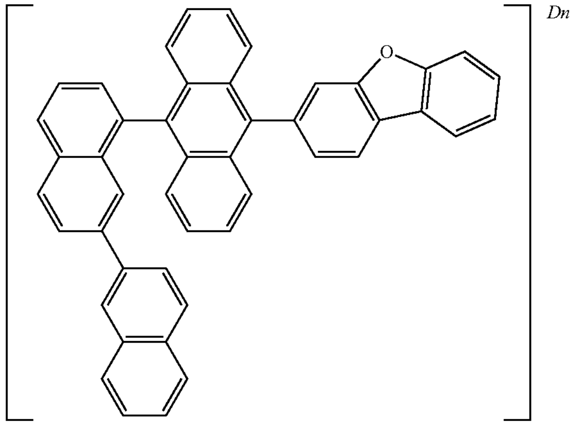
H1-278
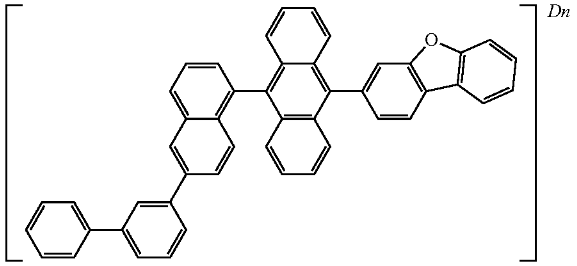
H1-279
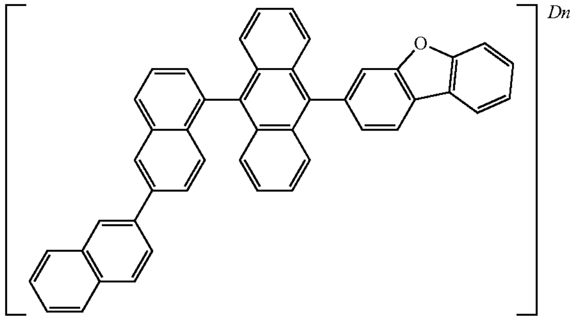
H1-280
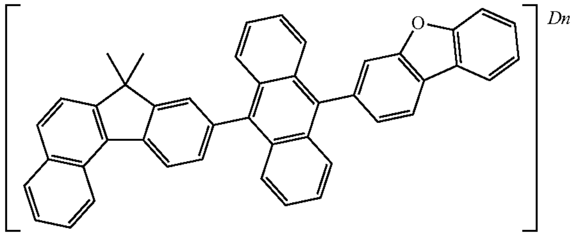
H1-281
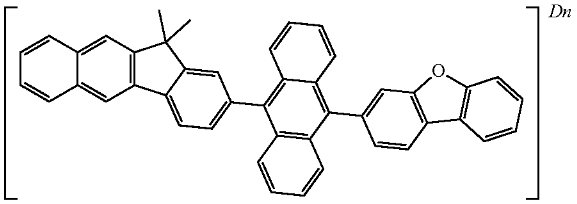

-continued
H1-282
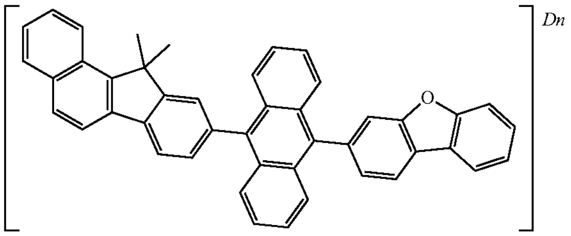
H1-283
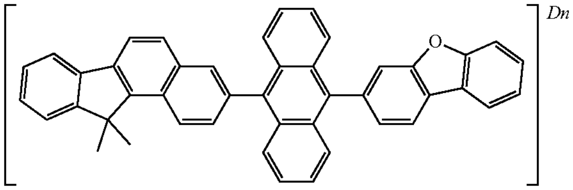
H1-284
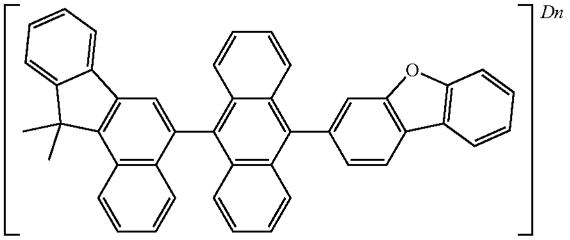
H1-285
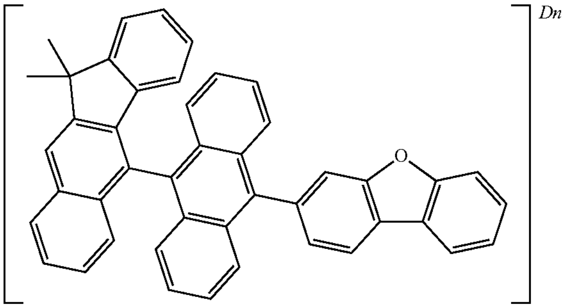
H1-286
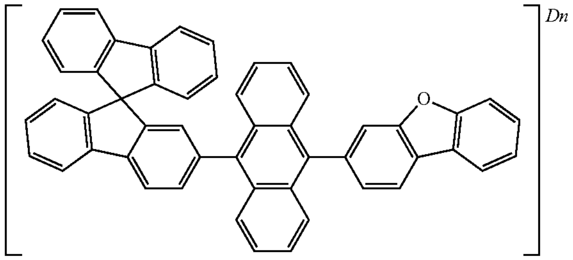
-continued
H1-287
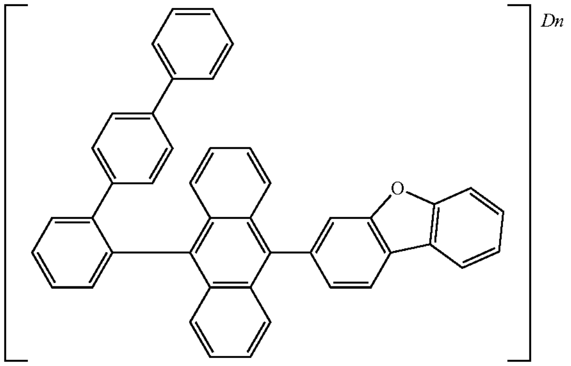
H1-288
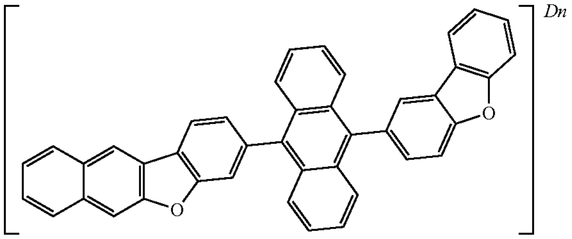
H1-289
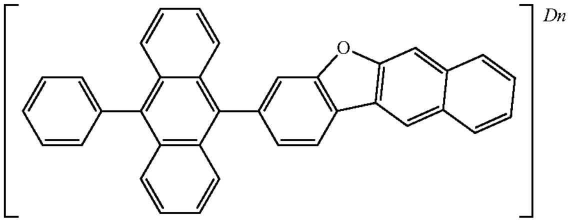
H1-290
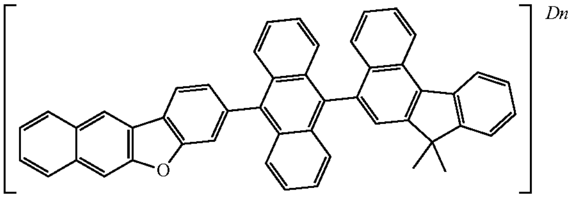
H1-291
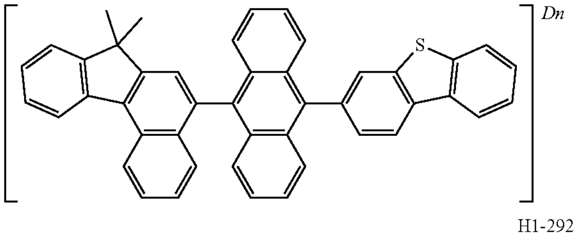
H1-292
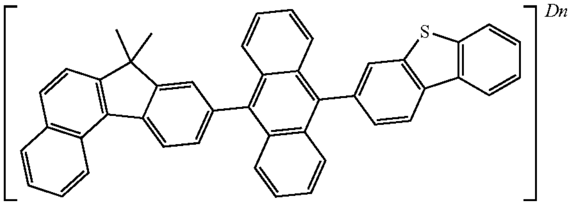

-continued
H1-293
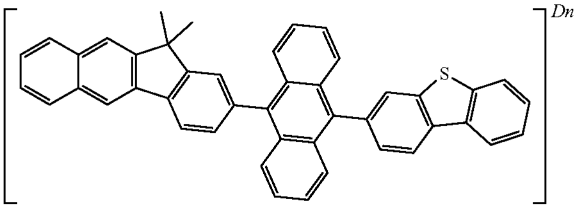
H1-294
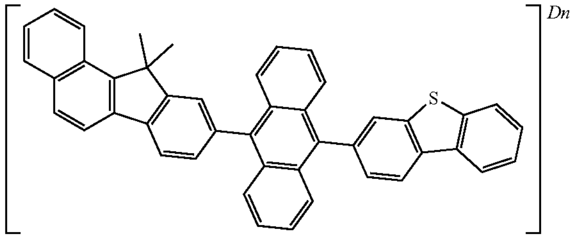
H1-295
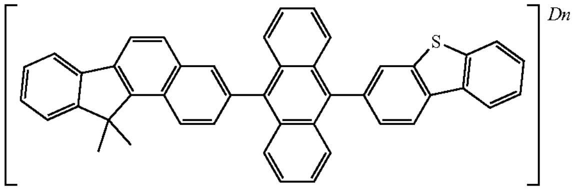
H1-296
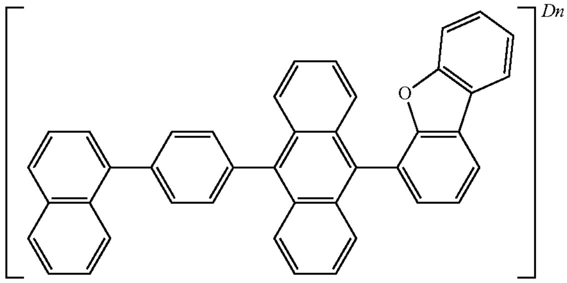
H1-297
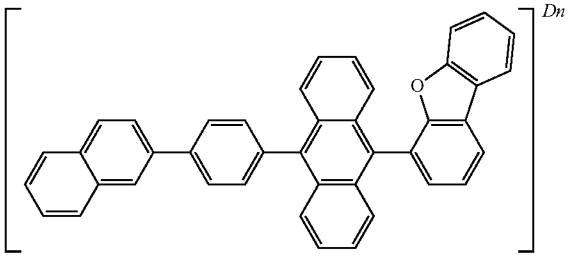
H1-298
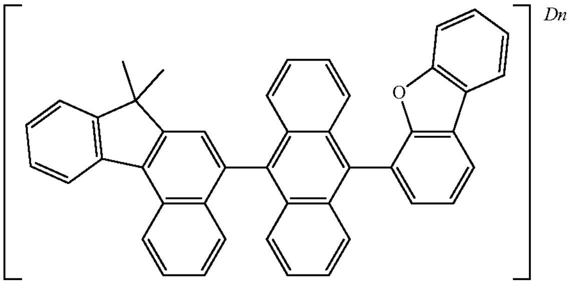
-continued
H1-299
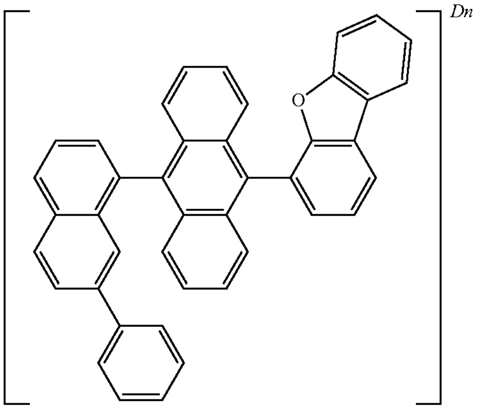
H1-300
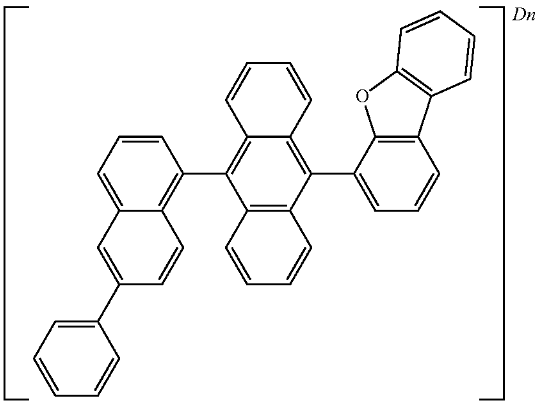
H1-301
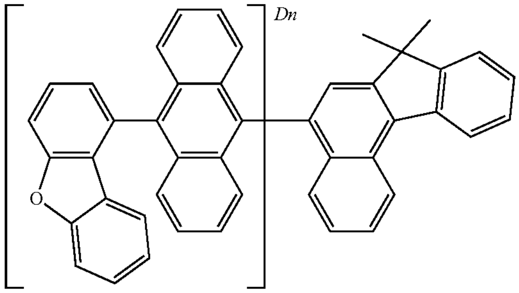
H1-302
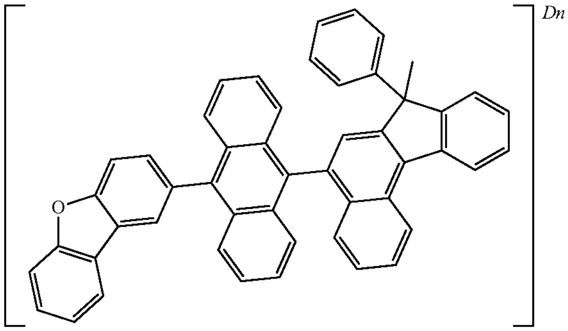

-continued

H1-303

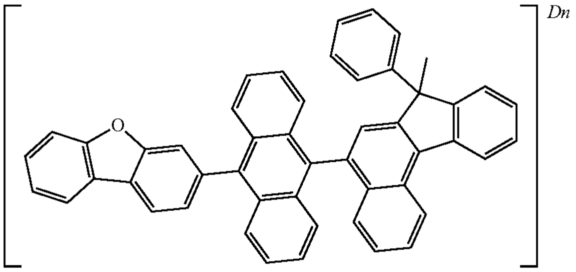

H1-304

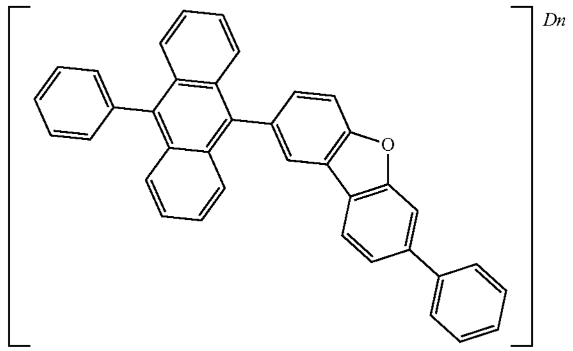

H1-305

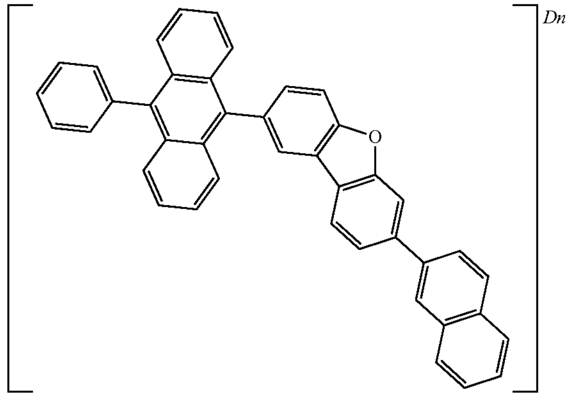

In the compounds above, Dn means that n number of hydrogens is replaced with deuterium, wherein n represents an integer of 1 or more. Wherein, the upper limit of n is determined by the number of hydrogens that can be substituted in each compound. According to one embodiment of the present disclosure, n is preferably an integer of 10 or more, more preferably an integer of 15 or more. When deuterated with a number equal to or higher than the lower limit, the bond dissociation energy according to deuteration increases, thereby exhibiting the improved lifespan property.

The compound represented by formula 1 according to the present disclosure can be prepared by a known synthetic method. Specifically, the non-deuterated compound of formula 1 can be prepared by known coupling and substitution reactions. For example, the non-deuterated compound of formula 1 may be prepared by referring to Korean Patent Application Laid-Open No. 2015-0010016 (Jan. 28, 2015), etc. The deuterated compound of formula 1 can be prepared using a deuterated precursor material in a similar manner, or more generally can be prepared by treating a non-deuterated compound with a deuterated solvent, D6-benzene in the presence of a Lewis acid H/D exchange catalyst such as aluminum trichloride or ethyl aluminum chloride. In addition, the degree of deuterization can be controlled by varying reaction conditions such as reaction temperature. For example, the number of deuterium in formula 1 can be adjusted by controlling the reaction temperature and time, the equivalent of acid, etc.

The light-emitting material according to one embodiment may include a compound represented by the following formula 2.

(2)

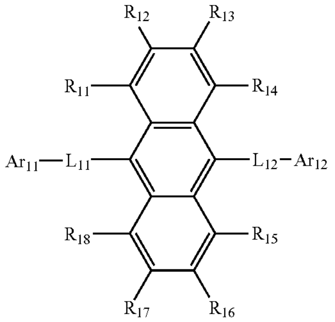

In formula 2, $L_{11}$ and $L_{12}$ each independently represent a single bond, a substituted or unsubstituted (C6-C30)arylene, or a substituted or unsubstituted (3- to 30-membered)heteroarylene;

$Ar_{11}$ and $Ar_{12}$ each independently represent a substituted or unsubstituted (C6-C30)aryl or a substituted or unsubstituted (3- to 30-membered)heteroaryl; and $R_{11}$ to $R_{18}$ each independently represent hydrogen or deuterium;

provided that a compound represented by the following formula b is excluded from the formula 2.

(b)

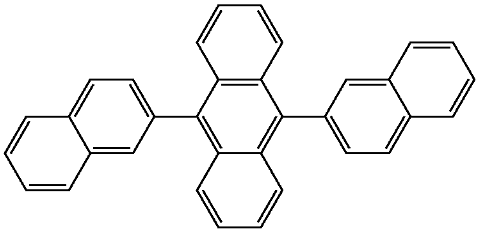

In one embodiment, $L_1$ and $L_{12}$ each independently may be a single bond, a substituted or unsubstituted (C6-C30) arylene, or a substituted or unsubstituted (5- to 30-membered)heteroarylene, preferably, a single bond, a substituted or unsubstituted (C6-C25)arylene, or a substituted or unsubstituted (5- to 25-membered)heteroarylene, more preferably, a single bond, a substituted or unsubstituted (C6-C18) arylene, or a substituted or unsubstituted (5- to 18-membered)heteroarylene. For example, $L_{11}$ and $L_{12}$ each independently may be a single bond, a substituted or unsubstituted phenylene, a substituted or unsubstituted m-biphenylene, a substituted or unsubstituted p-biphenylene, a substituted or unsubstituted naphthalenylene, a substituted or unsubstituted phenanthrenylene, a substituted or unsubstituted carbazolylene, a substituted or unsubstituted benzocarbazolylene, or a substituted or unsubstituted dibenzocarbazolylene.

In one embodiment, $Ar_{11}$ and $Ar_{12}$ each independently may be a substituted or unsubstituted (C6-C30)aryl or a substituted or unsubstituted (5- to 30-membered)heteroaryl, preferably, a substituted or unsubstituted (C6-C25)aryl or a substituted or unsubstituted (5- to 25-membered)heteroaryl, more preferably, a substituted or unsubstituted (C6-C25)aryl or a substituted or unsubstituted (5- to 20-membered)heteroaryl. For example, $Ar_1$ and $Ar_{12}$ each independently may be a substituted or unsubstituted phenyl, a substituted or unsubstituted naphthyl, a substituted or unsubstituted m-biphenyl, a substituted or unsubstituted p-biphenyl, a substituted or unsubstituted m-terphenyl, a substituted or unsubstituted p-terphenyl, a substituted or unsubstituted triphenylenyl, a substituted or unsubstituted phenanthrenyl, a substituted or unsubstituted fluorenyl, a substituted or unsubstituted benzofluorenyl, a substituted or unsubstituted spirobifluorenyl, a substituted or unsubstituted indenofluorenyl, a substituted or unsubstituted furanyl, a substituted or unsubstituted benzofuranyl, a substituted or unsubstituted dibenzofuranyl, a substituted or unsubstituted benzonaphthofuranyl, a substituted or unsubstituted dinaphthofuranyl, a substituted or unsubstituted triphenylenofuranyl, a substituted or unsubstituted dibenzothiophenyl, a substituted or unsubstituted benzonaphthothiophenyl, a substituted or unsubstituted benzocarbazolyl, a substituted or unsubstituted benzofurocarbazolyl, a substituted or unsubstituted benzothienocarbazolyl, a substituted or unsubstituted benzobisbenzofuranyl, a substituted or unsubstituted oxathiaindenofluorenyl, a substituted or unsubstituted dibenzocarbazolyl, a substituted or unsubstituted benzobisbenzothiophenyl, a substituted or unsubstituted carbazolyl, a substituted or unsubstituted indolocarbazolyl, a substituted or unsubstituted benzoxazolyl, a substituted or unsubstituted naphthooxazolyl, a substituted or unsubstituted phenanthrooxazolyl, a substituted or unsubstituted benzothiazolyl, or a substituted or unsubstituted naphthothiazolyl.

The light-emitting material according to another embodiment may further include a compound represented by the following formula 3.

(3)

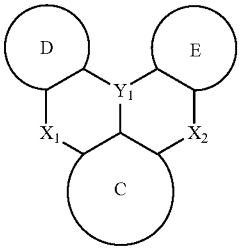

In formula 3,

Ring C, Ring D, and Ring E each independently represent a substituted or unsubstituted (C6-C30)aryl or a substituted or unsubstituted (3- to 50-membered)heteroaryl; or Ring D and Ring E may be linked to each other to form a fused ring(s);

$Y_1$ represents B;

$X_1$ and $X_2$ each independently represent NR', O, or S;

R' represents hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring of (C3-C30) aliphatic ring and (C6-C30) aromatic ring, or $-L_4-N(Ar_{13})(Ar_{14})$; or may be linked to at least one of Ring C, Ring D, and Ring E to form a ring(s);

$L_4$ represents a single bond, a substituted or unsubstituted (C1-C30)alkylene, a substituted or unsubstituted (C6-C30)arylene, or a substituted or unsubstituted (3- to 30-membered)heteroarylene; and $Ar_{13}$ and $Ar_{14}$ each independently represent a substituted or unsubstituted (C1-C30)alkyl, a substituted or unsubstituted (C2-C30)alkenyl, a substituted or unsubstituted (C6-C30)aryl, or a substituted or unsubstituted (3- to 30-membered)heteroaryl.

In one embodiment, Ring C, Ring D, and Ring E each independently may be a substituted or unsubstituted (C6-C30)aryl or a substituted or unsubstituted (5- to 50-membered)heteroaryl, preferably a substituted or unsubstituted (C6-C25)aryl or a substituted or unsubstituted (5- to 40-membered)heteroaryl. More preferably, Ring C may be a substituted or unsubstituted (C6-C18)aryl, and Ring D and Ring E each independently may be a substituted or unsubstituted (C6-C18)aryl or a substituted or unsubstituted (5- to 36-membered)heteroaryl; Ring D and Ring E may be linked to each other via a single bond, or via —O— as a linker to form a fused ring(s). For example, Ring C may be a substituted or unsubstituted benzene ring or unsubstituted naphthalene ring. The substituent of the substituted benzene ring may be at least one of deuterium; methyl unsubstituted or substituted with one or more deuterium; tert-butyl; diphenylamino unsubstituted or substituted with at least one of deuterium, methyl, and tert-phenyl; phenylnaphthylamino; dinaphthylamino; a substituted or unsubstituted phenyl; naphthyl, biphenyl; terphenyl; triphenylenyl; carbazolyl; phenothiazinyl; phenoxazinyl; dimethylacridinyl; and dimethylxanthenyl; and wherein the substituent of the substituted phenyl may be at least one of deuterium, methyl, carbazolyl, dibenzofuranyl, diphenylamino, phenoxazinyl, phenothiazinyl and dimethylacridinyl. For example, Ring D and Ring E each independently may be a substituted or unsubstituted benzene ring, unsubstituted naphthalene ring, unsubstituted dibenzothiophene ring, unsubstituted dibenzofuran ring, carbazole ring substituted with at least one of phenyl and diphenylamino, 21-membered hetero ring containing boron and nitrogen substituted with at least one of methyl and phenyl, 25-membered hetero ring containing boron and nitrogen substituted with one or more phenyl, or 36-membered hetero ring containing boron and nitrogen substituted with one or more methyl. The substituents of the substituted benzene ring may be deuterium; methyl; tert-butyl; phenyl; a substituted or unsubstituted diphenylamino; phenylnaphthylamino; or phenylamino substituted with phenylcarbazolyl or dibenzofuranyl; and wherein the substituents of the substituted diphenylamino may be at least one of methyl and diphenylamino.

In one embodiment, $Y_1$ may be B, and $X_1$ and $X_2$ each independently may be NR'. Wherein, R' may be hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, or $-L_4-N(Ar_{13})(Ar_{14})$; or may be linked to at least one of Ring C, Ring D, and Ring E to form a ring(s), preferably, hydrogen, deuterium, a substituted or unsubstituted (C1-C20)alkyl, a substituted or unsubstituted (C6-C25)aryl, or a substituted or unsubstituted (3-to 25-membered)heteroaryl; or may be linked to at least one of Ring C, Ring D, and Ring E to form a ring(s), more preferably, hydrogen, deuterium, unsubstituted (C1-C10)alkyl, (C6-C18)aryl unsubstituted or substituted with at least one of (C1-C10)alkyl and di(C6-C18) arylamino, or (5- to 20-membered)heteroaryl substituted with (C6-C18)aryl; or may be linked to at least one of Ring C, Ring D, and Ring E to form a fused ring(s). For example, R' may be hydrogen; deuterium; phenyl unsubstituted or substituted with at least one of deuterium, methyl, and tert-butyl; naphthyl; biphenyl unsubstituted or substituted with diphenylamino; triphenylenyl; or carbazolyl substituted with phenyl; or may be linked to at least one of Ring C. Ring D, and Ring E via a single bond, or via O, S, B, or isopropylene as a linker to form a fused ring(s).

The compound represented by formula 3 according to one embodiment may be represented by the following formula 3-1.

(3-1)

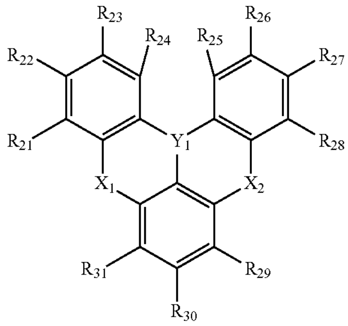

In formula 3-1, $R_{21}$ to $R_{31}$ each independently represent hydrogen, deuterium, halogen, cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, or $-L_4-N(Ar_{13})(Ar_{14})$; or may be linked to the adjacent substituent to form a ring(s); and $Y_1$, $X_1$, $X_2$, $L_4$, $Ar_{13}$, and $Ar_{14}$ are as defined in formula 3.

In one embodiment, Rat to Rat each independently may be hydrogen, deuterium, a substituted or unsubstituted (C1-C20)alkyl, a substituted or unsubstituted (C6-C25)aryl, a substituted or unsubstituted (5- to 20-membered)heteroaryl, a substituted or unsubstituted mono- or di-(C6-C25)arylamino, or a substituted or unsubstituted (5- to 20-membered)heteroaryl(C6-C25)arylamino, or may be linked to the adjacent substituent to form a ring(s), preferably, hydrogen, deuterium, (C1-C10)alkyl unsubstituted or substituted with at least one deuterium; (C6-C18)aryl unsubstituted or substituted with at least one of deuterium, (C1-C10)alkyl, (13- to 18-membered)heteroaryl, and di(C6-C18)arylamino; (5- to 18-membered)heteroaryl unsubstituted or substituted with at least one of deuterium and (C1-C10)alkyl; mono- or di-(C6-C18)arylamino unsubstituted or substituted with at least one of deuterium, (C1-C10)alkyl, di(C6-C18)arylamino, and (13- to 20-membered)heteroaryl; or (5- to 20-membered)heteroaryl(C6-C25)arylamino unsubstituted or substituted with at least one of (C1-C10)alkyl and (C6-C18)aryl; or may be linked to the adjacent substituent to form a ring(s).

For example, $R_2$; to $R_{31}$ each independently may be hydrogen; deuterium; methyl unsubstituted or substituted with at least one deuterium; tert-butyl; a substituted or unsubstituted phenyl; naphthyl; biphenyl; terphenyl; triphenylenyl; carbazolyl; phenoxazinyl; phenothiazinyl; 9,9-dimethyl-dihydroacridinyl; dimethylxanthenyl; diphenylamino unsubstituted or substituted with at least one of deuterium, methyl, tert-butyl and diphenylamino; phenylnaphthylamino; phenylbiphenylamino unsubstituted or substituted with tert-butyl; dinaphthylamino; dibiphenylamino; carbazolylphenylamino substituted with phenyl; dibenzofuranylphenylamino; dihydroacridinylphenylamino substituted with methyl; or (17- to 21-membered)heteroaryl unsubstituted or substituted with at least one of methyl and phenyl; or may be linked to the adjacent substituent to form benzene ring, indole ring substituted with at least one of phenyl and diphenylamino, benzofuran ring, benzothiophene ring, or (17- to 32-membered) hetero ring containing boron and nitrogen substituted with at least one of methyl and phenyl. In addition, $R_{24}$ and $R_{25}$ may be linked to each other via —O— as a linker. The substituent of the substituted phenyl may be at least one of methyl, carbazolyl, dibenzofuranyl, diphenylamino, phenoxazinyl, phenothiazinyl, and 9,9-dimethyl-dihydroacridinyl.

According to one embodiment, the compound represented by formula 3 may be more specifically illustrated by the following compounds, but is not limited thereto.

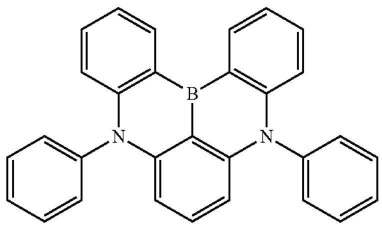

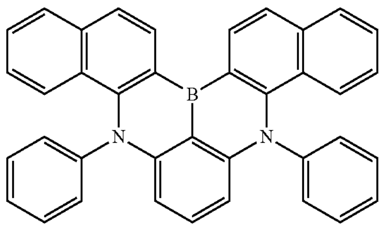

-continued
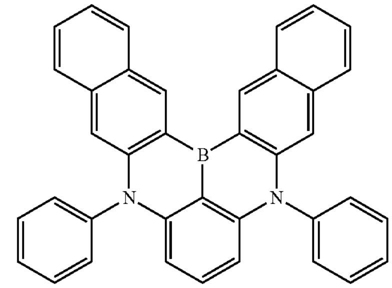
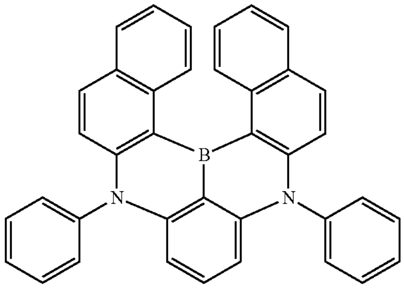
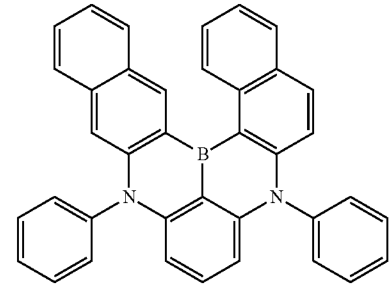
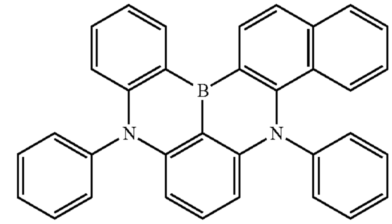
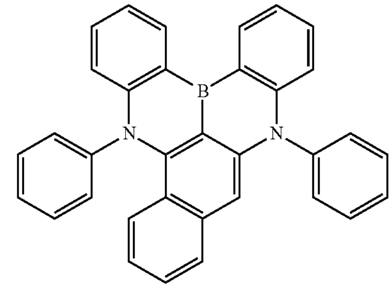
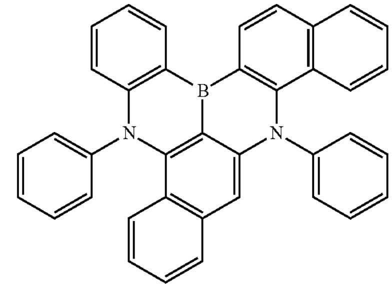
-continued
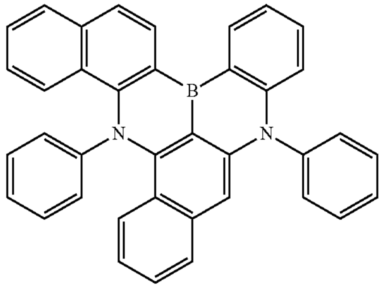
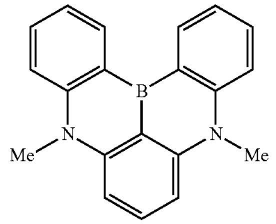
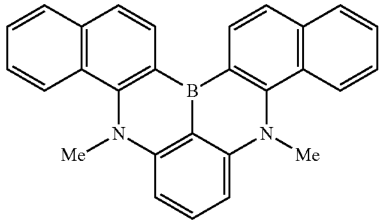
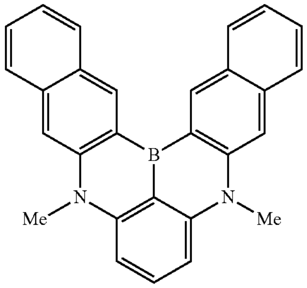
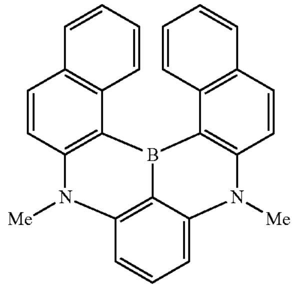
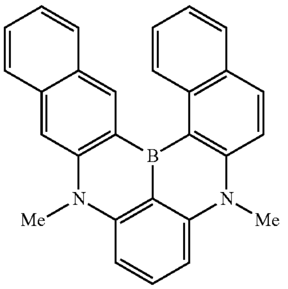

-continued
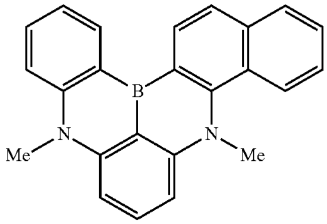
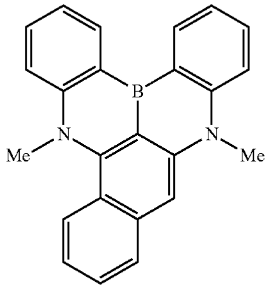
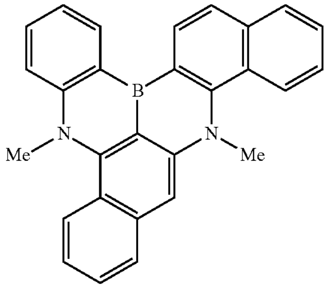
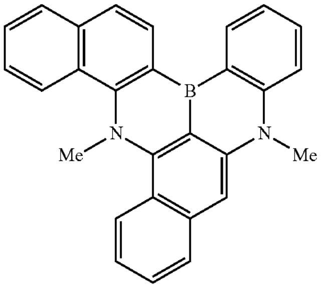
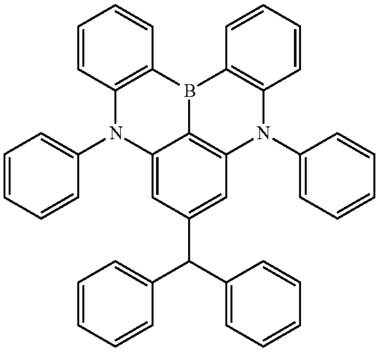
-continued
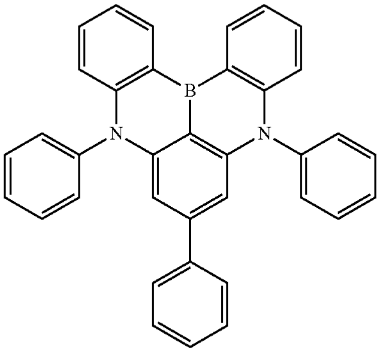
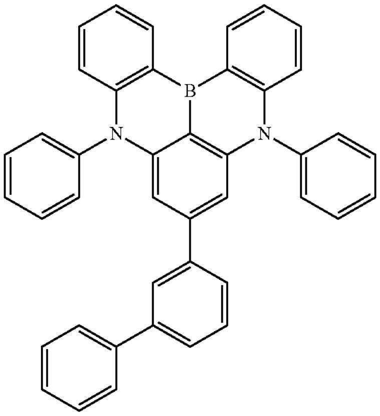
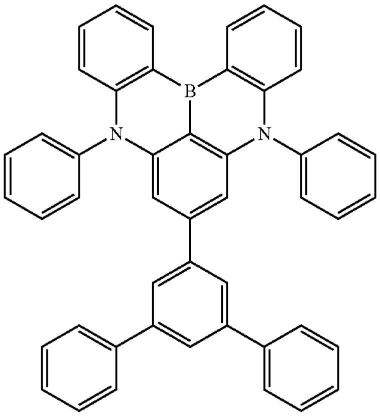
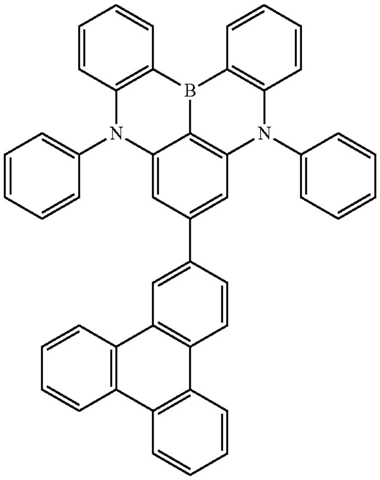

-continued
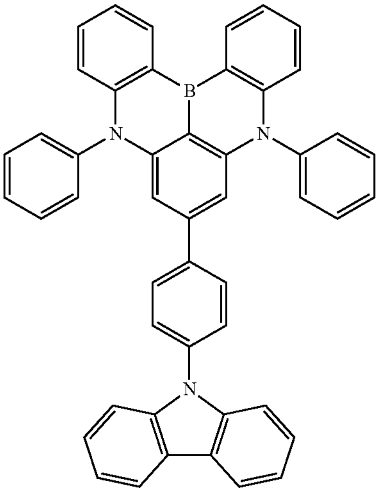
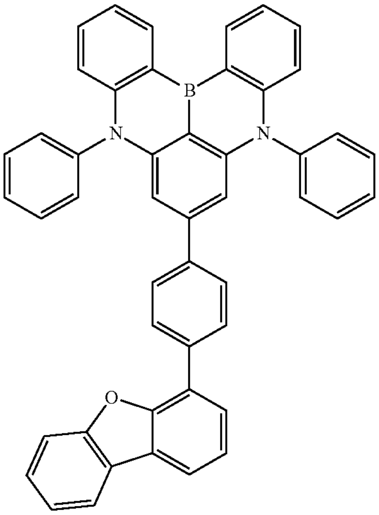
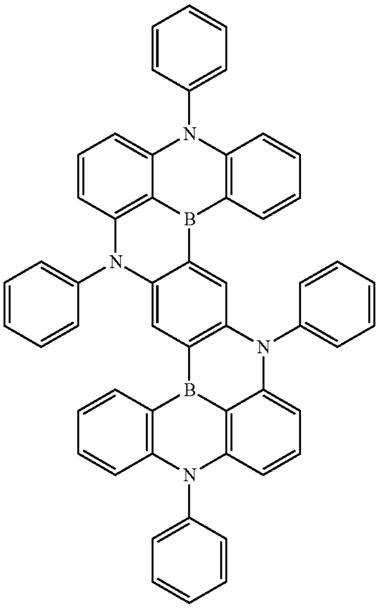
-continued
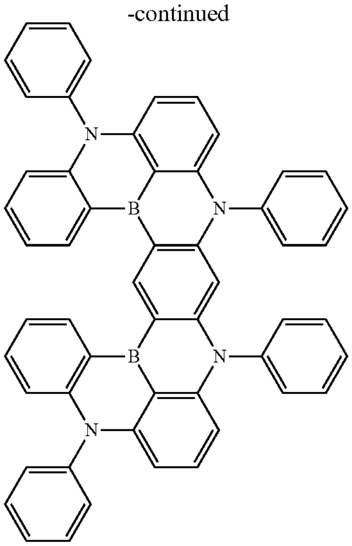
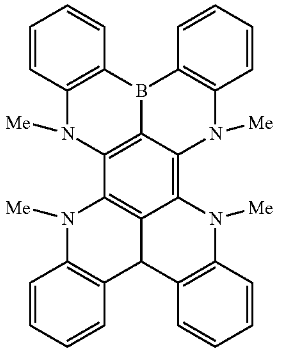
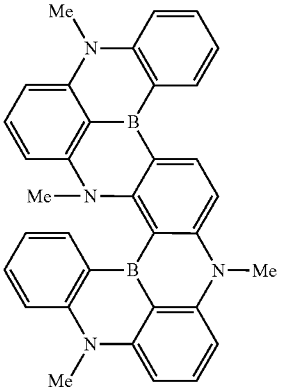
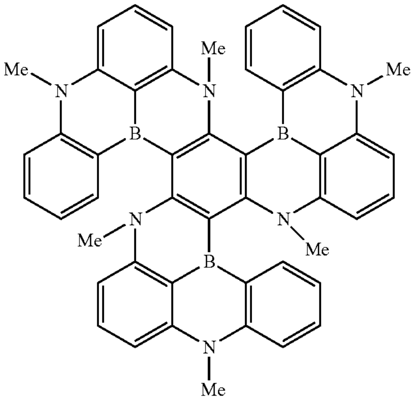

-continued
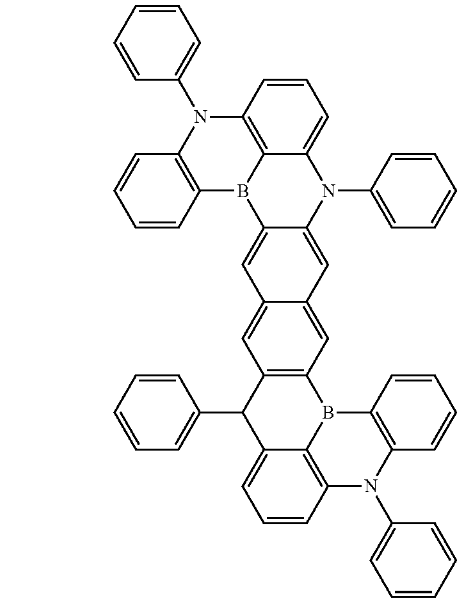
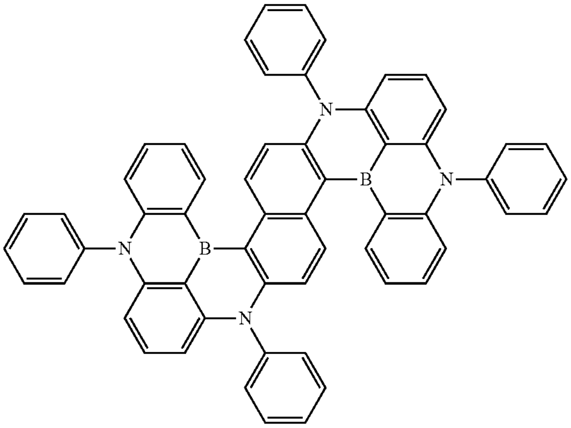
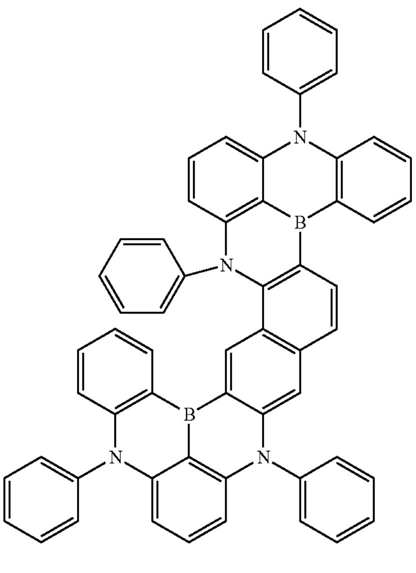
-continued
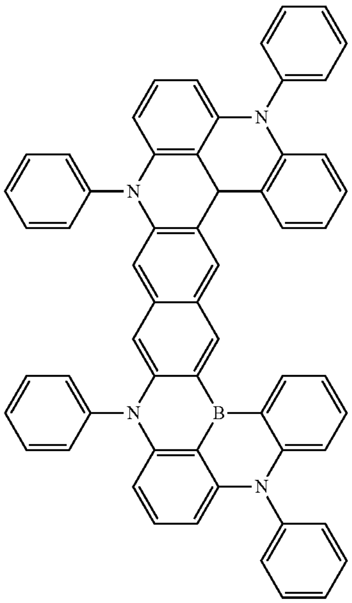
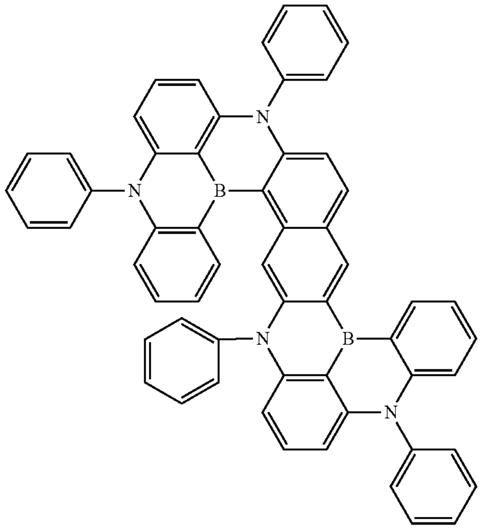
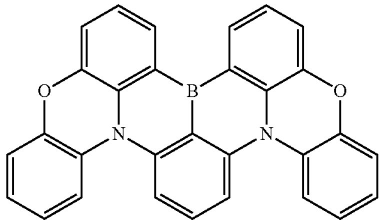
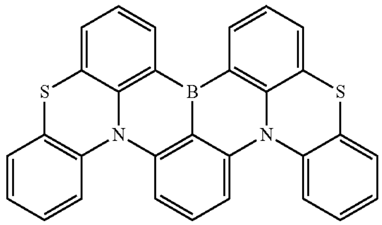

-continued
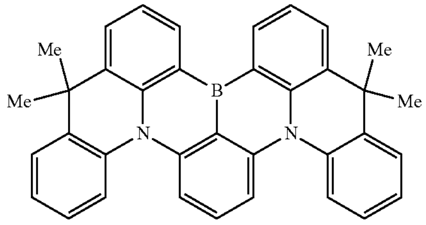
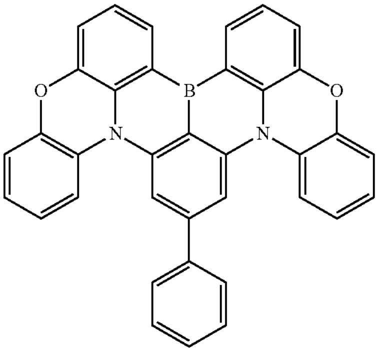
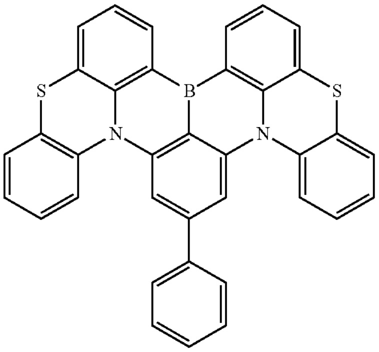
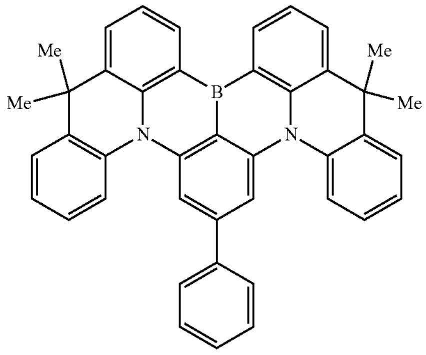
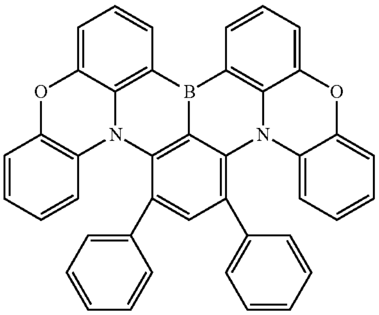
-continued
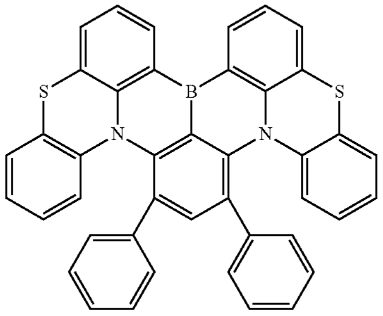
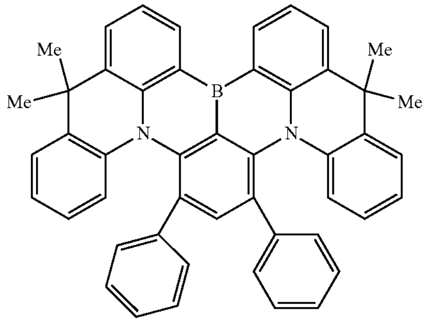
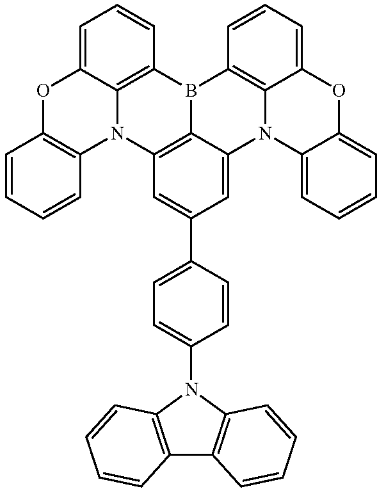
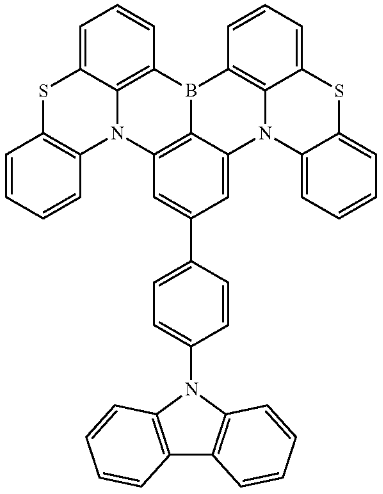

-continued
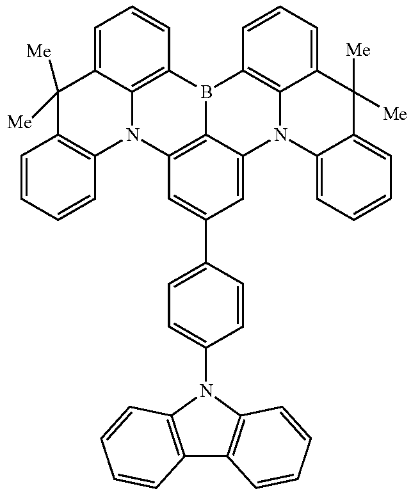
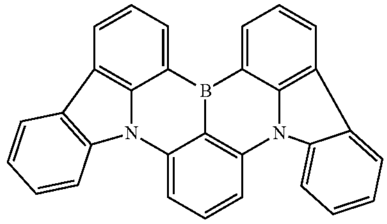
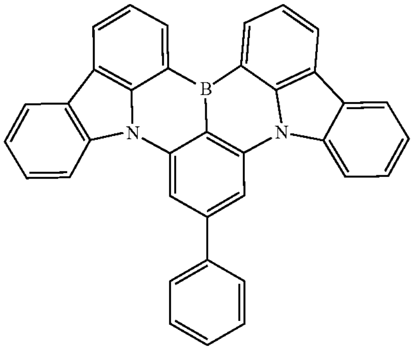
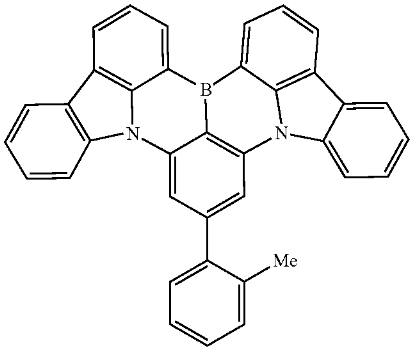
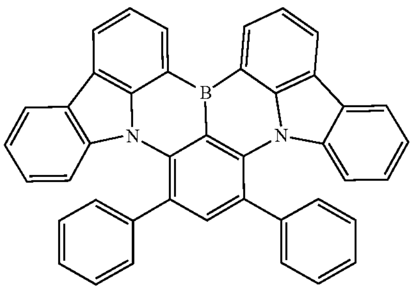
-continued
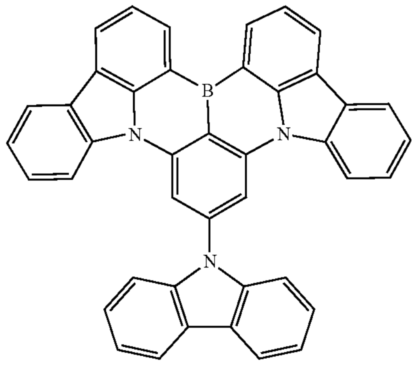
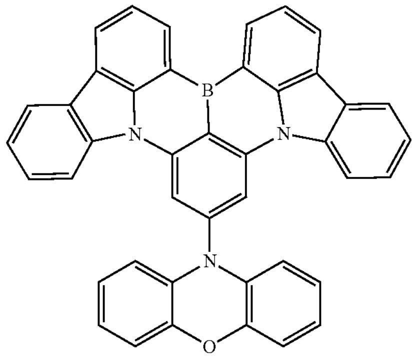
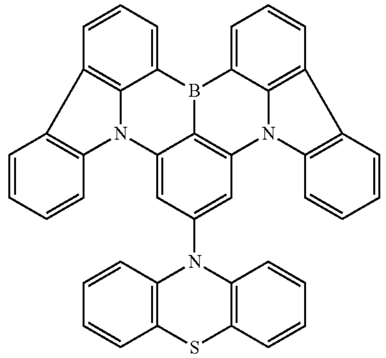
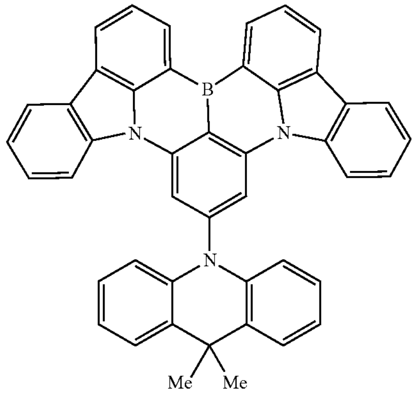

-continued
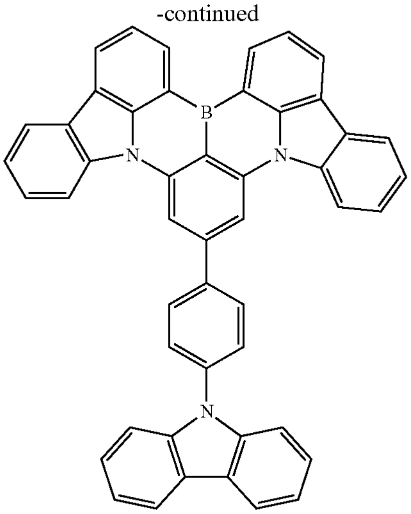
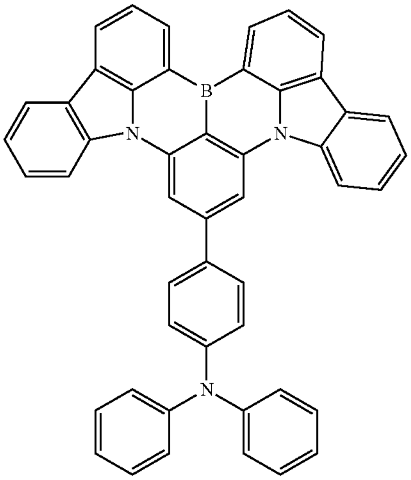
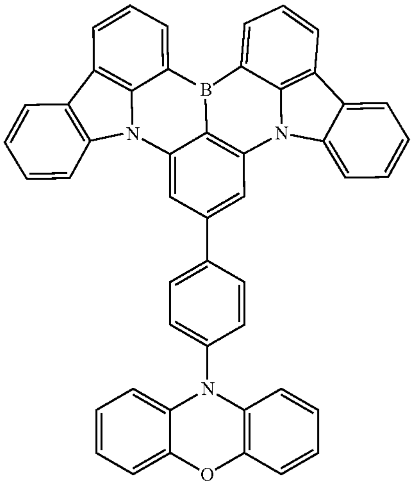
-continued
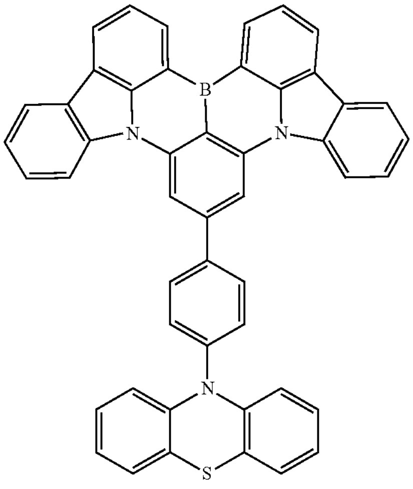
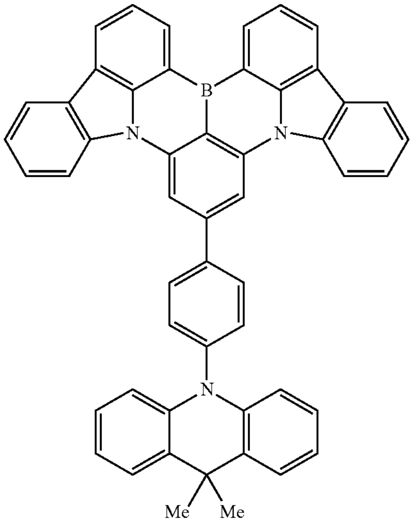
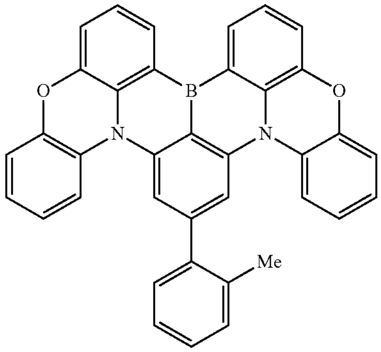
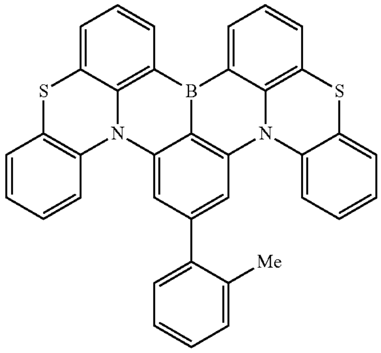

-continued
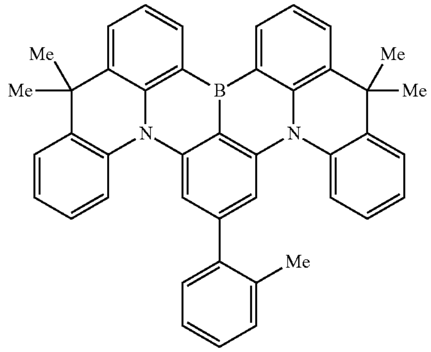
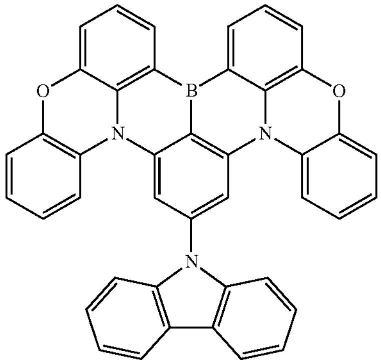
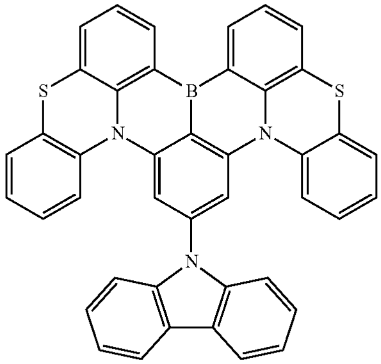
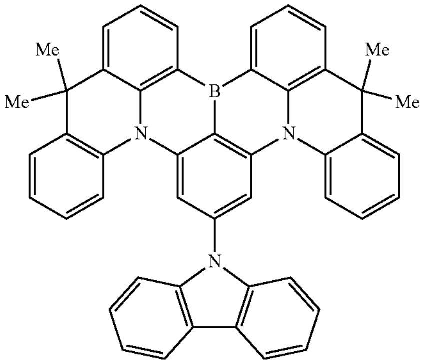
-continued
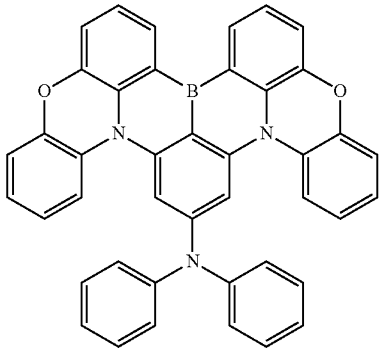
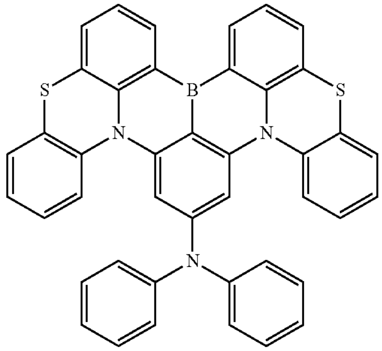
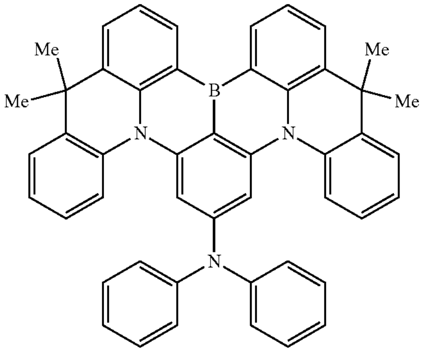
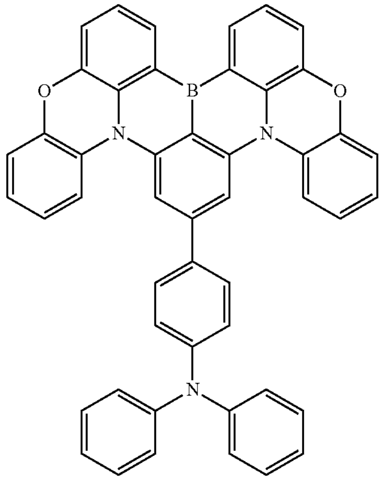

-continued
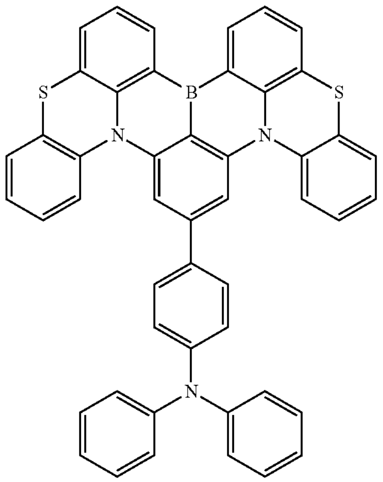
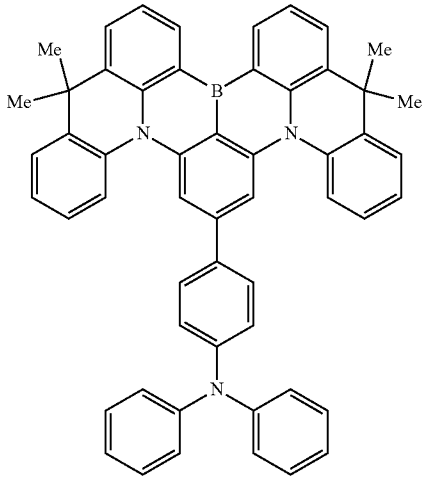
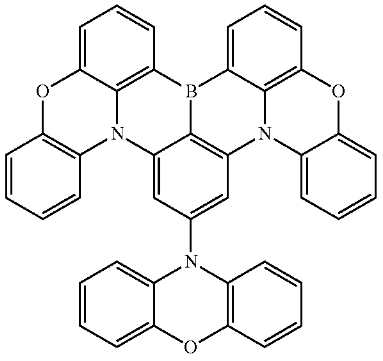
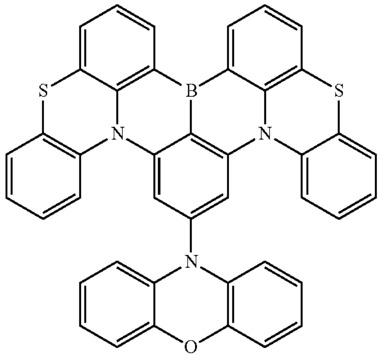
-continued
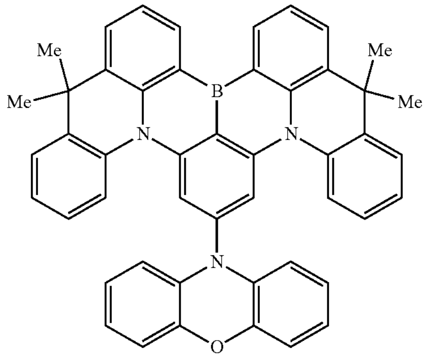
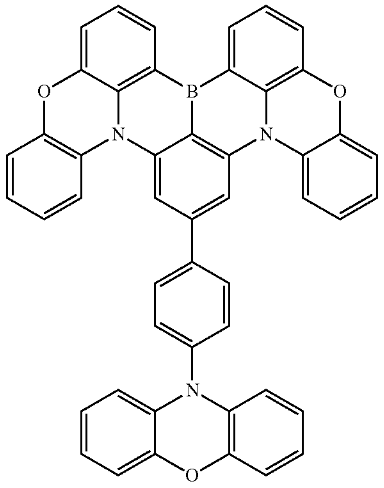
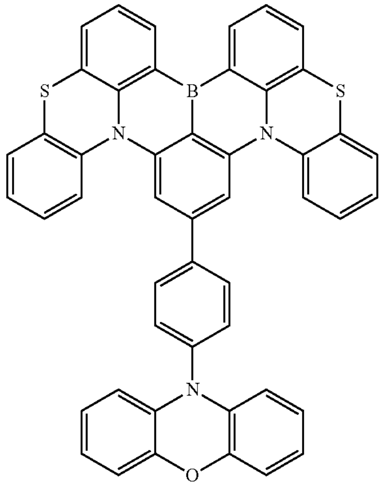

-continued
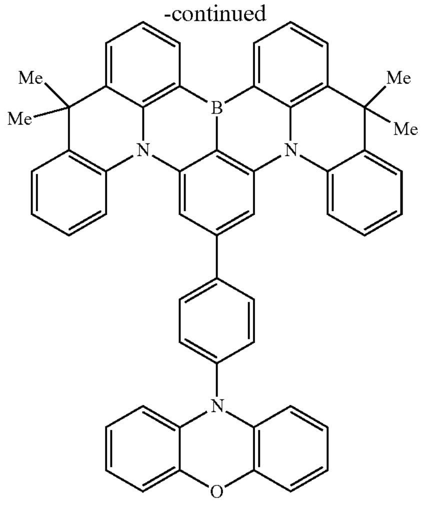
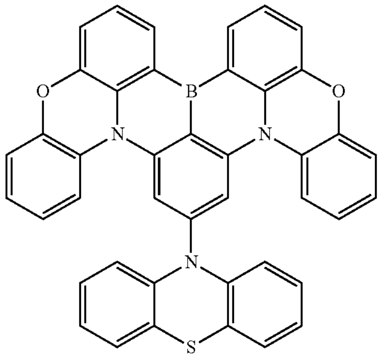
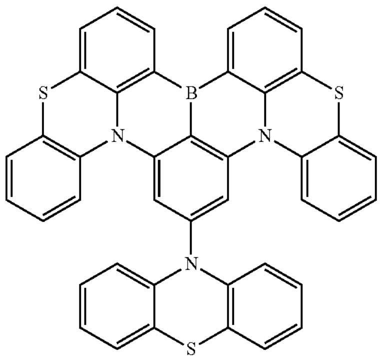
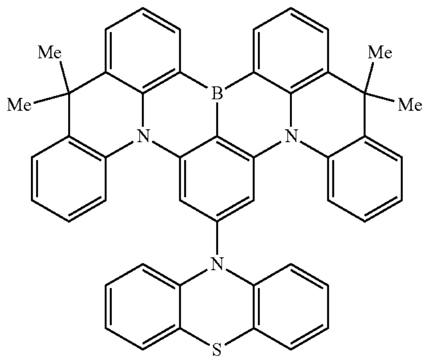
-continued
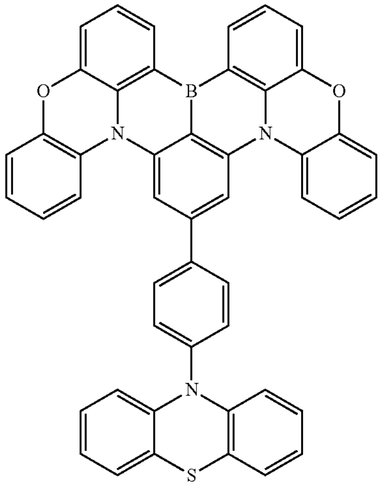
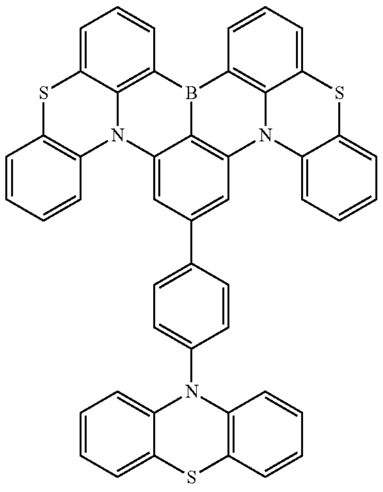
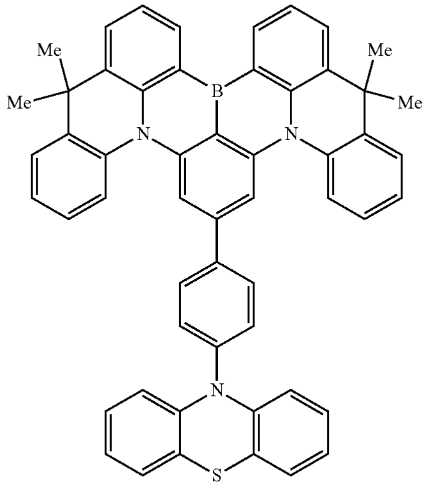

-continued
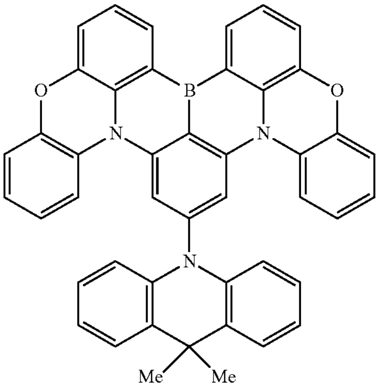
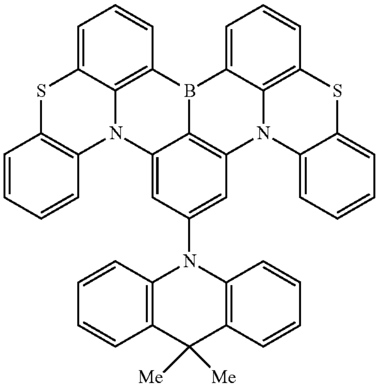
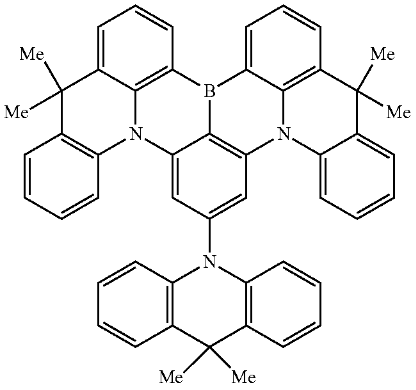
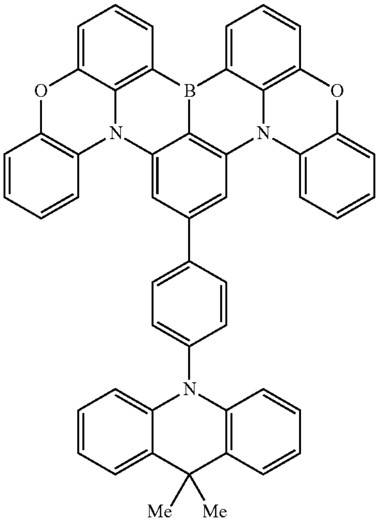
-continued
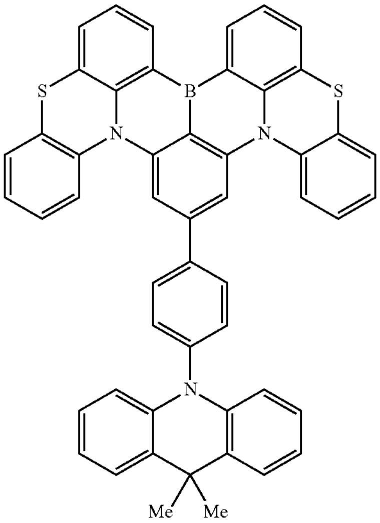
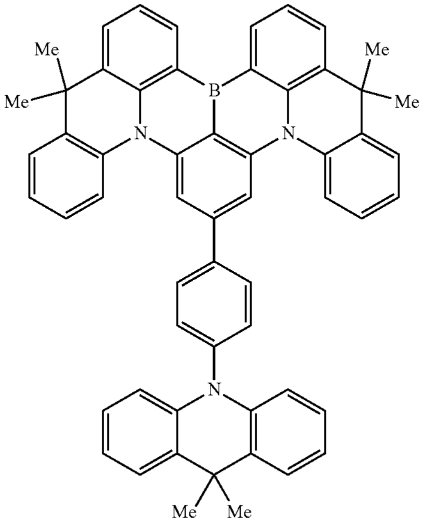
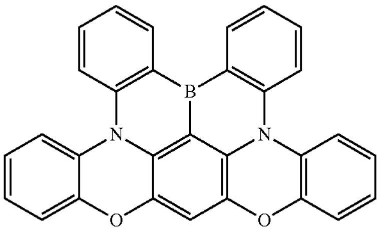
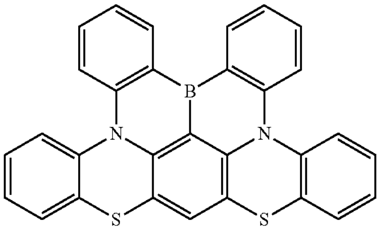

-continued
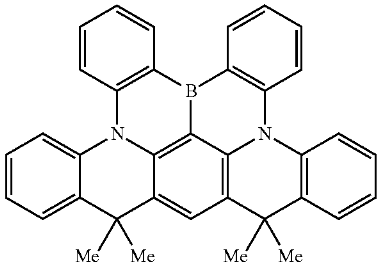
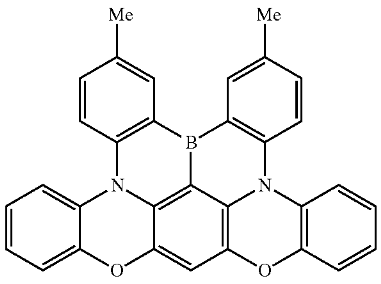
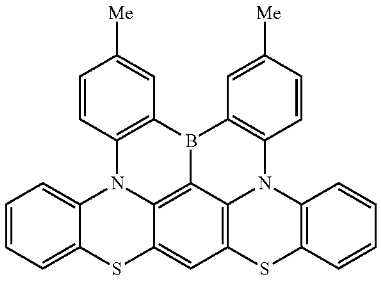
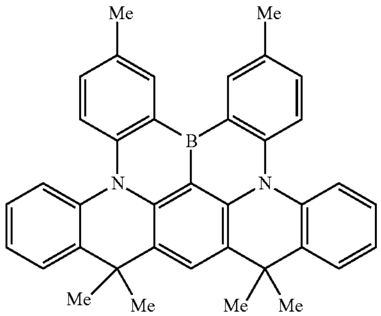
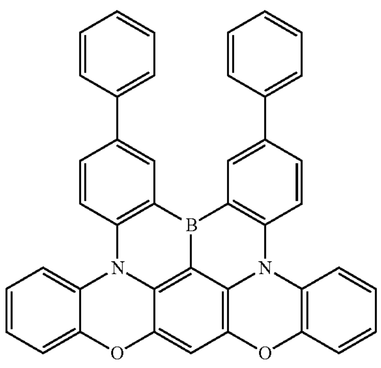
-continued
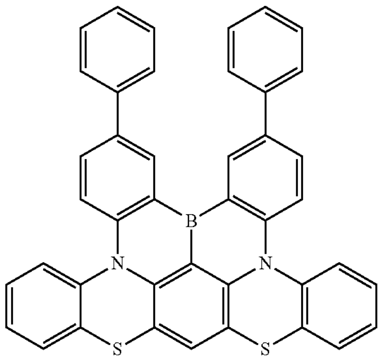
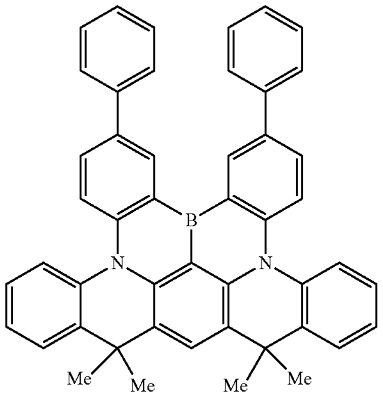
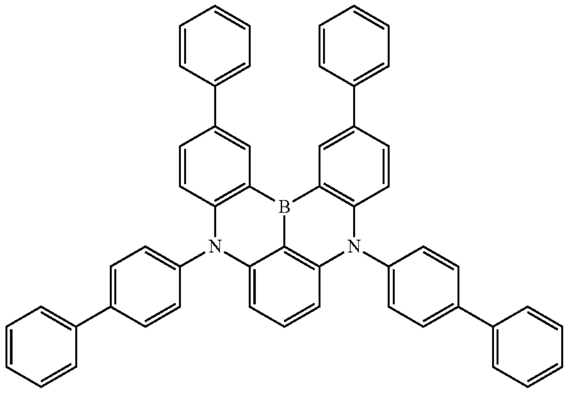
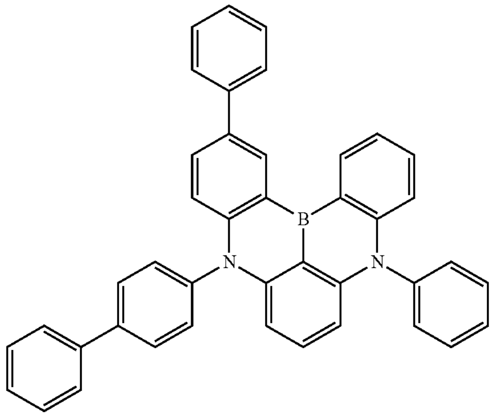

-continued
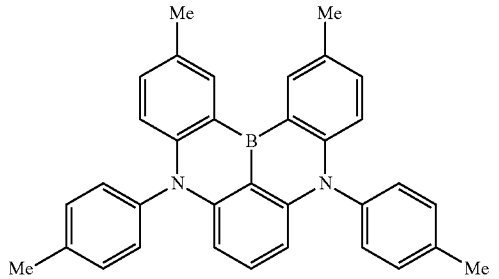
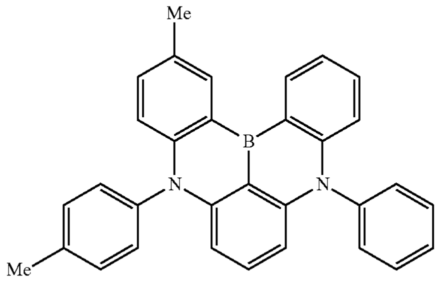
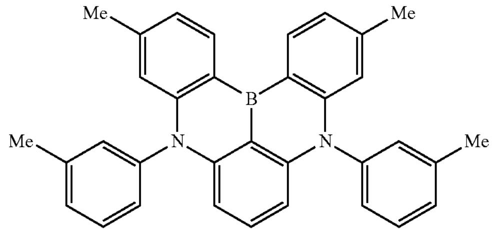
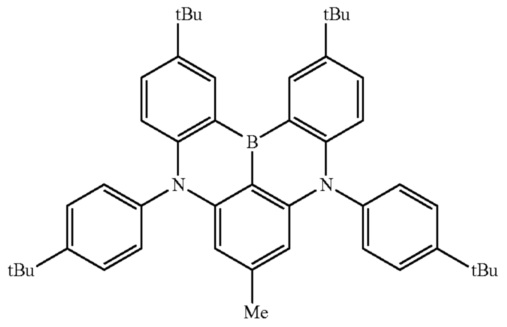
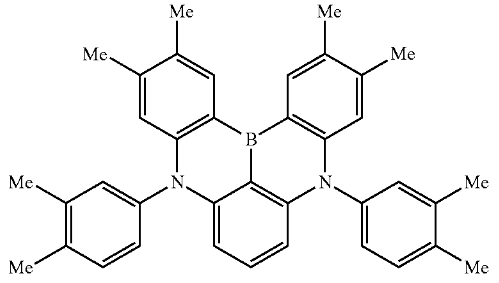
-continued
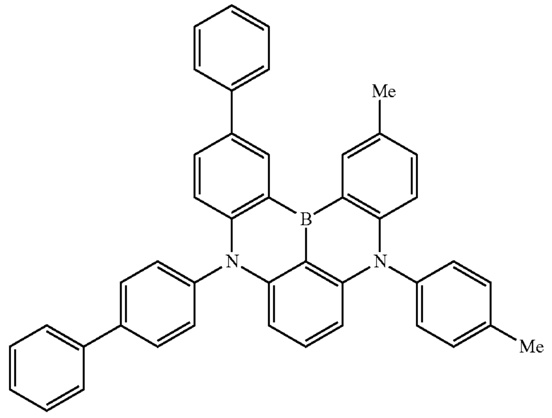
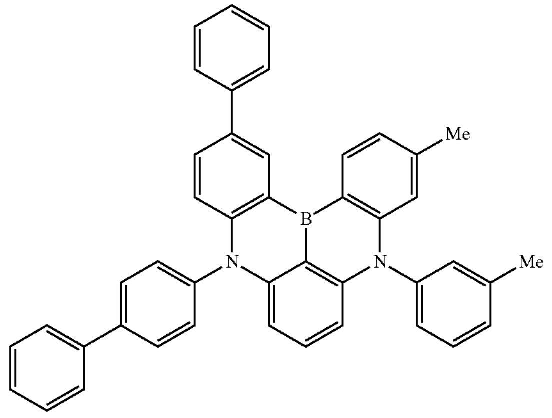
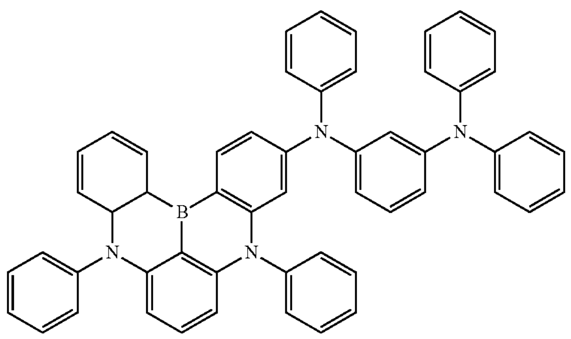
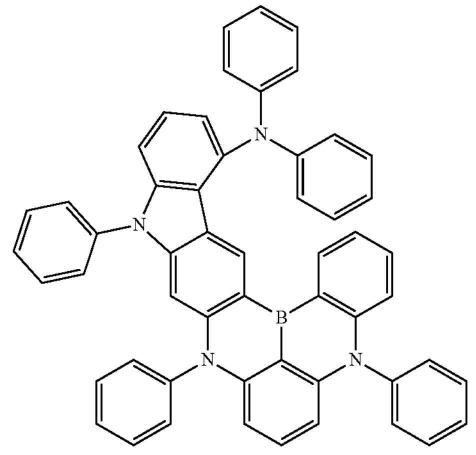

-continued
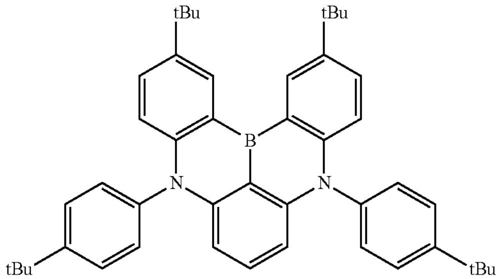
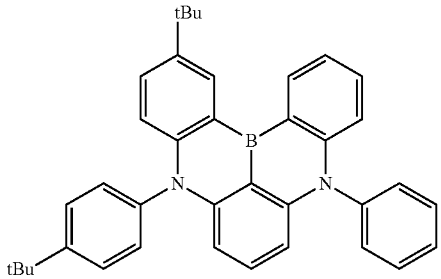
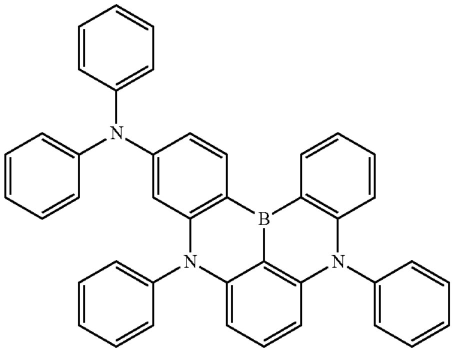
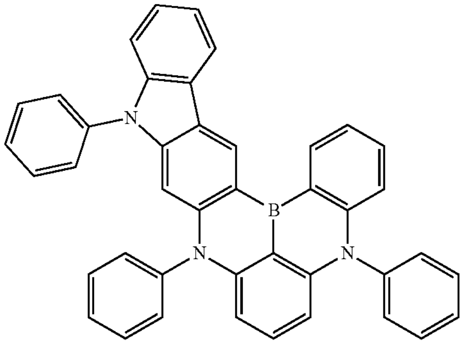
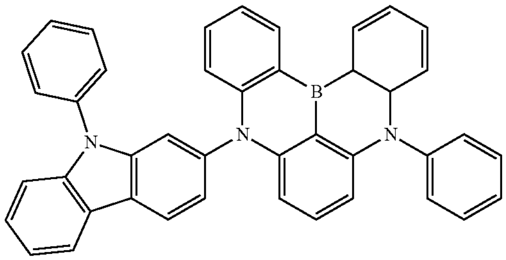
-continued
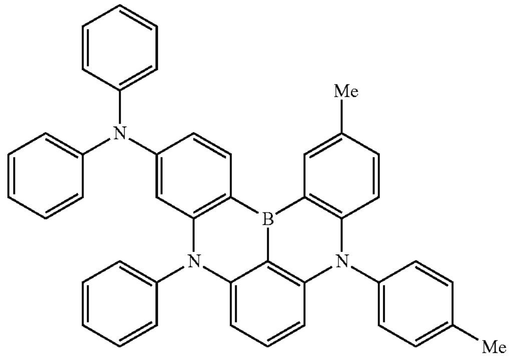
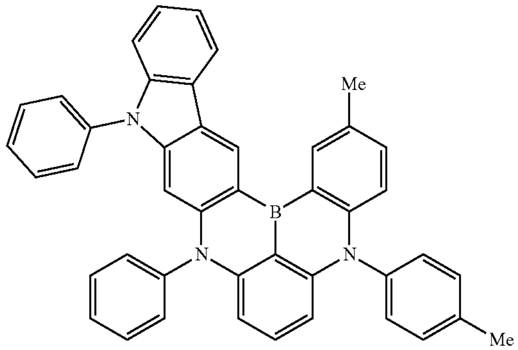
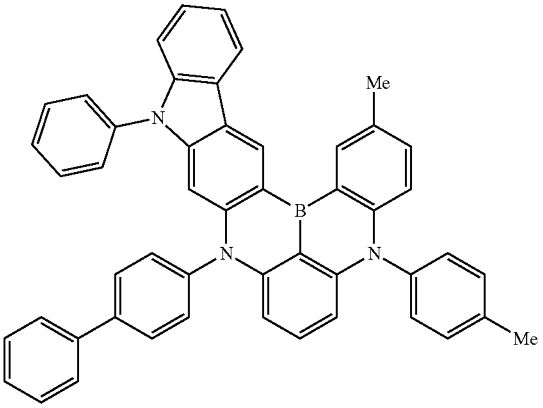
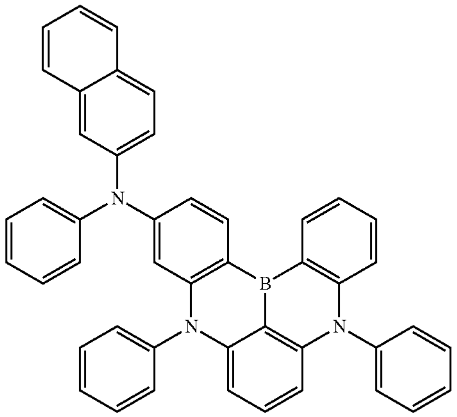

-continued
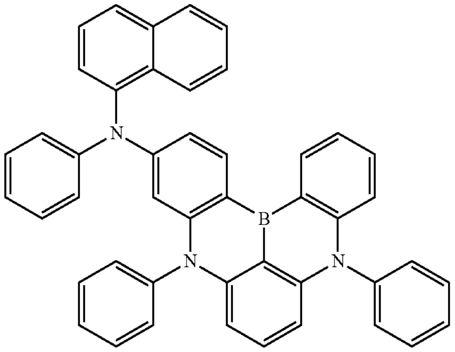
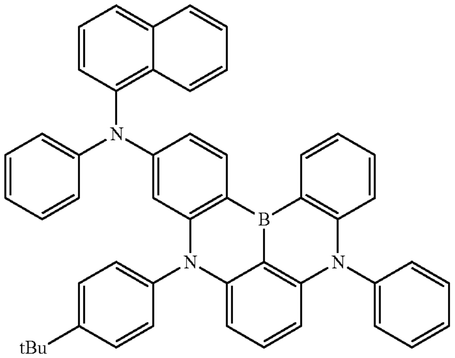
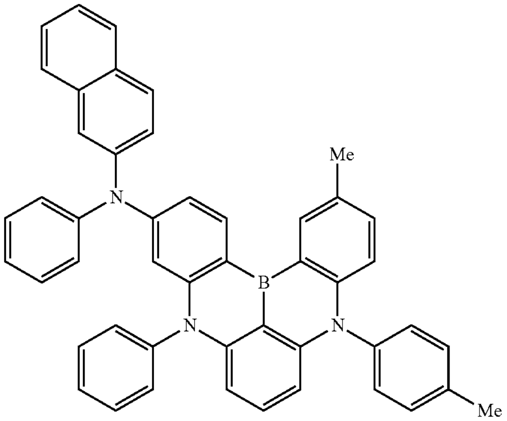
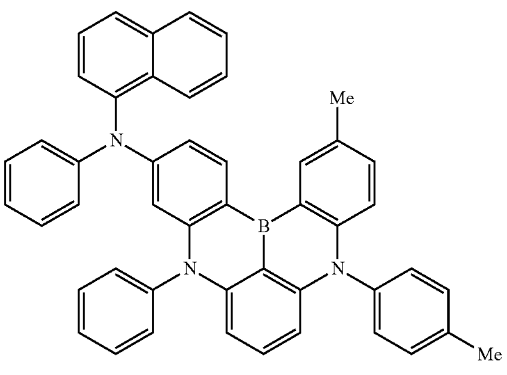
-continued
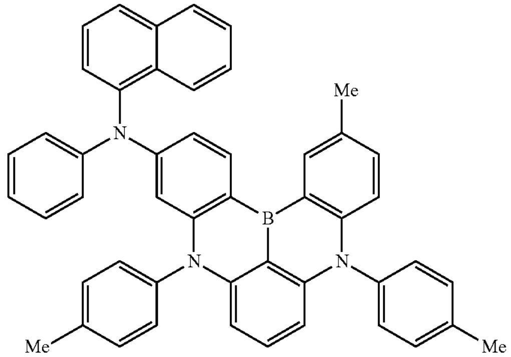
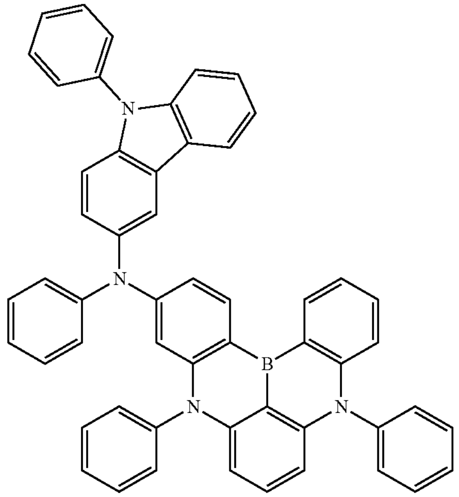
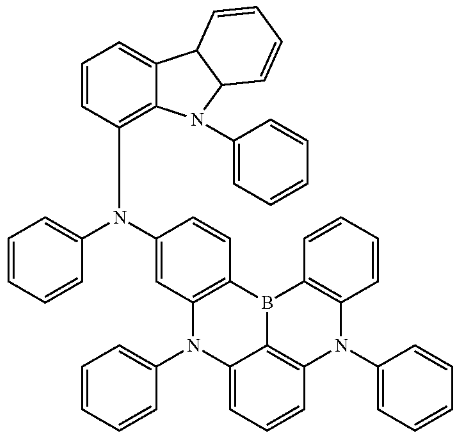

-continued
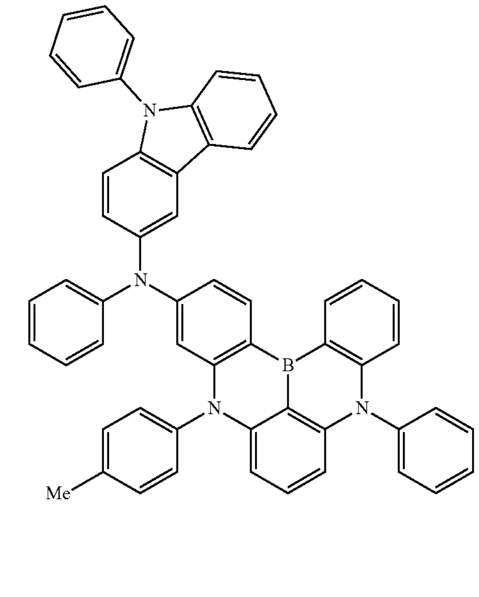
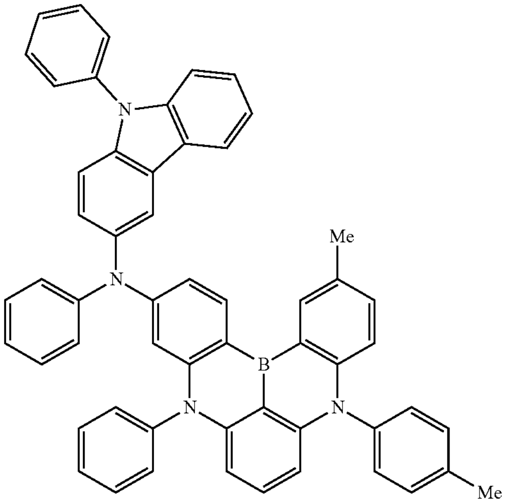
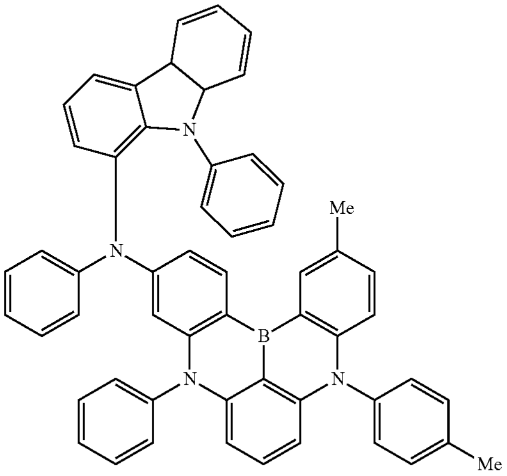
-continued
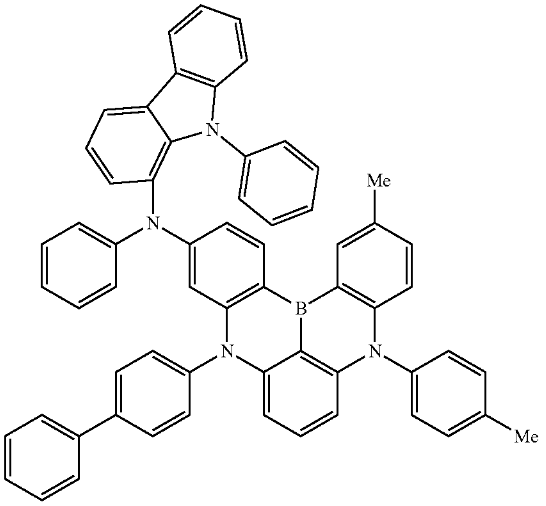
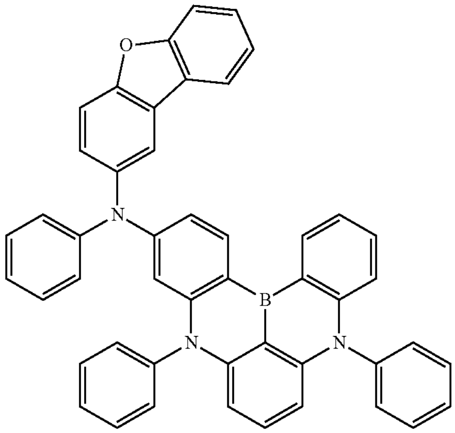
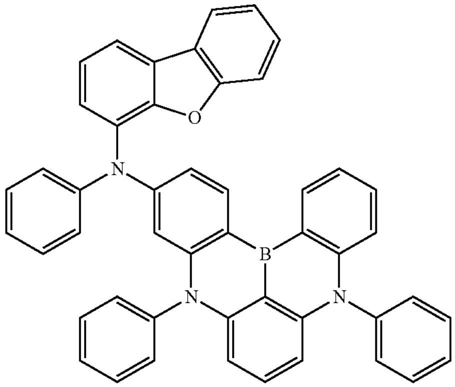

-continued
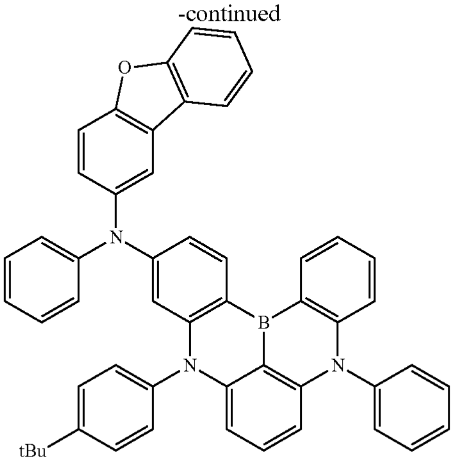
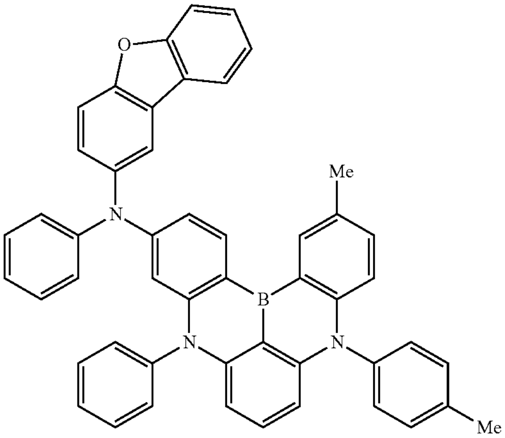
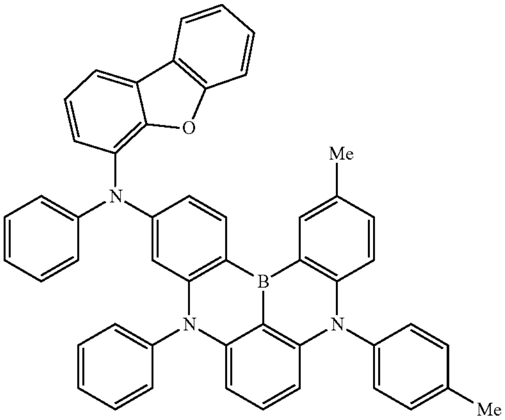
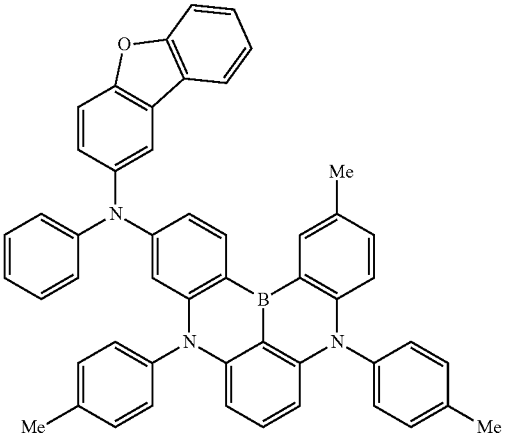
-continued
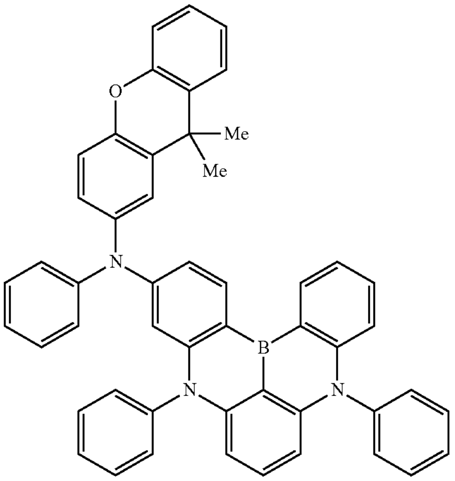
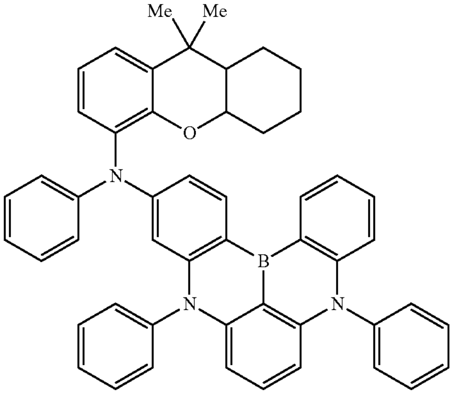
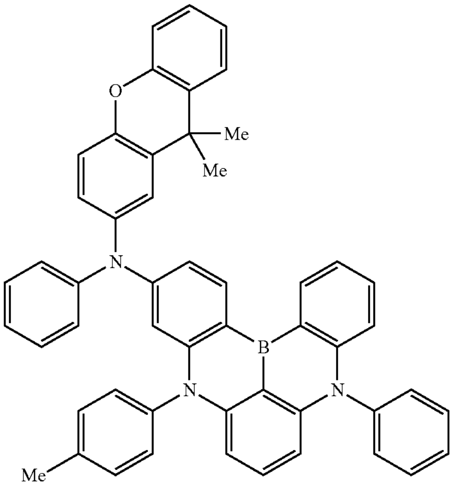

-continued
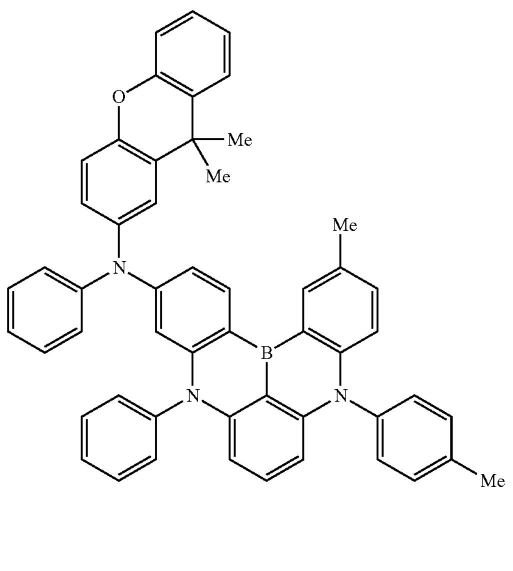
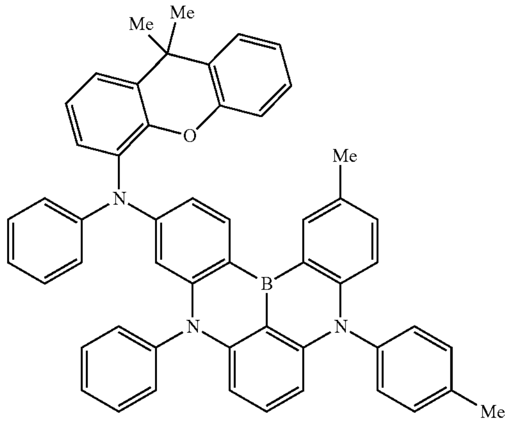
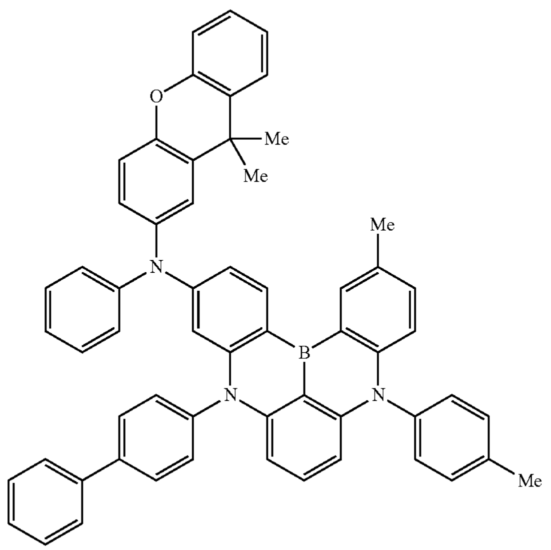
-continued
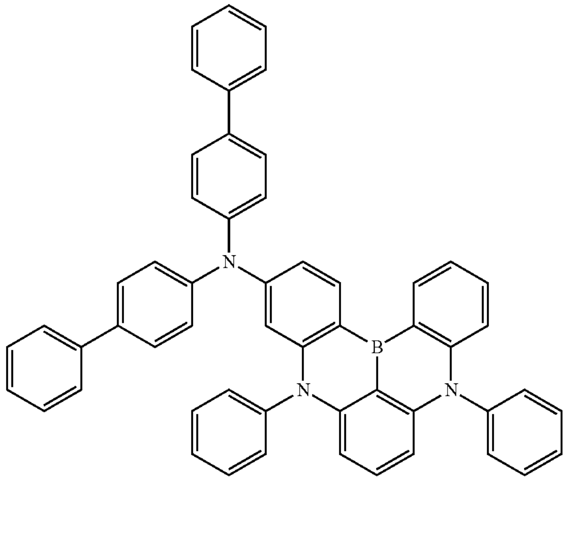
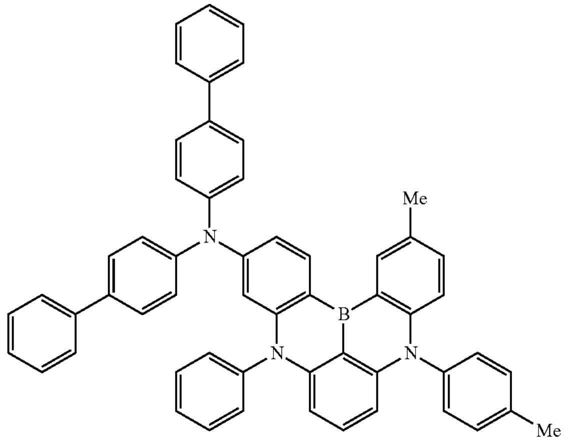
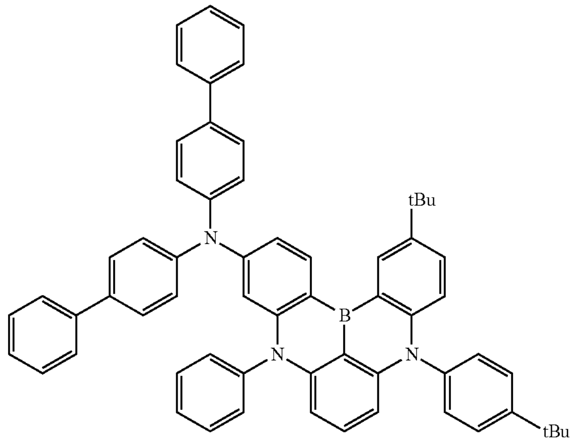

-continued
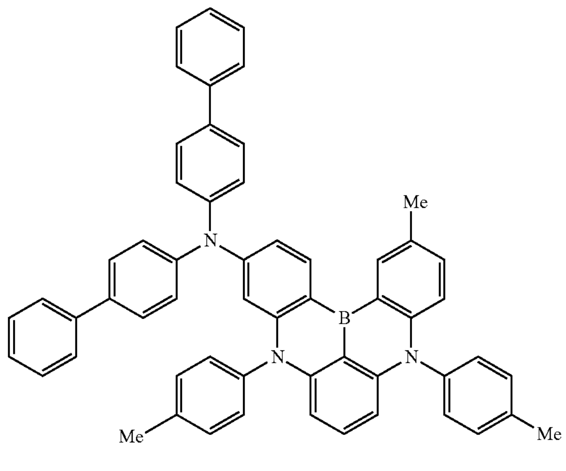
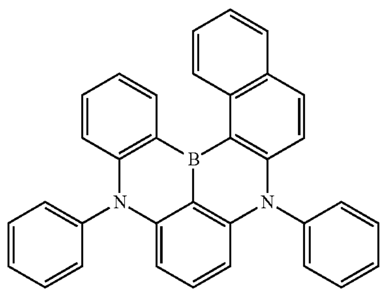
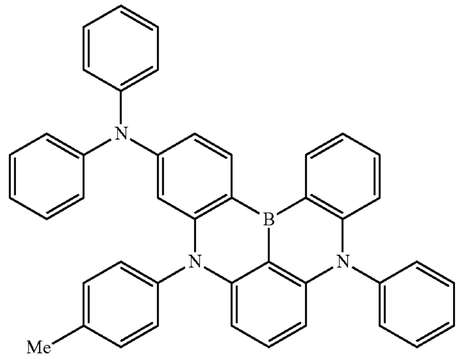
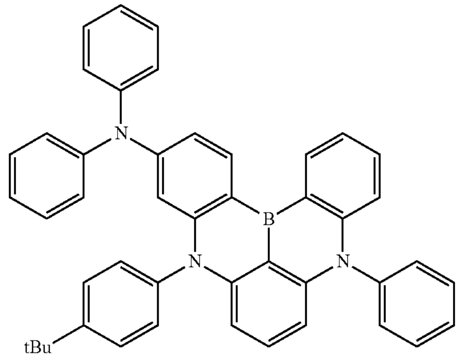
-continued
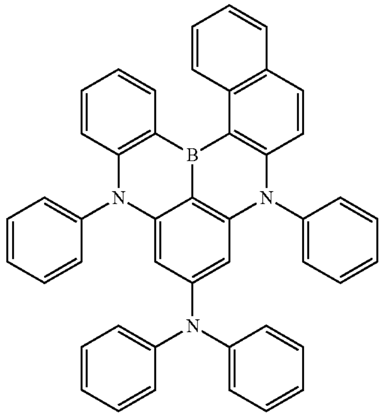
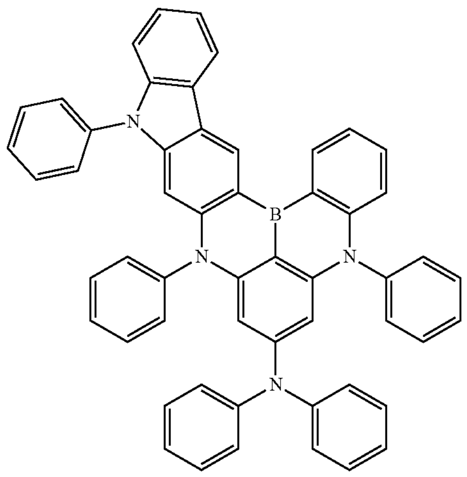
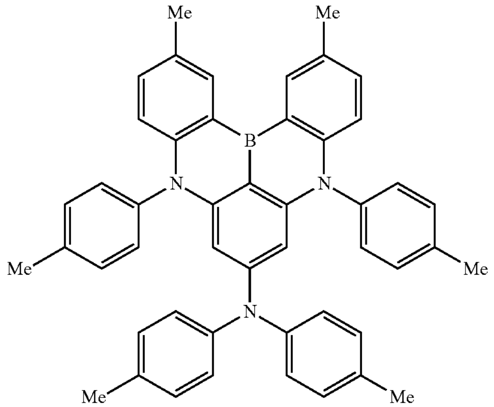
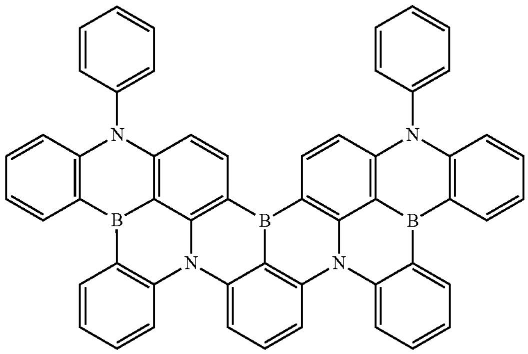

-continued
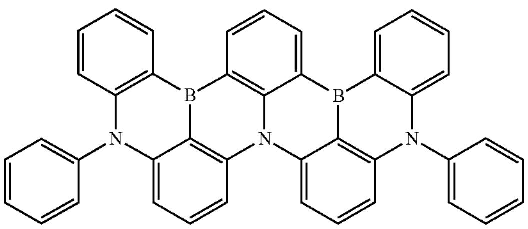
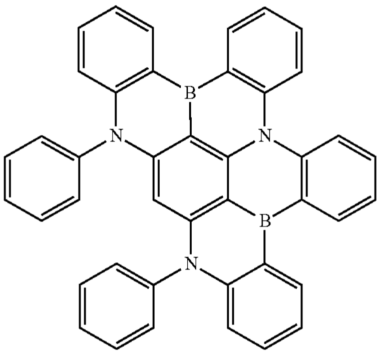
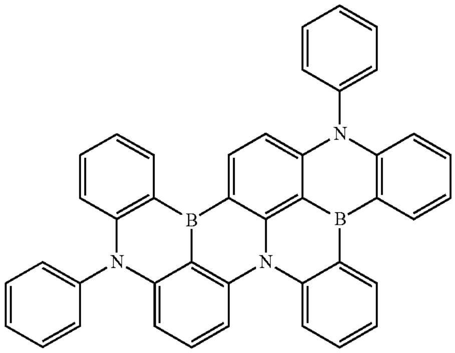
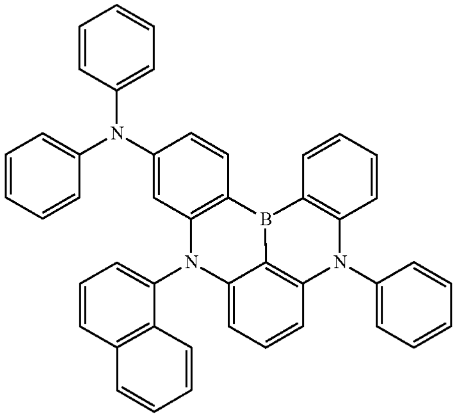
-continued
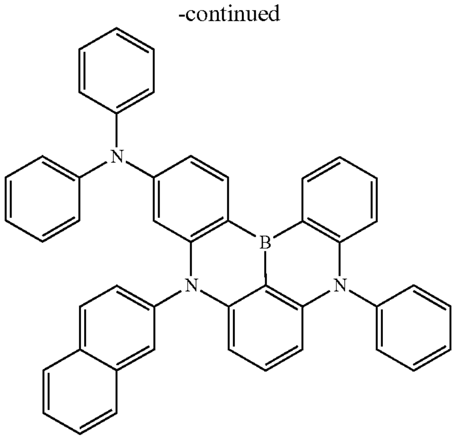
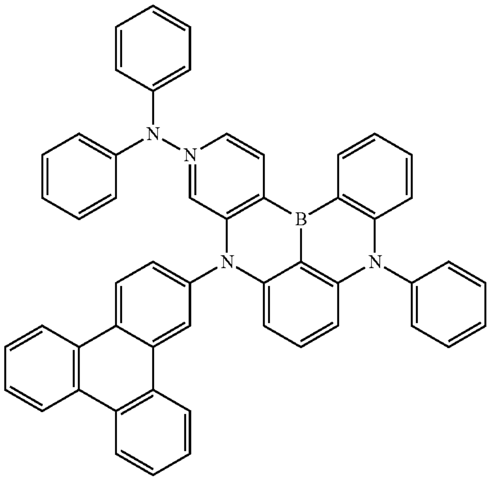
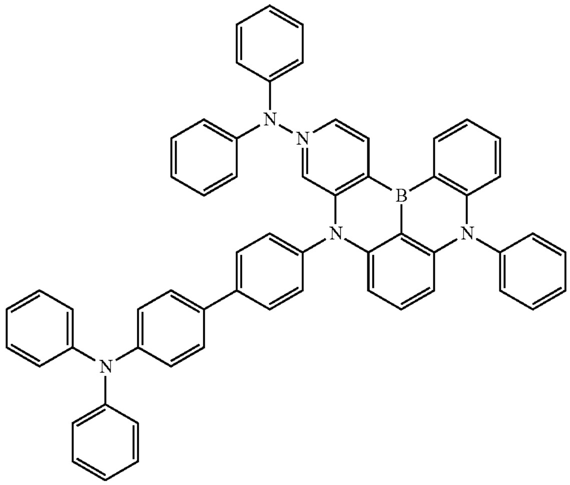

-continued
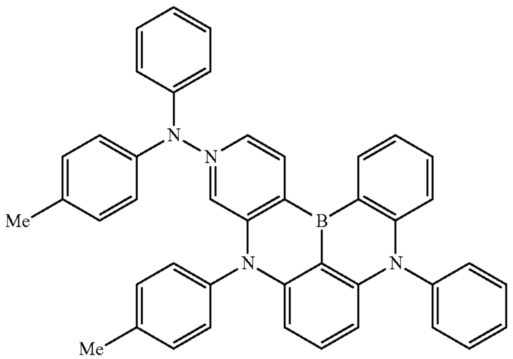
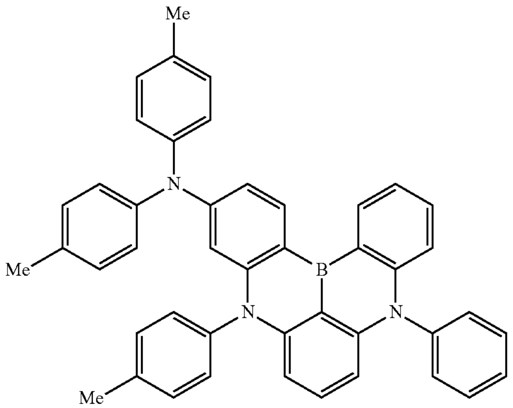
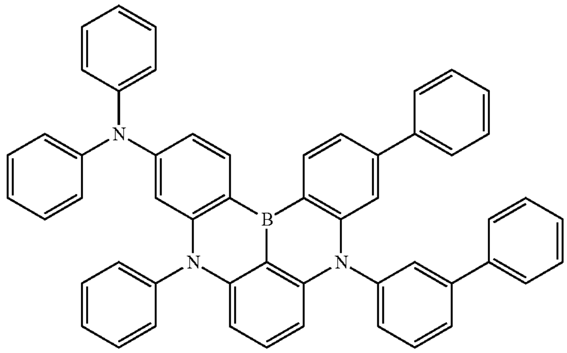
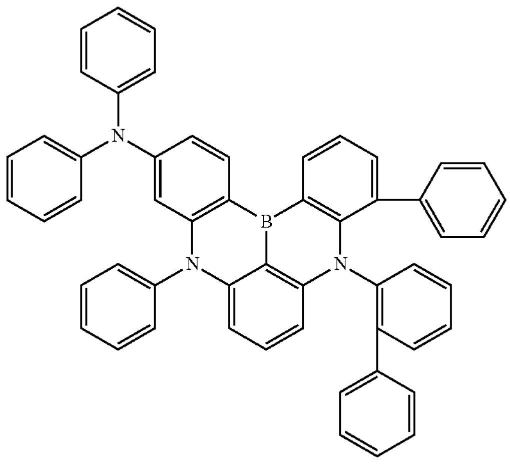
-continued
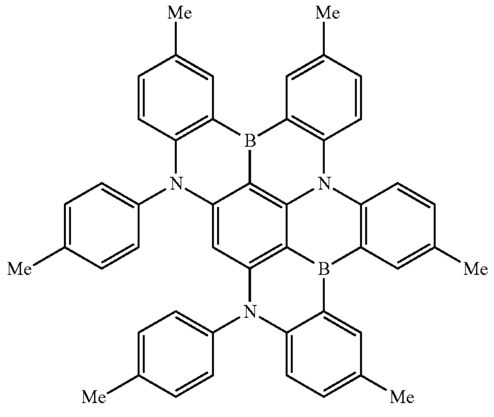
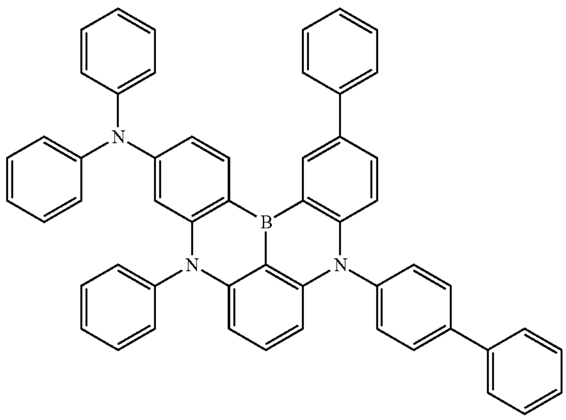
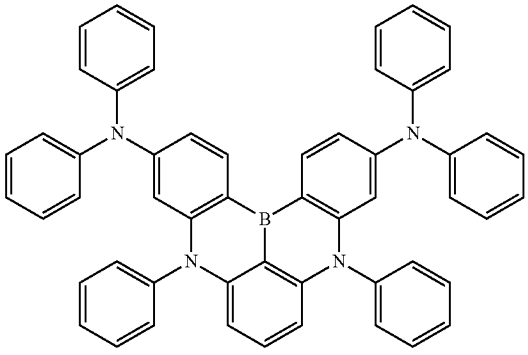
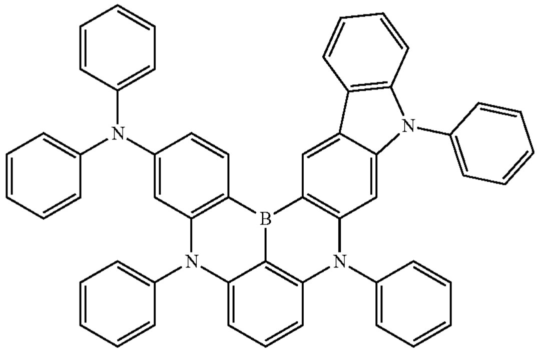

-continued
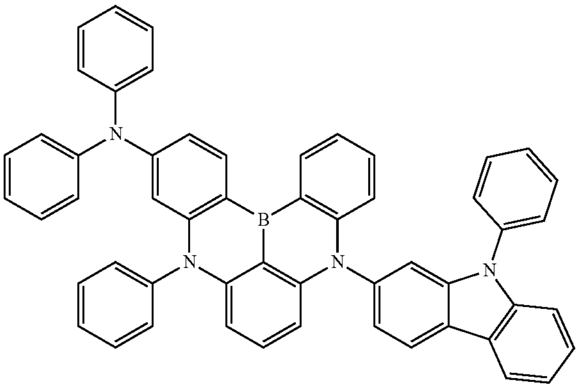
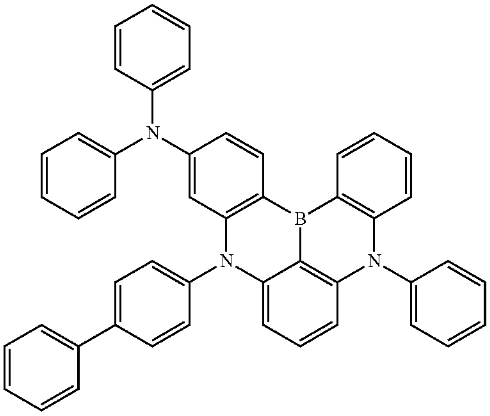
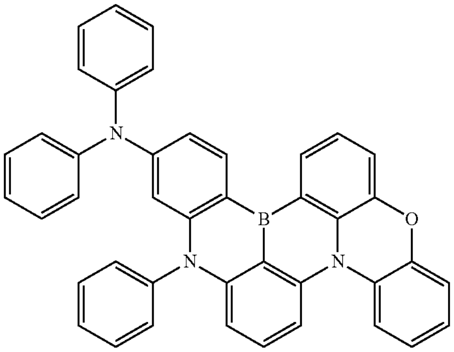
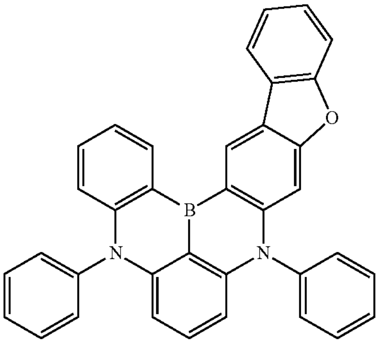
-continued
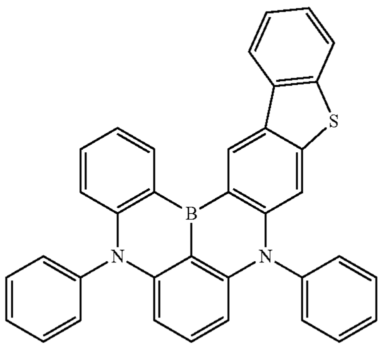
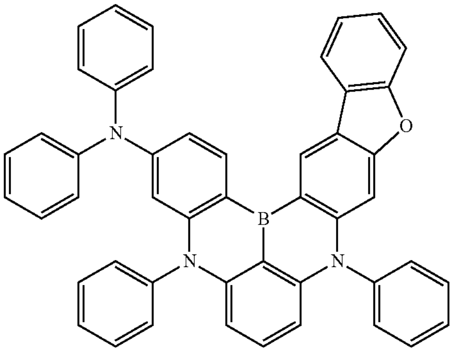
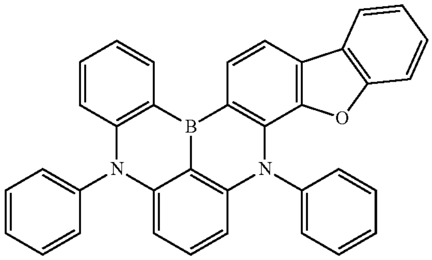
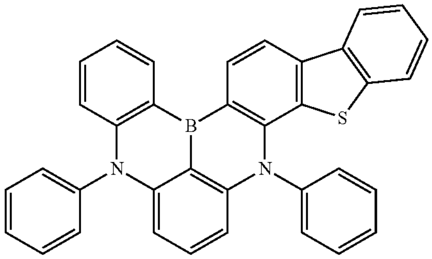
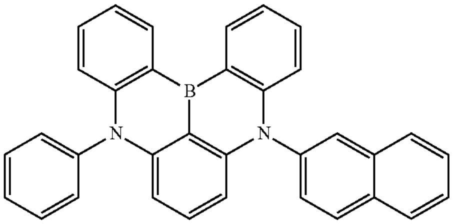
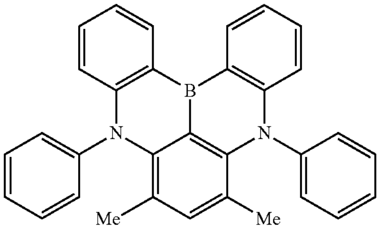

-continued
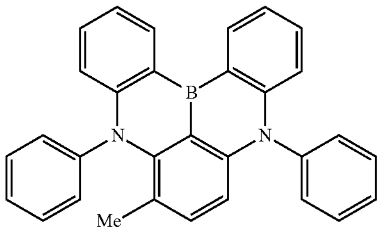
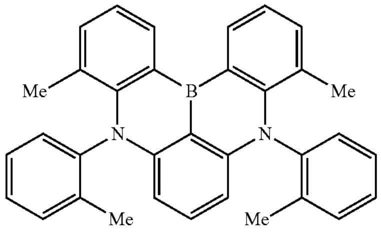
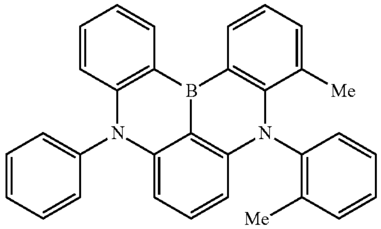
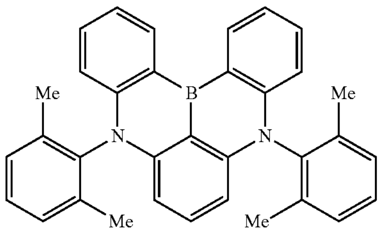
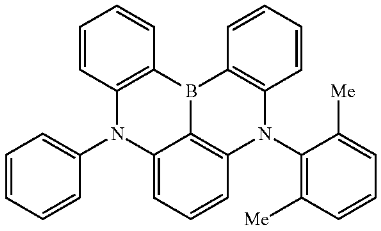
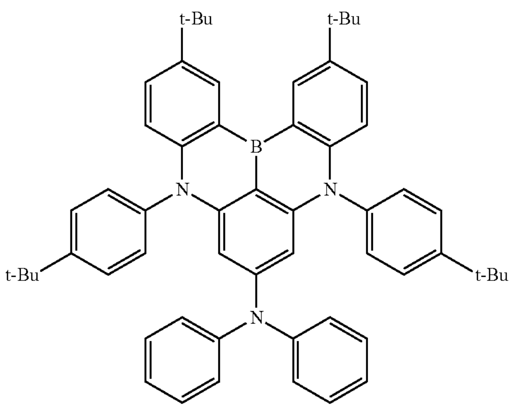
-continued
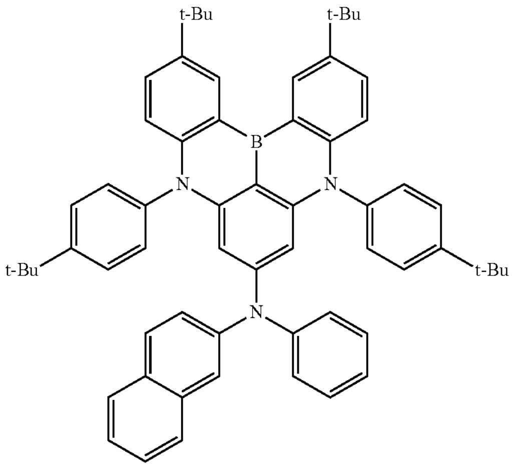
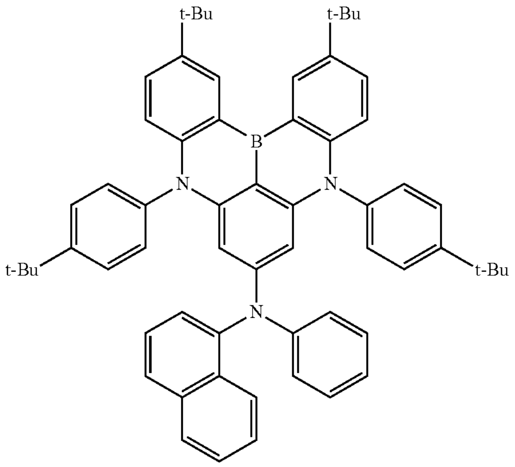
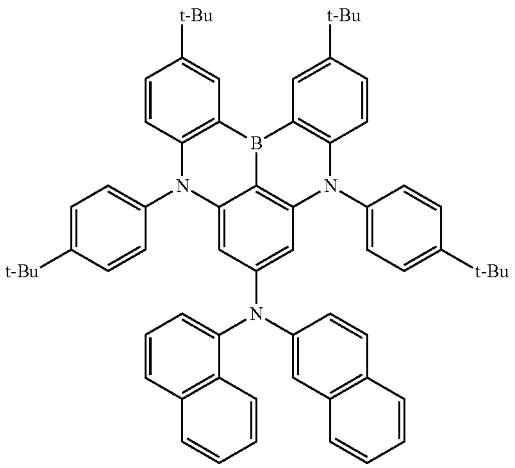

-continued
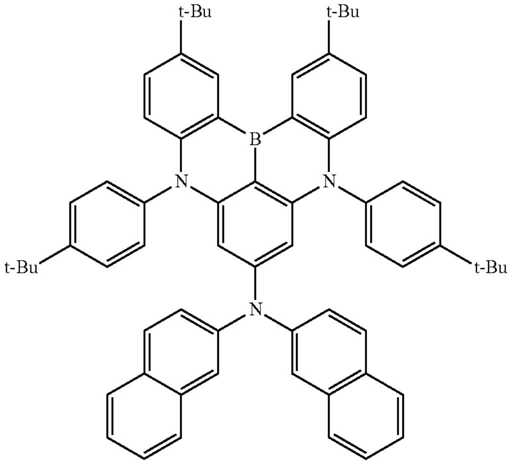
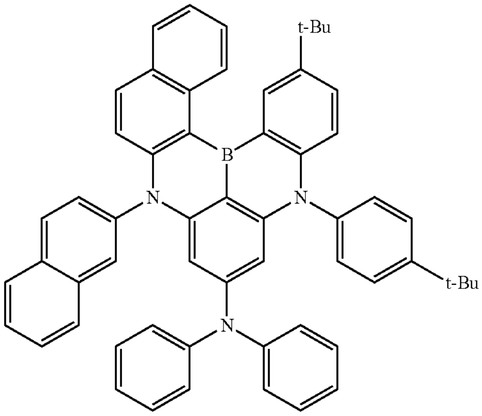
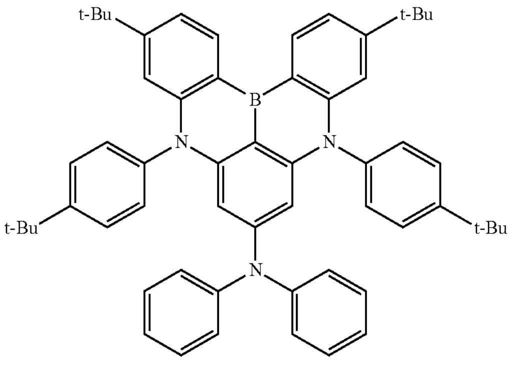
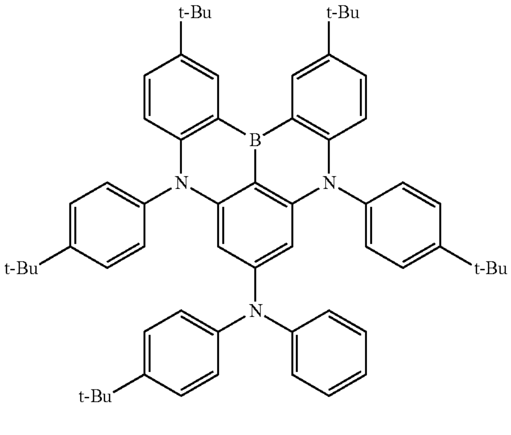
-continued
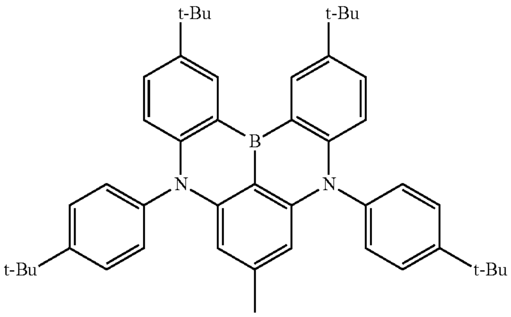
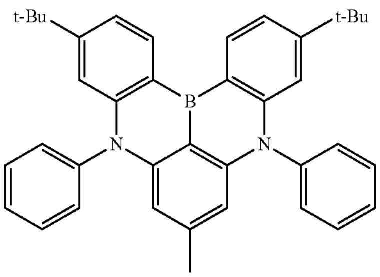
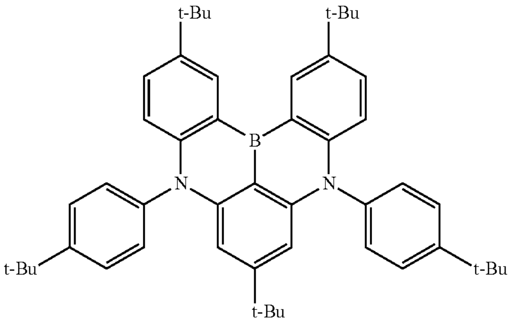
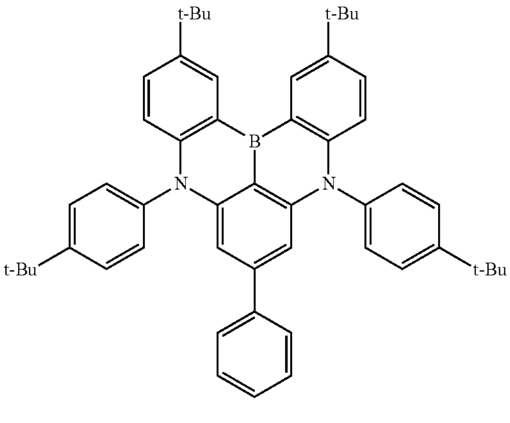

-continued
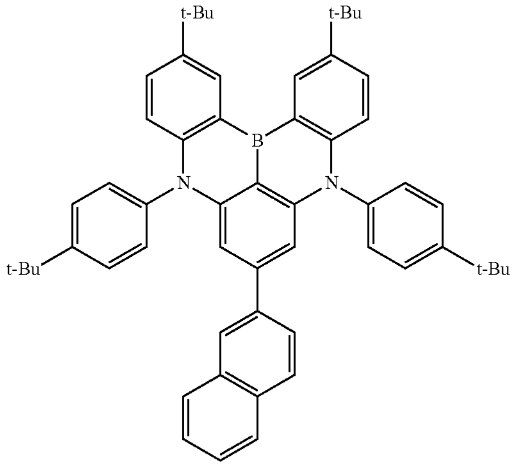
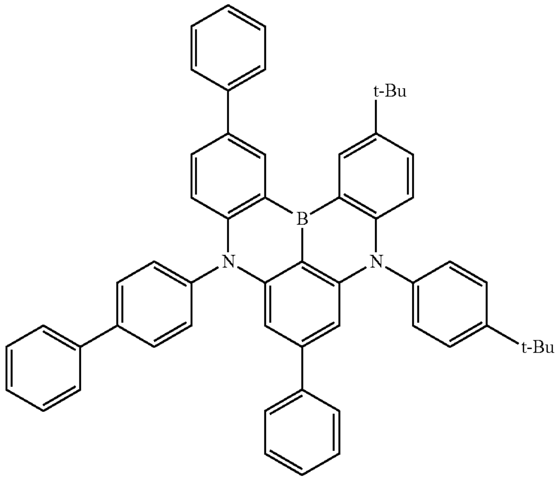
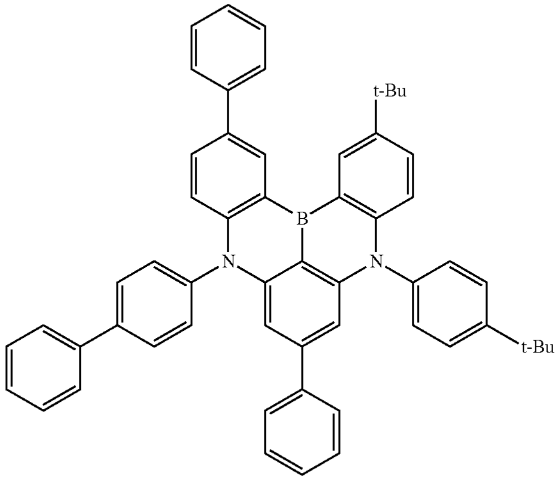
-continued
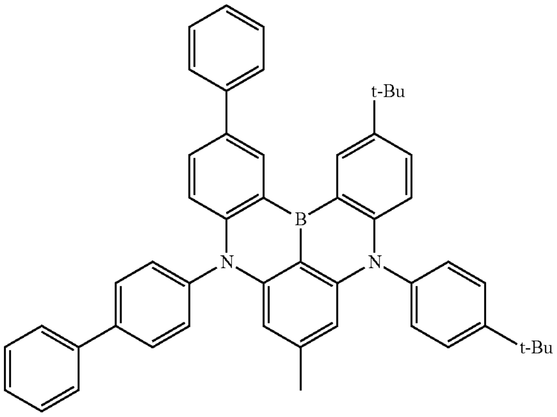
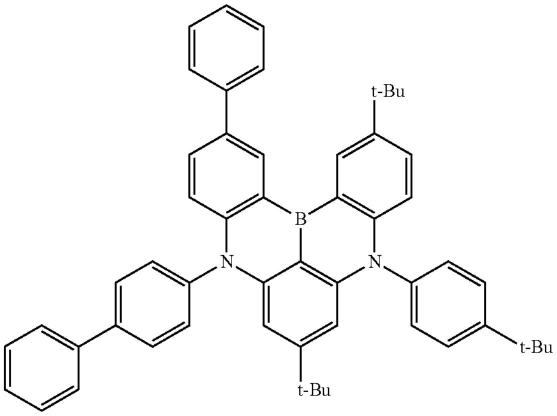
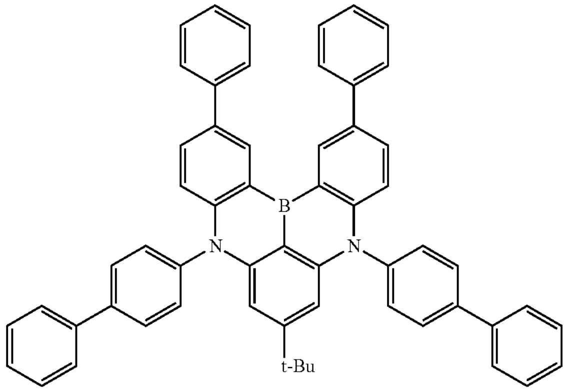
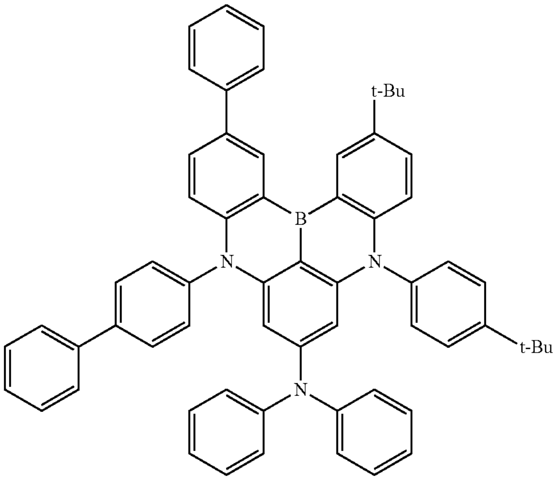

-continued
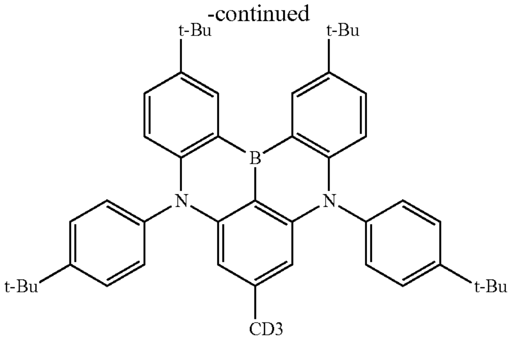
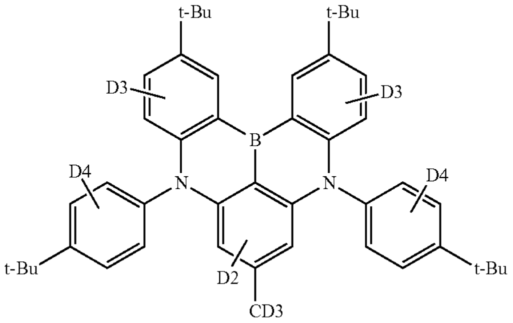
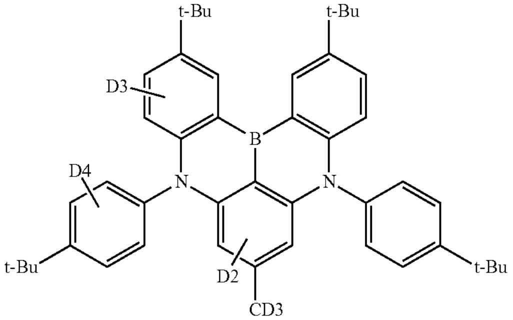
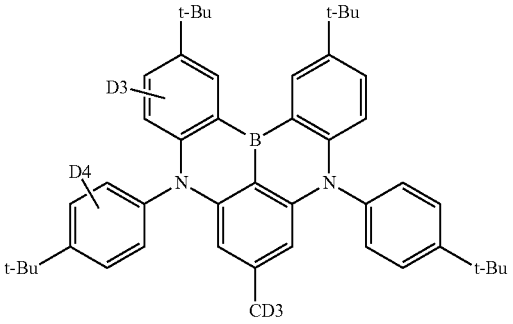
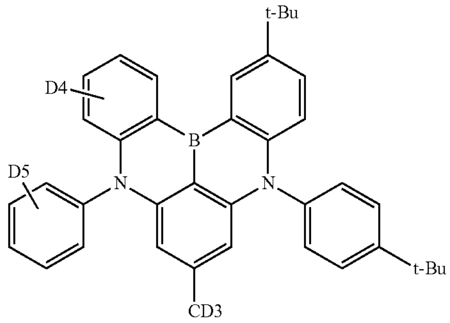
-continued
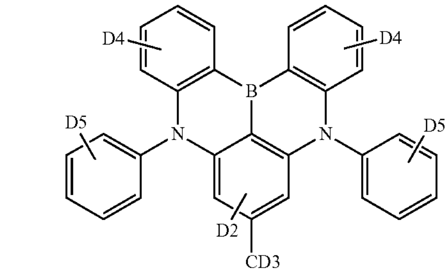
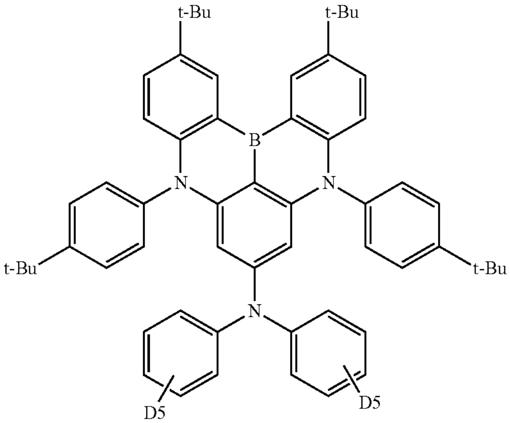
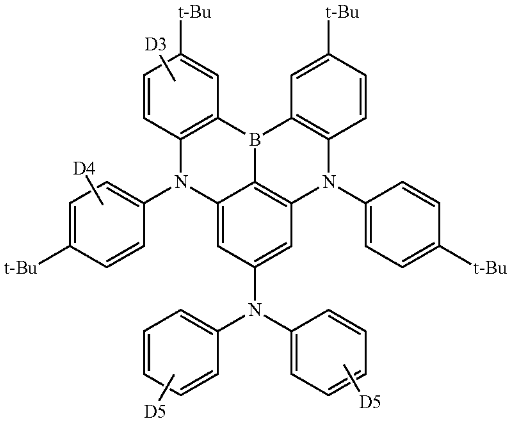
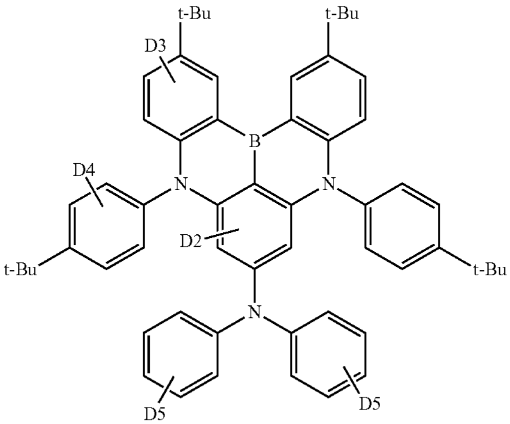

-continued
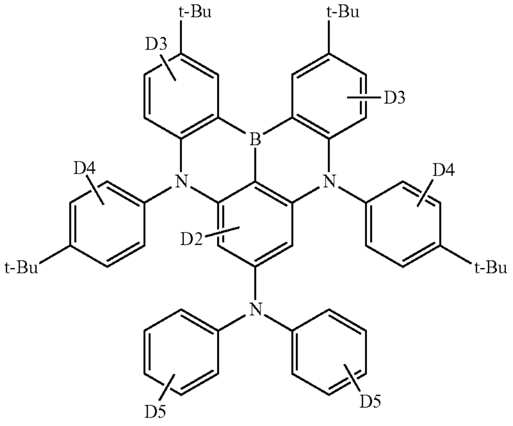
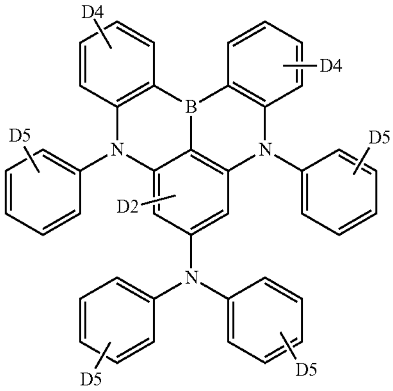
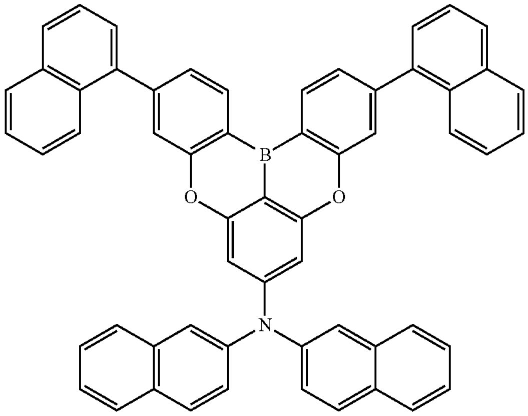
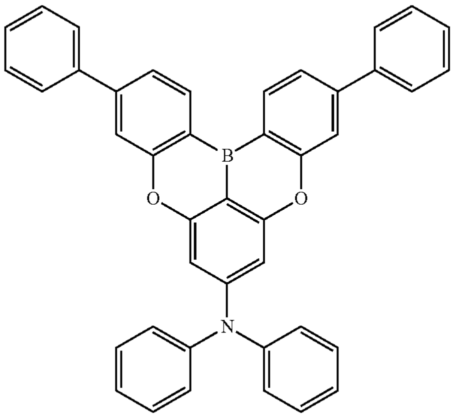
-continued
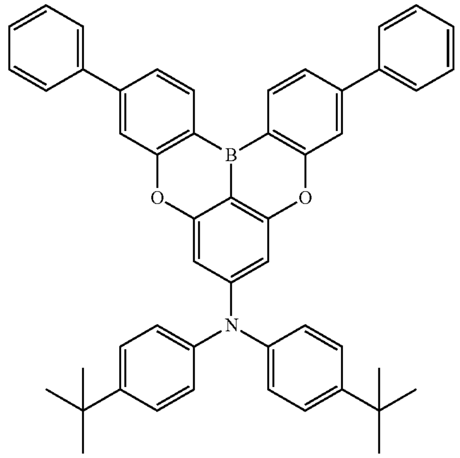
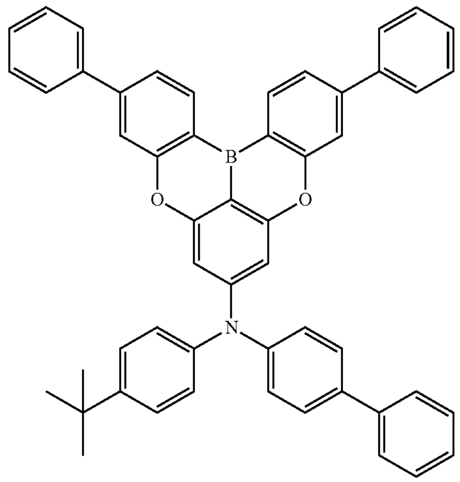
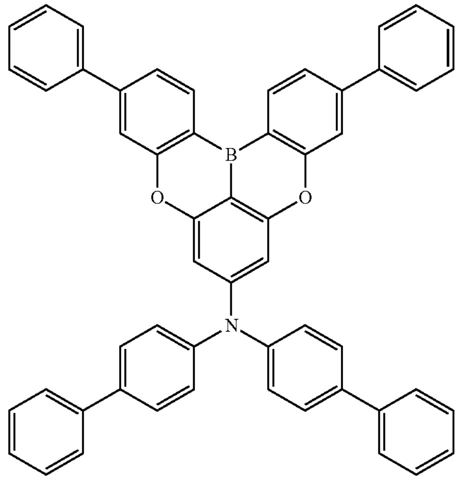

-continued
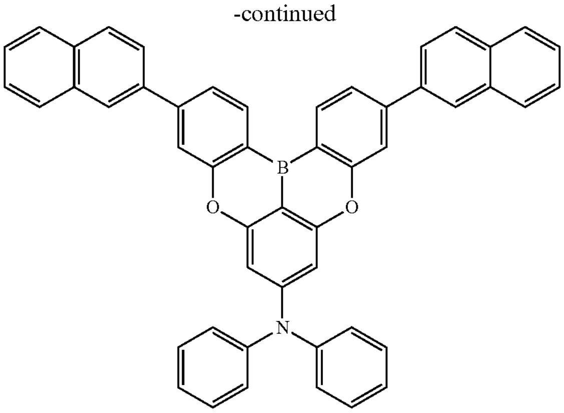
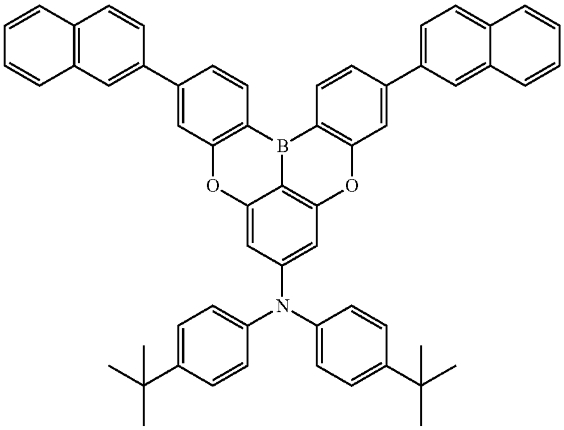
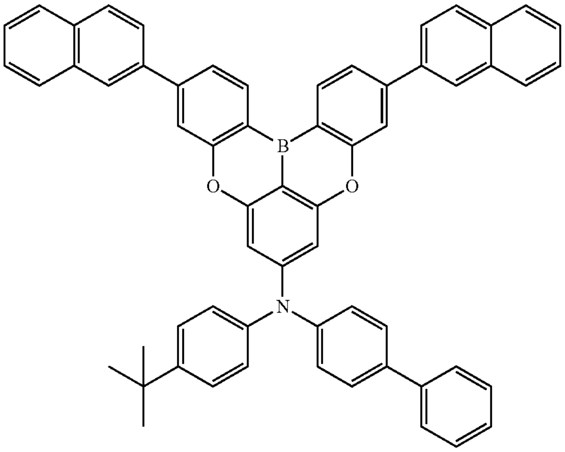
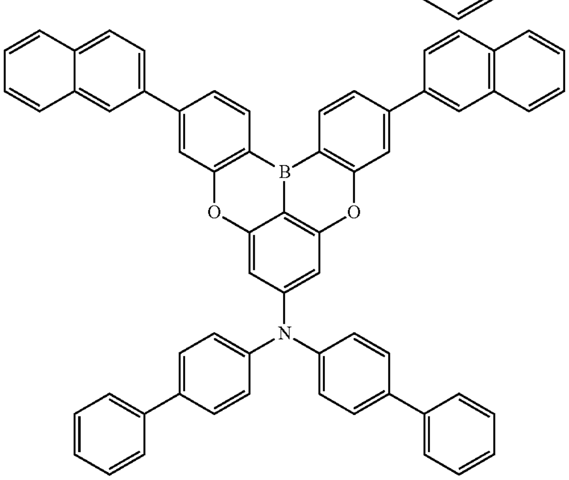
-continued
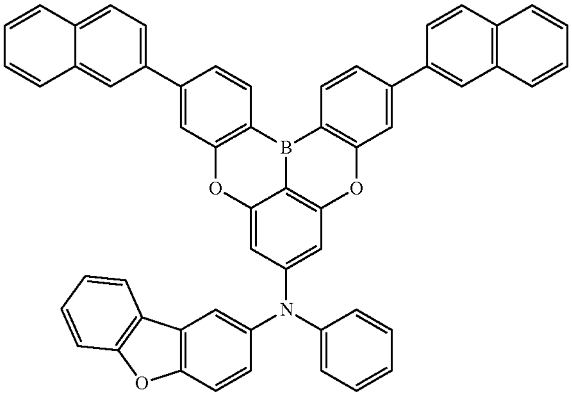
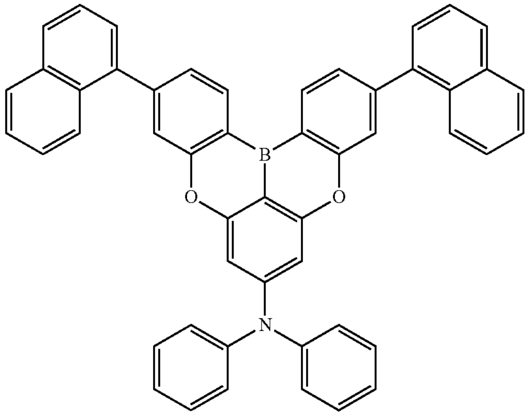
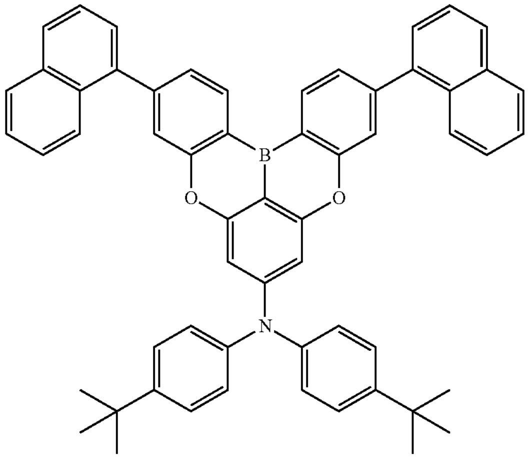

-continued
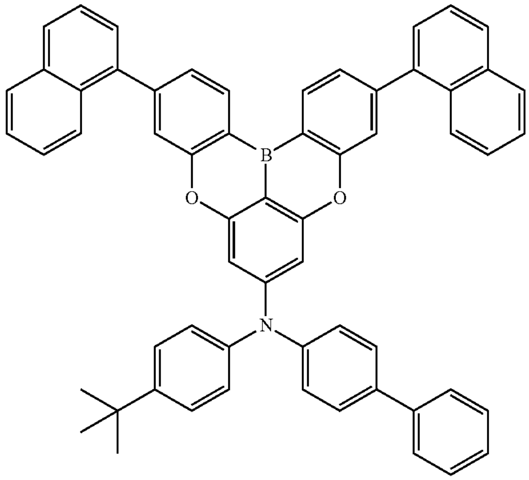
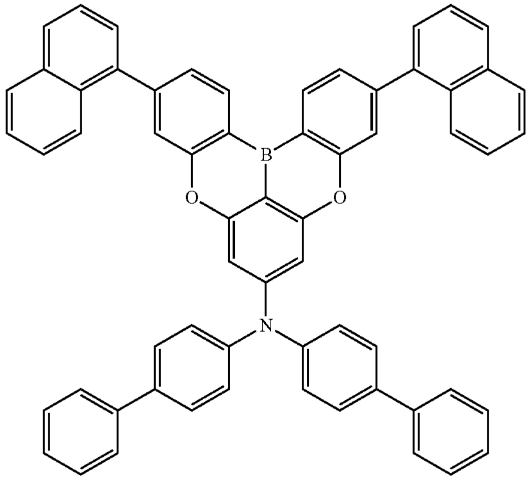
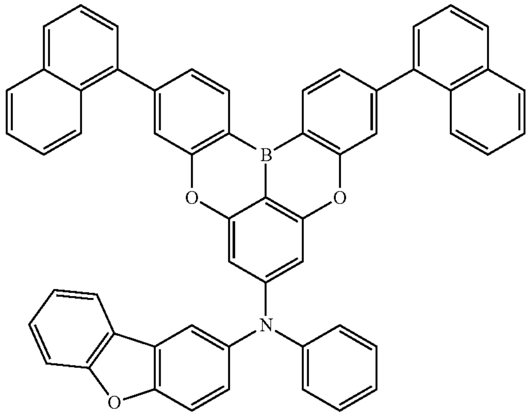
-continued
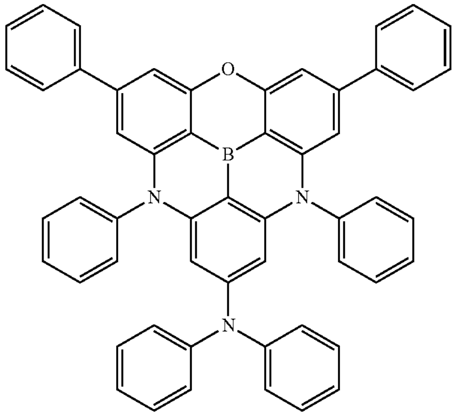
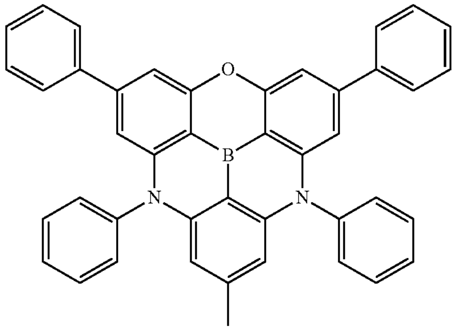
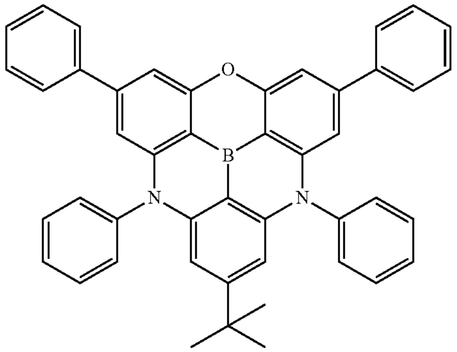
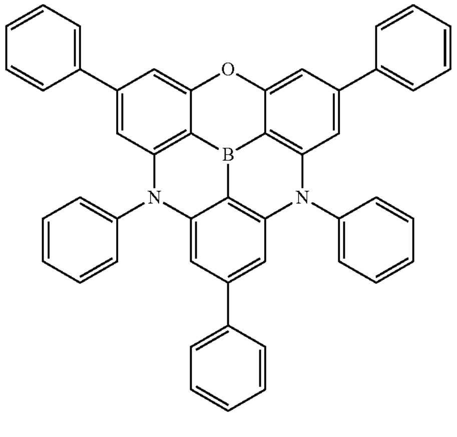

-continued

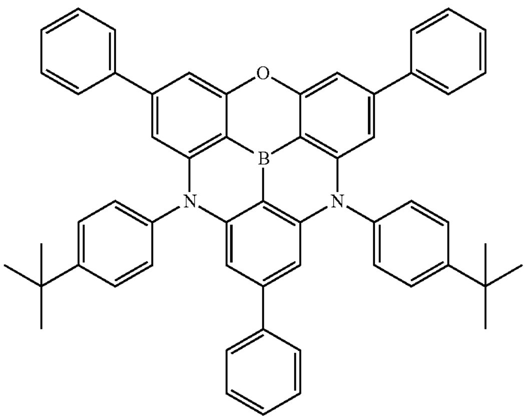

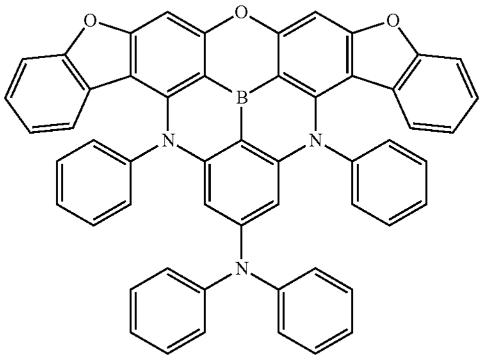

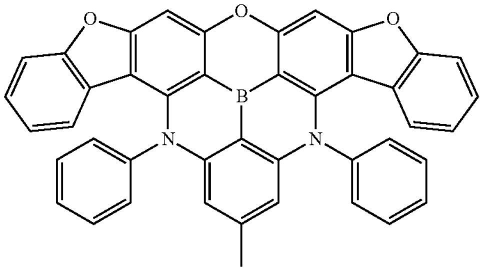

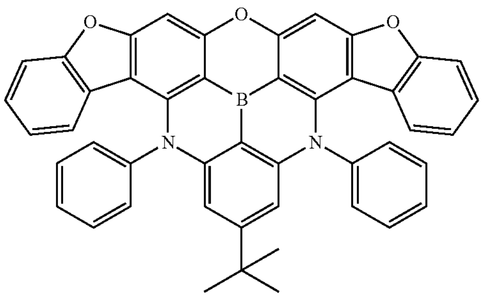

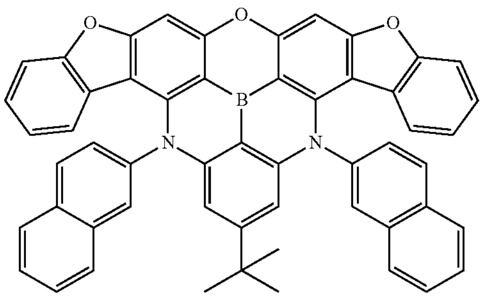

-continued

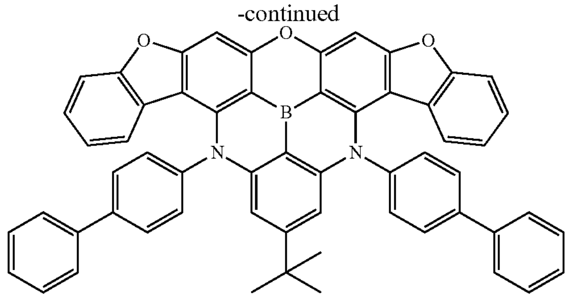

In the compounds above, D2 to D5 mean that two (2) to five (5) hydrogens each have been replaced with deuterium.

The compound represented by formula 3 according to the present disclosure can be prepared by a known synthetic method. For example, the compound of formula 3 may be synthesized in the methods described in KR 1876763 B1 (Jul. 11, 2018), JP 5935199 B2 (May 20, 2016), and KR 2017-0130434 A (Nov. 28, 2017), but is not limited thereto.

Hereinafter, an organic electroluminescent device to which an organic electroluminescent material including the compound represented by the aforementioned formula 1 and the compound represented by the aforementioned formula 2 and/or the aforementioned formula 3 is applied will be described with reference to the drawings.

Figure 2:
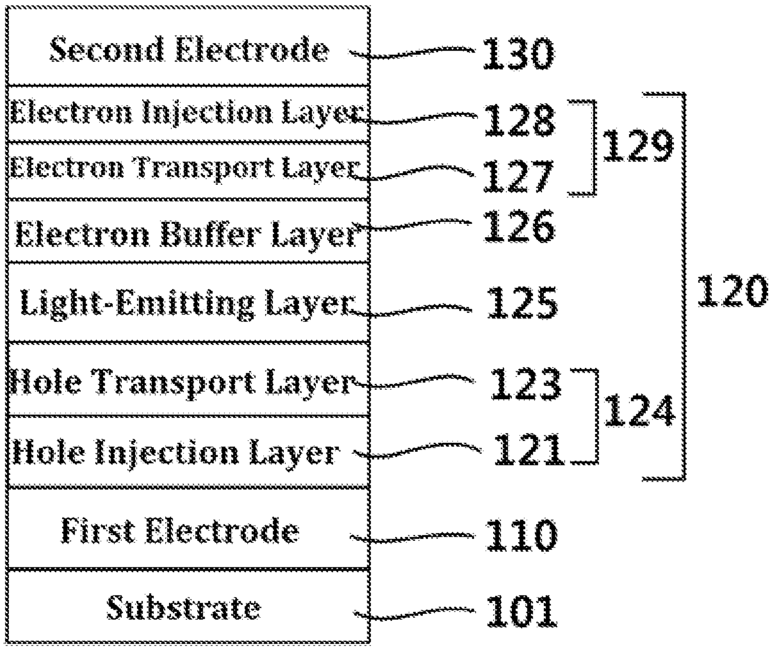
FIG. 2 shows an example of an organic electroluminescent device according to another embodiment of the present disclosure.

FIGS. 1 and 2 show an example of an OLED according to one embodiment, respectively.

Referring to FIG. 1, the OLED 100 according to one embodiment includes a first electrode 110 and a second electrode 130 facing each other on a substrate 101, and an organic layer 120 positioned between the first electrode 110 and the second electrode 130.

The organic layer 120 includes a light-emitting layer 125 between the first electrode 110 and the second electrode 130; and an electron buffer layer 126 and an electron transport zone 129 between the light-emitting layer 125 and the second electrode 130, and the electron buffer layer 126 includes a compound represented by formula 1, and the light-emitting layer 125 includes a compound represented by formula 2 and/or a compound represented by formula 3.

The electron buffer layer 126 is a layer for improving a problem in which a decrease in light-emitting luminance may occur due to a change in current properties in a device when exposed to high temperatures in a panel manufacturing process. The properties of a material included in the electron buffer layer are important. Further, the compound used in the electron buffer layer preferably plays a role of controlling electron injection according to the electron withdrawing property and the electron affinity LUMO (lowest unoccupied molecular orbital) energy value. Through this, it can play a role of improving the efficiency and lifespan of the organic electroluminescent device.

The light-emitting layer 125 is a layer in which light is emitted including a host and a dopant, and may be a single layer or a plurality of layers in which two or more layers are stacked. Wherein, the host mainly promotes recombination of electrons and holes, and has a function of confining excitons in the light-emitting layer, and the dopant has a function of efficiently emitting excitons obtained through recombination. The dopant compound of the light-emitting layer 125 may be doped in an amount of less than 25% by weight, preferably, less than 17% by weight, more preferably, less than 10% by weight with respect to the total amount of host compound and the dopant compound. According to one embodiment, the light-emitting layer 125 may include a compound represented by formula 2 as a host material, and further includes a compound represented by formula 3 as a dopant material.

One of the first electrode 110 and the second electrode 130 may be an anode and the other may be a cathode. Wherein, the first electrode 110 and the second electrode 130 may each be formed as a transmissive conductive material, a transflective conductive material, or a reflective conductive material. The organic electroluminescent device may be a top emission type, a bottom emission type, or a both-sides emission type according to the kinds of the material forming the first electrode 110 and the second electrode 130.

Referring to FIG. 2, the organic electroluminescent device 200 according to one embodiment may include a hole transport zone 124 between the anode and the light-emitting layer 125. The hole transport zone 124 includes a hole injection layer 121 and a hole transport layer 123. Although it is not shown in the Figure, an electron blocking layer or a combination thereof may be used.

The hole injection layer 121 may be formed of a plurality of layers for the purpose of lowering the hole injection barrier (or hole injection voltage) from the anode to the hole transport layer 123 or the electron blocking layer, and each layer includes two compounds simultaneously. In addition, the hole injection layer 121 may be doped with p-dopant. The electron blocking layer is positioned between the hole transport layer (or hole injection layer) and the light-emitting layer 125, and blocks overflow of electrons from the light-emitting layer 125 to confine excitons in the light-emitting layer to prevent a light-emitting leakage. A plurality of layers may be used for the hole transport layer 123 or the electron blocking layer, and a plurality of compounds may be used for each layer.

An electron buffer layer 126 and an electron transport zone 129 may include between the light-emitting layer 125 and the cathode. The electron transport zone 129 includes an electron transport layer 127 and an electron injection layer 128. Although it is not shown in the Figure, a hole blocking layer or a combination thereof may be used.

In the electron buffer layer 126, a plurality of layers may be used for the purpose of controlling electron injection and improving interfacial characteristics between the light-emitting layer 125 and the electron injection layer 128, and each layer may contain two compounds simultaneously. A plurality of layers may be used for the hole blocking layer or electron transport layer 127, and a plurality of compounds may be used for each layer. In addition, the electron injection layer 128 may be doped with n-dopant.

The organic electroluminescent device of the present disclosure may further include a light-emitting auxiliary layer placed between the anode and the light-emitting layer 125, or between the cathode and the light-emitting layer 125. When the light-emitting auxiliary layer is placed between the anode and the light-emitting layer, it can be used for promoting the hole injection and/or the hole transport, or for preventing the overflow of electrons. When the light-emitting auxiliary layer is placed between the cathode and the light-emitting layer, it can be used for promoting the electron injection and/or the electron transport, or for preventing the overflow of holes. In addition, the hole auxiliary layer may be placed between the hole transport layer (or hole injection layer) and the light-emitting layer, and may be effective to promote or block the hole transport rate (or the hole injection rate), thereby enabling the charge balance to be controlled. When an organic electroluminescent device includes two or more hole transport layers, the hole transport layer, which is further included, may be used as the hole auxiliary layer or the electron blocking layer. The light-emitting auxiliary layer, the hole auxiliary layer, or the electron blocking layer may have an effect of improving the efficiency and/or the lifespan of the organic electroluminescent device.

In the organic electroluminescent device of the present disclosure, preferably, at least one layer (hereinafter, "a surface layer") selected from a chalcogenide layer, a halogenated metal layer, and a metal oxide layer may be placed on an inner surface(s) of one or both of a pair of electrodes. Specifically, a chalcogenide (including oxides) layer of silicon and aluminum is preferably placed on an anode surface of an electroluminescent medium layer, and a halogenated metal layer or a metal oxide layer is preferably placed on a cathode surface of an electroluminescent medium layer. The operation stability for the organic electroluminescent device may be obtained by the surface layer. Preferably, the chalcogenide includes $SiO_X(1 \leq X \leq 2)$, $AlO_X$ $(1 \leq X \leq 1.5)$, SiON, SiAlON, etc.; the halogenated metal includes LIF, $MgF_2$, $CaF_2$, a rare earth metal fluoride, etc.; and the metal oxide includes $Cs_2O$, $Li_2O$, MgO, SrO, BaO, CaO, etc.

In addition, in the organic electroluminescent device of the present disclosure, a mixed region of an electron transport compound and a reductive dopant, or a mixed region of a hole transport compound and an oxidative dopant may be placed on at least one surface of a pair of electrodes. In this case, the electron transport compound is reduced to an anion, and thus it becomes easier to inject and transport electrons from the mixed region to an electroluminescent medium. Furthermore, the hole transport compound is oxidized to a cation, and thus it becomes easier to inject and transport holes from the mixed region to the electroluminescent medium. Preferably, the oxidative dopant includes various Lewis acids and acceptor compounds, and the reductive dopant includes alkali metals, alkali metal compounds, alkaline earth metals, rare-earth metals, and mixtures thereof. Also, a reductive dopant layer may be employed as a charge generating layer to prepare an organic electroluminescent device having two or more light-emitting layers and emitting white light.

The organic electroluminescent devices 100 and 200 of the present disclosure can be prepared by forming a first electrode 110 or a second electrode 130 on a substrate 101, forming an organic layer using any one of dry film-forming methods such as vacuum evaporation, sputtering, plasma, ion plating methods, etc., or wet film-forming methods such as ink jet printing, nozzle printing, slot coating, spin coating, dip coating, flow coating methods, etc., and then, forming the second electrode 130 or the first electrode 110 thereon.

When using a wet film-forming method, a thin film may be formed by dissolving or diffusing materials forming each layer into any suitable solvent such as ethanol, chloroform, tetrahydrofuran, dioxane, etc. The solvent may be any solvent where the materials forming each layer can be dissolved or diffused, and where there are no problems in film-formation capability.

In one embodiment, the present disclosure can provide display devices by using organic electroluminescent device comprising a compound represented by formula 1 and a compound represented by formula 2 and/or a compound represented by formula 3. That is, it is possible to manufacture a display device or a lighting device using the organic electroluminescent device of the present disclosure. Specifically, the organic electroluminescent device of the present disclosure can be used for the manufacture of display devices such as White Organic Light Emitting Device, smartphones, tablets, notebooks, PCs, TVs, or display devices for vehicles, or lighting devices such as outdoor or indoor lighting.

Hereinafter, the preparation method of an organic electroluminescent device (OLED) comprising the aforementioned organic electroluminescent material, and the properties thereof will be explained in order to understand the present disclosure in detail.

[Device Examples 1 to 3] Producing OLEDs Comprising a Compound According to the Present Disclosure OLEDs comprising the organic electroluminescent material according to the present disclosure were produced. First, a transparent electrode indium tin oxide (ITO) thin film (10 Ω/sq) on a glass substrate for an OLED (GEOMATEC CO., LTD., Japan) was subjected to an ultrasonic washing with acetone, ethanol and distilled water, sequentially, and thereafter was stored in isopropanol and then used. After evacuating until the degree of vacuum in the chamber reaches 10-6 torr, the ITO substrate was mounted on a substrate holder of a vacuum vapor deposition apparatus. Then, compound HT-1 was introduced into a cell of the vacuum vapor deposition apparatus, and compound HI was introduced into another cell of the vacuum vapor deposition apparatus. The two materials were evaporated and compound HI was deposited in a doping amount of 3 wt % based on the total amount of compound HT-1 and compound HI to form a hole injection layer having a thickness of 10 nm on the ITO substrate. Next, compound HT-1 in a cell of the vacuum vapor deposition apparatus was evaporated to deposit a first hole transport layer having a thickness of 80 nm on the hole injection layer. Next, compound HT-2 was then introduced into another cell of the vacuum vapor deposition apparatus and was evaporated by applying an electric current to the cell, thereby depositing a second hole transport layer having a thickness of 5 nm on the first hole transport layer. After forming the hole injection layer and the hole transport layers, a light-emitting layer was formed thereon as follows: Compound H1-1 was introduced into a cell of the vacuum vapor deposition apparatus as a host of the light-emitting layer, and compound BD01 was introduced into another cell as a dopant. The two materials were evaporated and the dopant was deposited in a doping amount of 2 wt % based on the total amount of the host and dopant to form a light-emitting layer having a thickness of 20 nm on the second hole transport layer. Next, the compound described in the following Table 1 was deposited as an electron buffer layer having a thickness of 5 nm. Next, compound EI-1 and compound ET-1 in another two cells were evaporated at a rate of 1:1 to deposit an electron transport layer having a thickness of 30 nm on the electron buffer layer. Next, after depositing compound EI-1 as an electron injection layer having a thickness of 2 nm, an Al cathode having a thickness of 80 nm was deposited by another vacuum vapor deposition apparatus. Thus, OLEDs were produced.

[Comparative Example 1] Preparation of an OLED that does not Include the Electron Buffer Layer An OLED was produced in the same manner as in Device Example 1, except that no electron buffer layer was deposited.

The driving voltage, the current efficiency, the luminous efficiency, and the CIE color coordinates at a luminance of 1,000 nits, and the time taken to reduce from 100% to 95% at a luminance of 1,280 nits (lifespan; T95) of the organic electroluminescent device according to Device Examples 1 to 3 and Comparative Example 1 produced as described above, are measured, and the results thereof are shown in the following Table 1.

TABLE 1

| | Host:Dopant | Material for Electron Buffer Layer | Driving Voltage (V) | Current Efficiency (cd/A) | CIE Color Coordinates (x, y) | Luminous Efficiency (Eff/y) | Lifespan (T95, hr) |
|---|---|---|---|---|---|---|---|
| Device Example 1 | H1-1:BD01 | H1-58 | 4.0 | 4.8 | (0.139, 0.059) | 81.4 | 36.7 |
| Device Example 2 | H1-1:BD01 | H1-203 | 4.1 | 4.7 | (0.139, 0.063) | 74.6 | 36.7 |
| Device Example 3 | H1-1:BD01 | H1-278 | 4.1 | 4.7 | (0.139, 0.060) | 78.3 | 41.9 |
| Comparative Example 1 | H1-1:BD01 | — | 4.3 | 4.2 | (0.138, 0.059) | 71.2 | 28.5 |

[Device Examples 4 to 7] Producing OLEDs Comprising a Compound According to the Present Disclosure OLEDs were produced in the same manner as in Device Example 1, except that compound BD02 was used as the dopant and the compound described in the following Table 2 was used as the material for electron buffer layer.

The driving voltage, the current efficiency, the luminous efficiency, and the CIE color coordinates at a luminance of 1,000 nits, and the time taken to reduce from 100% to 95% at a luminance of 1,650 nits (lifespan; T95) of the organic electroluminescent device according to Device Examples 4 to 7 produced as described above, are measured, and the results thereof are shown in the following Table 2.

TABLE 2

| | Host:Dopant | Material for Electron Buffer Layer | Driving Voltage (V) | Current Efficiency (cd/A) | CIE Color Coordinates (x, y) | Luminous Efficiency (Eff/y) | Lifespan (T95, hr) |
|---|---|---|---|---|---|---|---|
| Device Example 4 | H1-1:BD02 | H1-98 | 4.0 | 5.8 | (0.132, 0.078) | 74.4 | 68.8 |
| Device Example 5 | H1-1:BD02 | H1-254 | 4.0 | 5.5 | (0.131, 0.082) | 67.1 | 107.4 |
| Device Example 6 | H1-1:BD02 | H1-179 | 3.9 | 5.8 | (0.131, 0.081) | 71.6 | 74.3 |
| Device Example 7 | H1-1:BD02 | H1-180 | 4.1 | 5.3 | (0.132, 0.078) | 67.9 | 119.9 |

It was confirmed that an organic electroluminescent device manufactured by using a specified combination of a host and a dopant material of a light-emitting layer and a material for an electron buffer layer according to the present disclosure has a longer lifespan, a lower driving voltage, and/or high current efficiency and luminous efficiency than a conventional organic electroluminescent device that does not include an electron buffer layer. In addition, due to the combination according to one embodiment of the present disclosure, the electron buffer layer can induce a combination of charge carriers into the light emitting layer by reducing the electron injection barrier, thereby providing a blue light emitting organic electroluminescent device with high current efficiency and luminous efficiency, and a long lifespan.

The compounds used in Device Examples 1 to 7 and Comparative Example 1 above are specifically shown in the following Table 3.

TABLE 3

| | |
|---|---|
| Hole Injection Layer/ Hole Transport Layer | 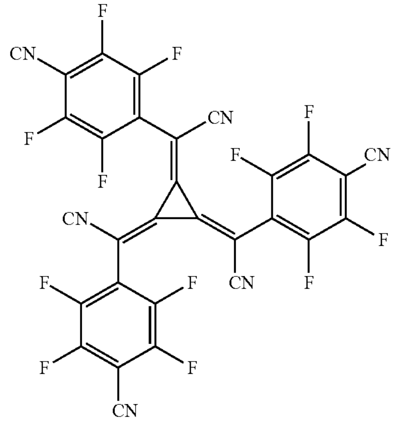 HI 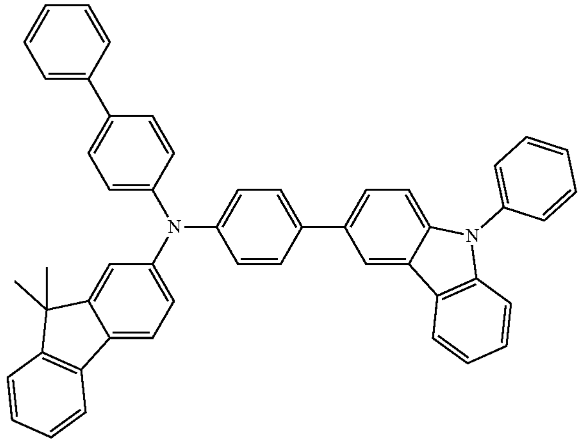 HT-1 |

TABLE 3-continued
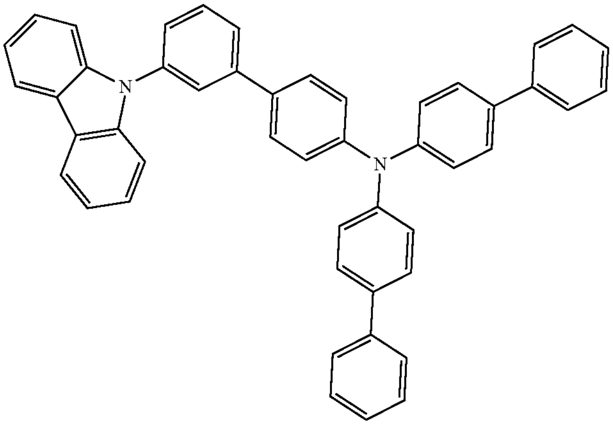
HT-2
Light-Emitting Layer
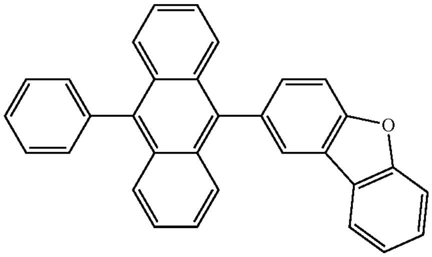
H1-1
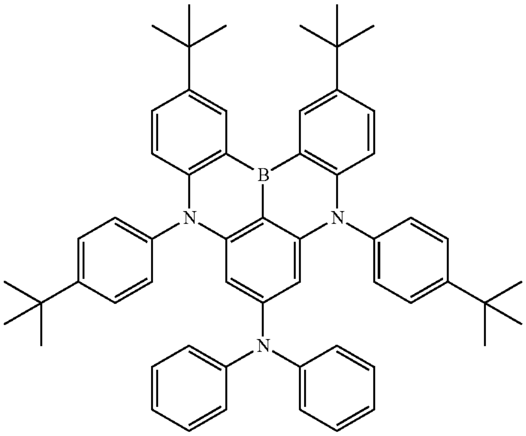
BD01
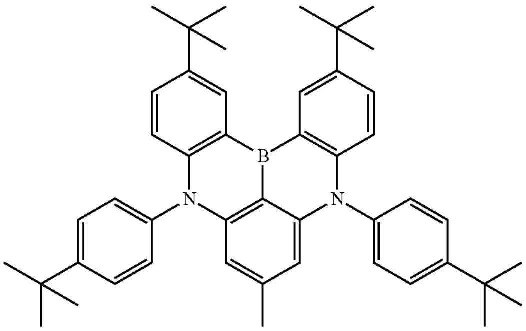
BD02

TABLE 3-continued
| | |
|---|---|
| Electron Buffer layer | 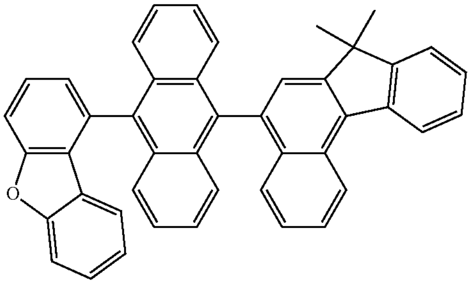 H1-58 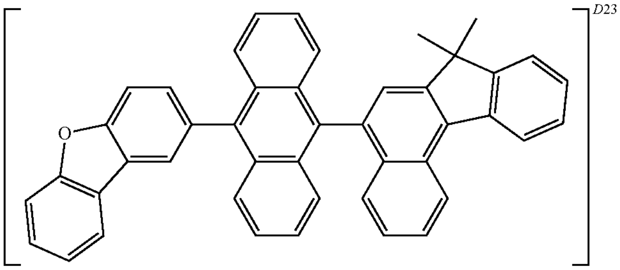 H1-203 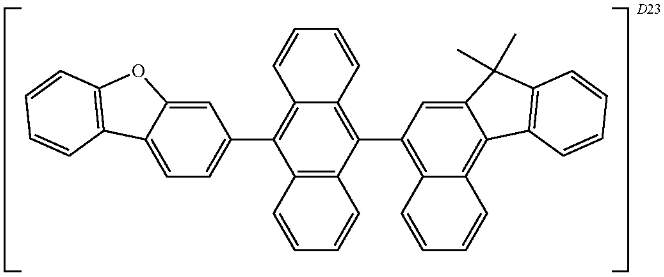 H1-278 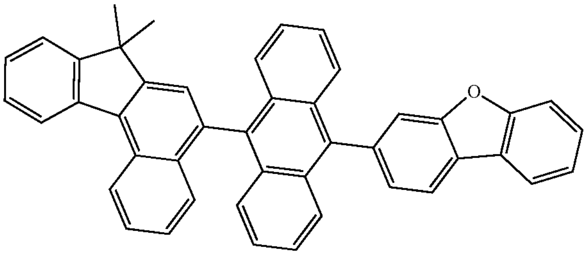 H1-98 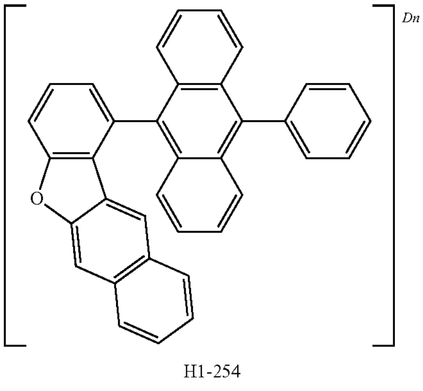 H1-254 |

TABLE 3-continued
| | |
|---|---|
| | 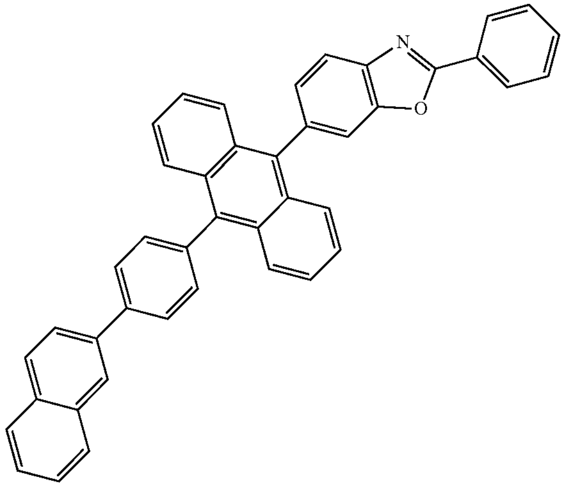 H1-179 |
| | 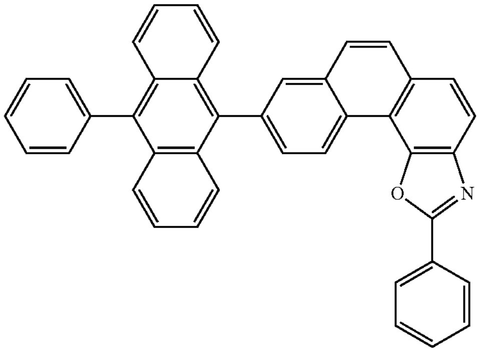 H1-180 |
| Electron Transport Layer/ Electron Injection Layer | 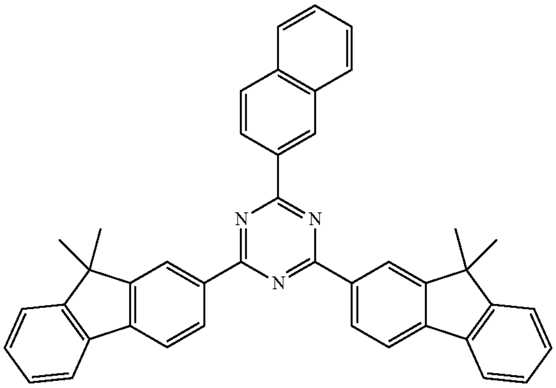 ET-1 |
| | 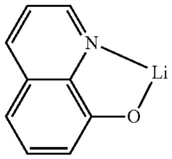 EI-1 |
DESCRIPTION OF SYMBOL
100, 200: organic electroluminescent device
101: Substrate
110: First Electrode
120: Organic Layer
121: Hole Injection Layer
123: Hole Transport Layer

124: Hole Transport Zone

125: Light-Emitting Layer

126: Electron Buffer Layer

127: Electron Transport Layer

128: Electron Injection Layer

129: Electron Transport Zone

130: Second Electrode

The invention claimed is:

1. An organic electroluminescent device comprising a first electrode; a second electrode facing the first electrode; a light-emitting layer between the first electrode and the second electrode; and an electron buffer layer and an electron transport zone between the light-emitting layer and the second electrode, wherein the electron buffer layer comprises a compound represented by the following formula 1-3:

(1-3)

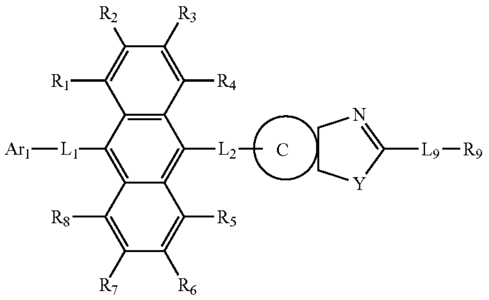

Wherein $R_1$ to $R_6$ each independently represent hydrogen or deuterium;

$L_1$ represents a single bond, or a substituted or unsubstituted (C6-C30)arylene, $L_2$ represents a single bond, a substituted or unsubstituted (C6-C30)arylene, or a substituted or unsubstituted (3- to 30-membered)heteroarylene;

$Ar_1$ represents a substituted or unsubstituted (C6-C30) aryl;

Y represents O or S;

Ring C represents a substituted or unsubstituted benzene ring, a substituted or unsubstituted naphthalene ring, or a substituted or unsubstituted phenanthrene ring;

$L_9$ represents a single bond, a substituted or unsubstituted (C6-C30)arylene, or a substituted or unsubstituted (3- to 30-membered)heteroarylene; and $R_9$ represents a substituted or unsubstituted (C6-C30)aryl or a substituted or unsubstituted (3- to 30-membered) heteroaryl.

2. An organic electroluminescent device comprising a first electrode; a second electrode facing the first electrode; a light-emitting layer between the first electrode and the second electrode; and an electron buffer layer and an electron transport zone between the light-emitting layer and the second electrode, wherein the electron buffer layer comprises a compound selected from the following compounds:

H1-26

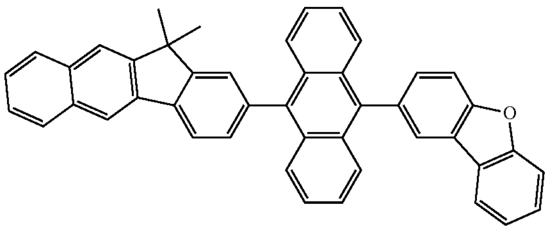

H1-27

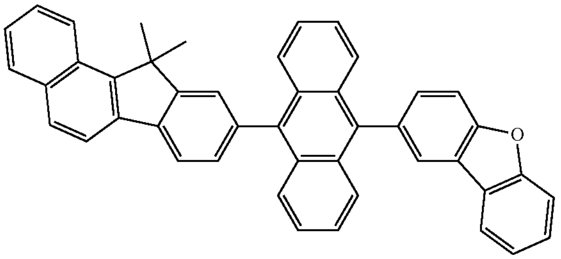

H1-28

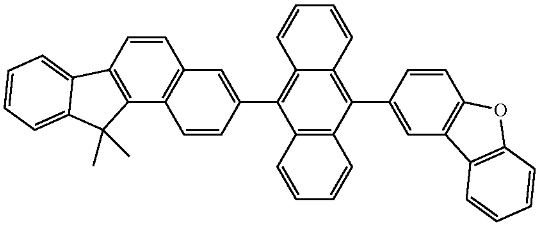

H1-29

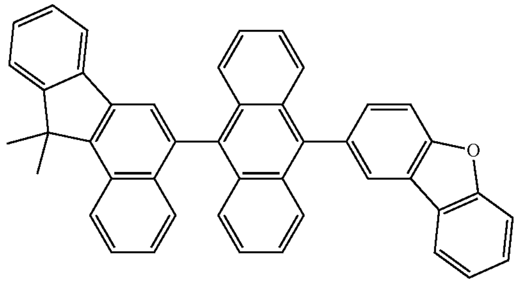

H1-30

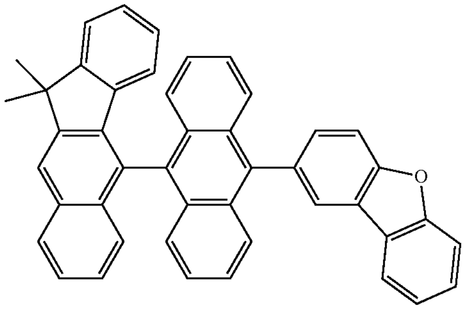

-continued
H1-37
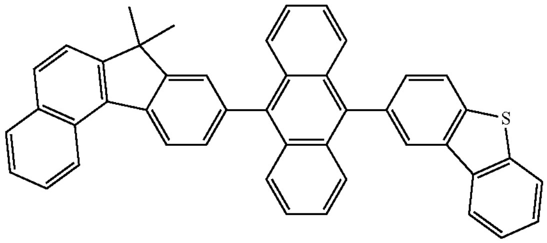
H1-38
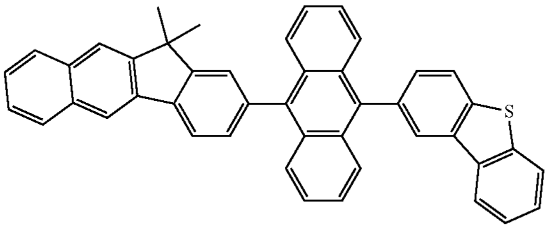
H1-39
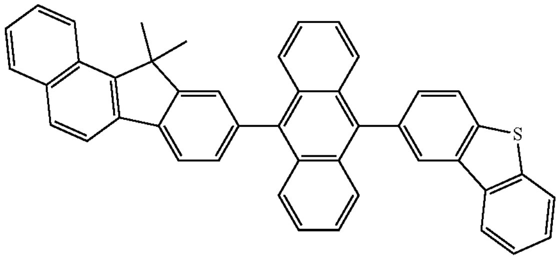
H1-40
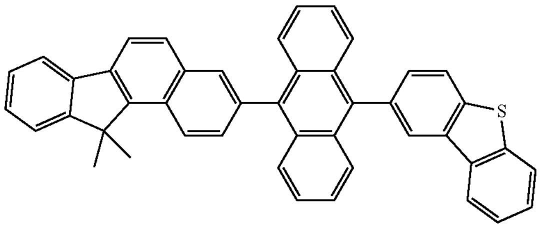
H1-65
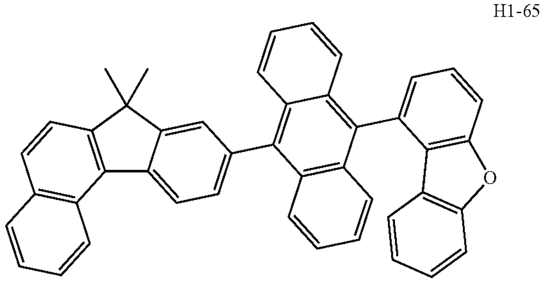
-continued
H1-66
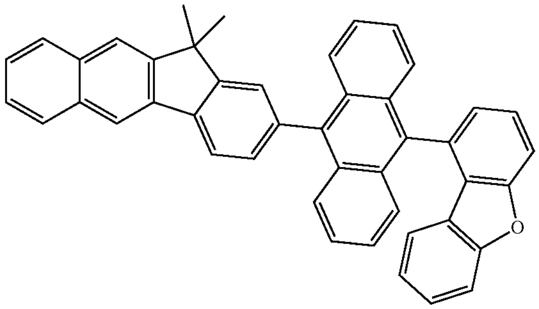
H1-67
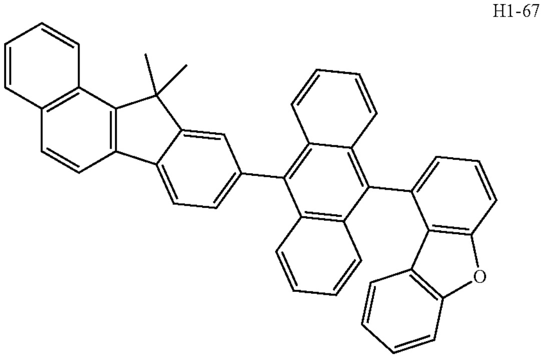
H1-68
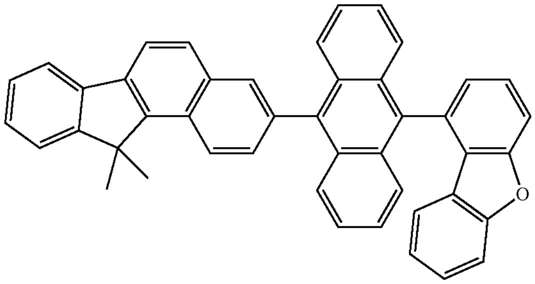
H1-69
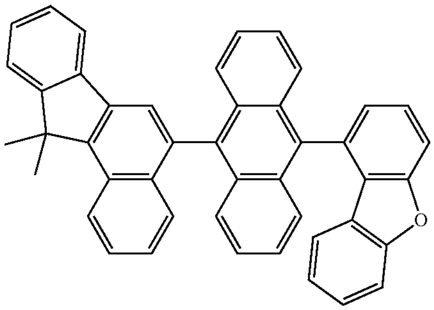

-continued
H1-70
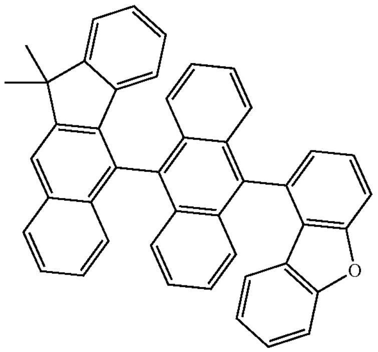
H1-77
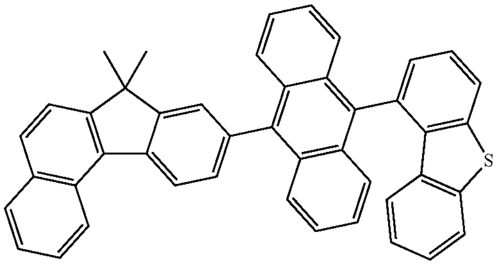
H1-78
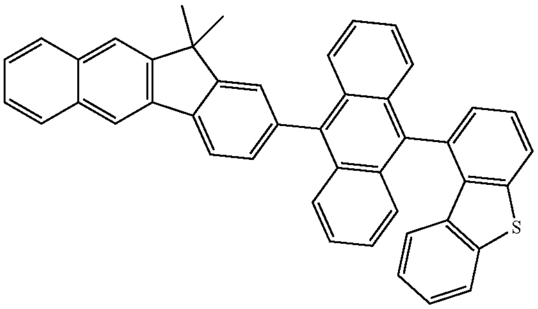
H1-79
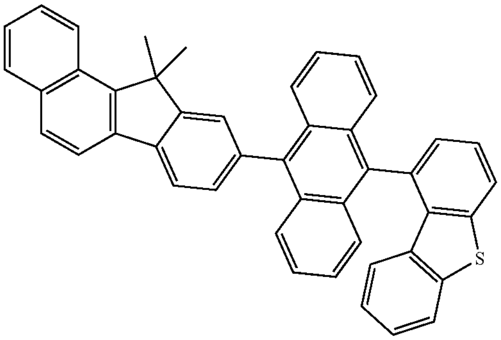
-continued
H1-80
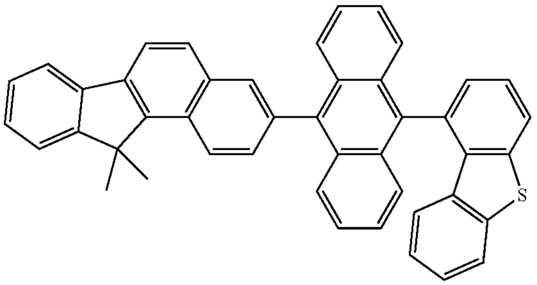
H1-105
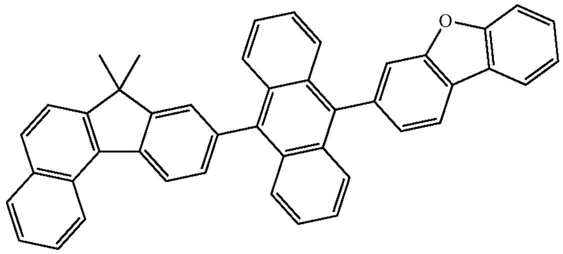
H1-106
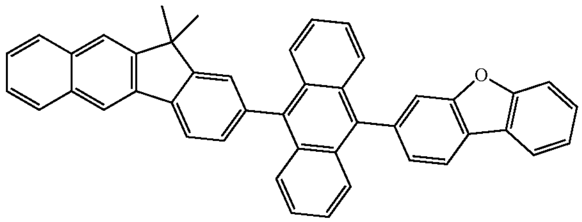
H1-107
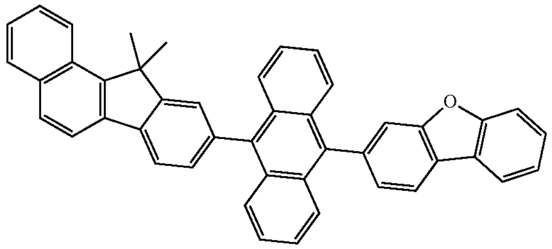
H1-108
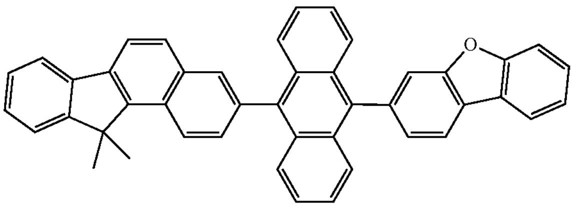
H1-109
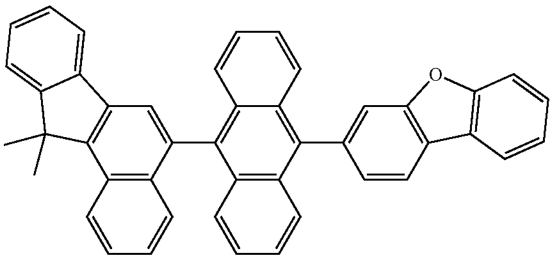

-continued
H1-110
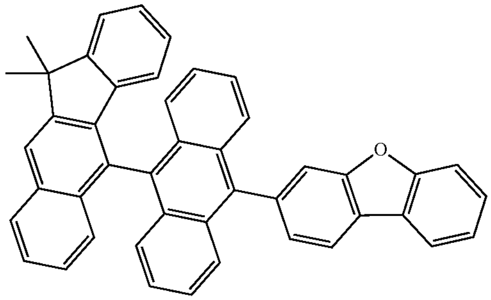
H1-117
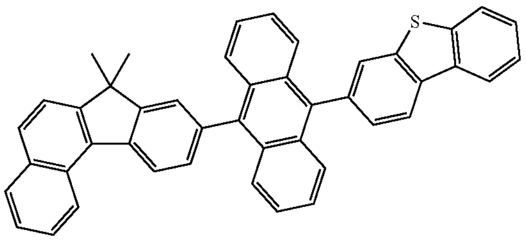
H1-118
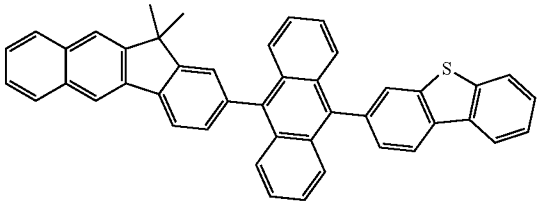
H1-119
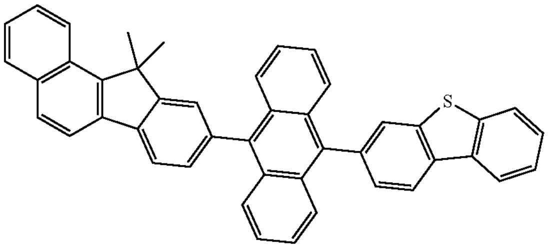
H1-120
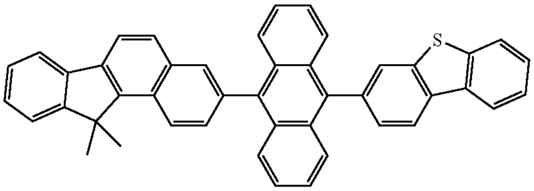
H1-135
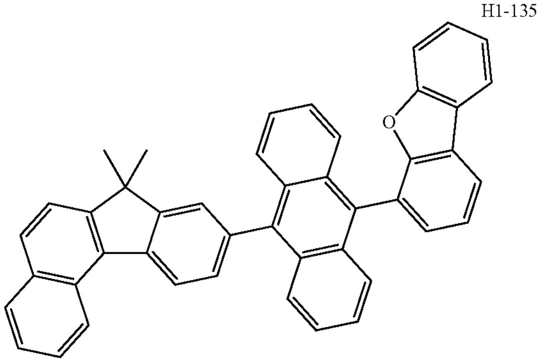
-continued
H1-36
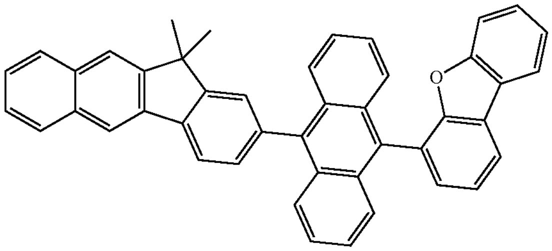
H1-37
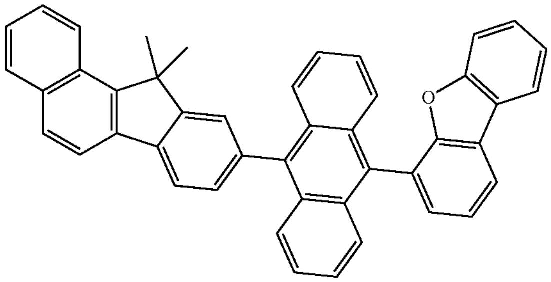
H1-138
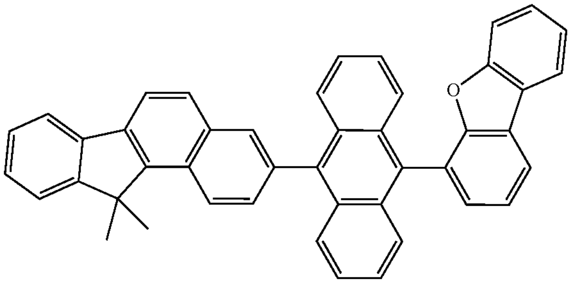
H1-139
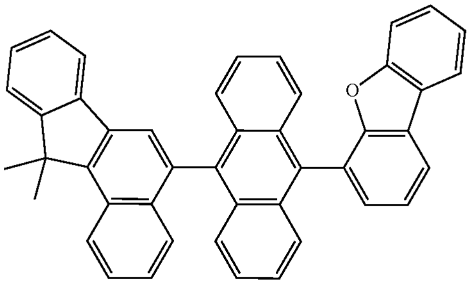
H1-140
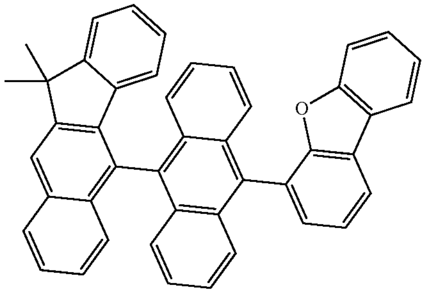

H1-147
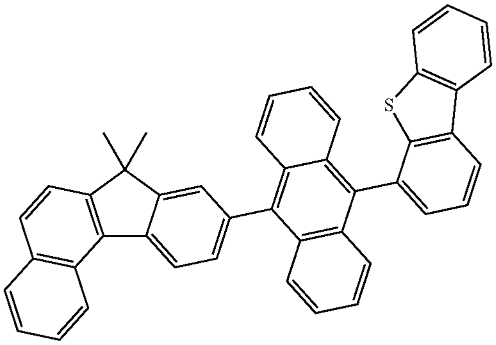
H1-148
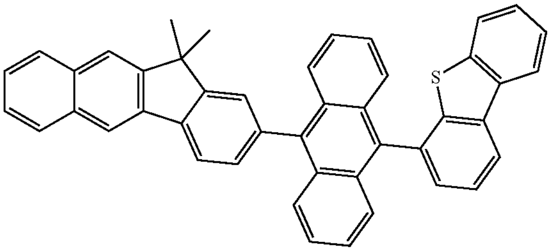
H1-149
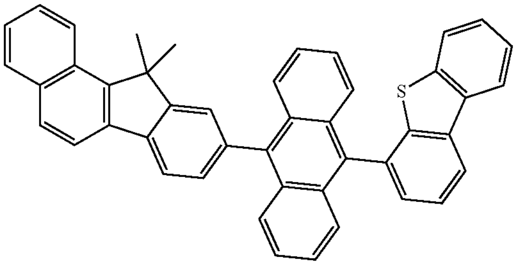
H1-150
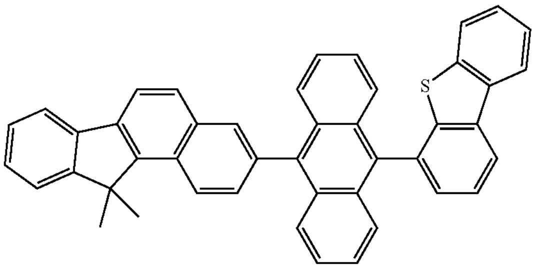
H1-201
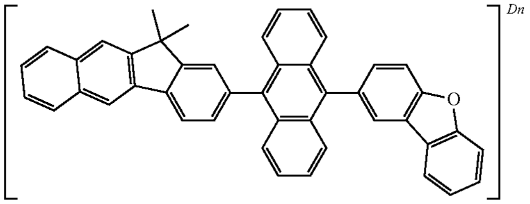
H1-202
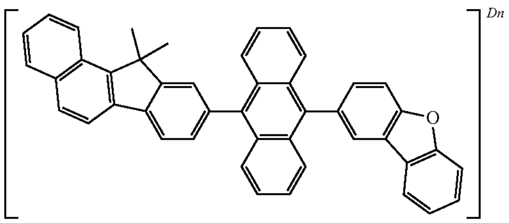
H1-203
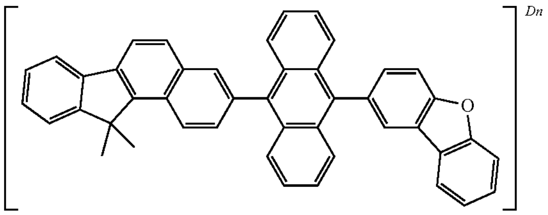
H1-204
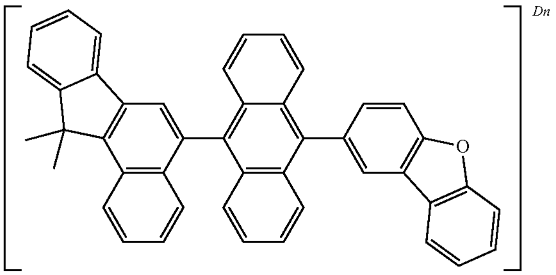
H1-205
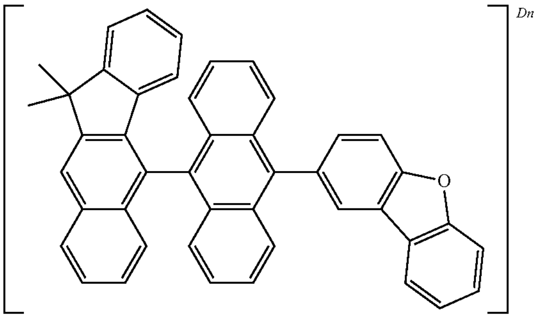
H1-212
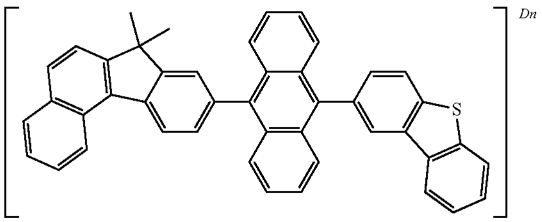

-continued
H1-213
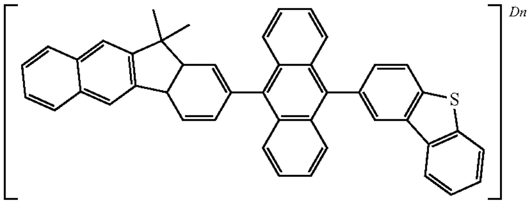
H1-214
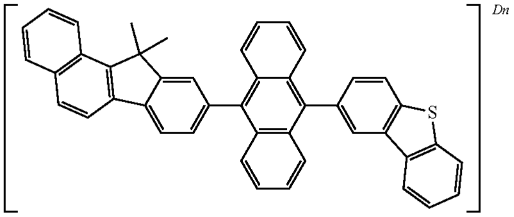
H1-215
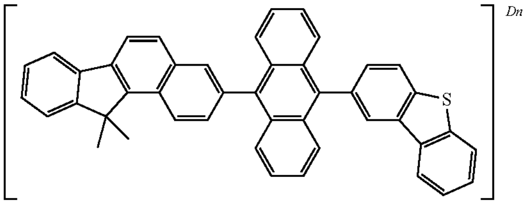
H1-240
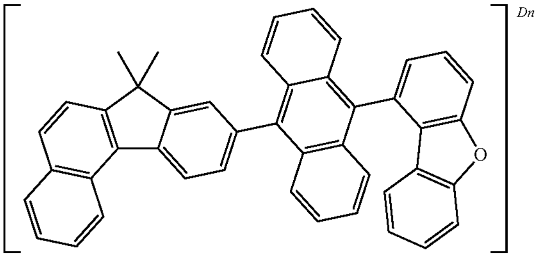
H1-241
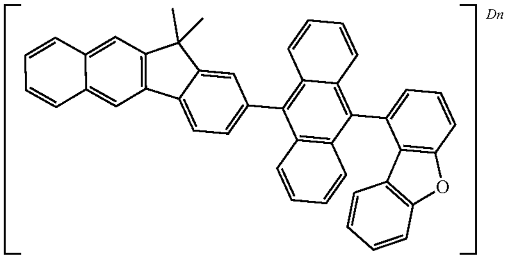
-continued
H1-242
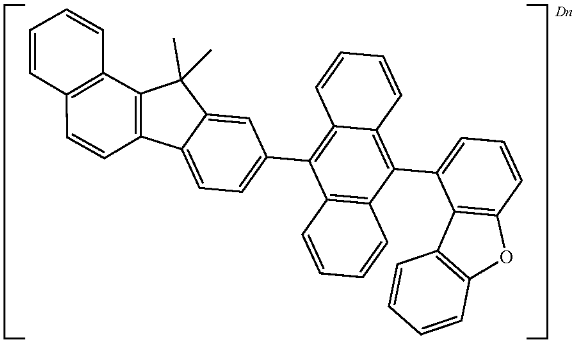
H1=243
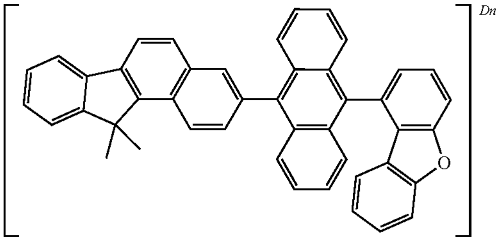
H1-244
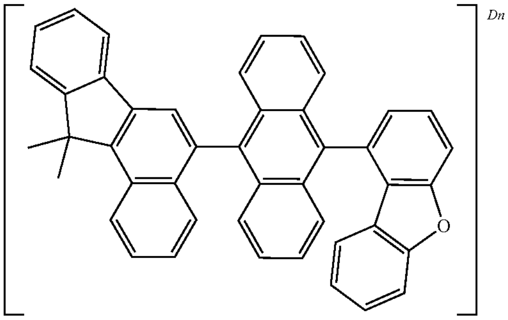
H1-245
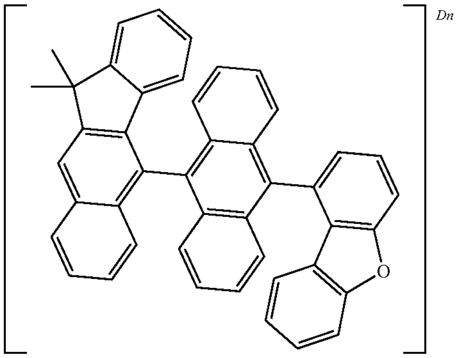

-continued
H1-252
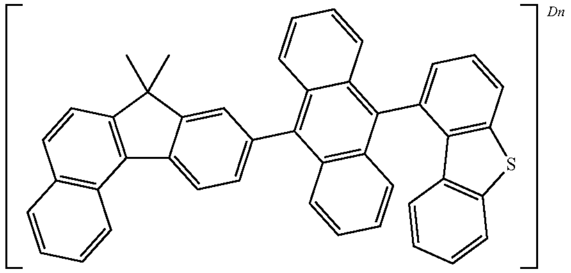
H1-253
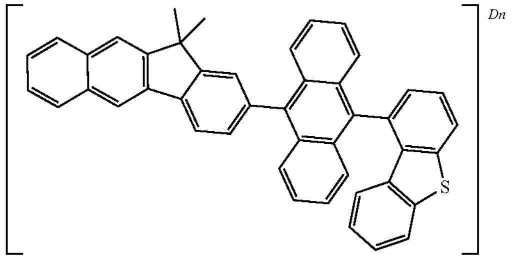
H1-254
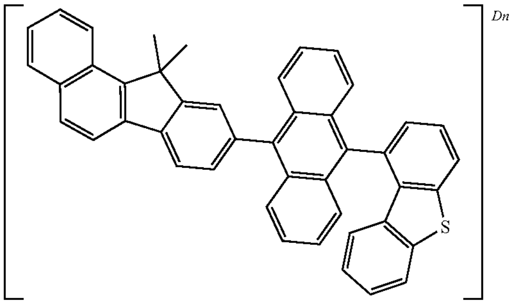
H1-255
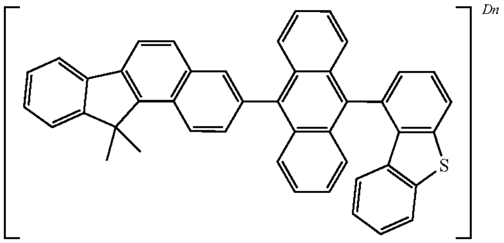
H1-280
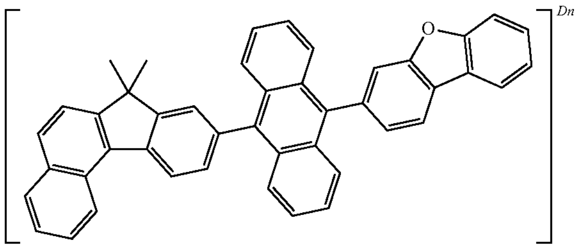
-continued
H1-281
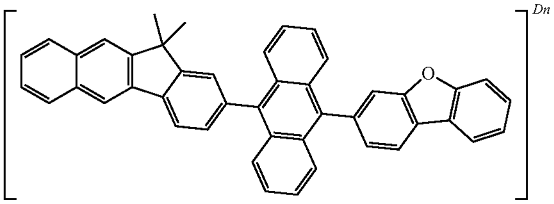
H1-282
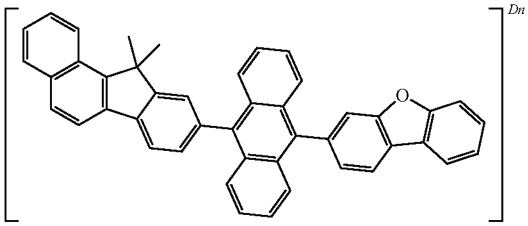
H1-283
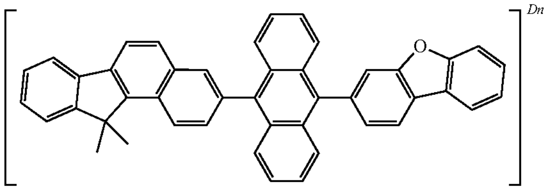
H1-284
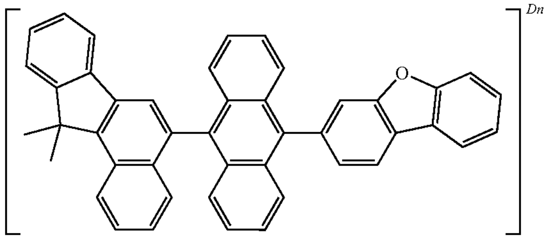
H1-285
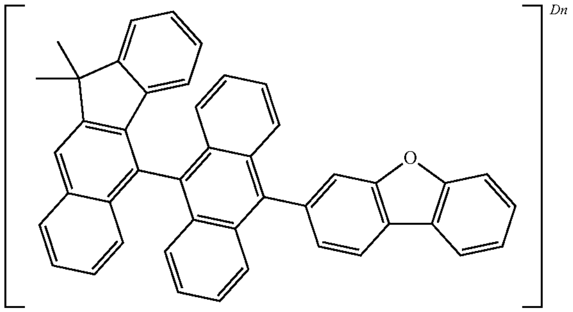
H1-292
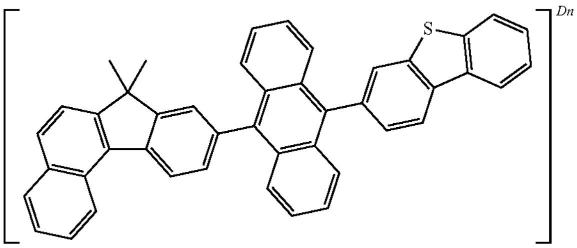

-continued

H1-293

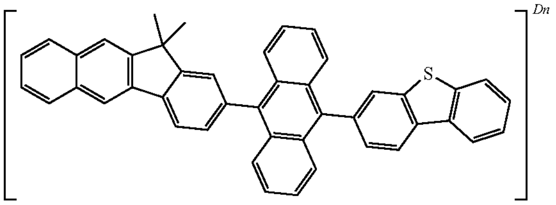

H1-294

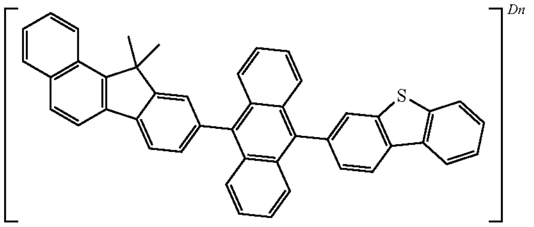

H1-295

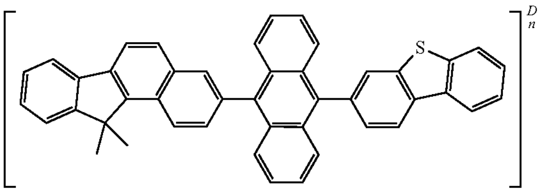

wherein

Dn means that n number of hydrogens is replaced with deuterium, wherein n represents an integer of 1 or more.

3. An organic electroluminescent device comprising a first electrode; a second electrode facing the first electrode; a light-emitting layer between the first electrode and the second electrode; and an electron buffer layer and an electron transport zone between the light-emitting layer and the second electrode, wherein the electron buffer layer comprises a compound represented by the following formula 1-1:

(1-1)

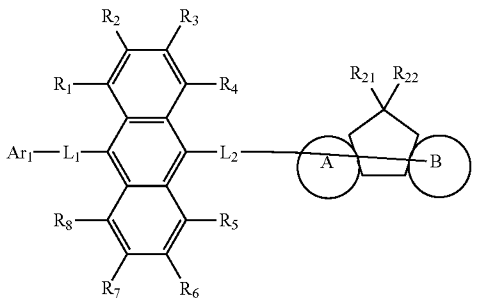

wherein $L_1$ represents a single bond;

$L_2$ represents a single bond, a substituted or unsubstituted (C6-C30)arylene, or a substituted or unsubstituted (3- to 30-membered)heteroarylene;

$Ar_1$ represents a substituted or unsubstituted (3- to 30-membered)heteroaryl; and $R_1$ to $R_8$ each independently represent hydrogen or deuterium;

Ring A and Ring B each independently represent a substituted or unsubstituted benzene ring or a substituted or unsubstituted naphthalene ring; and $R_{21}$ and $R_{22}$ each independently represent hydrogen, deuterium, a substituted or unsubstituted (C1-C30)alkyl, a substituted or unsubstituted (C6-C30)aryl, a substituted or unsubstituted (3- to 30-membered)heteroaryl, or a substituted or unsubstituted (C3-C30)cycloalkyl; or may be linked to the adjacent substituent to form a ring(s);

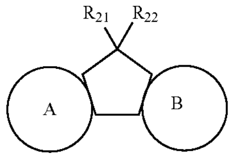

is selected from the following Group 1:

[Group 1]

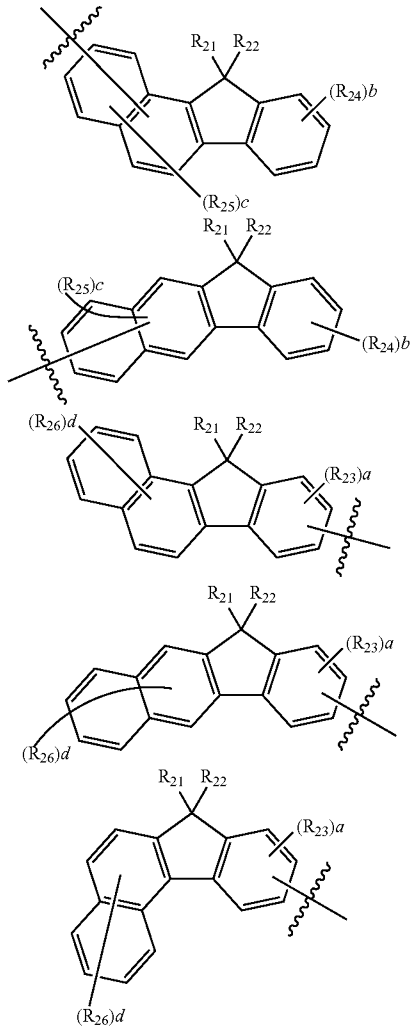

wherein $R_{23}$ to $R_{26}$ each independently represent hydrogen, deuterium, halogen, cyano, a substituted or unsubstituted (C1-C30)alkyl, a substituted or unsubstituted (C6-C50) aryl, a substituted or unsubstituted (3- to 30-membered) heteroaryl, or a substituted or unsubstituted (C3-C30) cycloalkyl; or may be linked to the adjacent substituent to form a ring(s);

a represents an integer of 1 to 3, b represents an integer of 1 to 4, c represents an integer of 1 to 5, and d represents an integer of 1 to 6; and when a to d are an integer of 2 or more, each of $R_{23}$ to $R_{26}$ may be the same or different; wherein the light-emitting layer comprises a compound selected from the following compounds:

H1-1

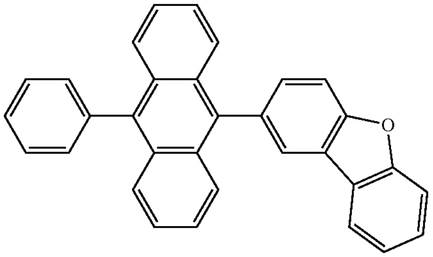

H1-2

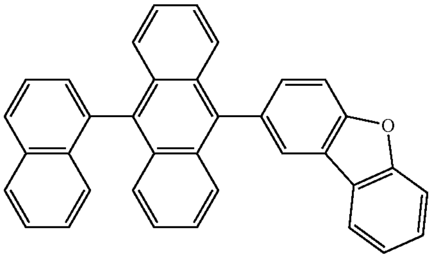

H1-3

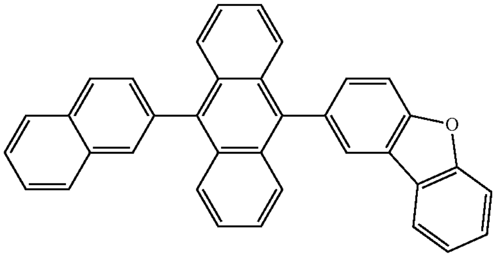

H1-4

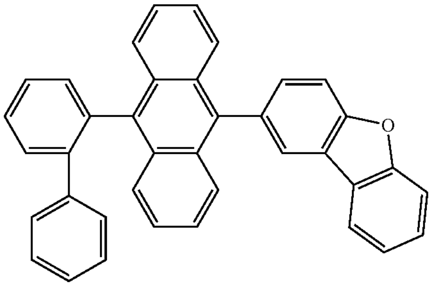

-continued

H1-5

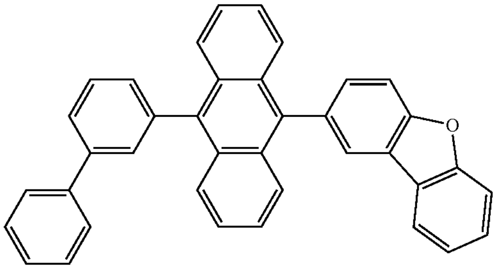

H1-6

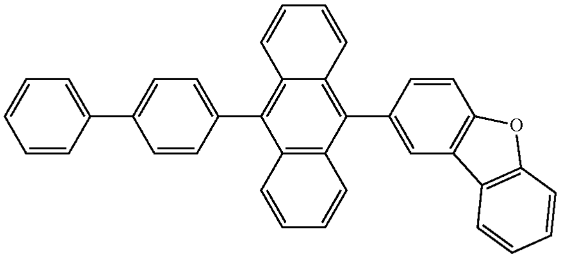

H1-7

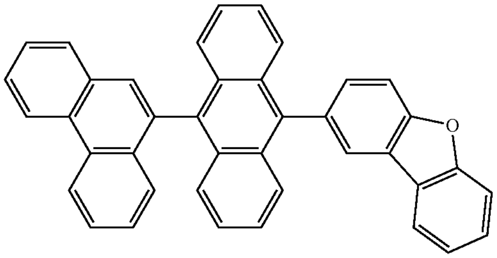

H1-8

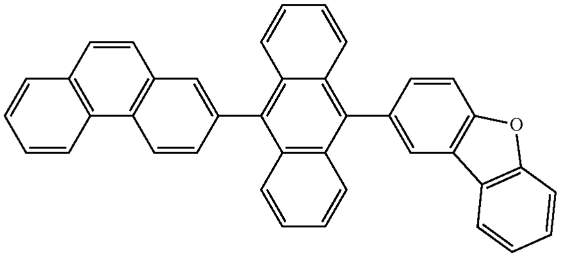

H1-9

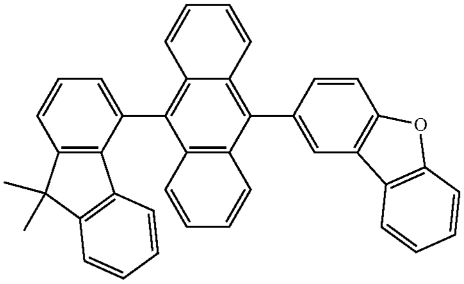

-continued
H1-10
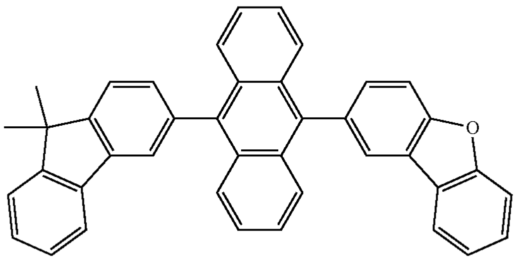
H1-11
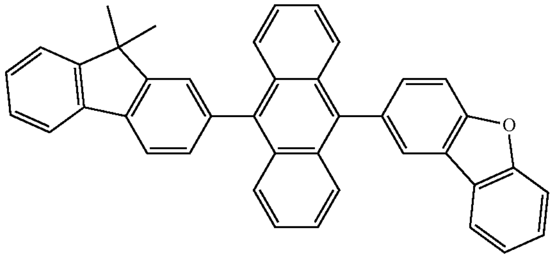
H1-12
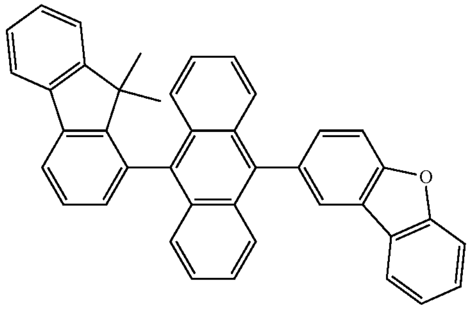
H1-13
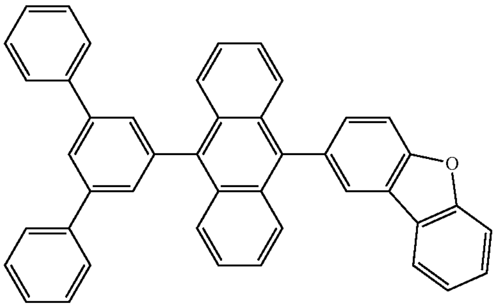
H1-14
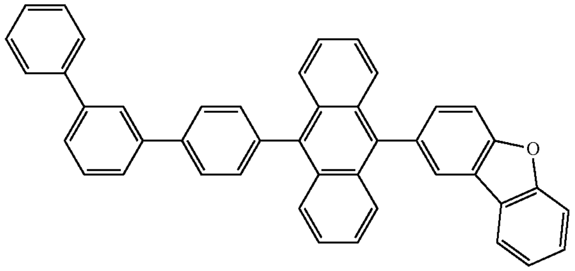
-continued
H1-15
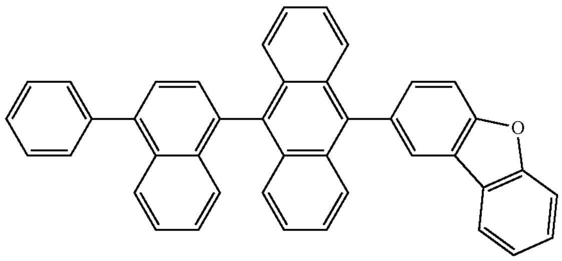
H1-16
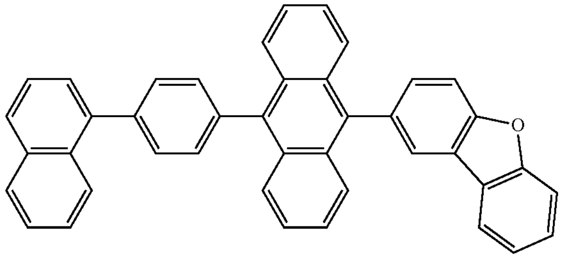
H1-17
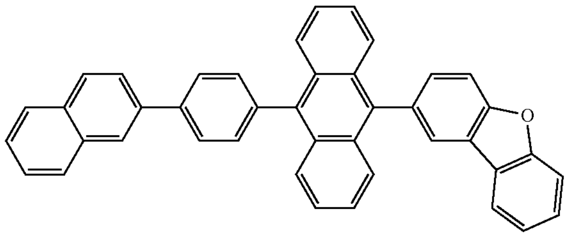
H1-18
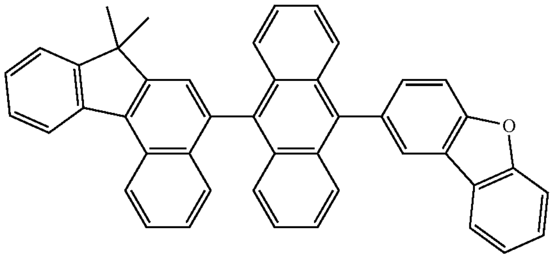
H1-19
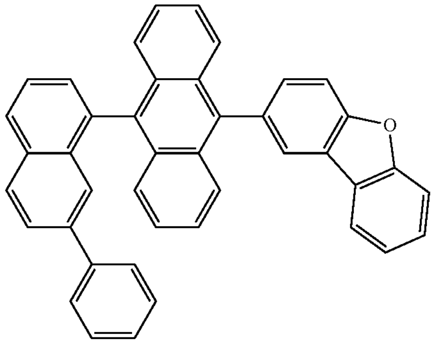

-continued
H1-20
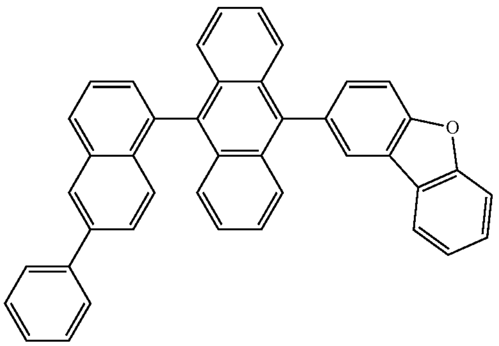
H1-21
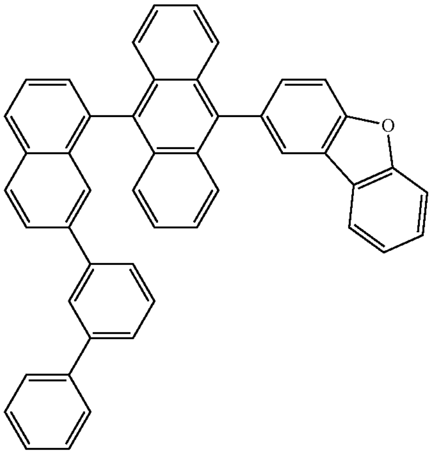
H1-22
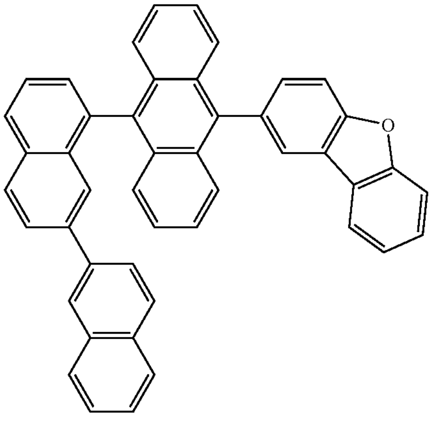
H1-23
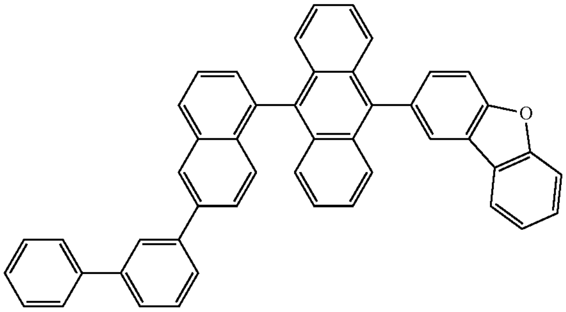
-continued
H1-24
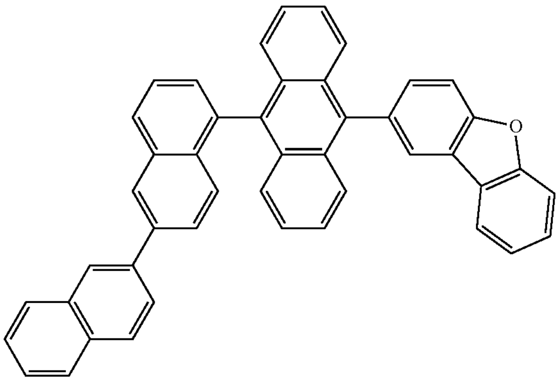
H1-25
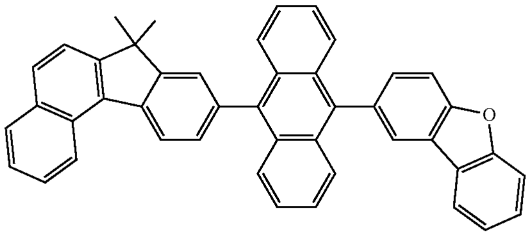
H1-26
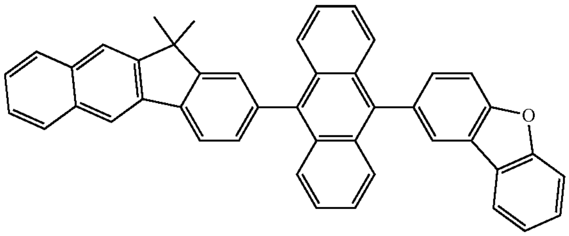
H1-27
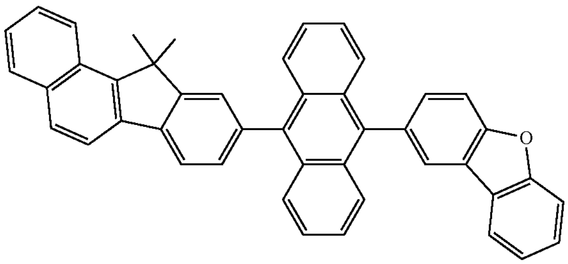
H1-28
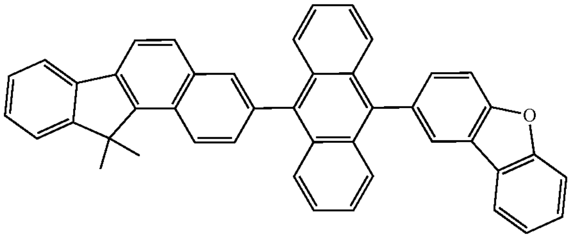

-continued
H1-29
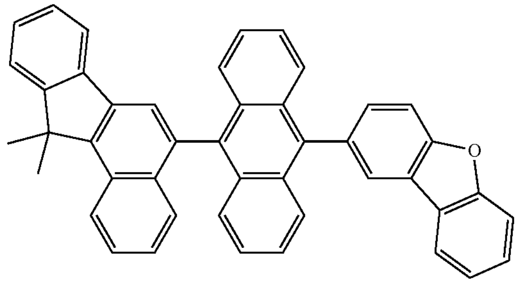
H1-30
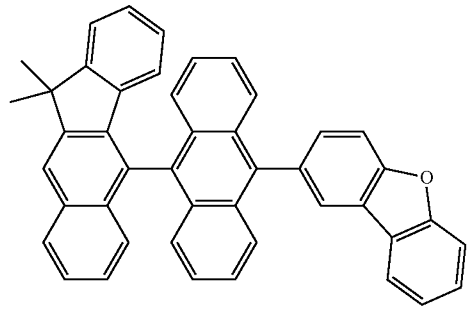
H1-31
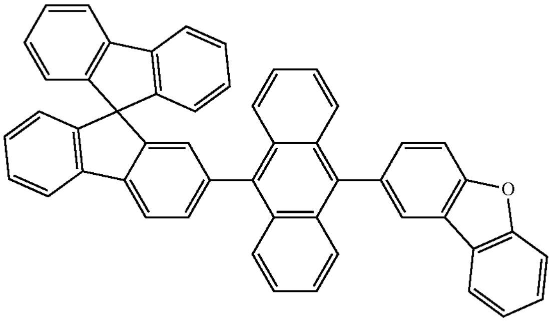
H1-32
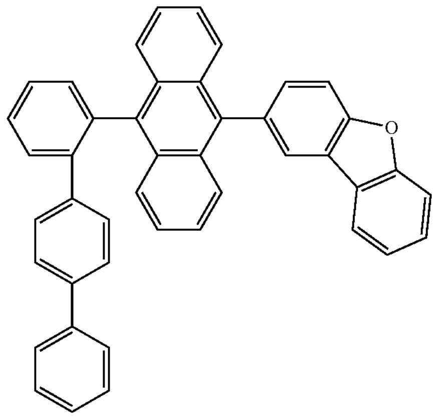
-continued
H1-33
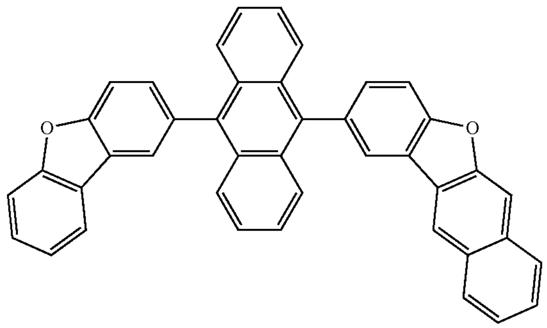
H1-34
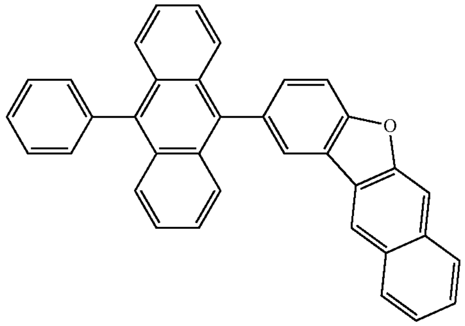
H1-35
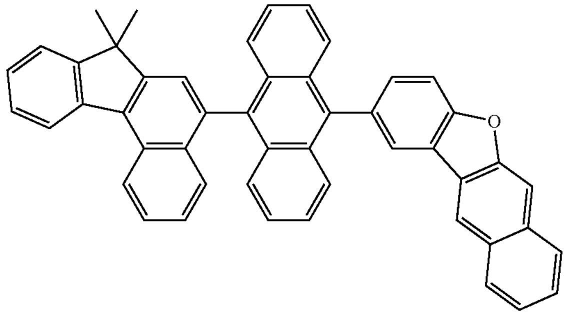
H1-36
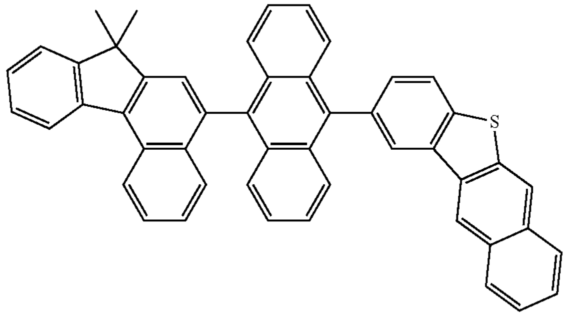
H1-37
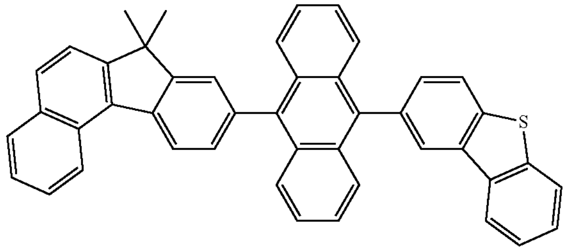

-continued
H1-38
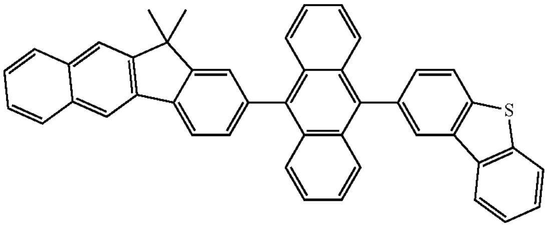
H1-39
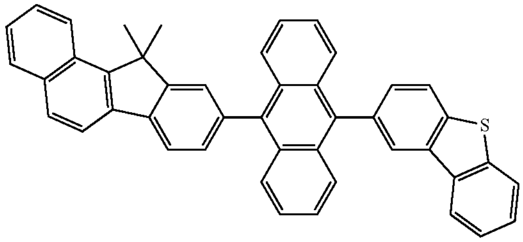
H1-40
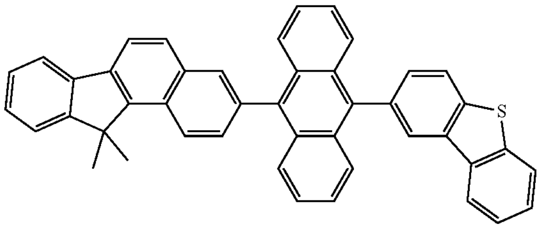
H1-41
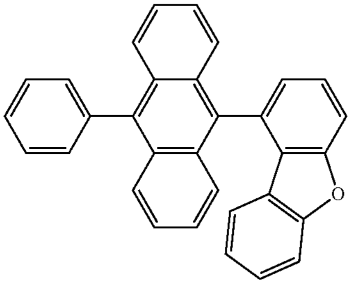
H1-42
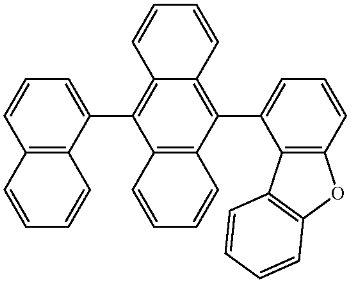
H1-43
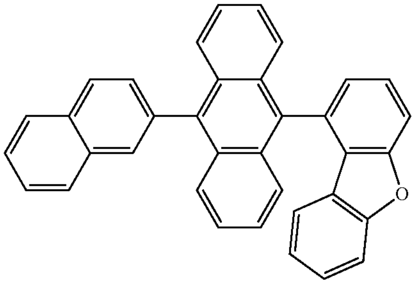
-continued
H1-44
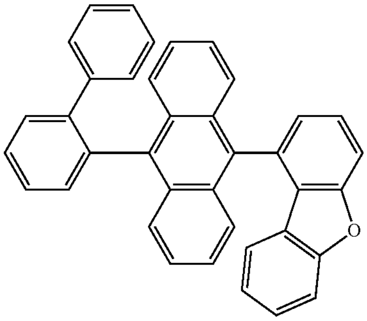
H1-45
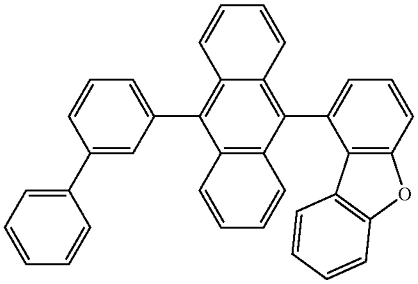
H1-46
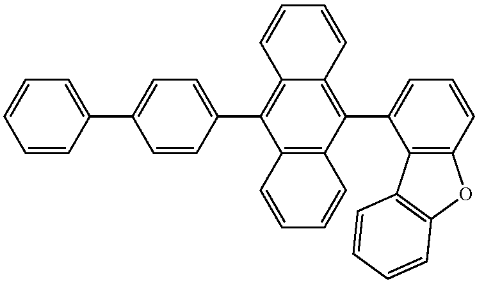
H1-47
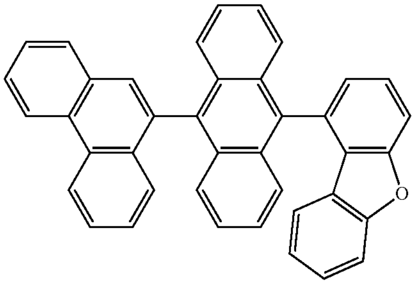
H1-48
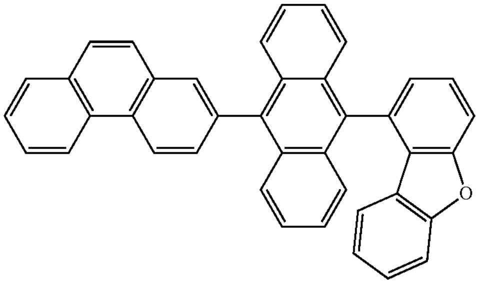

-continued
H1-49
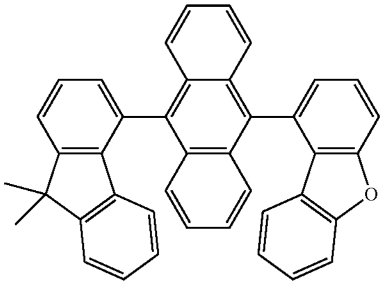
H1-50
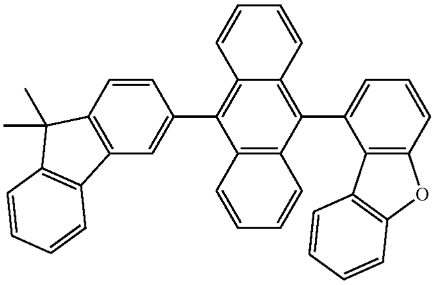
H1-51
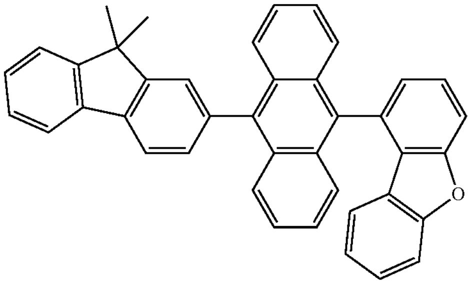
H1-52
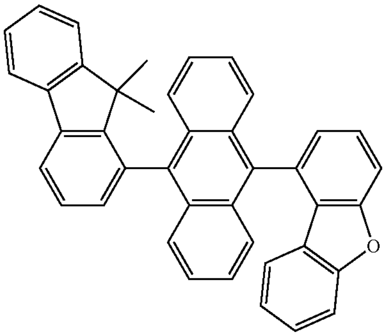
H1-53
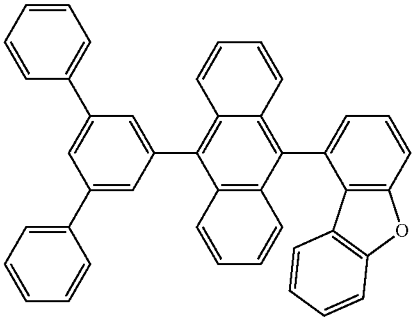
-continued
H1-54
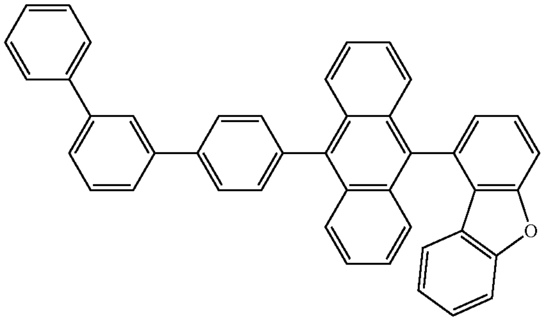
H1-55
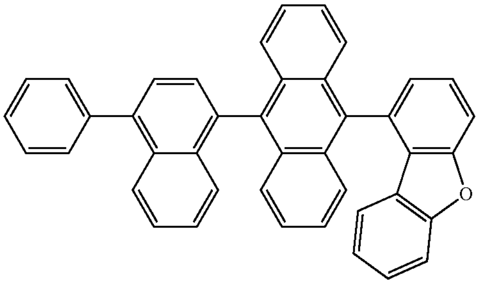
H1-56
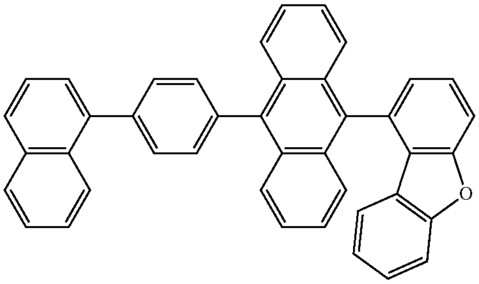
H1-57
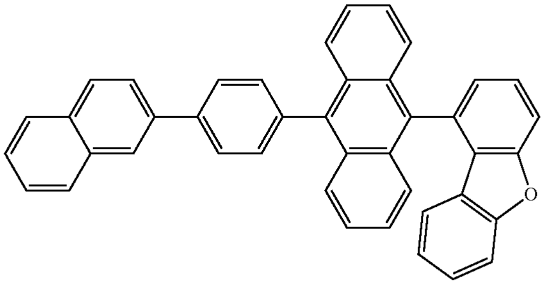
H1-58
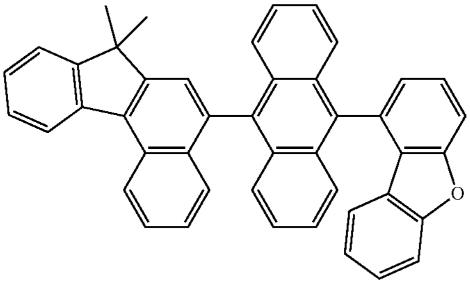

-continued
H1-59
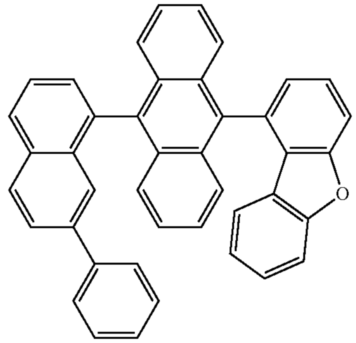
H1-60
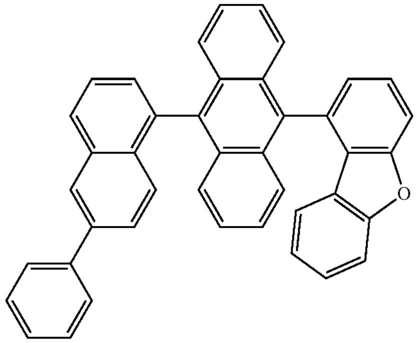
H1-61
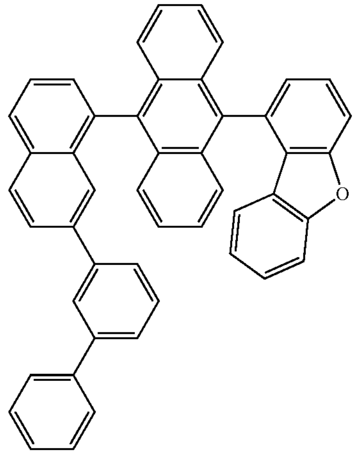
H1-62
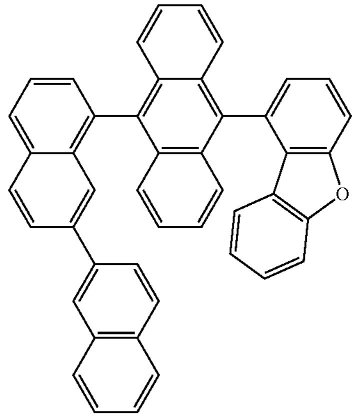
-continued
H1-63
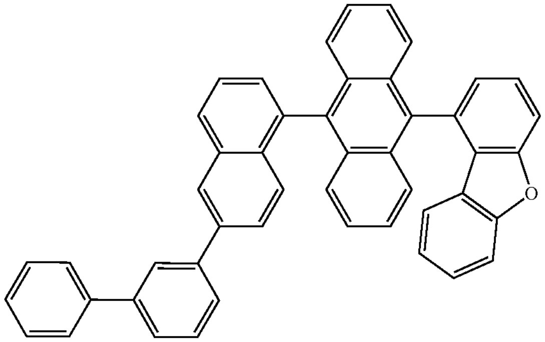
H1-64
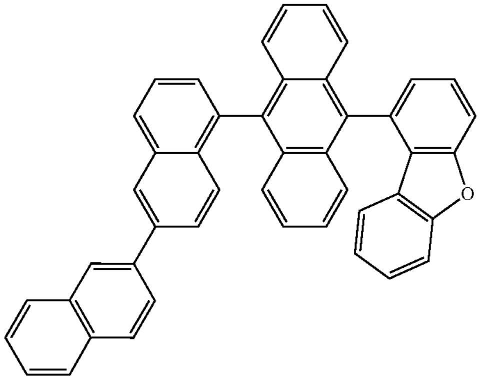
H1-65
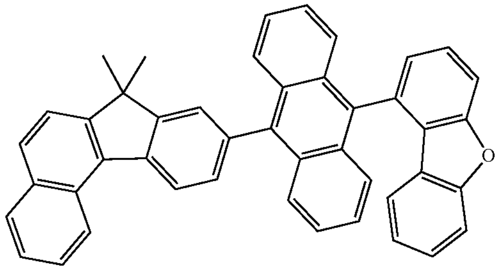
H1-66
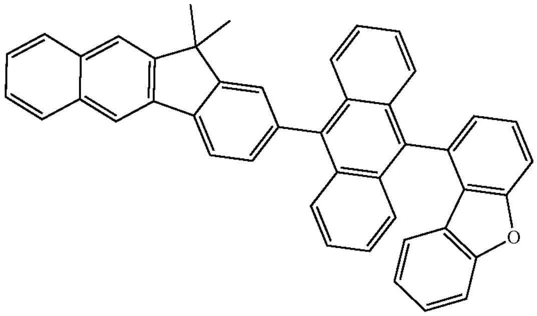

-continued
H1-67
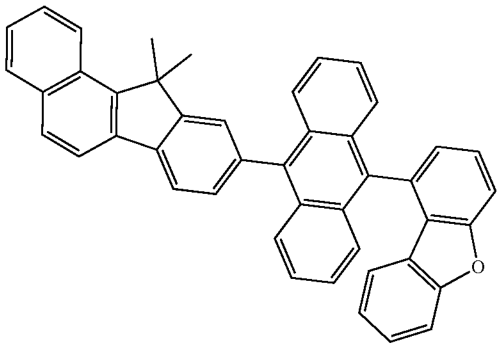
H1-68
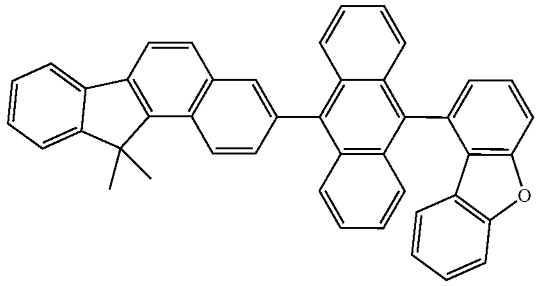
H1-69
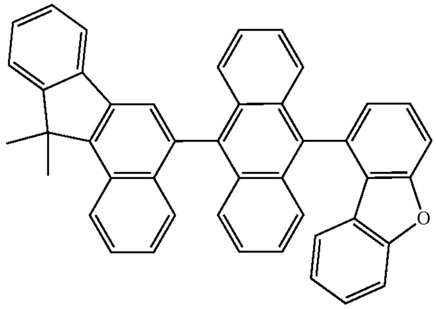
H1-70
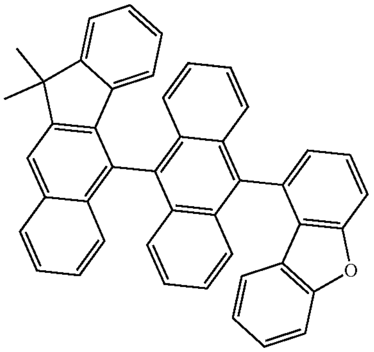
-continued
H1-71
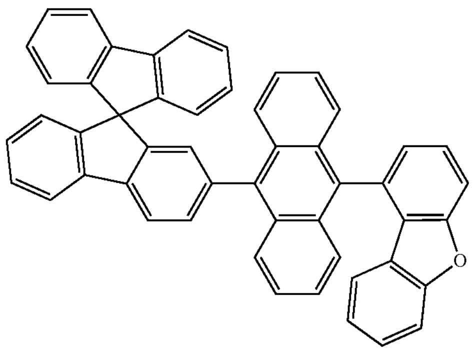
H1-72
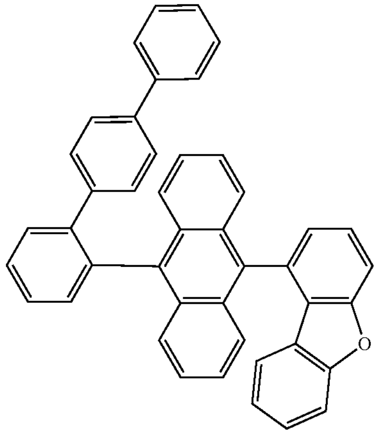
H1-73
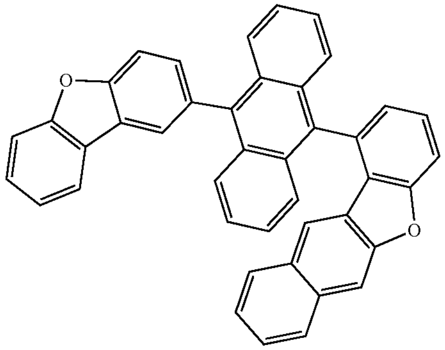
H1-74
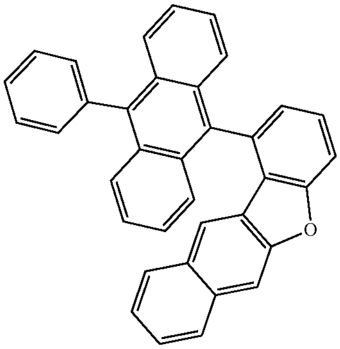

-continued
H1-75
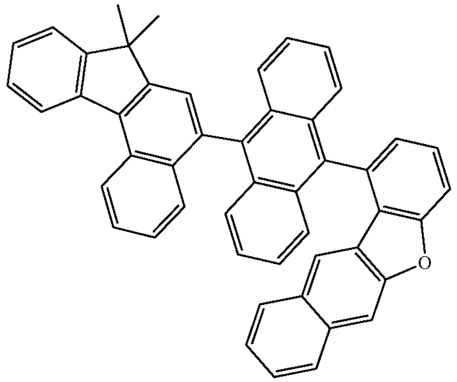
H1-76
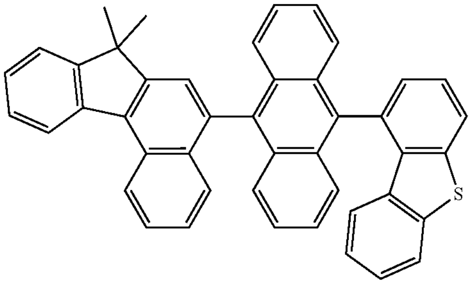
H1-77
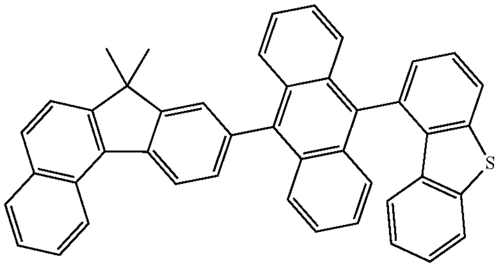
H1-78
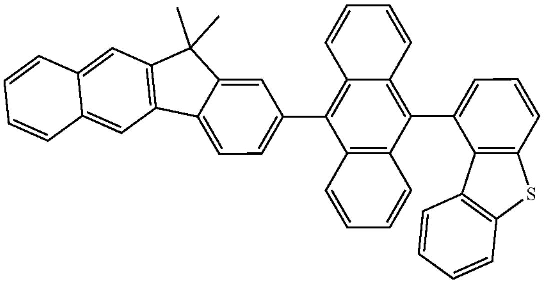
H1-79
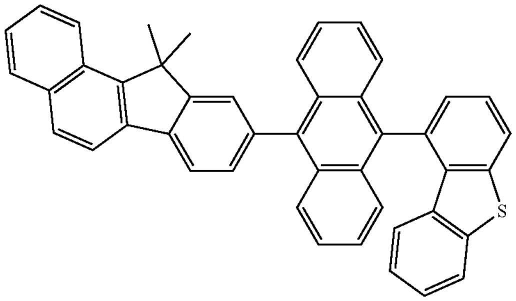
-continued
H1-80
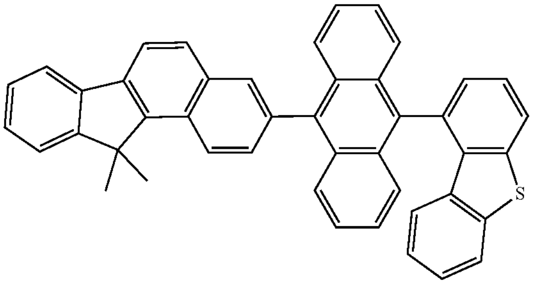
H1-81
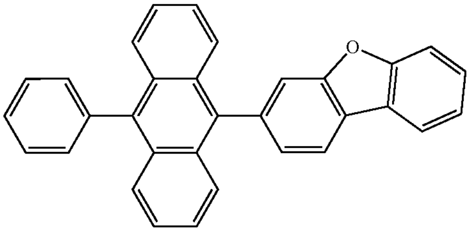
H1-82
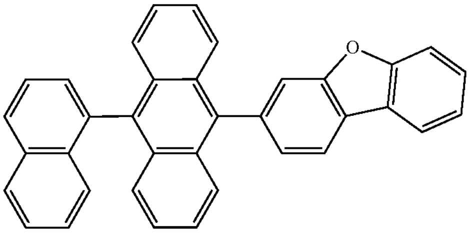
H1-83
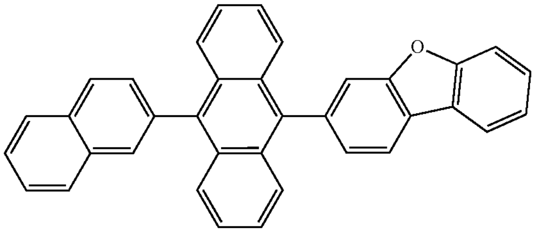
H1-84
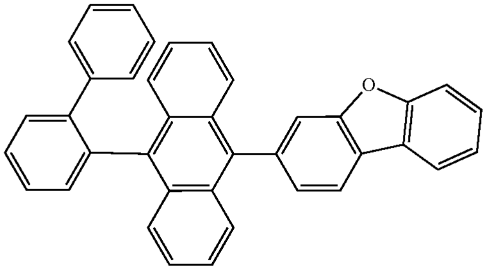
H1-85
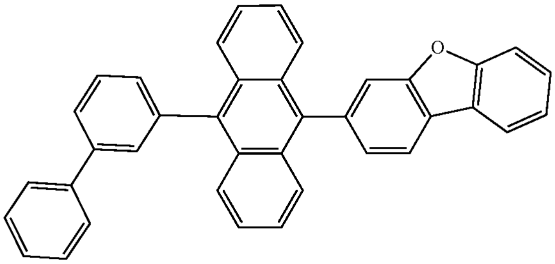

-continued
H1-86
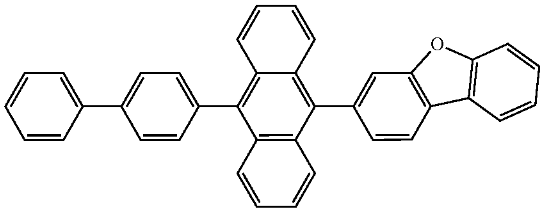
H1-87
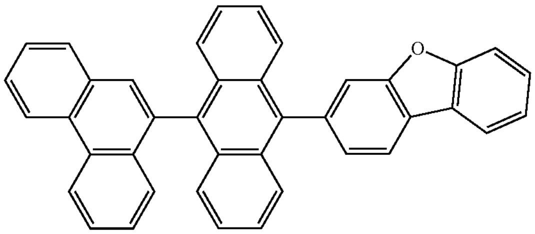
H1-88
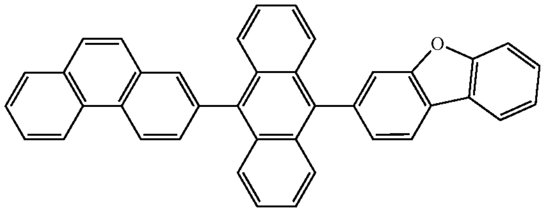
H1-89
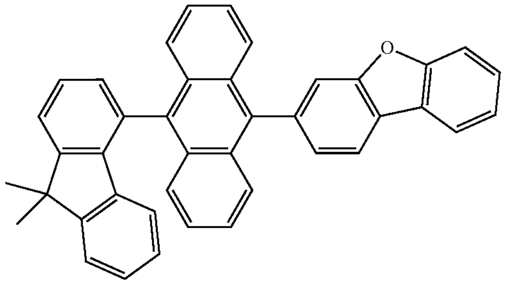
H1-90
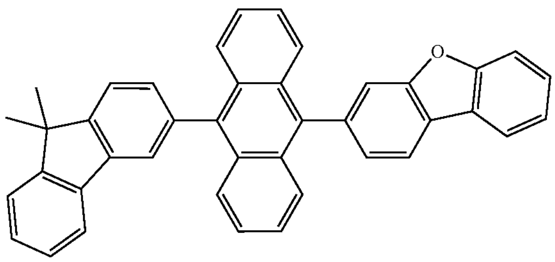
H1-91
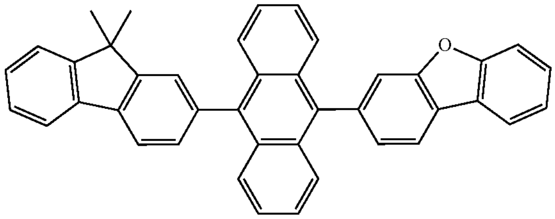
-continued
H1-92
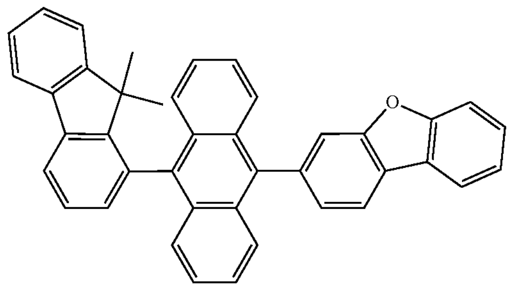
H1-93
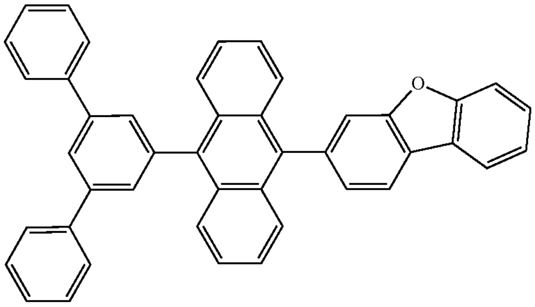
H1-94
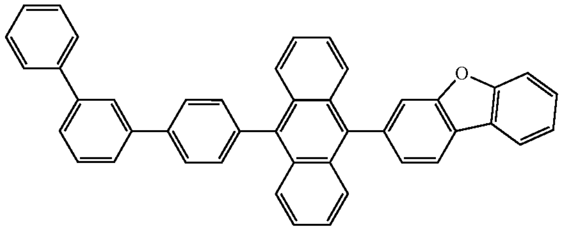
H1-95
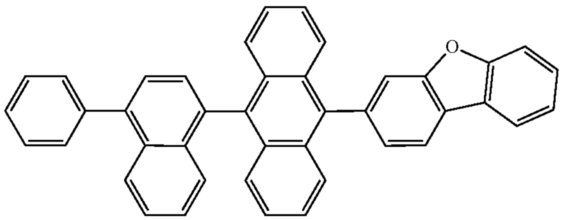
H1-96
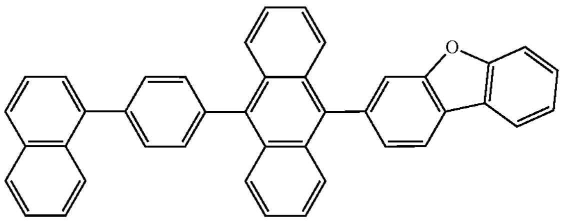
H1-97
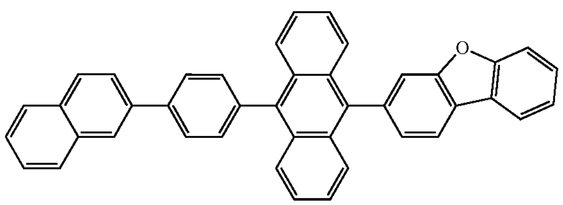

-continued
H1-98
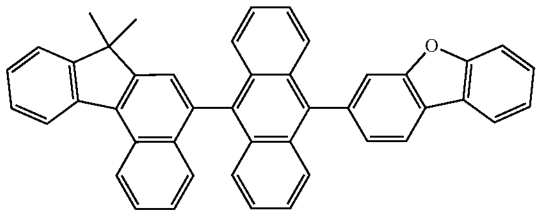
H1-99
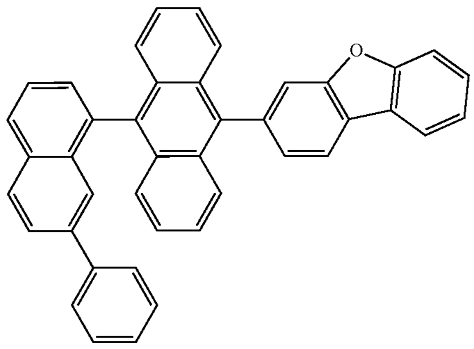
H1-100
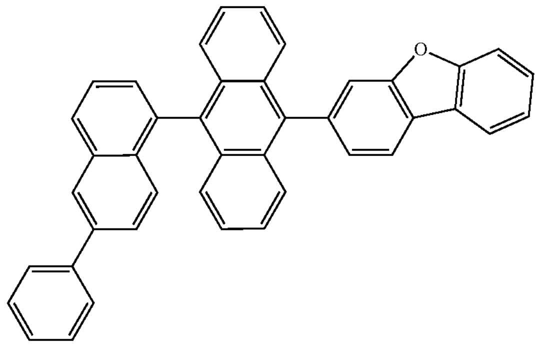
H1-101
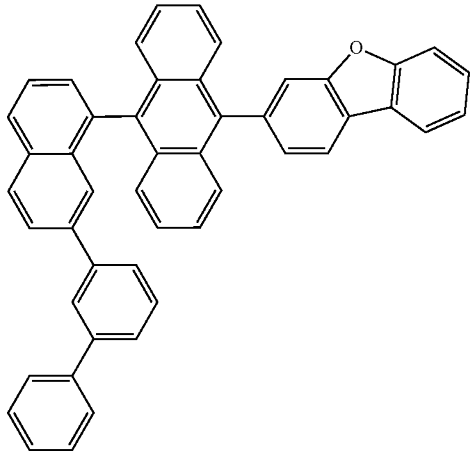
-continued
H1-102
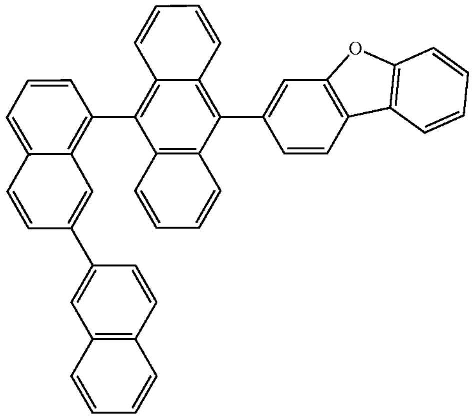
H1-103
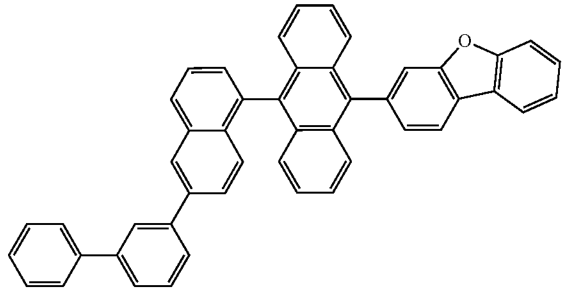
H1-104
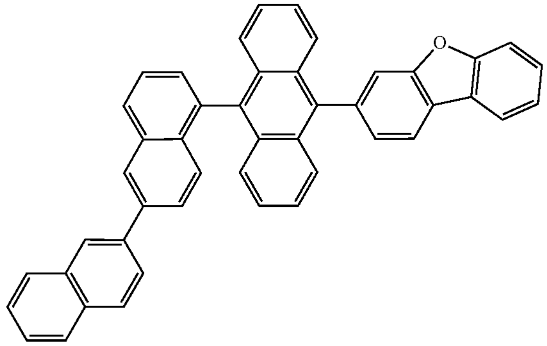
H1-105
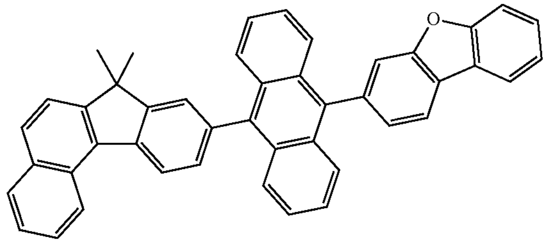
H1-106
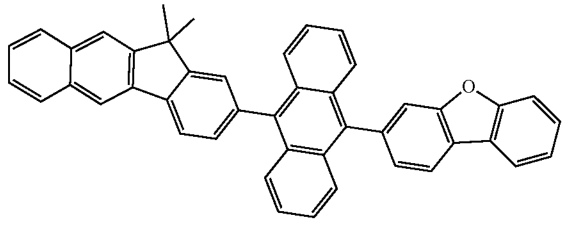

-continued
H1-107
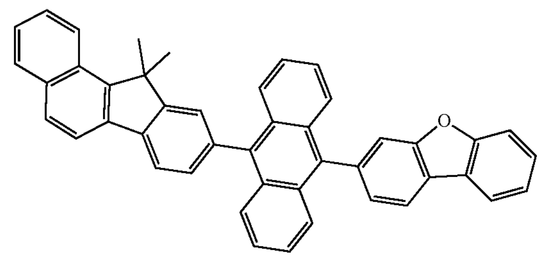
H1-108
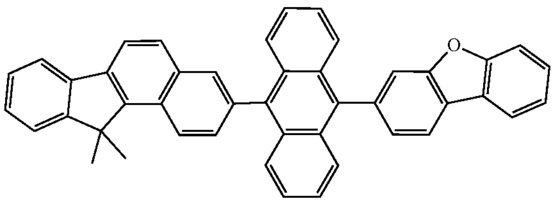
H1-109
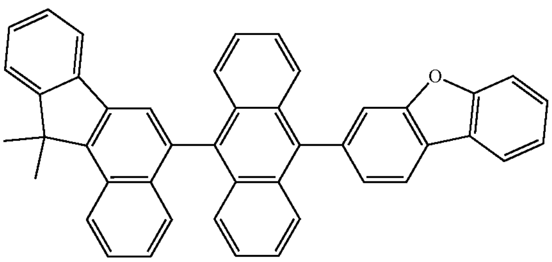
H1-110
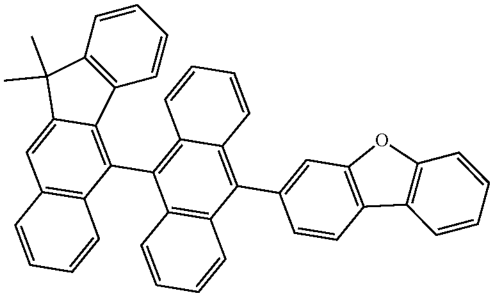
H1-111
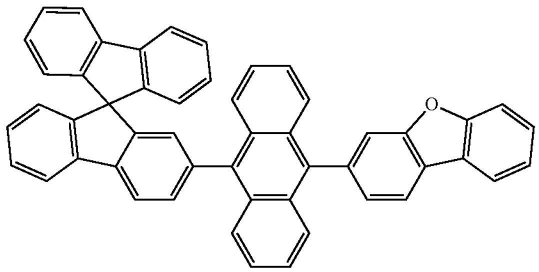
-continued
H1-112
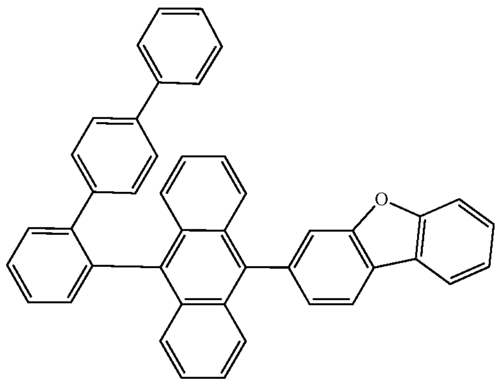
H1-113
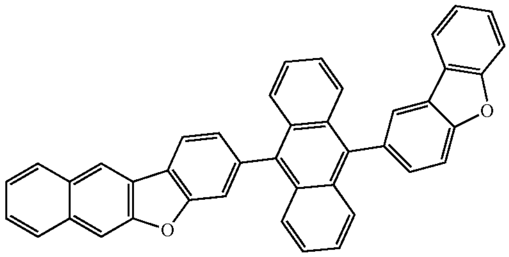
H1-114
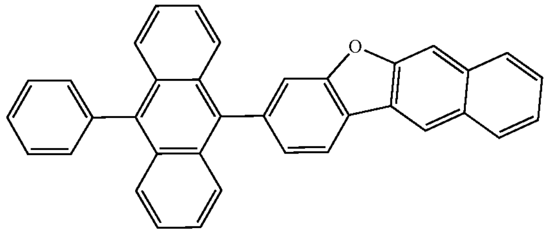
H1-115
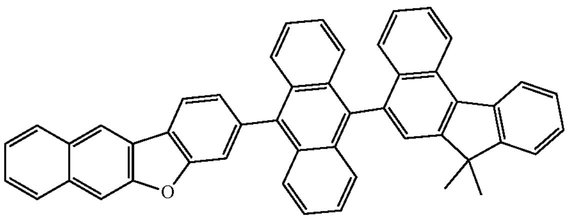
H1-116
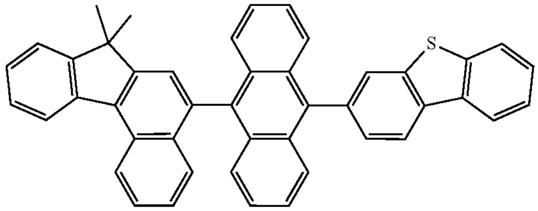

-continued
H1-117
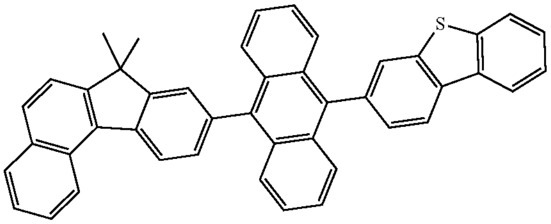
H1-118
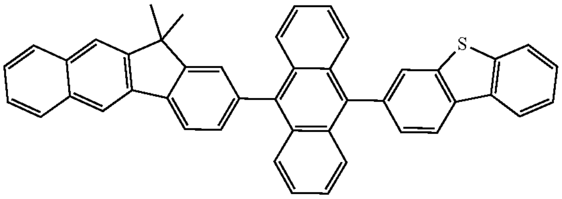
H1-119
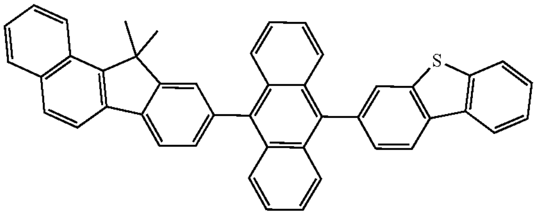
H1-120
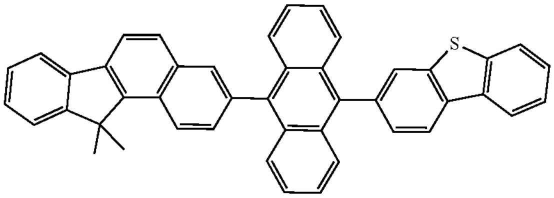
H1-121
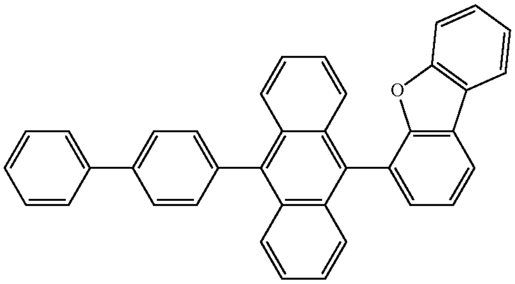
H1-122
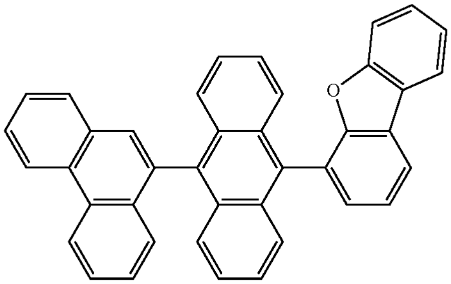
-continued
H1-123
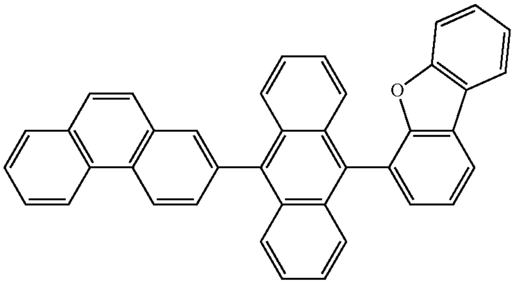
H1-124
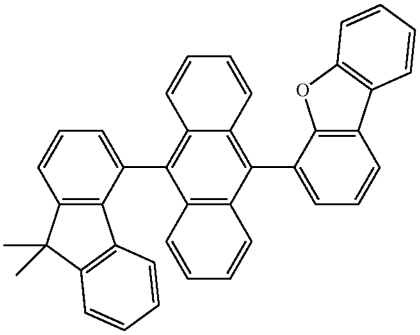
H1-125
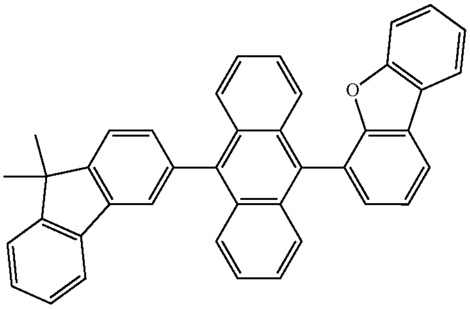
H1-126
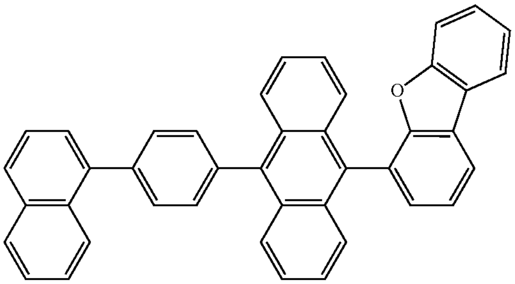
H1-127
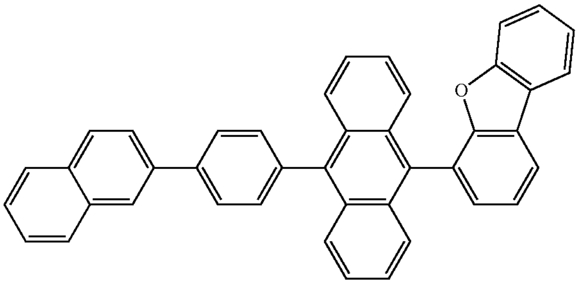

-continued
H1-128
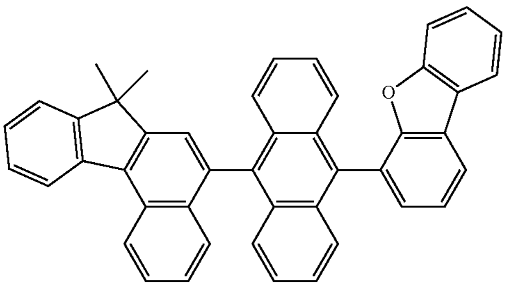
H1-129
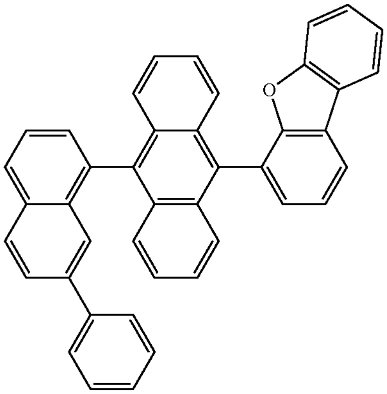
H1-130
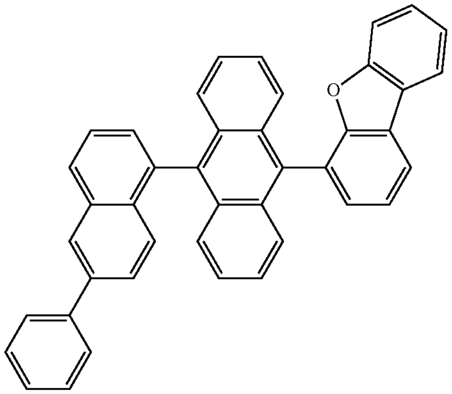
H1-131
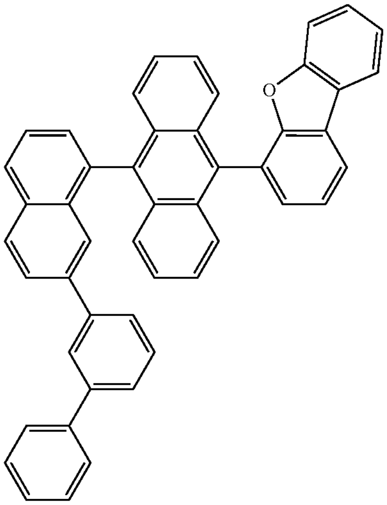
-continued
H1-132
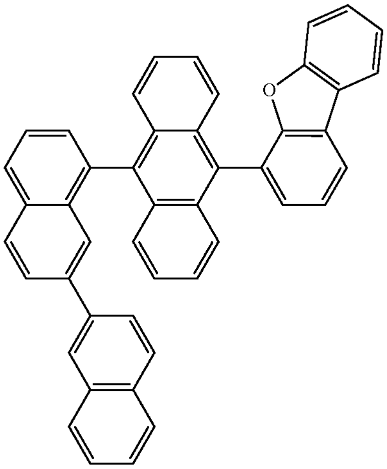
H1-133
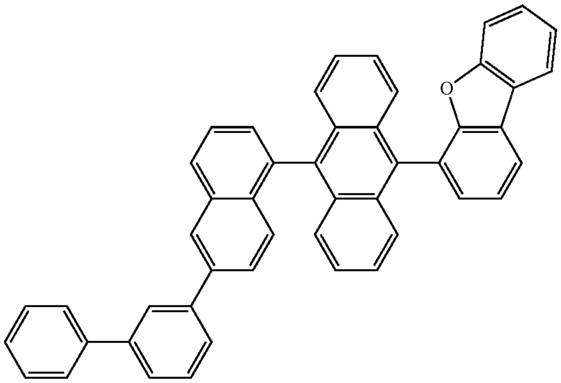
H1-134
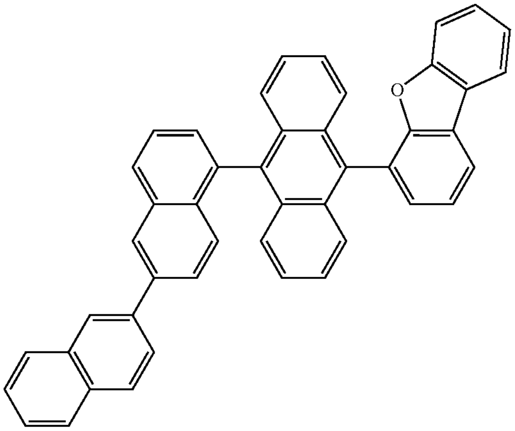

-continued
H1-135
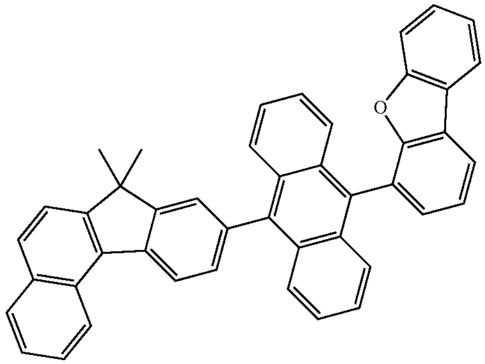
H1-136
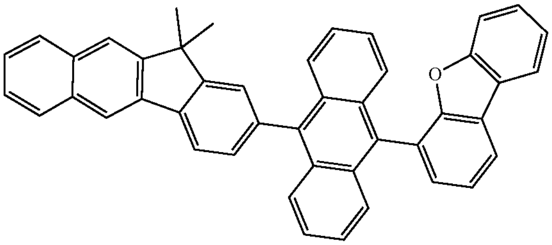
H1-137
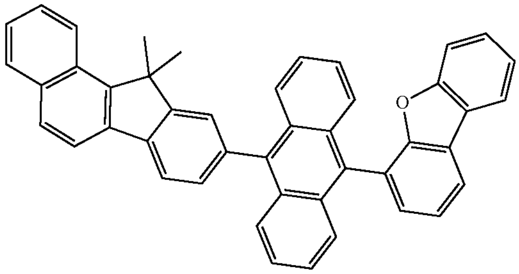
H1-138
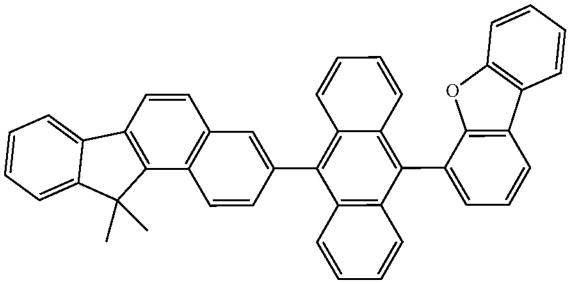
H1-139
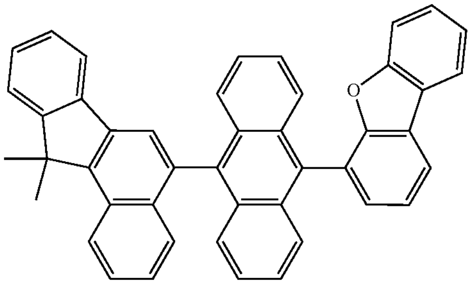
-continued
H1-140
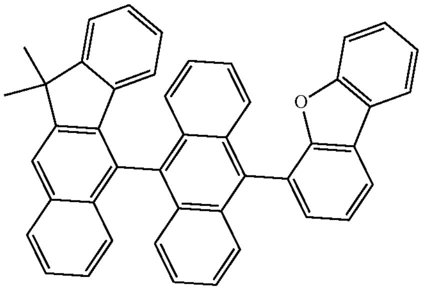
H1-141
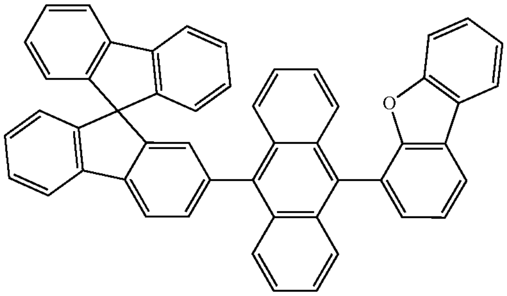
H1-142
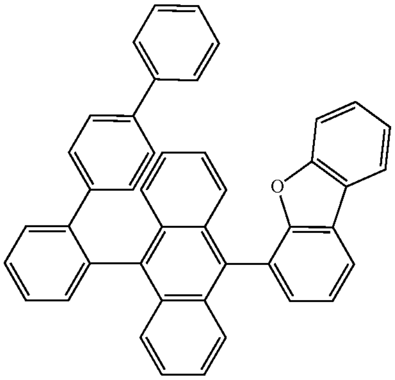
H1-143
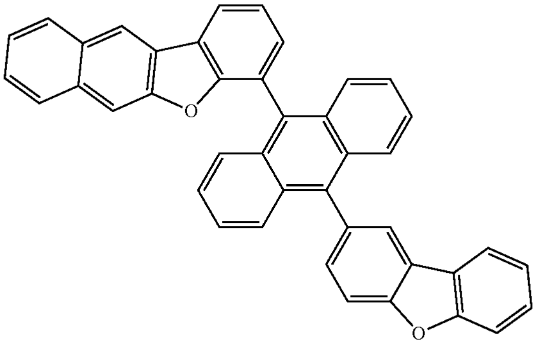

-continued
H1-144
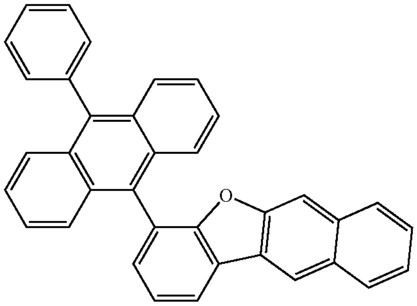
H1-145
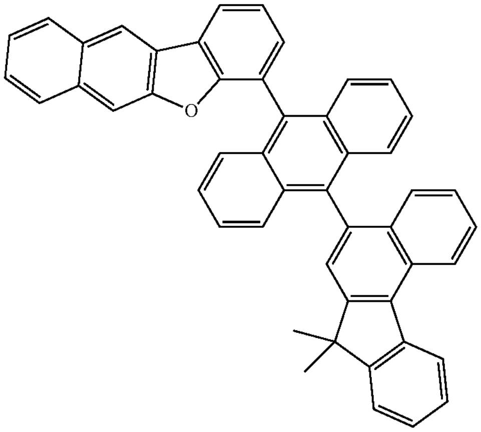
H1-146
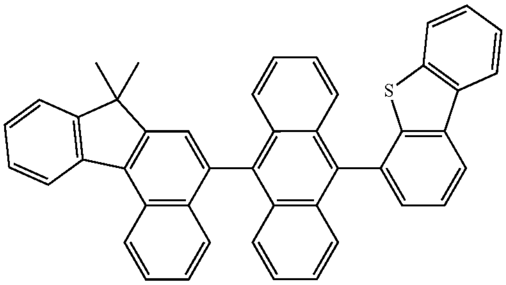
H1-147
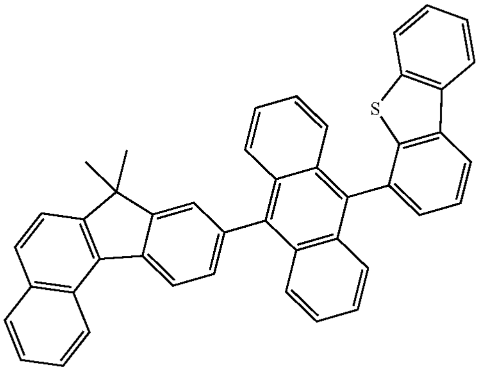
-continued
H1-148
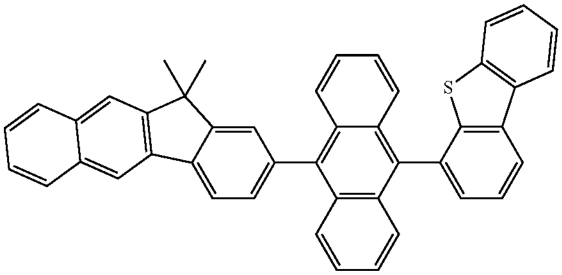
H1-149
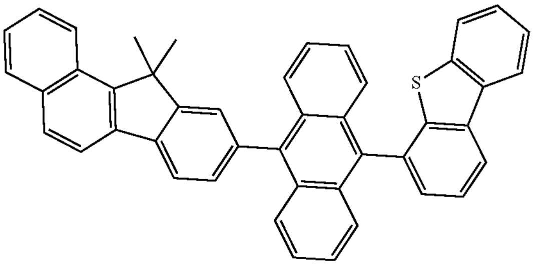
H1-150
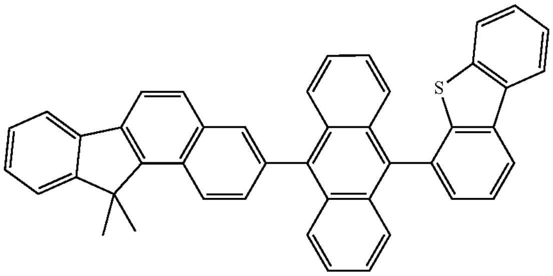
H1-151
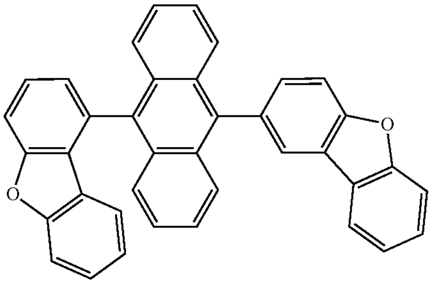
H1-152
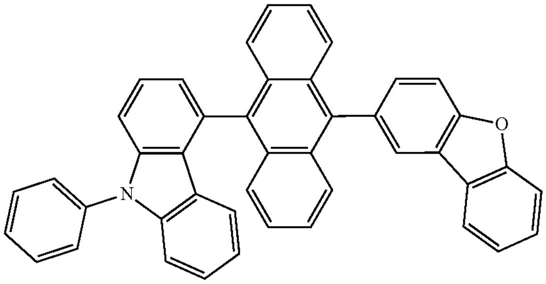

-continued
H1-153
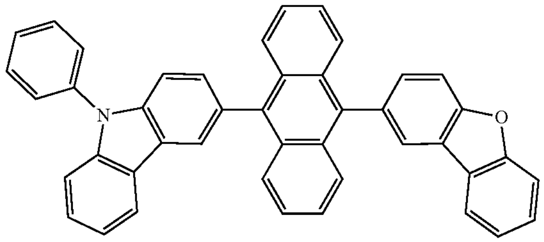
H1-154
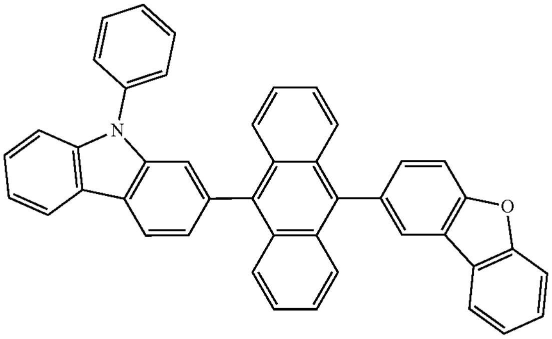
H1-155
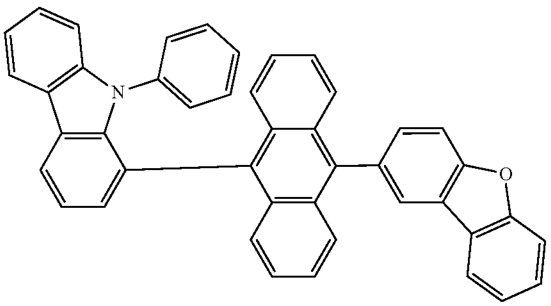
H1-156
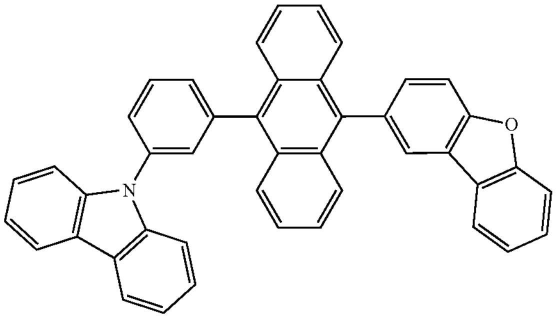
H1-157
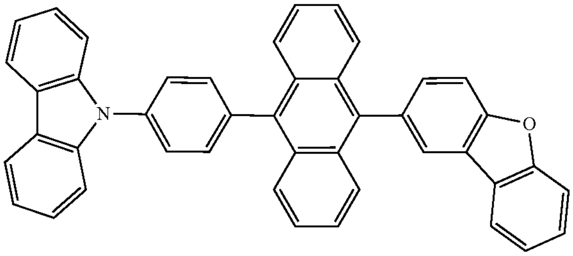
-continued
H1-158
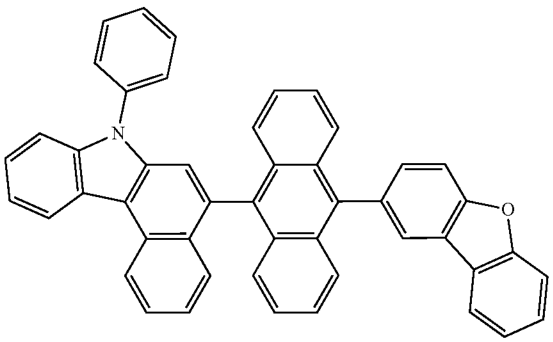
H1-159
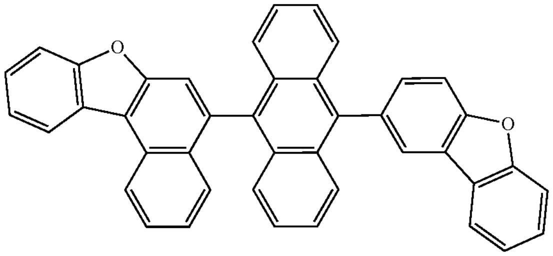
H1-160
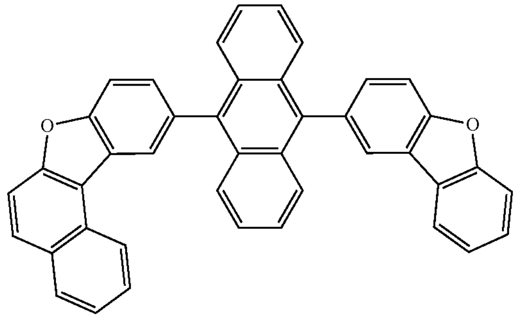
H1-161
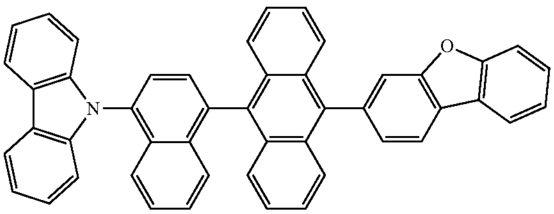
H1-162
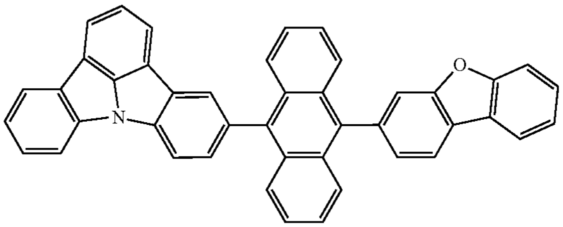

-continued
H1-163
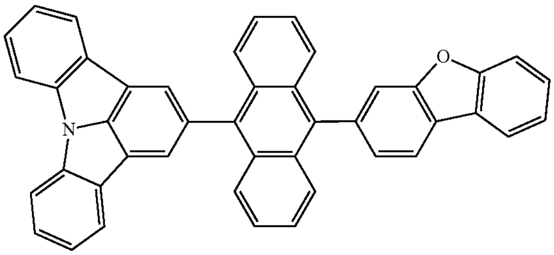
H1-164
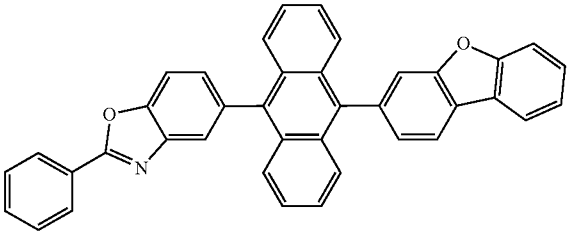
H1-165
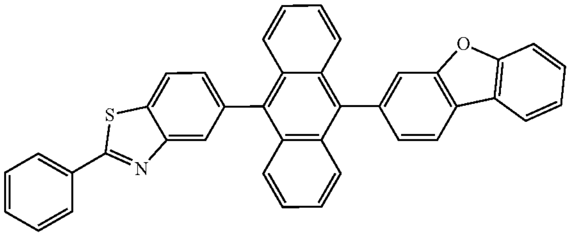
H1-166
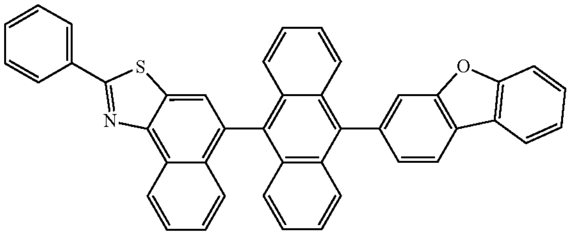
H1-167
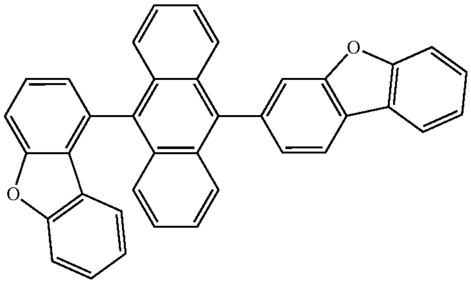
H1-168
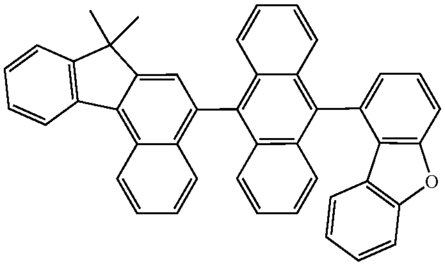
-continued
H1-169
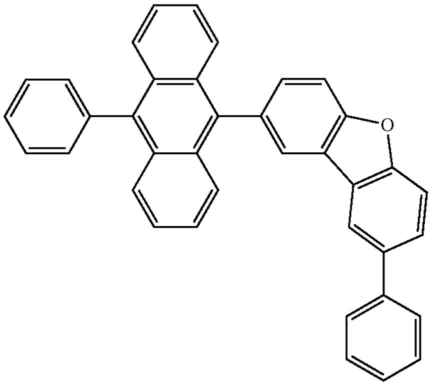
H1-170
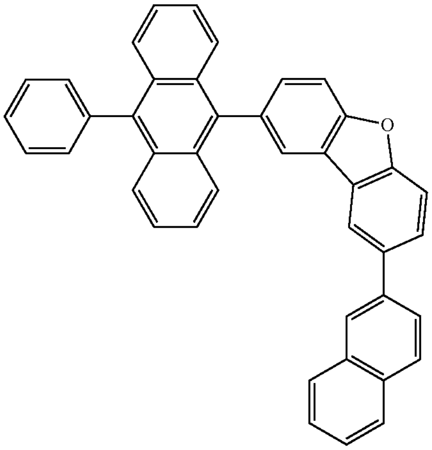
H1-171
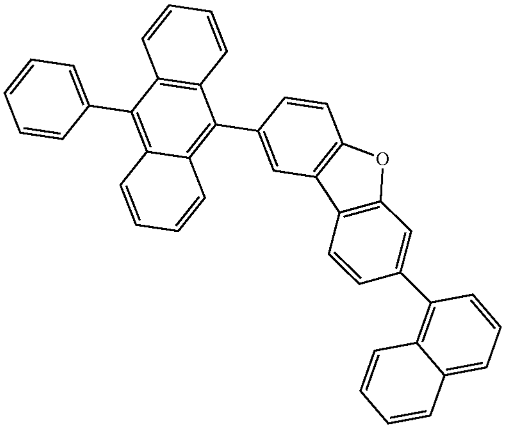

-continued
H1-172
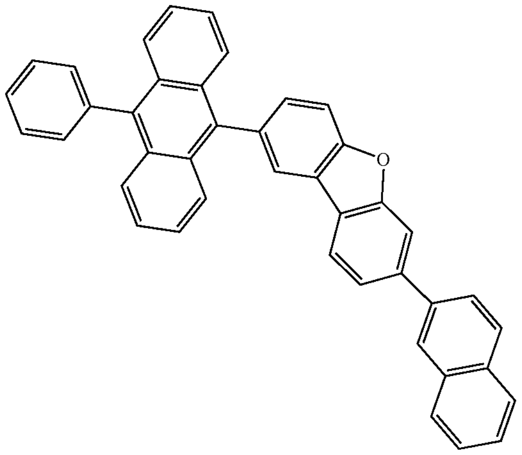
H1-173
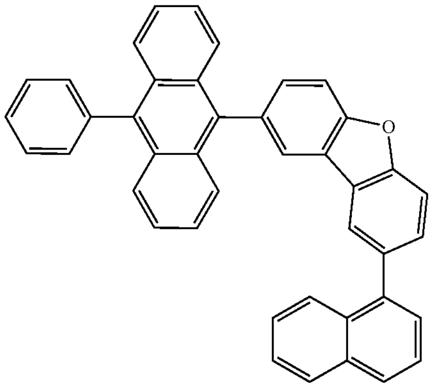
H1-174
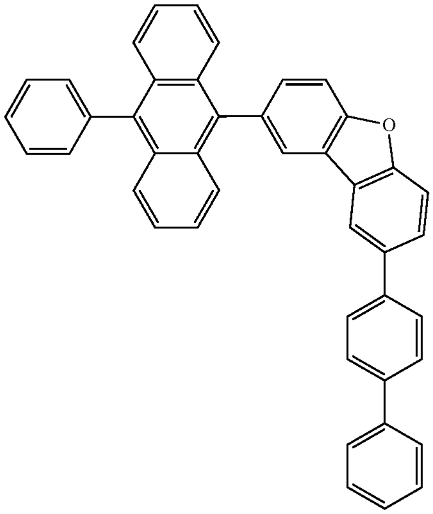
-continued
H1-175
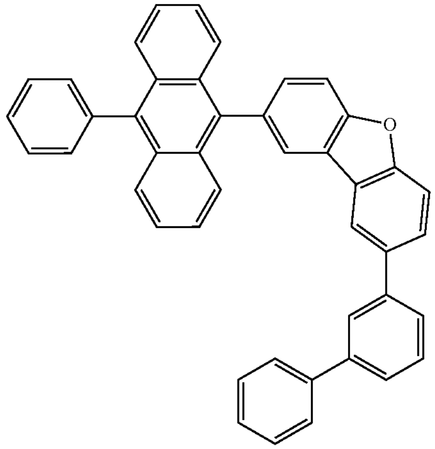
H1-176
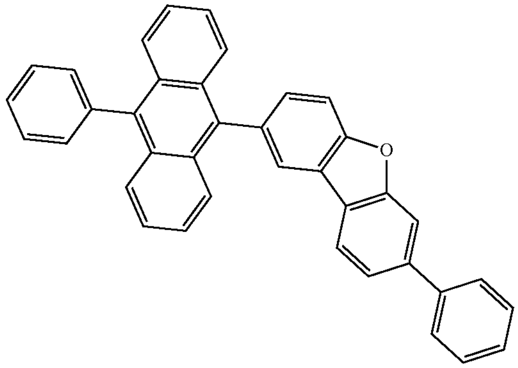
H1-177
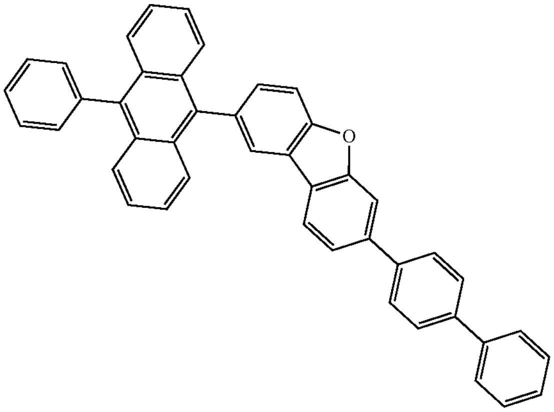

-continued
H1-178
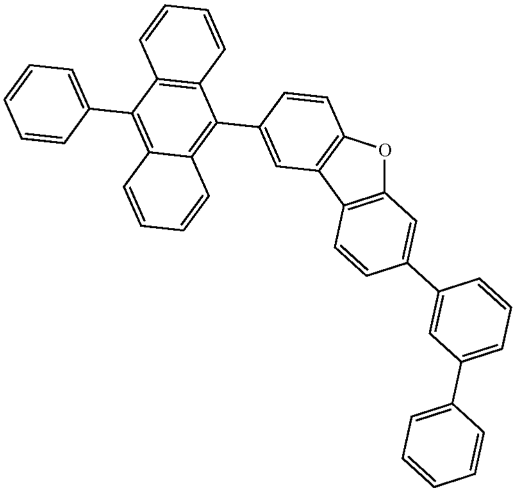
H1-179
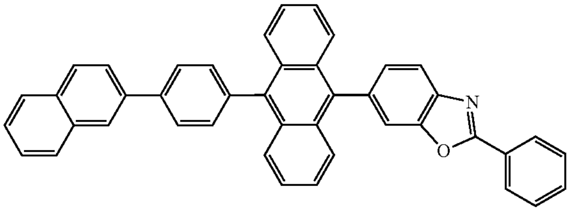
H1-180
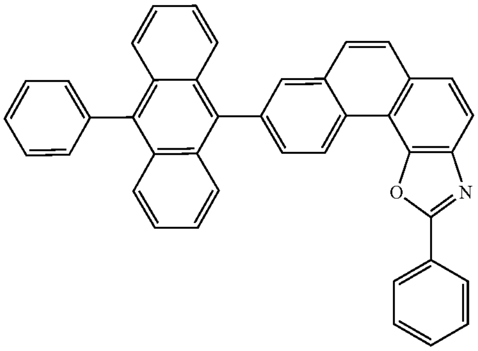
H1-181
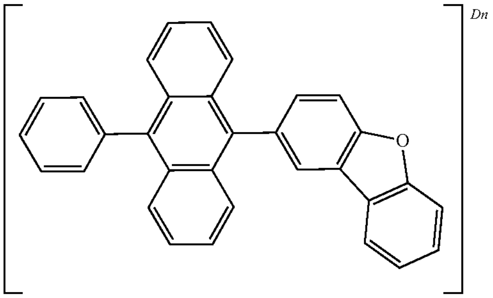
-continued
H1-182
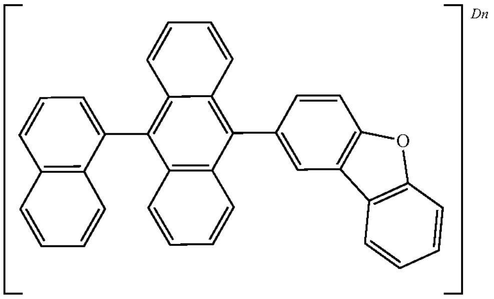
H1-183
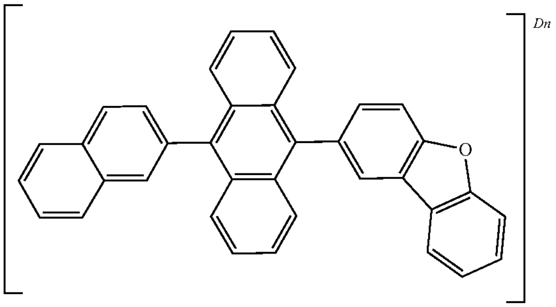
H1-184
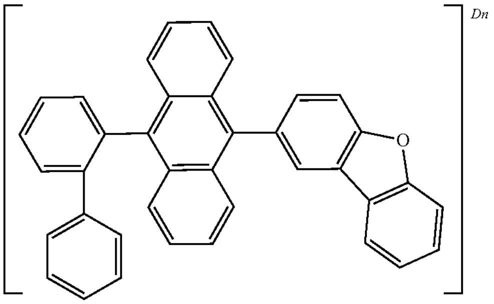
H1-185
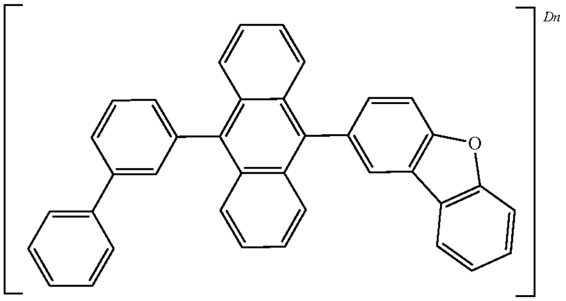

-continued
H1-186
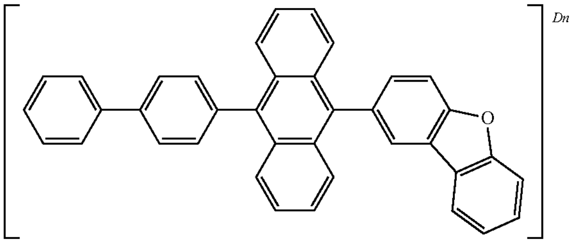
H1-187
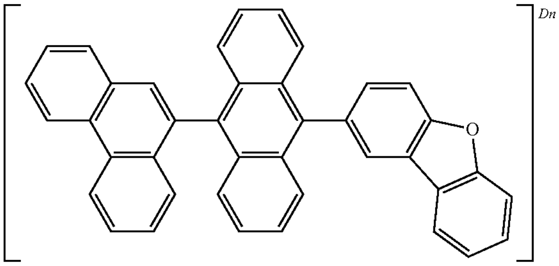
H1-188
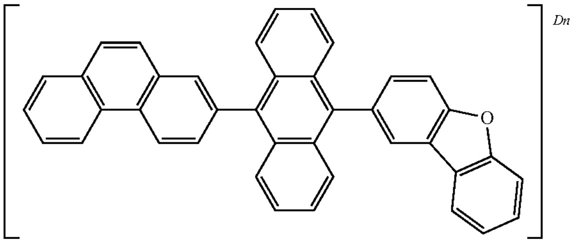
H1-189
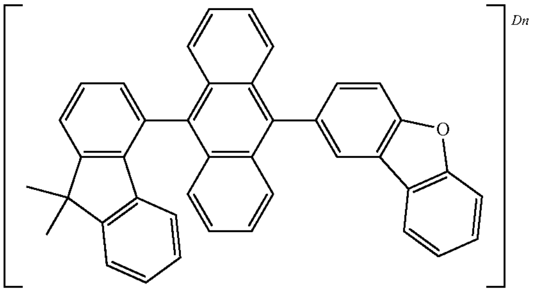
H1-190
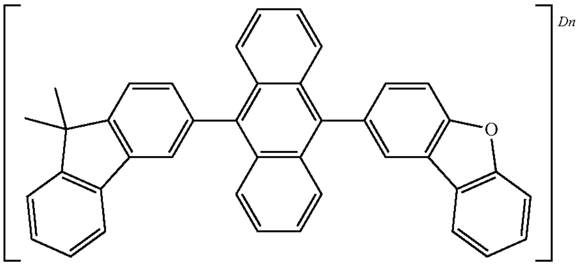
H1-191
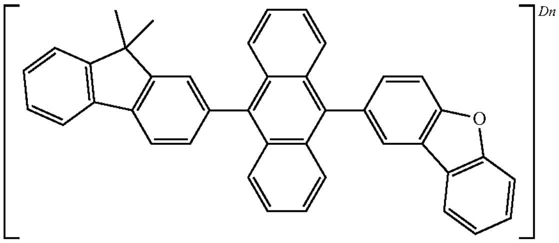
H1-192
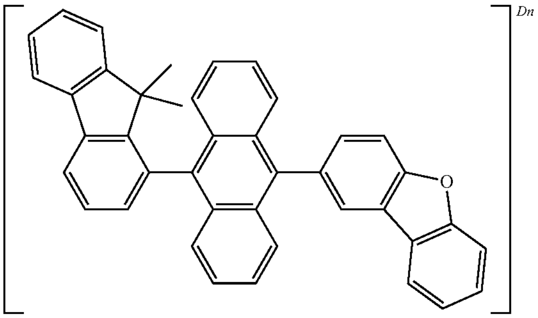
H1-193
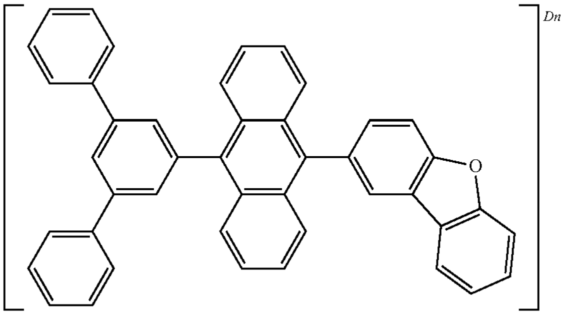
H1-194
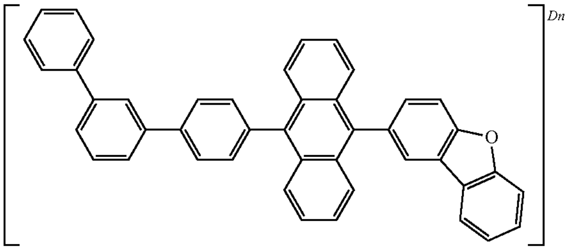
H1-195
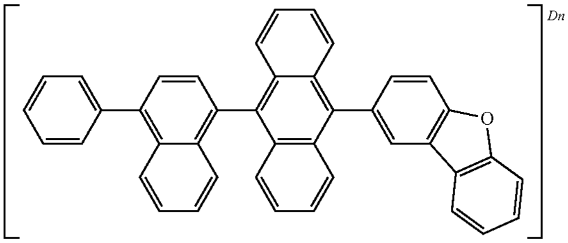

H1-196
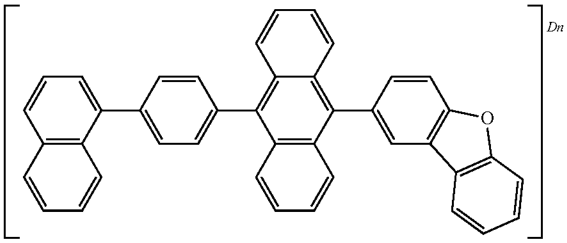
H1-197
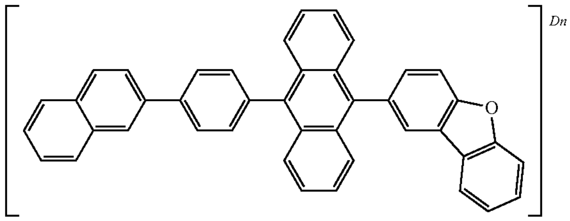
H1-198
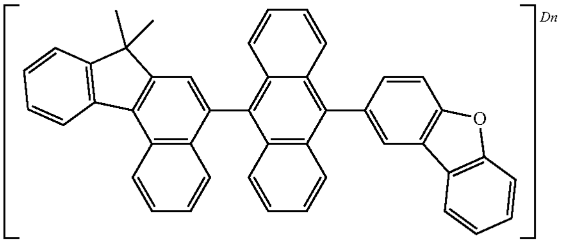
H1-199
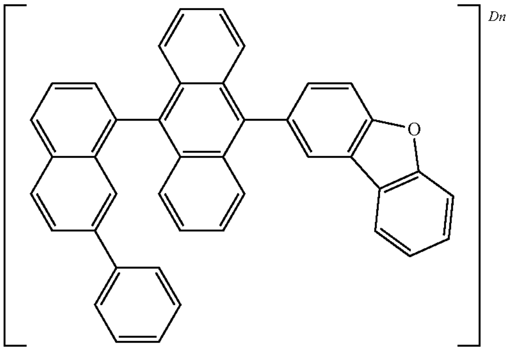
H1-200
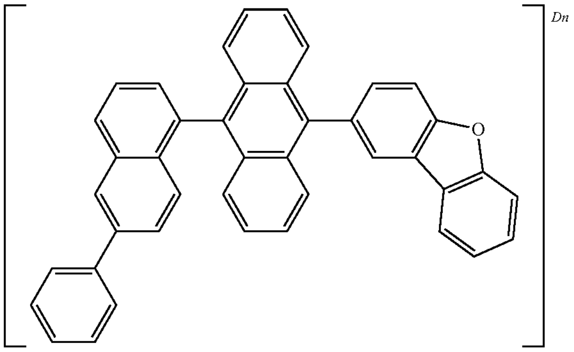
H1-201
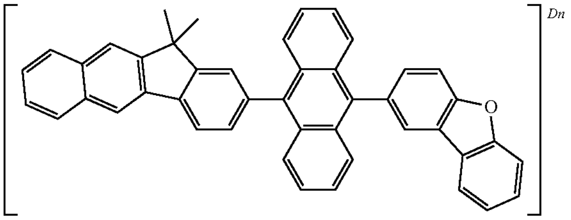
H1-202
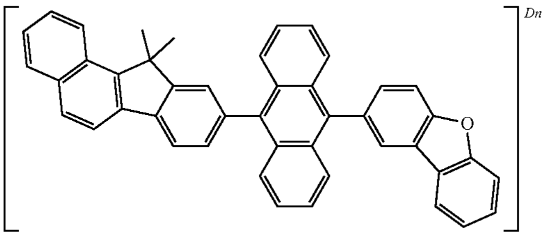
H1-203
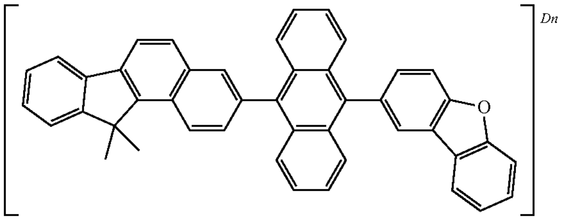
H1-204
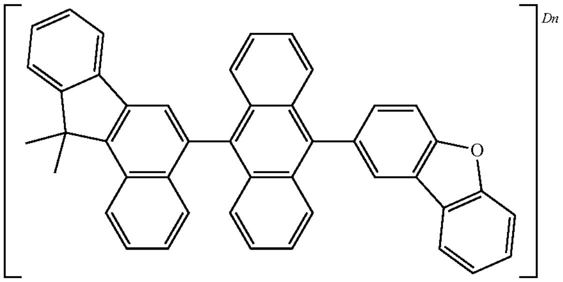
H1-205
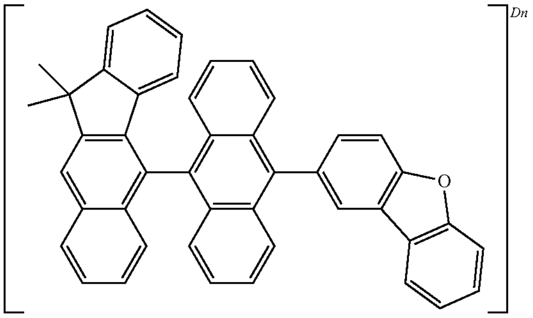

-continued
H1-206
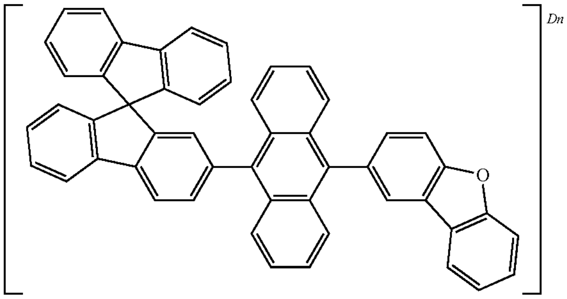
H1-207
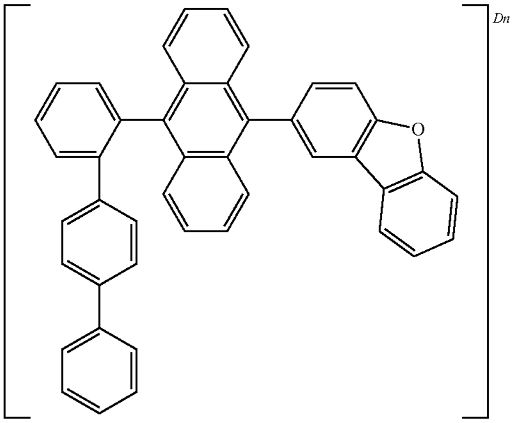
H1-208
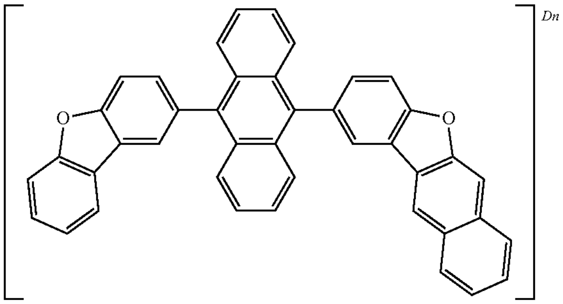
H1-209
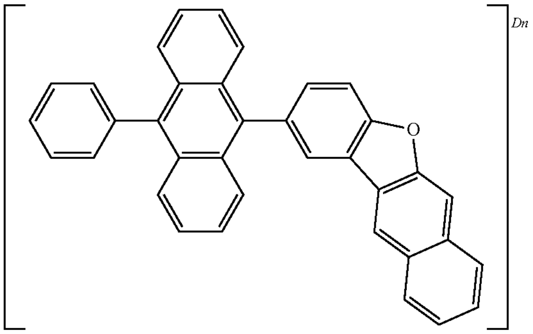
-continued
H1-210
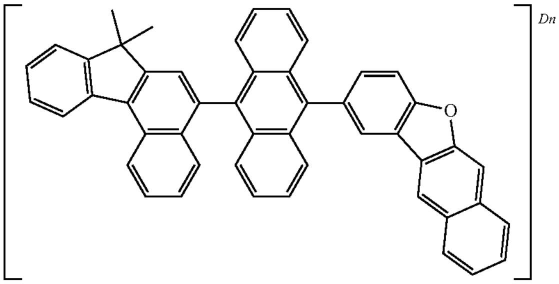
H1-211
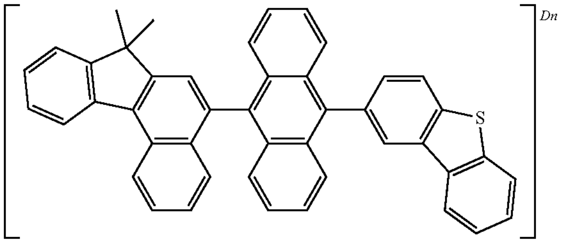
H1-212
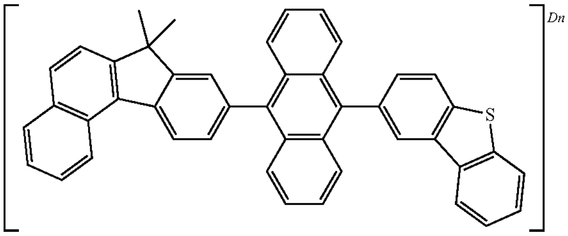
H-213
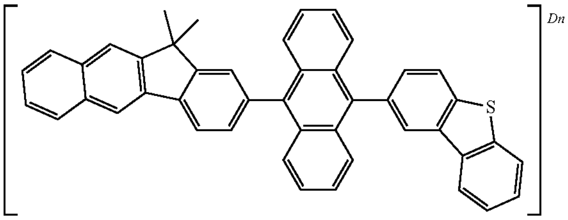
H-214
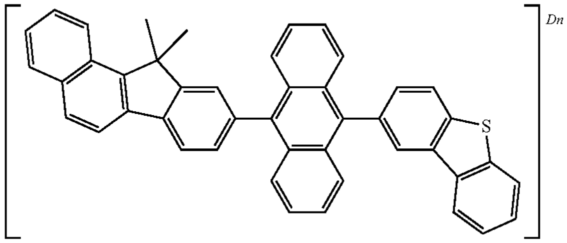
H-215
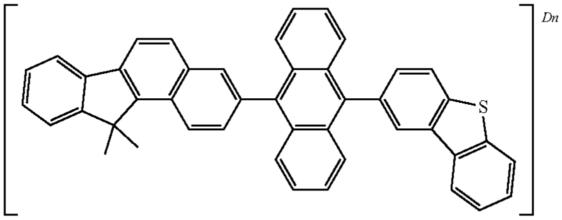

-continued
H1-216
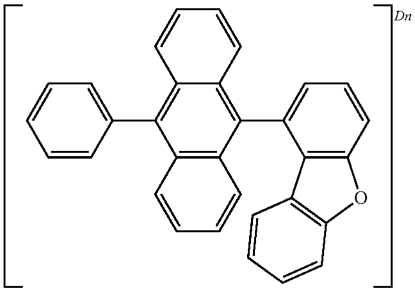
H1-217
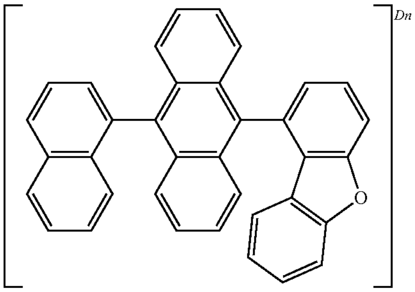
H1-218
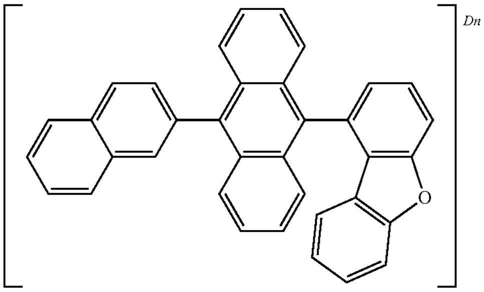
H1-219
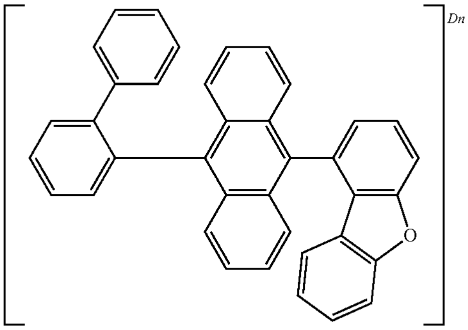
H1-220
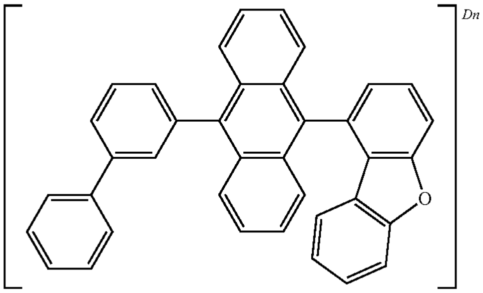
-continued
H1-221
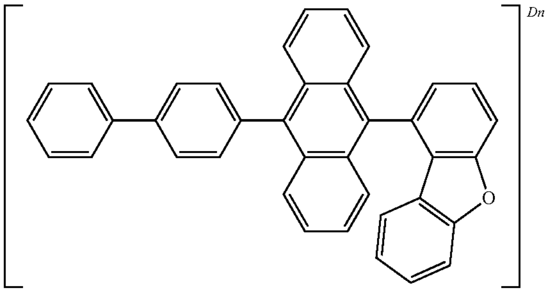
H1-222
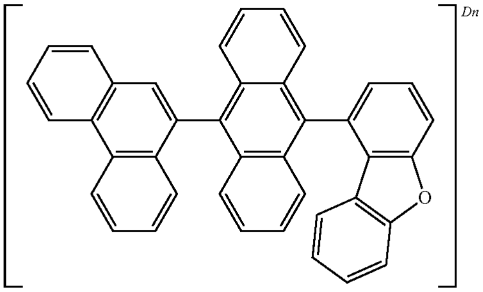
H1-223
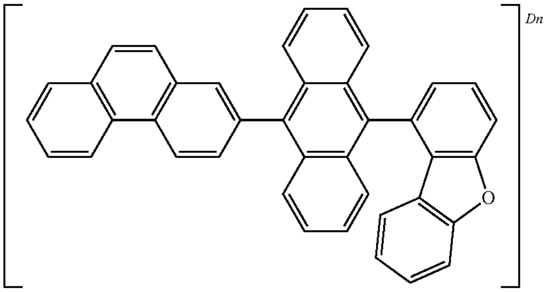
H1-224
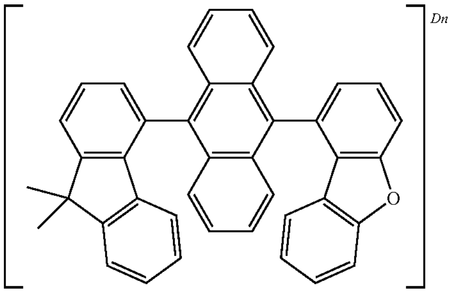
H1-225
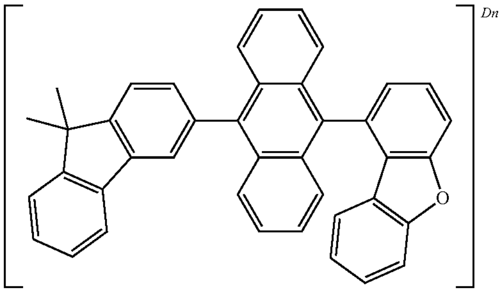

-continued
H1-226
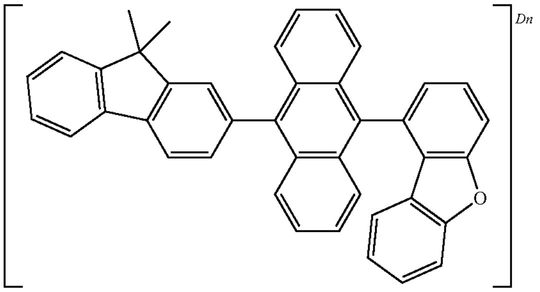
H1-227
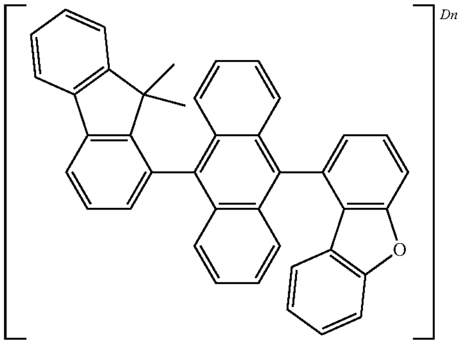
H1-228
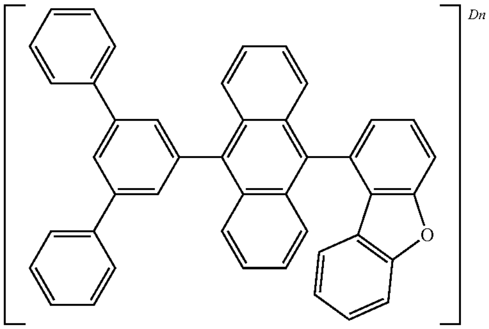
H1-229
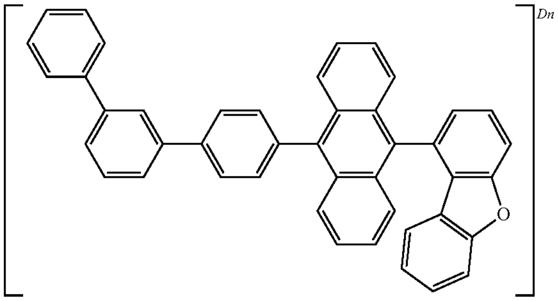
-continued
H1-230
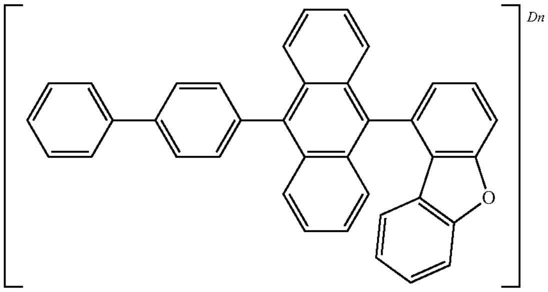
H1-231
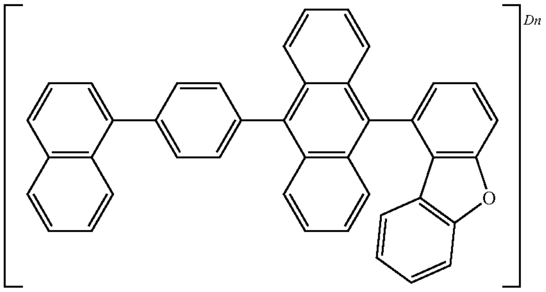
H1-232
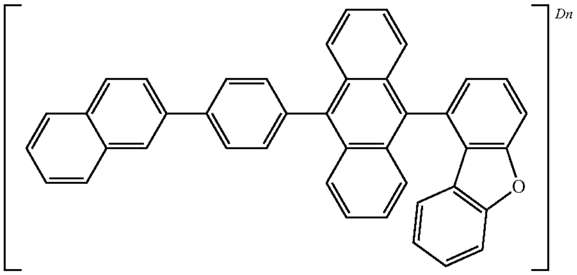
H1-233
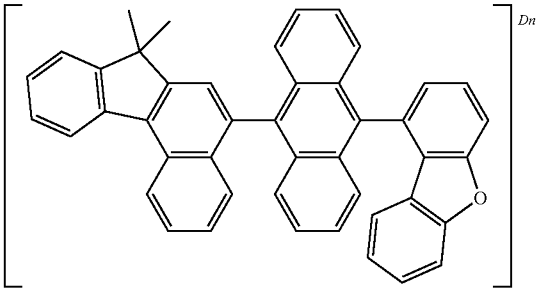
H1-234
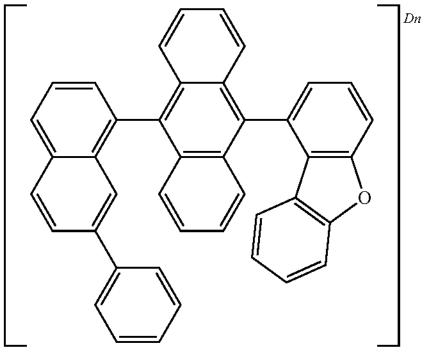

-continued
H1-235
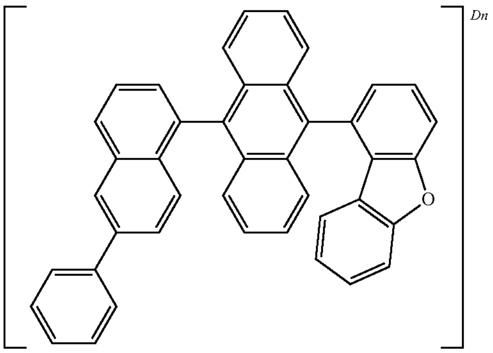
H1-236
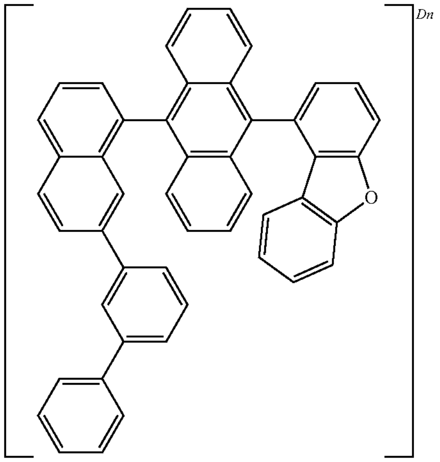
H1-237
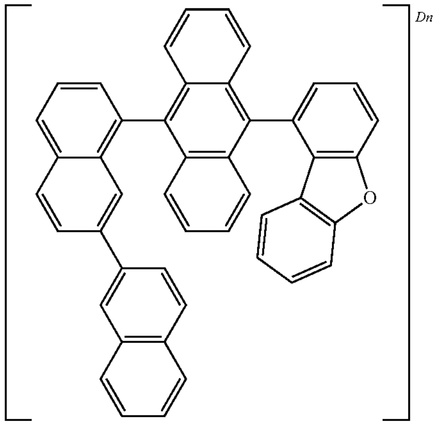
H1-238
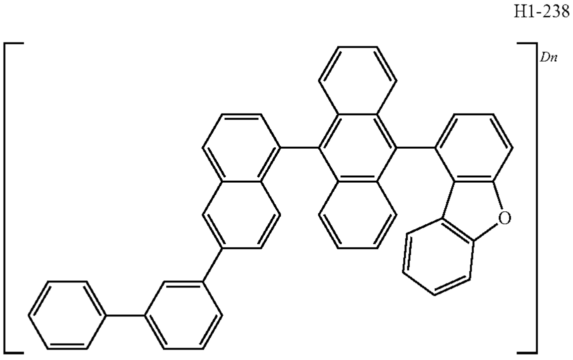
-continued
H1-239
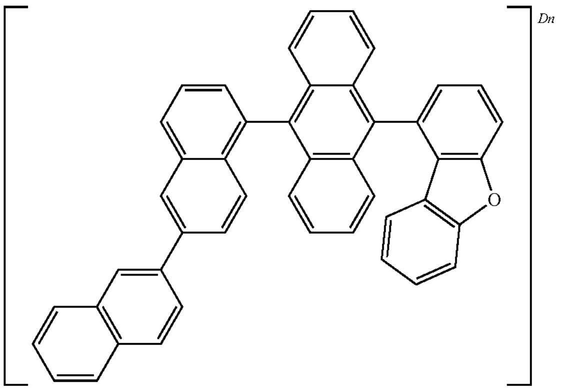
H1-240
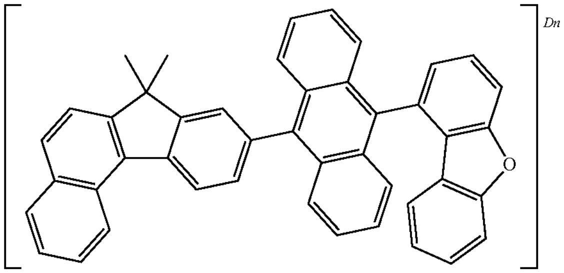
H1-241
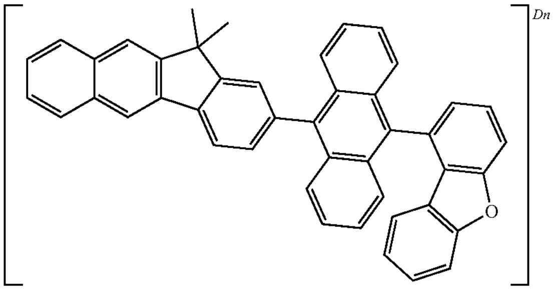
H1-242
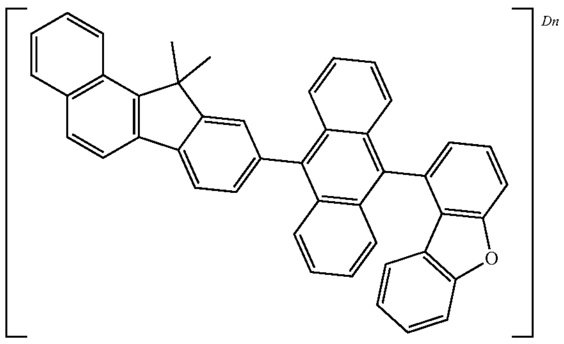

-continued
H1-243
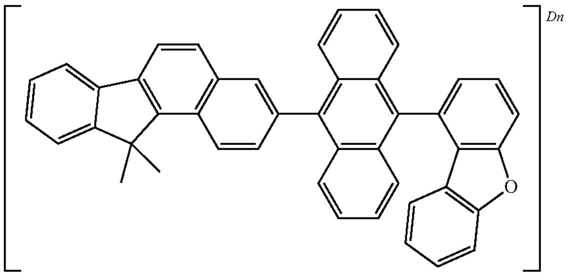
H1-244
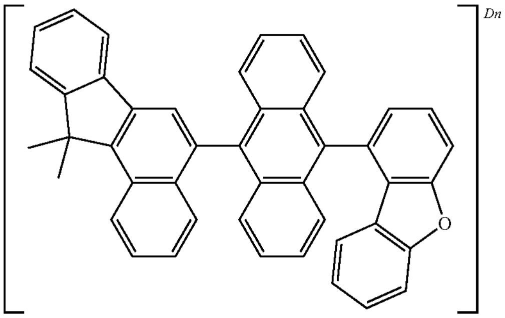
H1-245
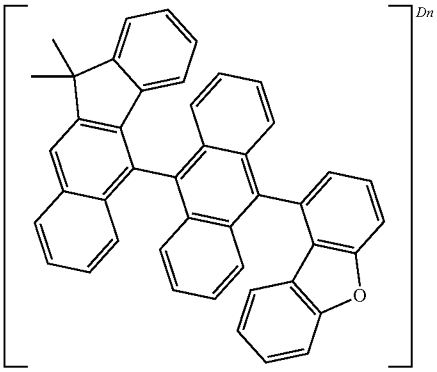
H1-246
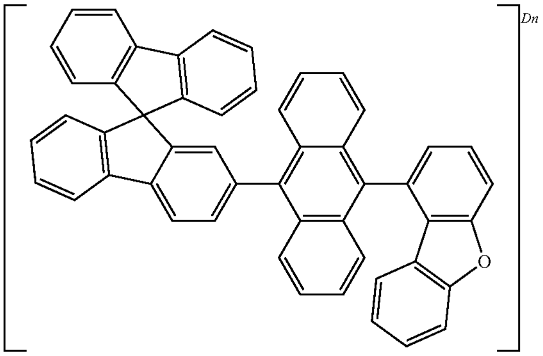
-continued
H1-247
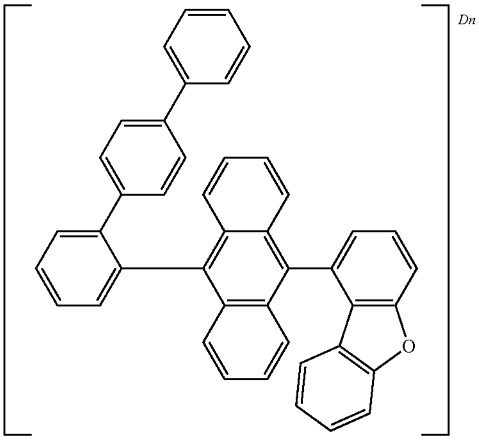
H1-248
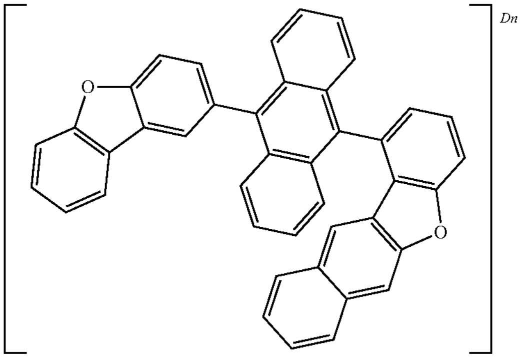
H1-249
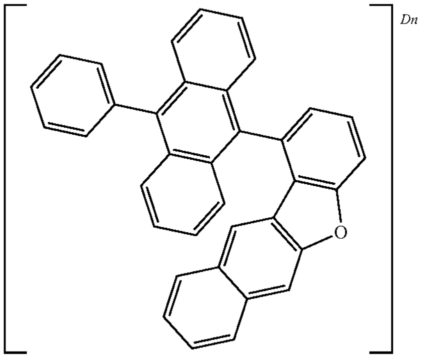
H1-250
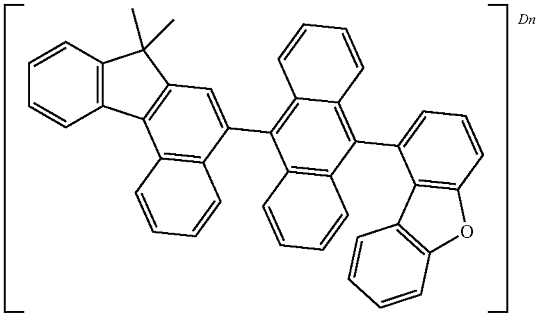

-continued
H1-251
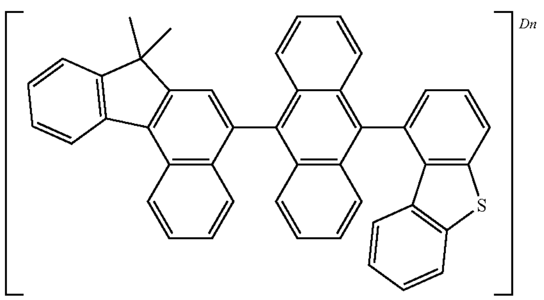
H1-252
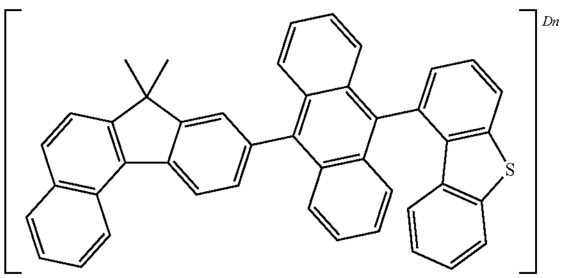
H1-253
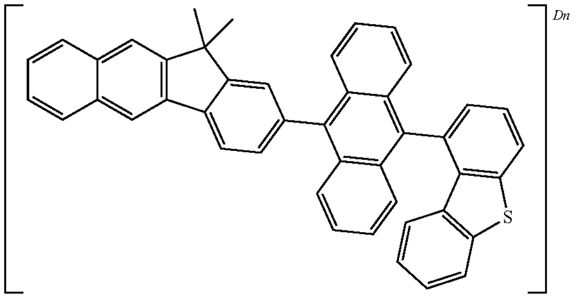
H1-254
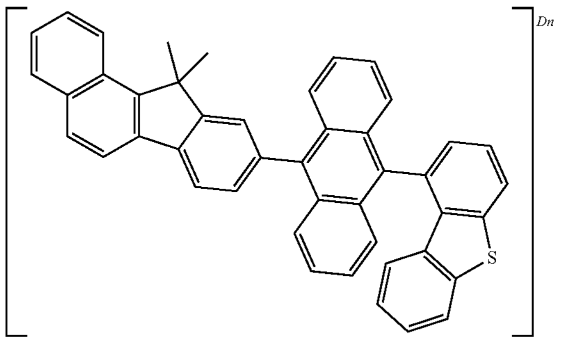
H1-255
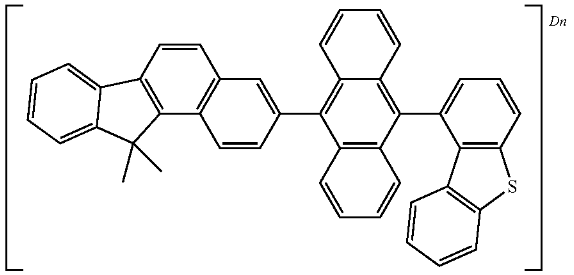
-continued
H1-256
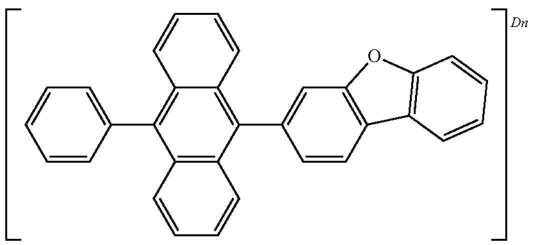
H1-257
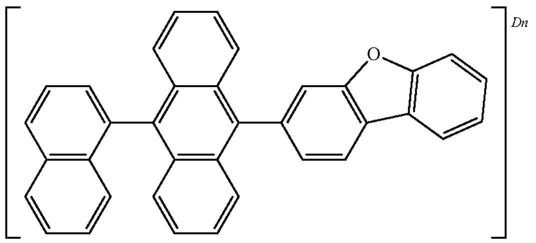
H1-258
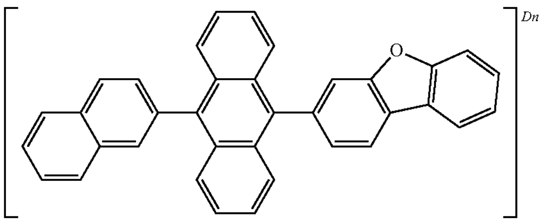
H1-259
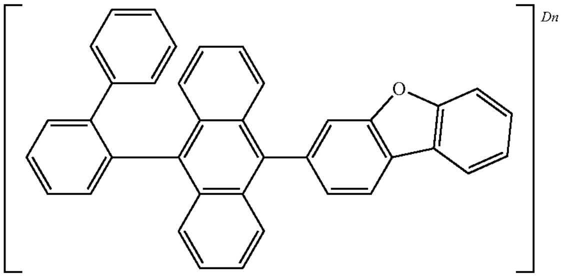
H1-260
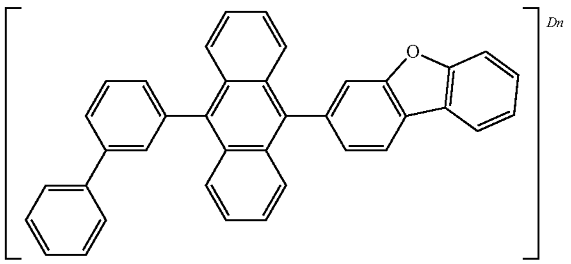
H1-261
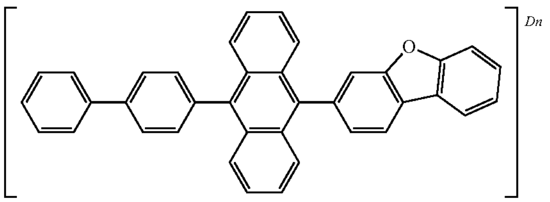

-continued
H1-262
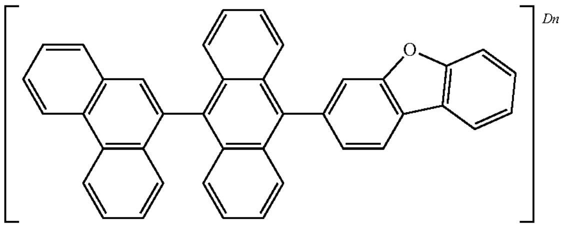
H1-263
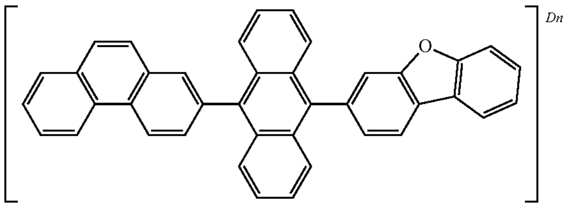
H1-264
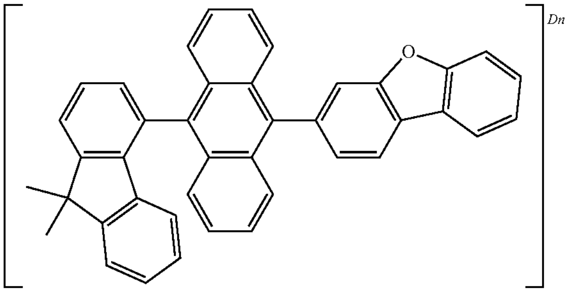
H1-265
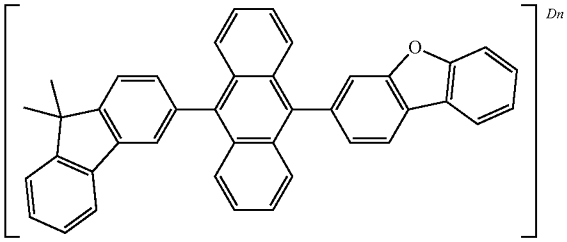
H1-266
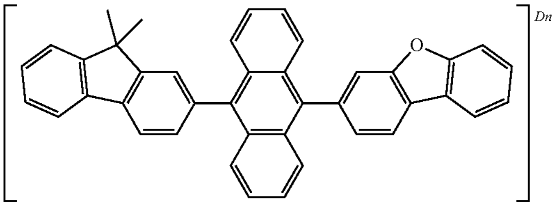
H1-267
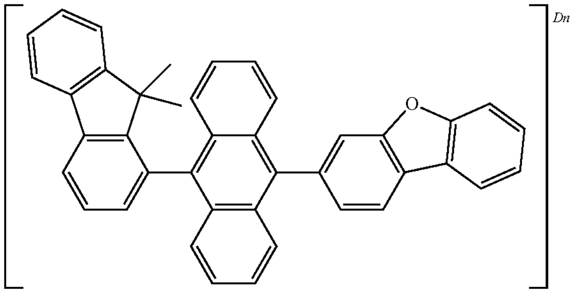
-continued
H1-268
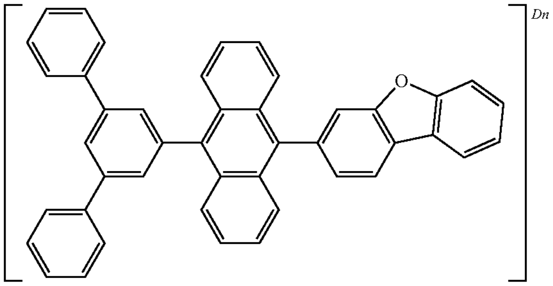
H1-269
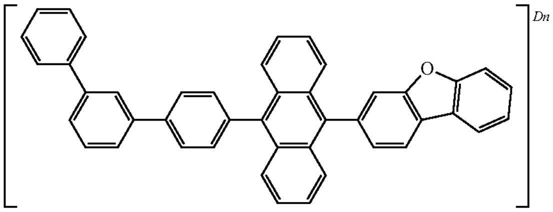
H1-270
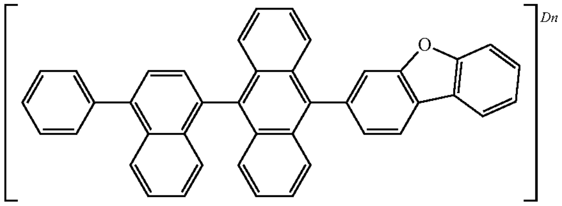
H1-271
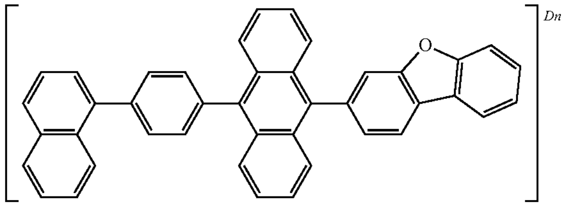
H1-272
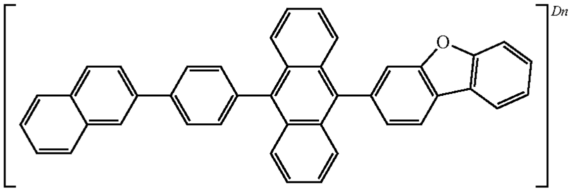
H1-273
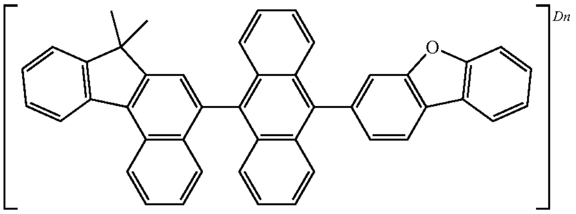

-continued
H1-274
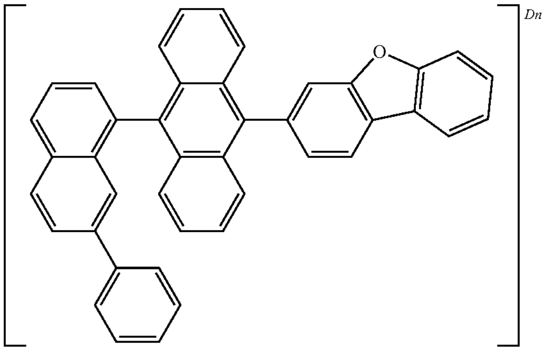
H1-275
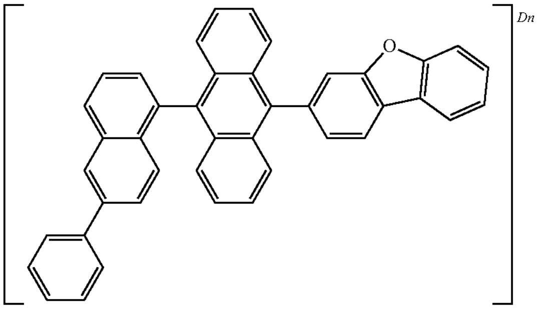
H1-276
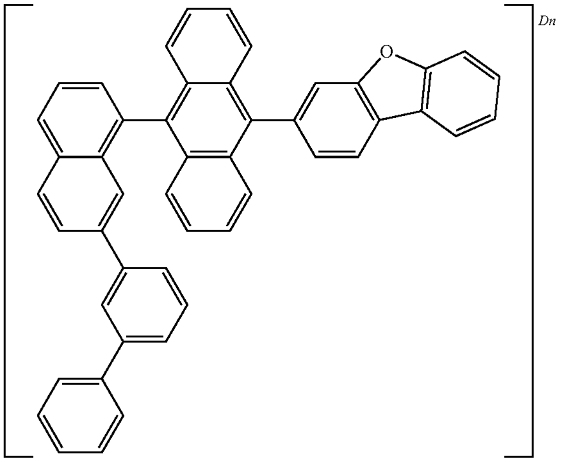
H1-277
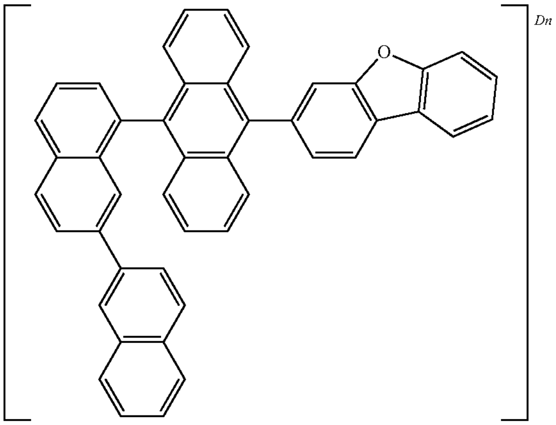
-continued
H1-278
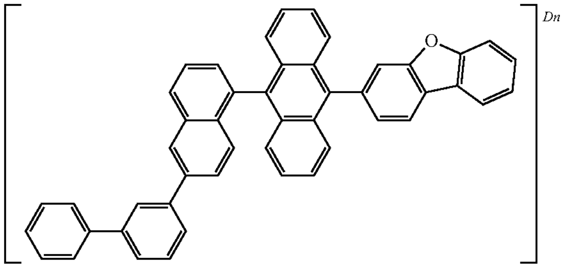
H1-279
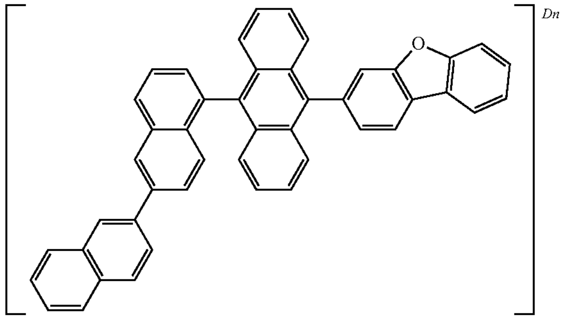
H1-280
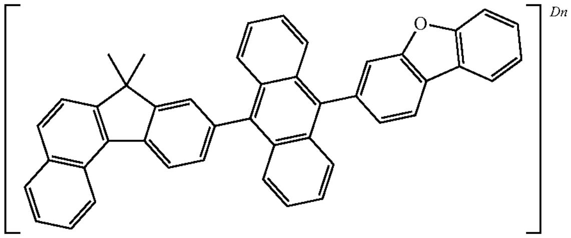
H1-281
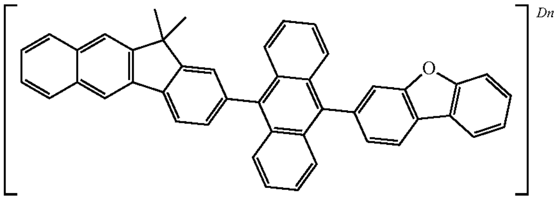
H1-282
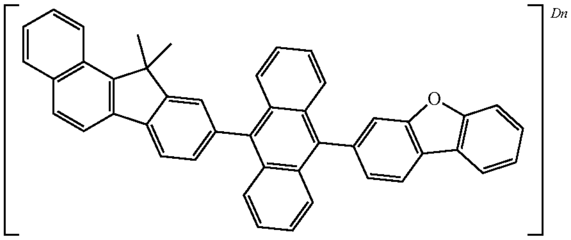
H1-283
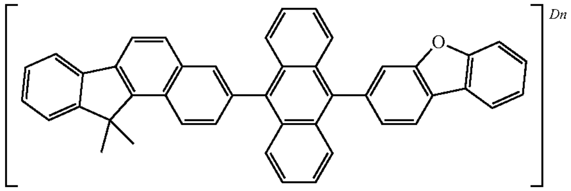

-continued
H1-284
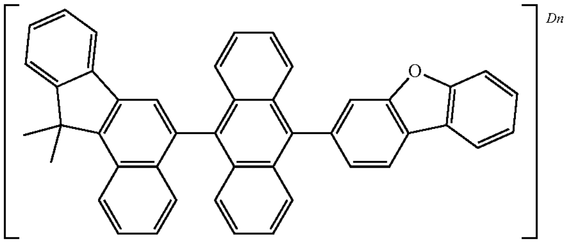
H1-285
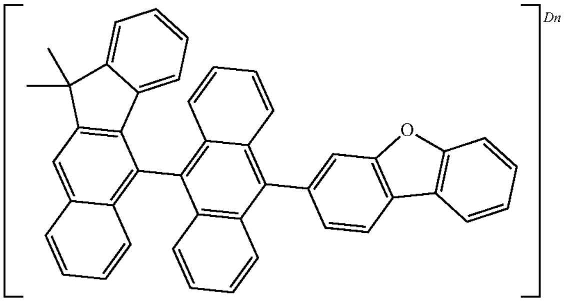
H1-286
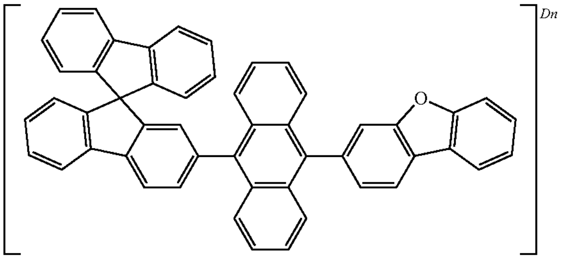
H1-287
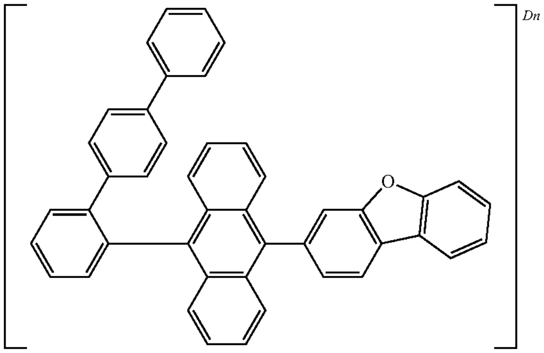
H1-288
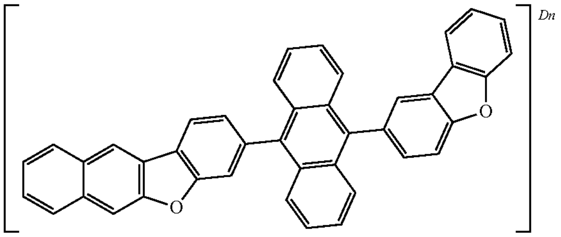
-continued
H1-289
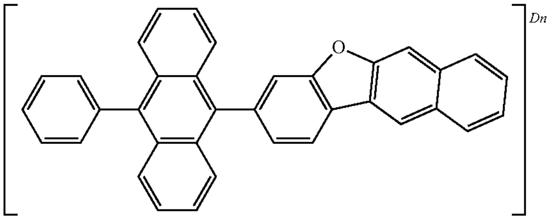
H1-290
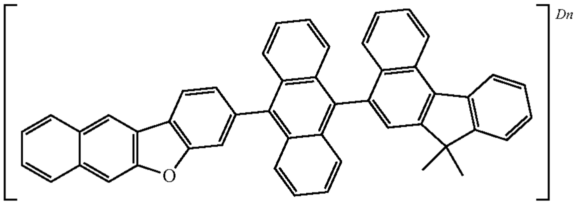
H1-291
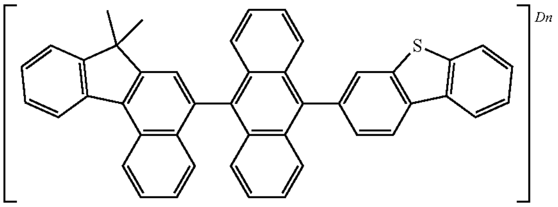
H1-292
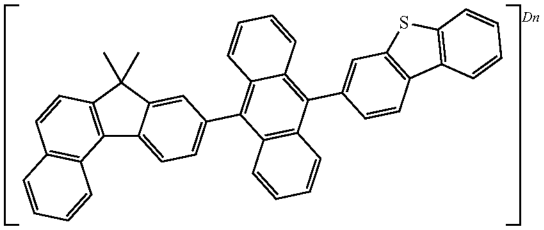
H1-293
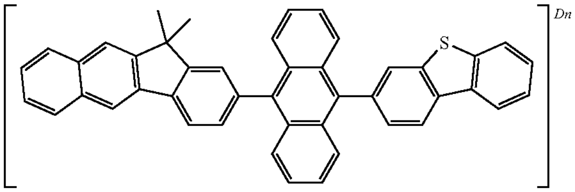
H1-294
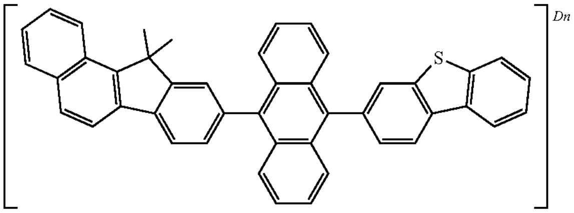

-continued
H1-295
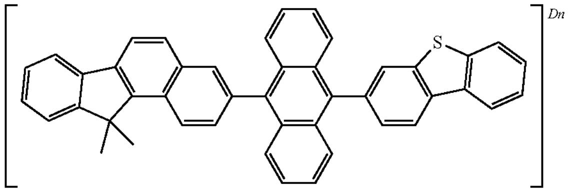
H1-296
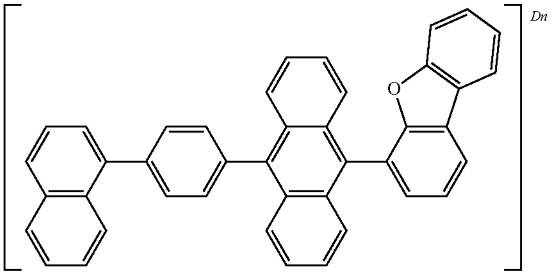
H1-297
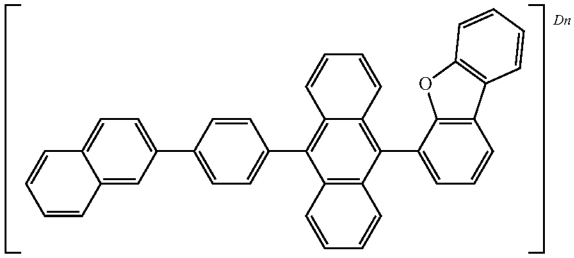
H1-298
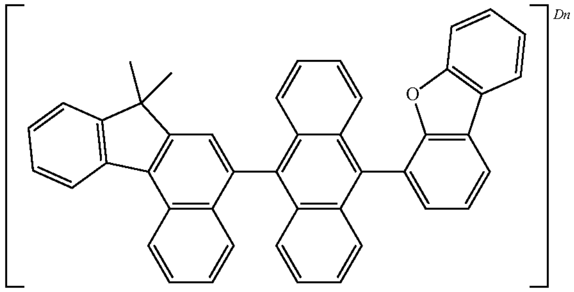
H1-299
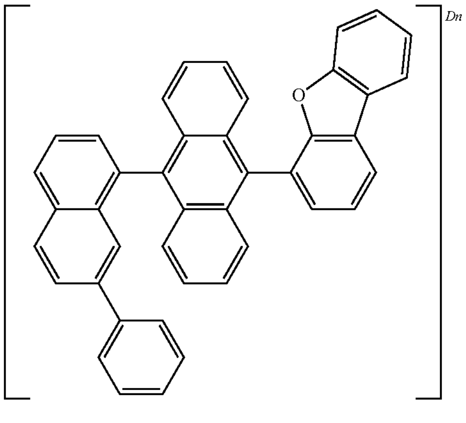
-continued
H1-300
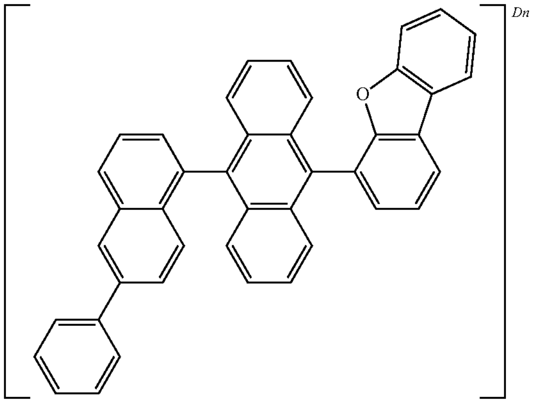
H1-301
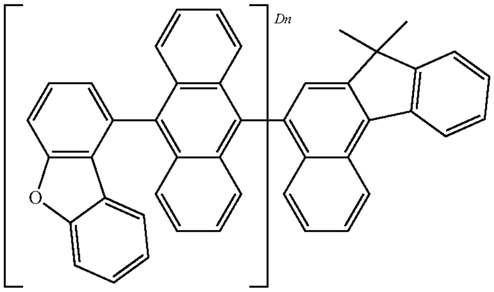
H1-302
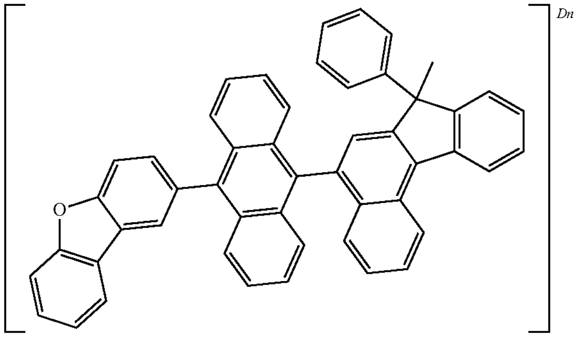
H1-303
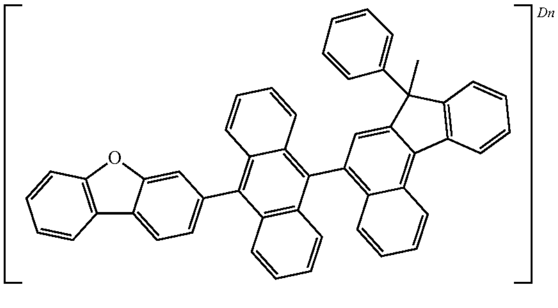

-continued
H1-304
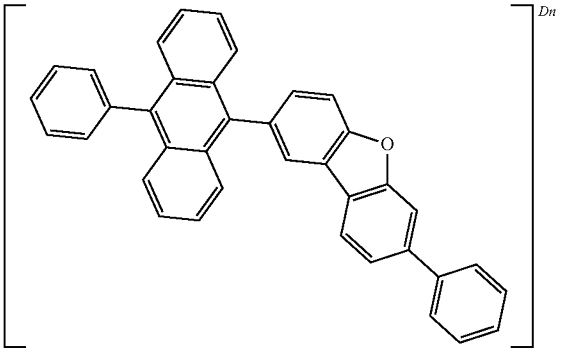
H1-305
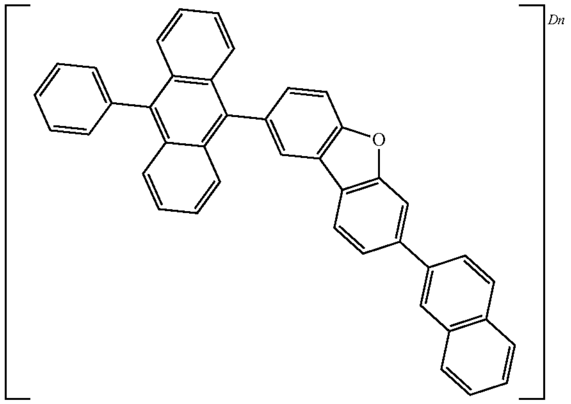
H2-1
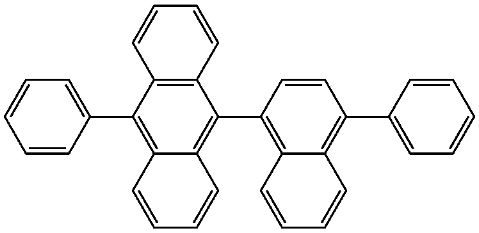
H2-2
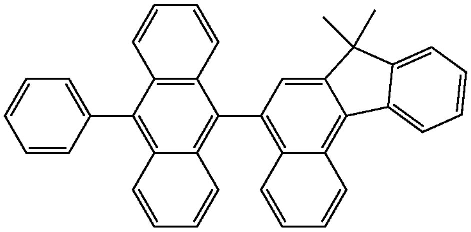
H2-3
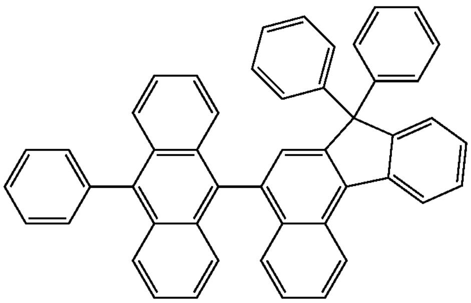
-continued
H2-4
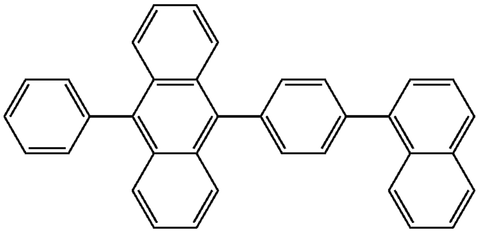
H2-5
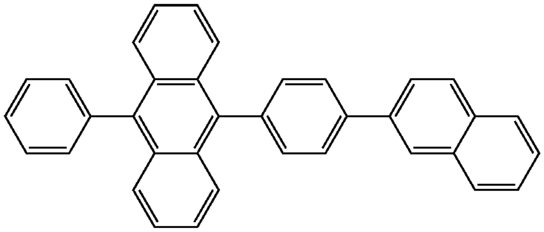
H2-6
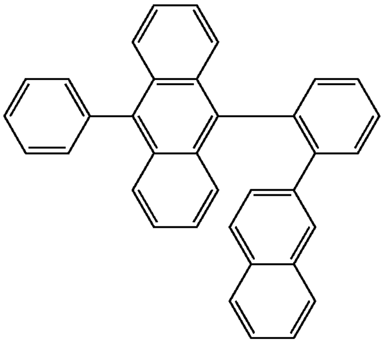
H2-7
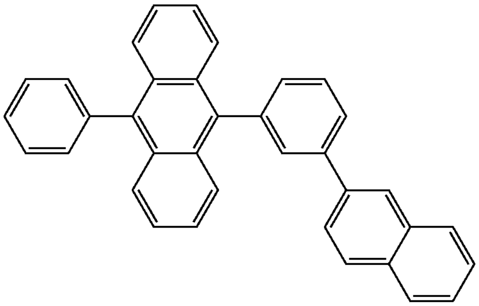
H2-8
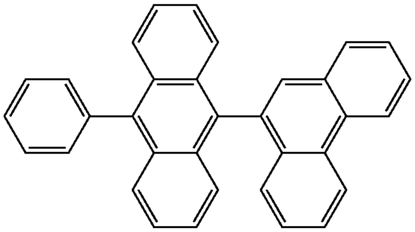

-continued
H2-9
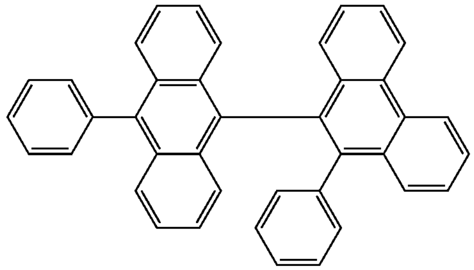
H2-10
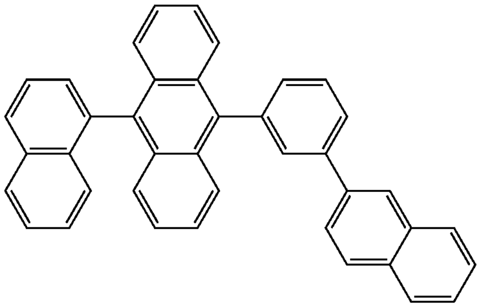
H2-11
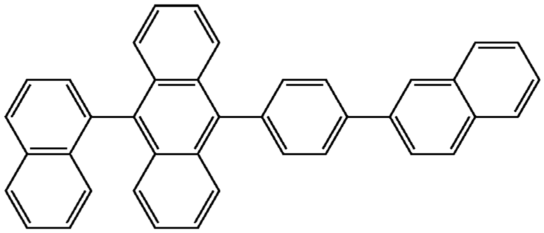
H2-12
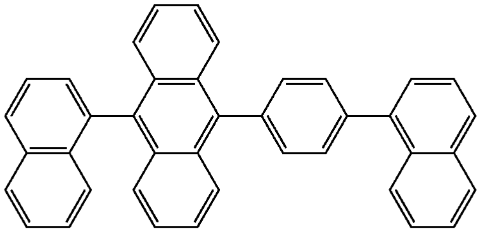
H2-13
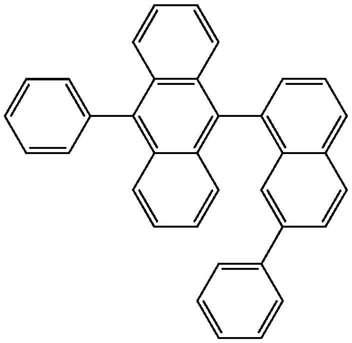
-continued
H2-14
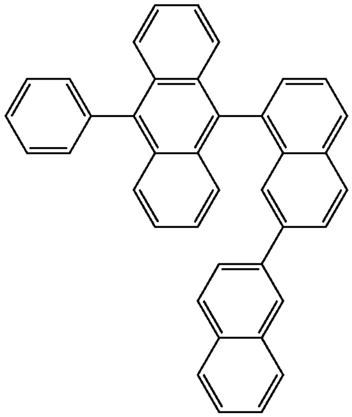
H2-15
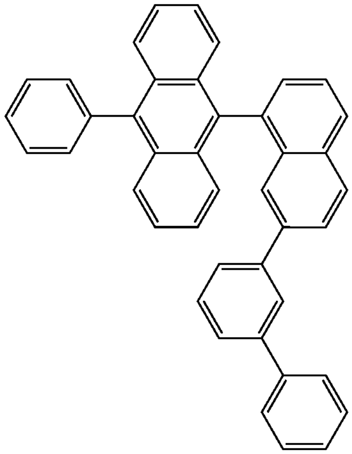
H2-16
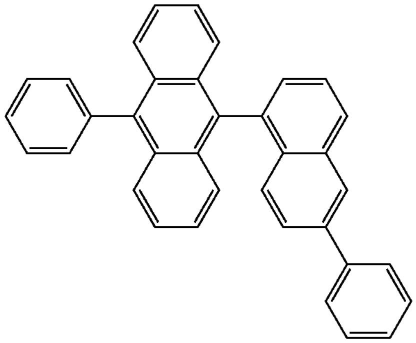
H2-17
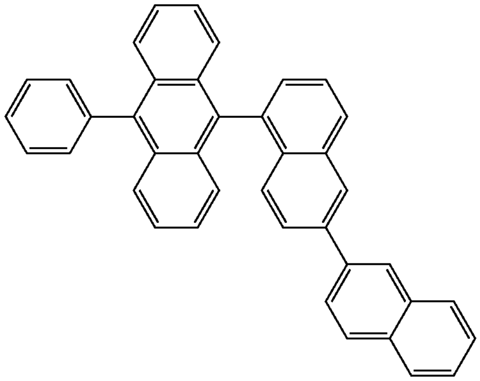

-continued
H2-18
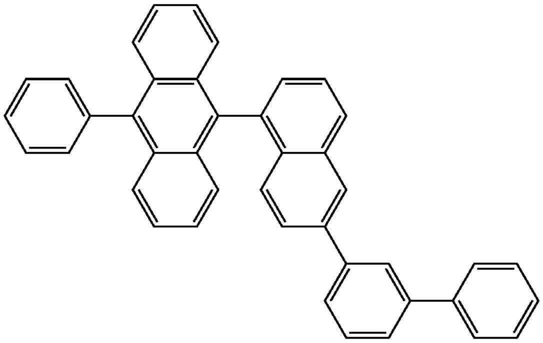
H2-19
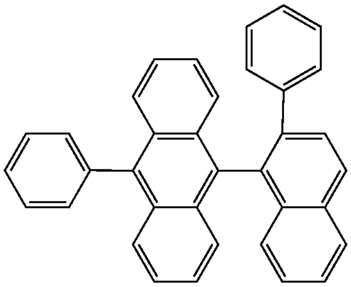
H2-20
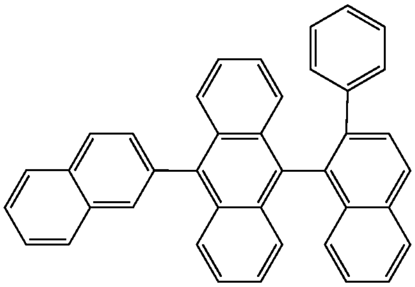
H2-21
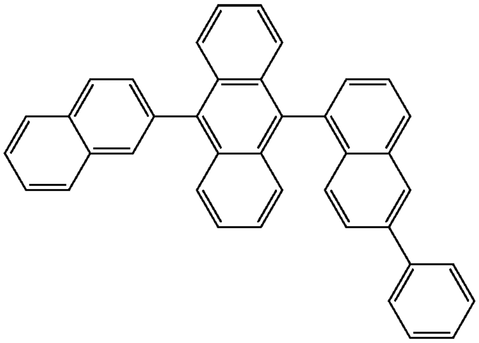
H2-22
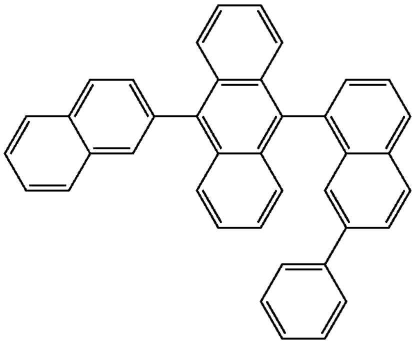
-continued
H2-23
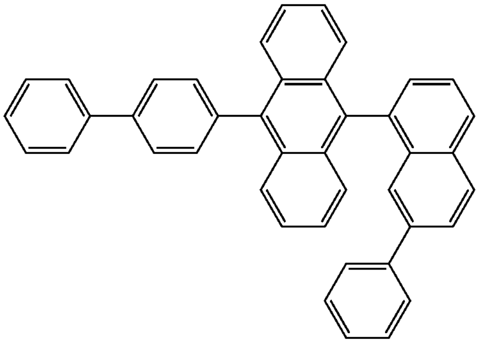
H2-24
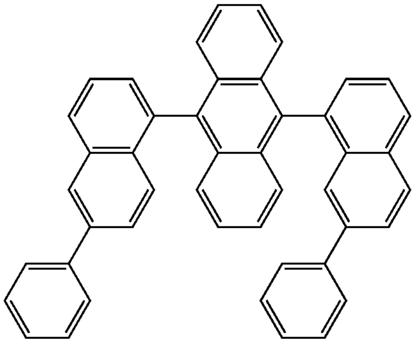
H2-25
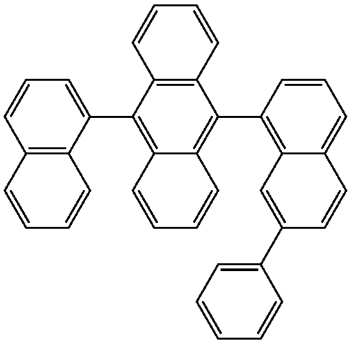
H2-26
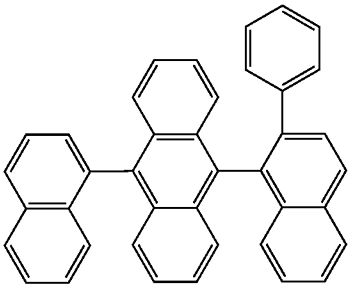

-continued
H2-27
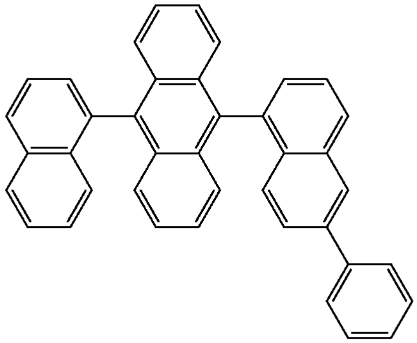
H2-28
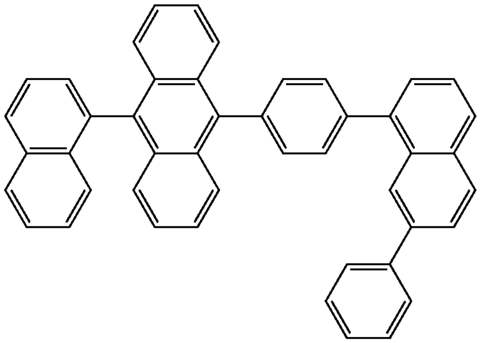
H2-29
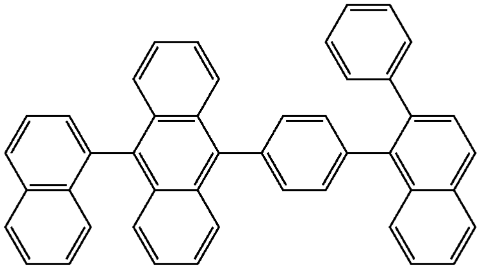
H2-30
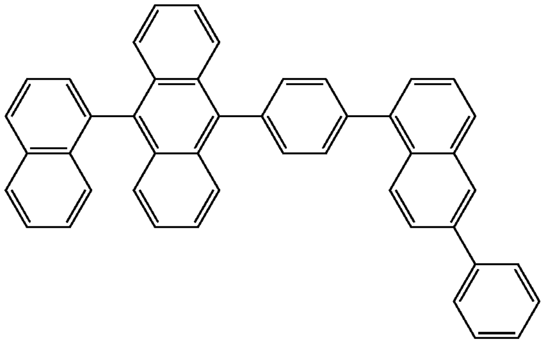
-continued
H2-31
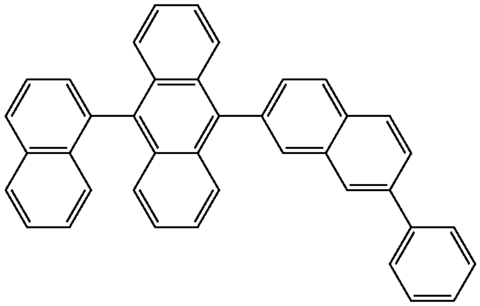
H2-32
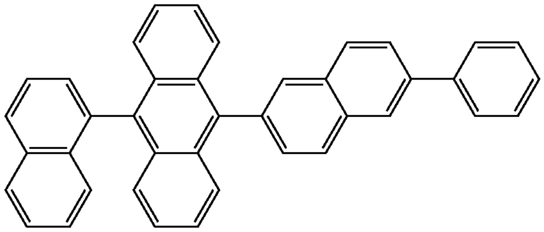
H2-33
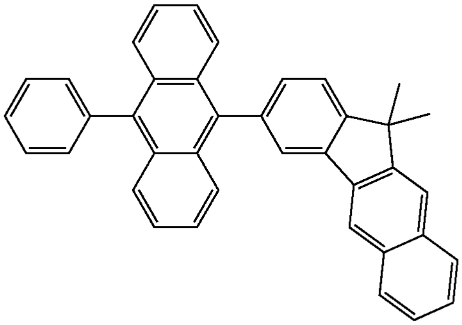
H2-34
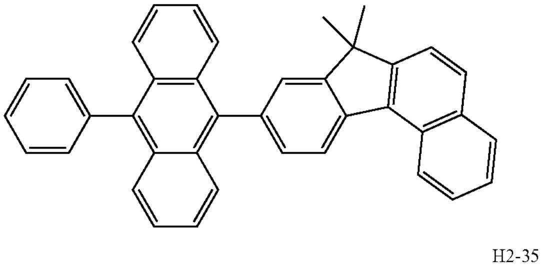
H2-35
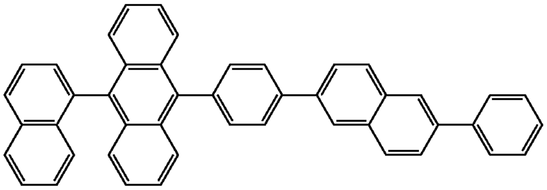

-continued
H2-36
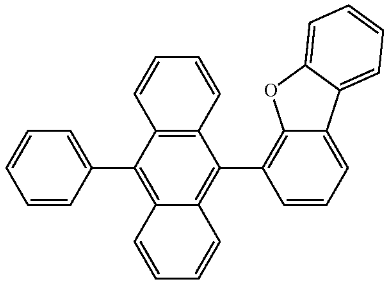
H2-37
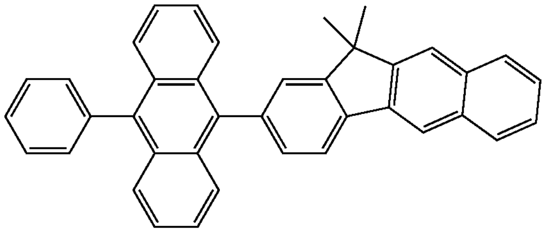
H2-38
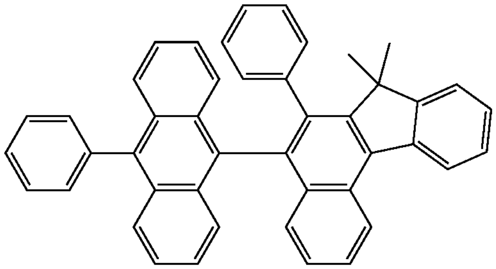
H2-39
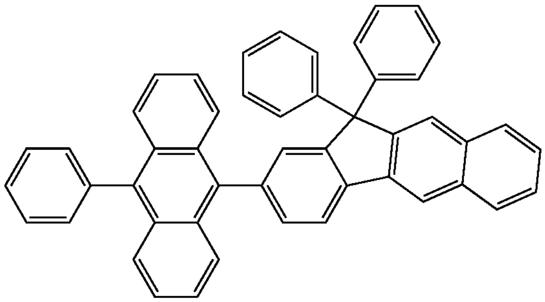
H2-40
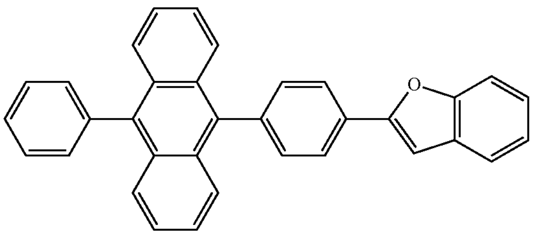
-continued
H2-41
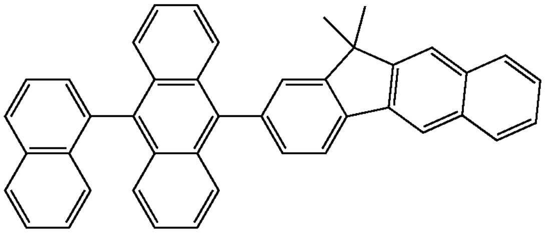
H2-42
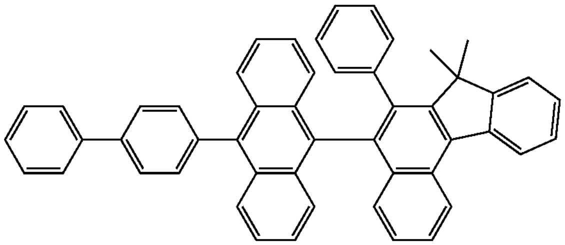
H2-43
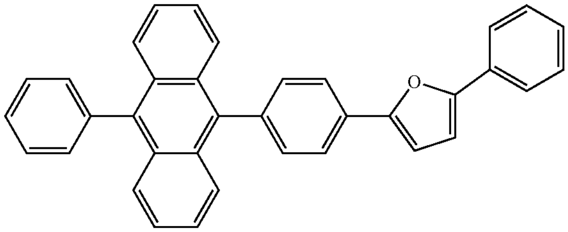
H2-44
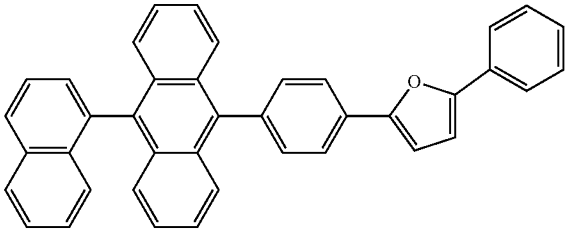
H2-45
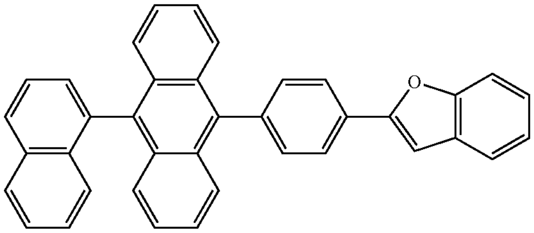
H2-46
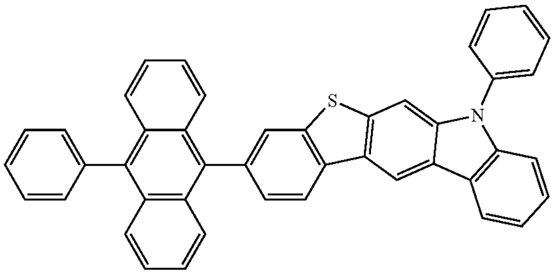

-continued
H2-47
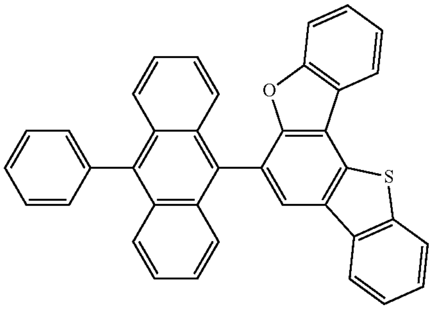
H2-48
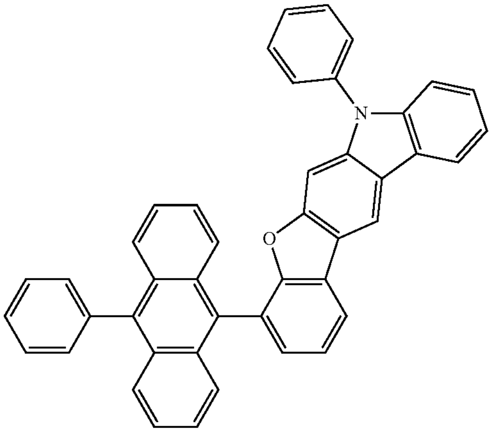
H2-49
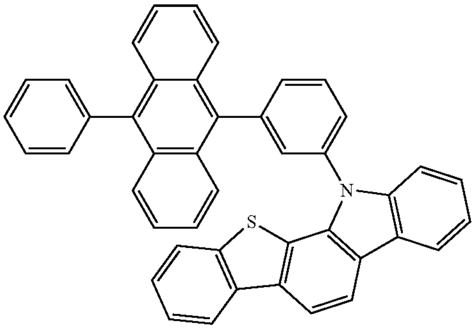
H2-50
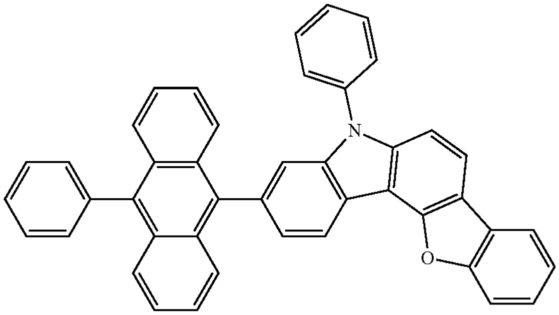
-continued
H2-51
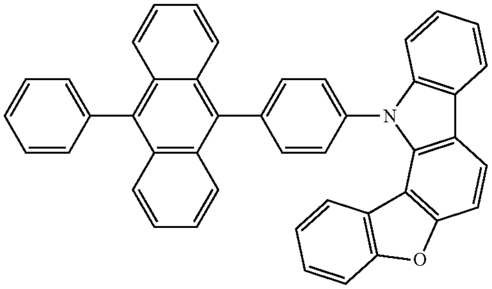
H2-52
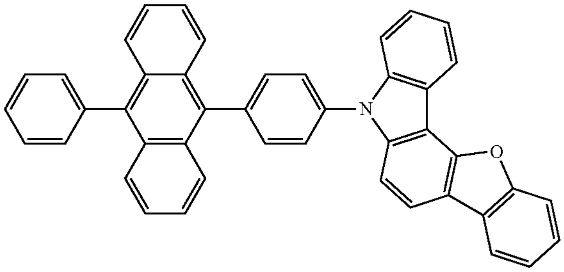
H2-53
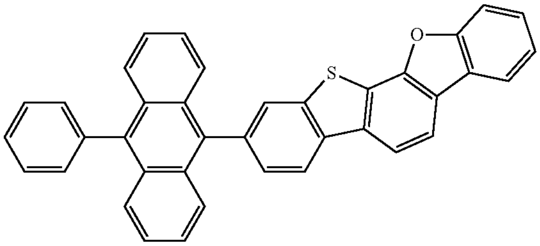
H2-54
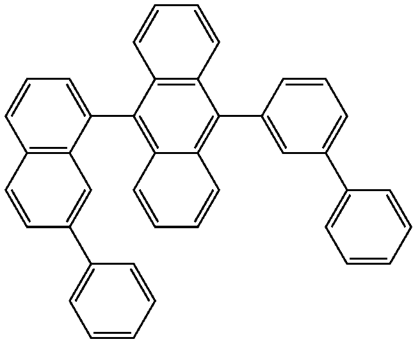
H2-55
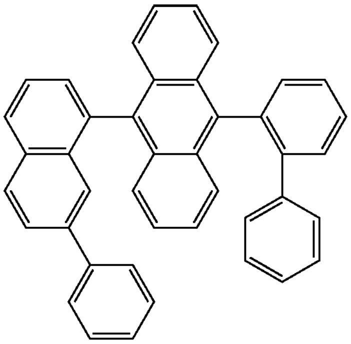

-continued
H2-56
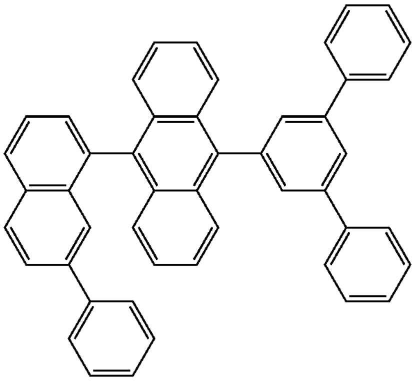
H2-57
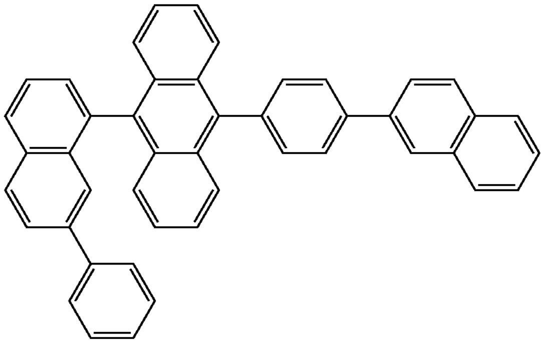
H2-58
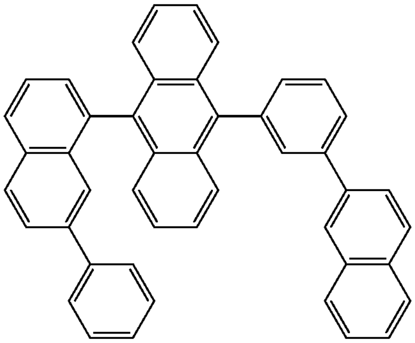
H2-59
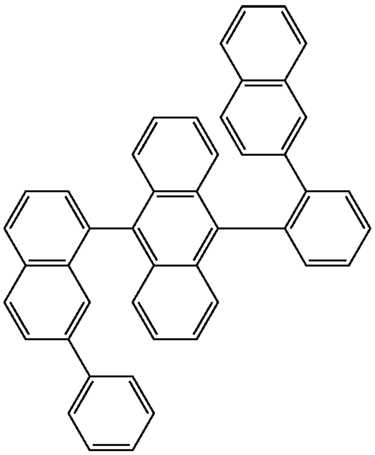
-continued
H2-60
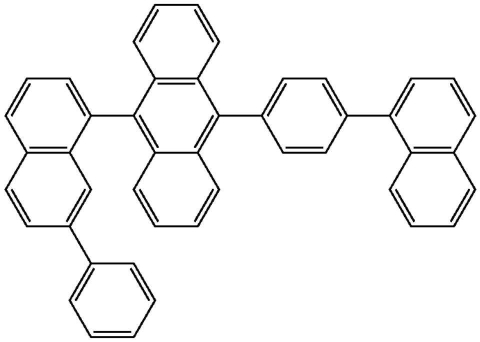
H2-61
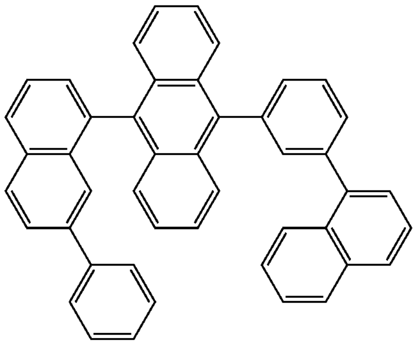
H2-62
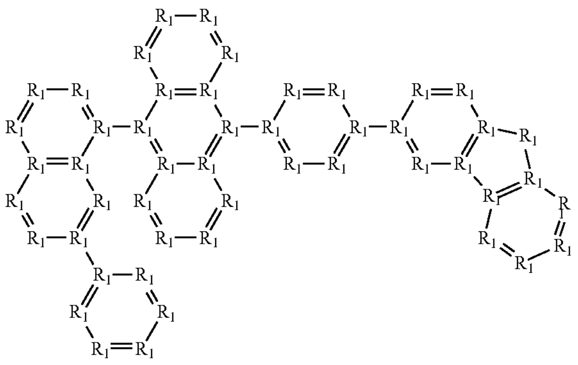
H2-63
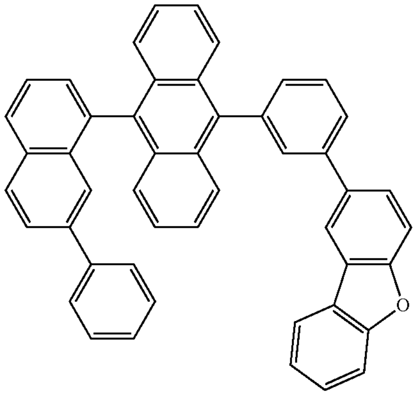

H2-64
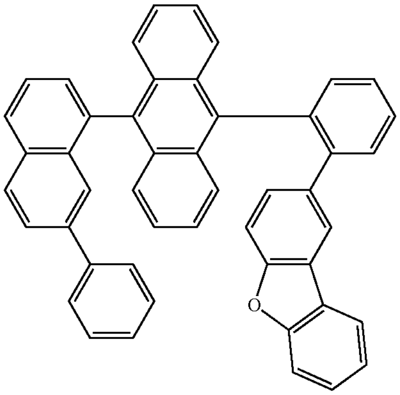
H2-65
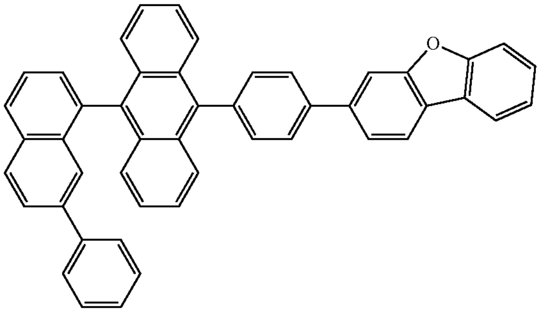
H2-66
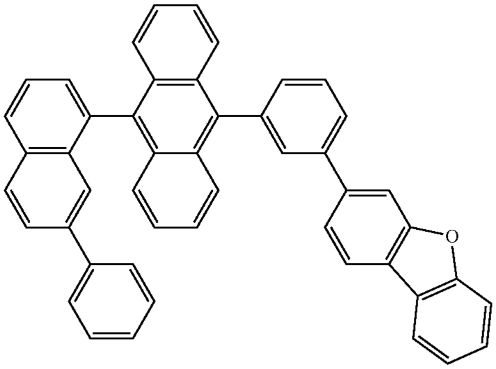
H2-67
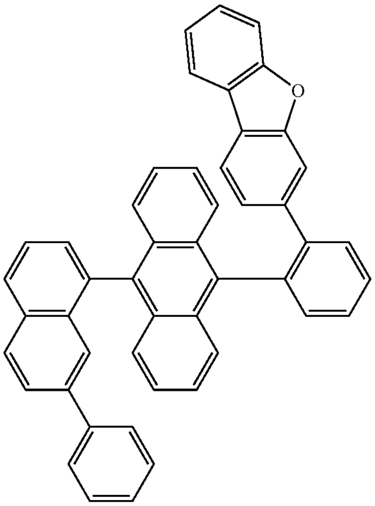
H2-68
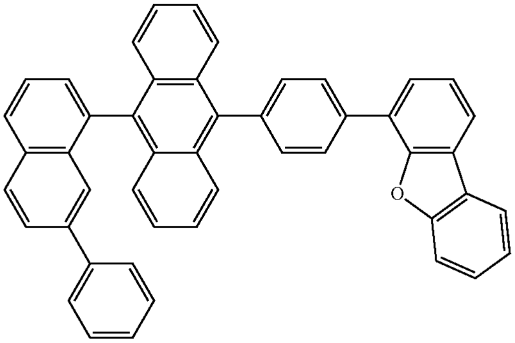
H2-69
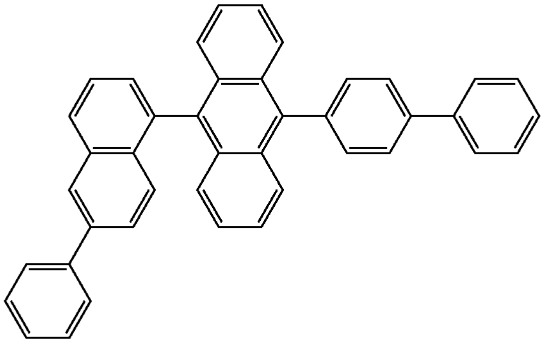
H2-70
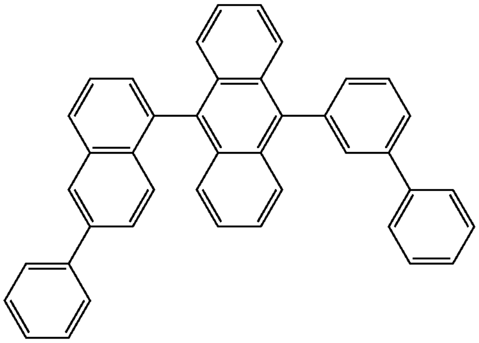
H2-71
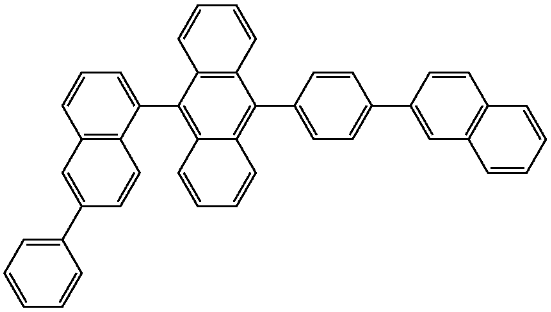

-continued
H2-72
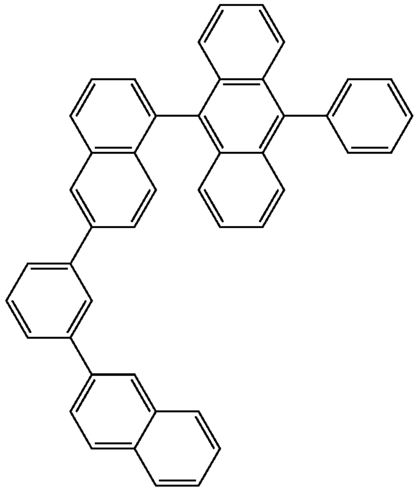
H2-73
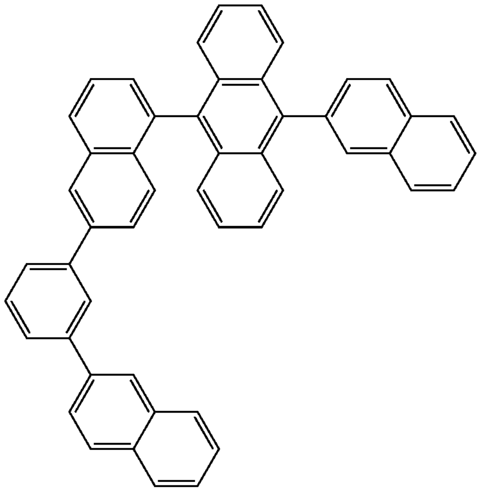
H2-74
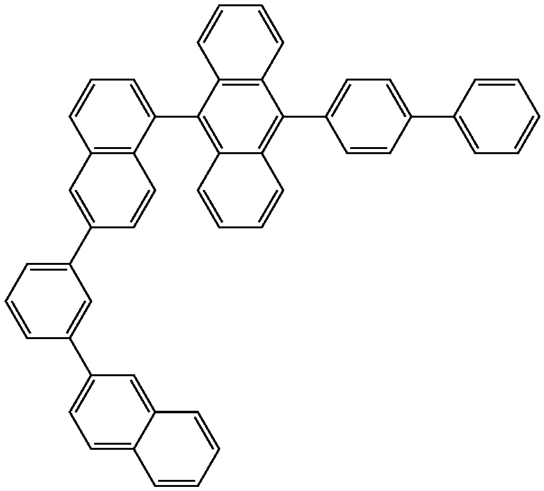
-continued
H2-75
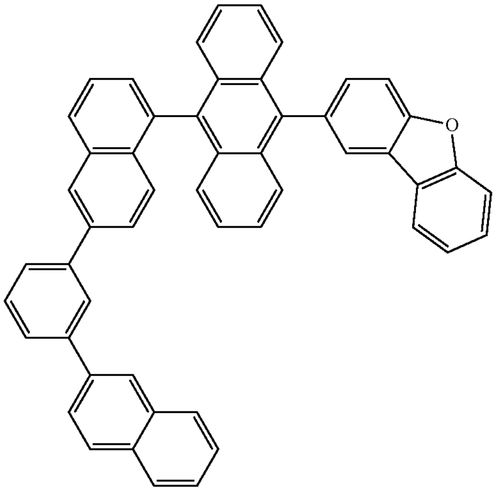
H2-76
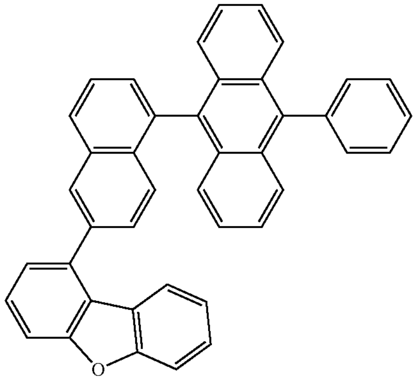
H2-77
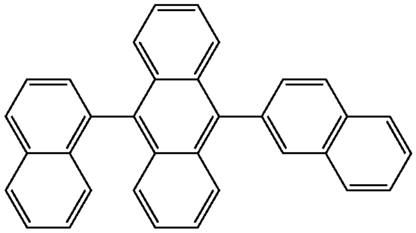
H2-78
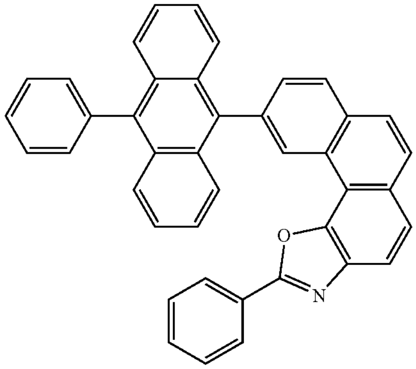

-continued
H2-79
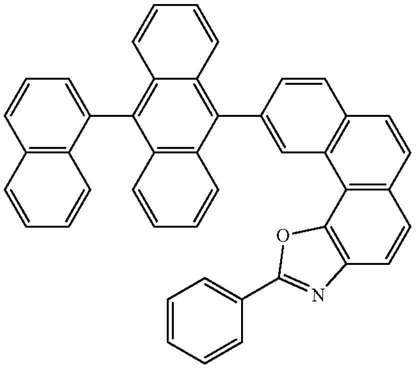
H2-80
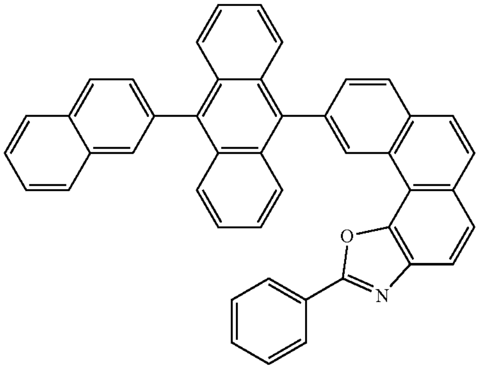
H2-81
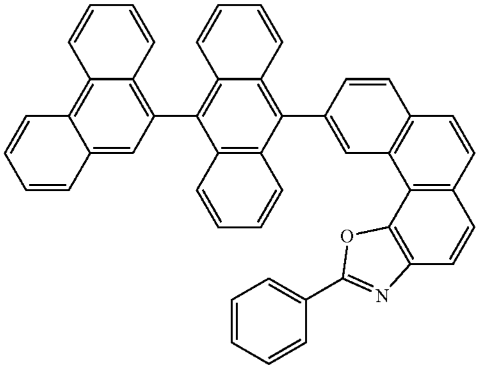
H2-82
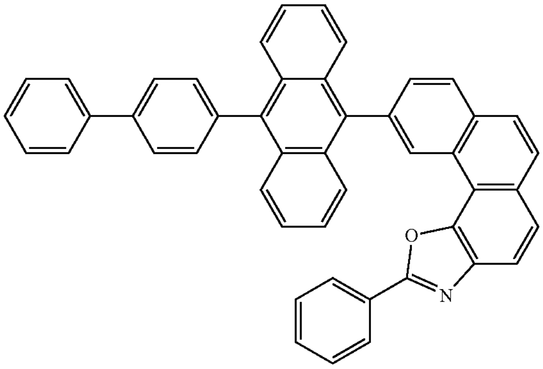
-continued
H2-83
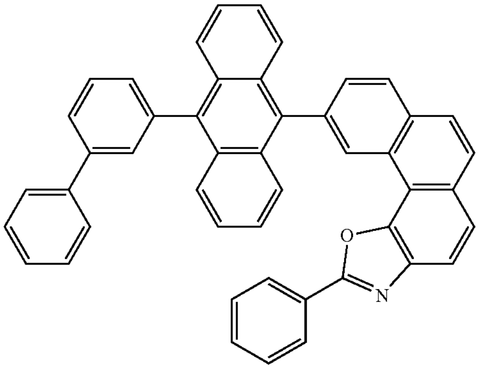
H2-84
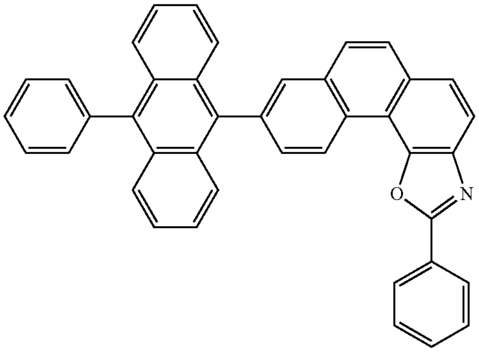
H2-85
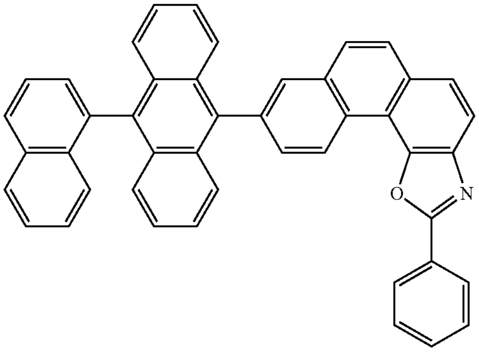
H2-86
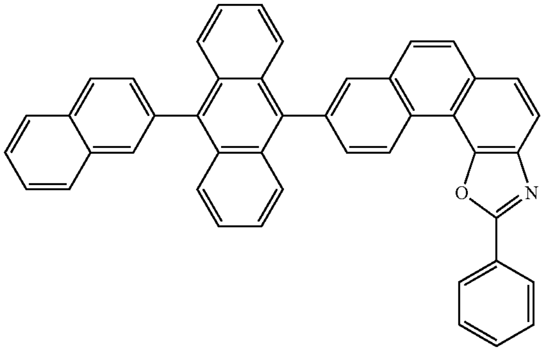

-continued
H2-87
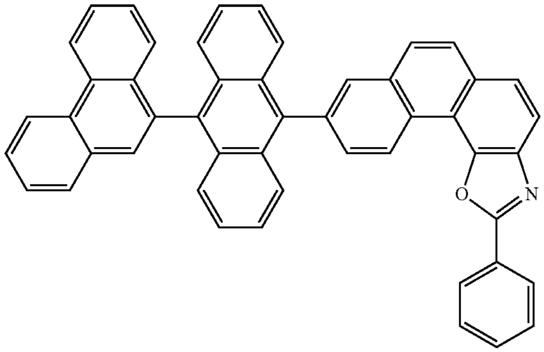
H2-88
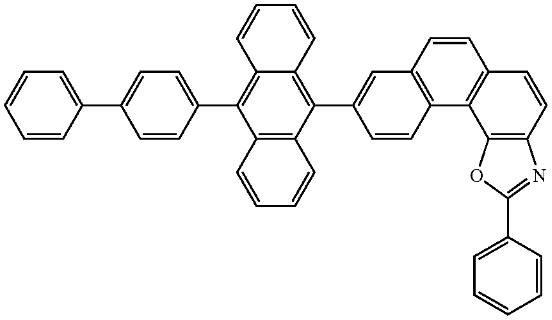
H2-89
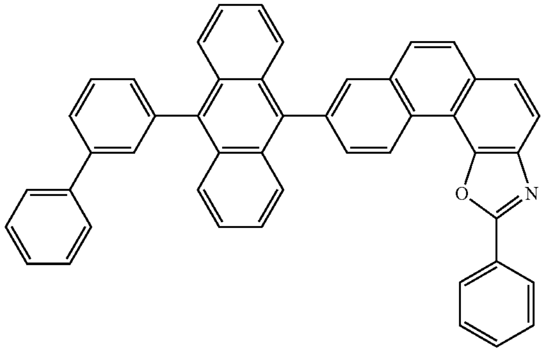
H2-90
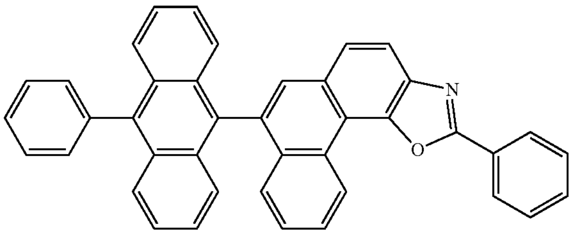
H2-91
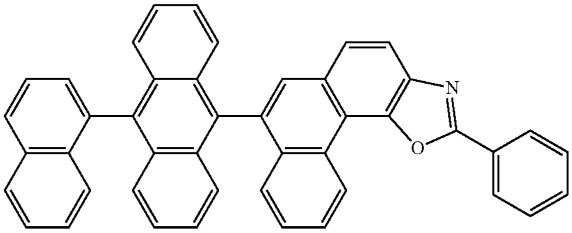
-continued
H2-92
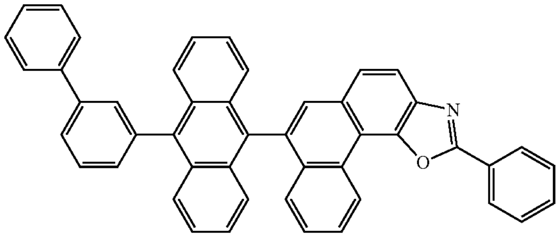
H2-93
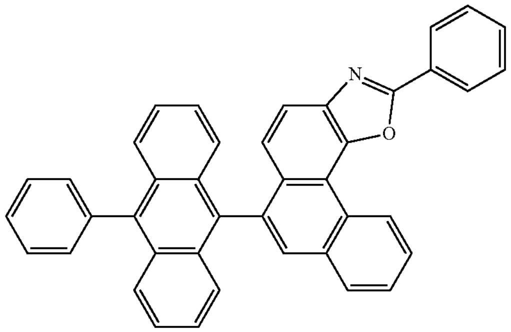
H2-94
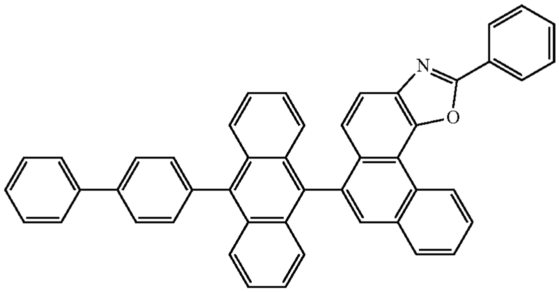
H2-95
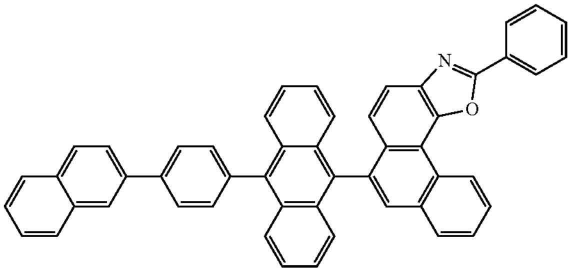
H2-96
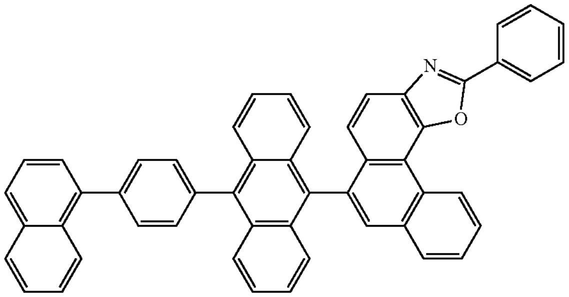

-continued
H2-97
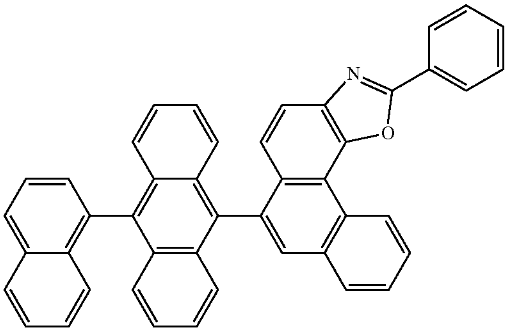
H2-98
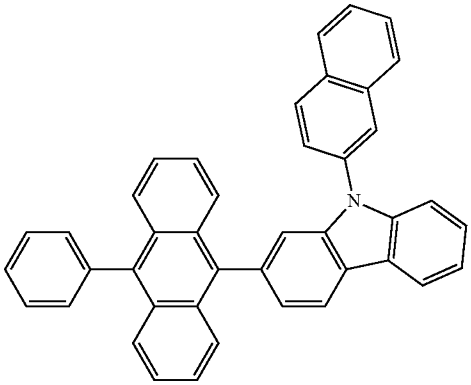
H2-99
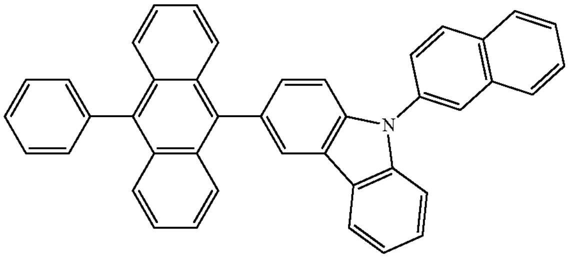
H2-100
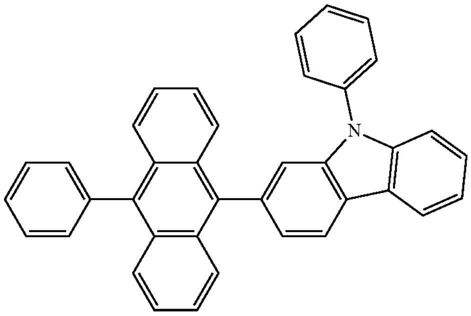
-continued
H2-101
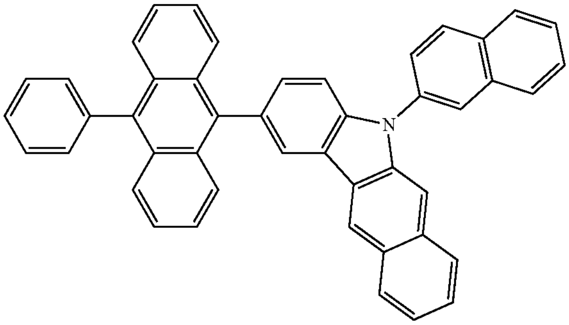
H2-102
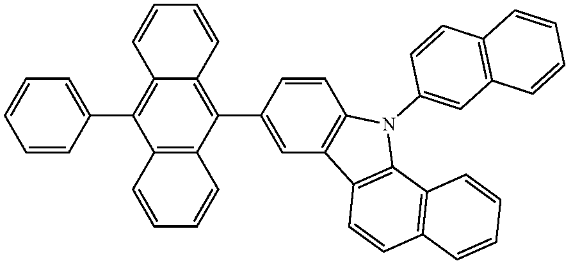
H2-103
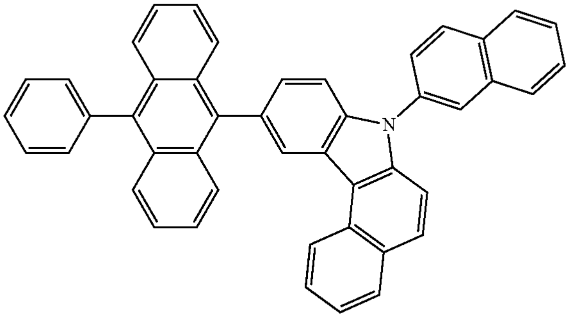
H2-104
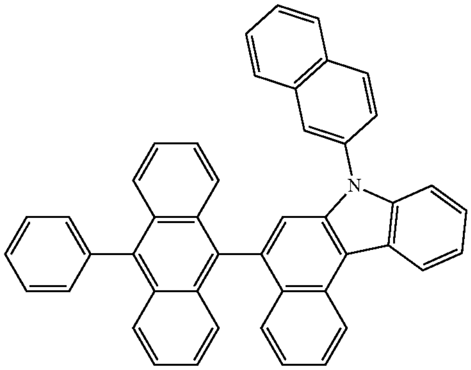
H2-105
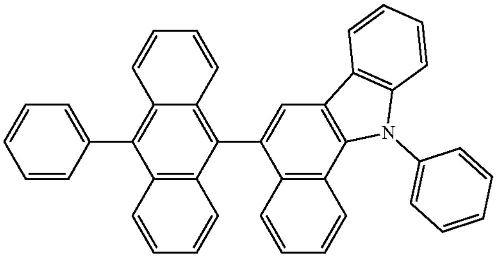

-continued
H2-106
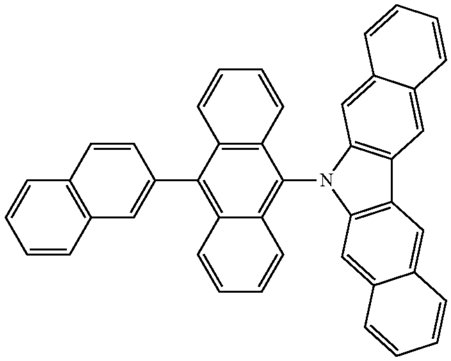
H2-107
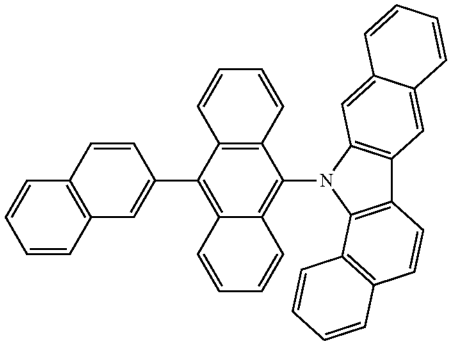
H2-108
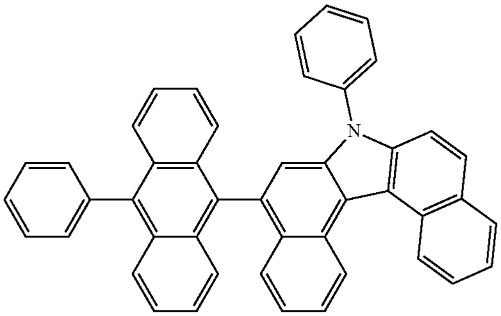
H2-109
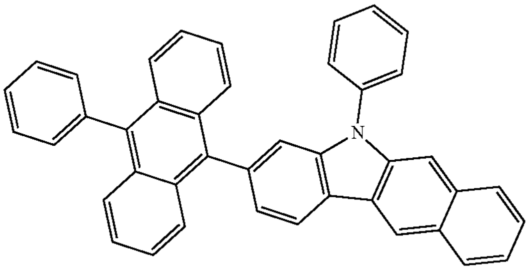
-continued
H2-110
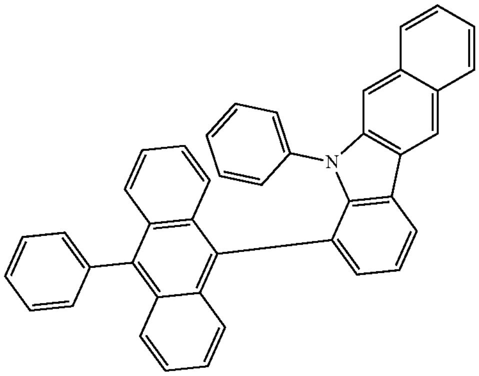
H2-111
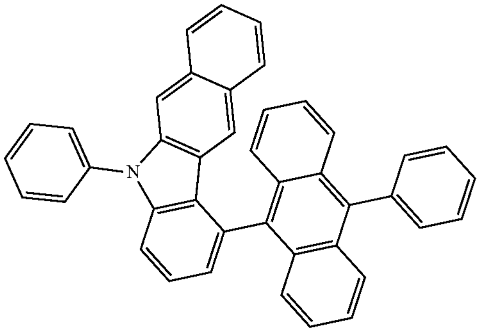
H2-112
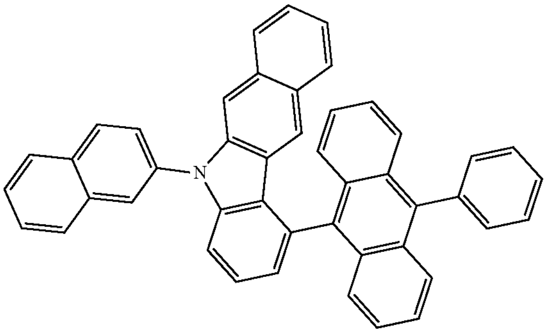
H2-113
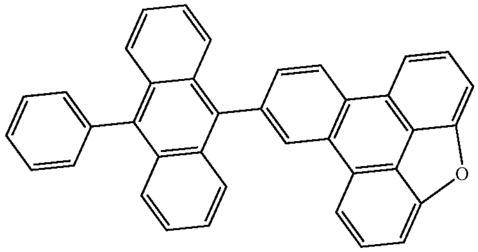

-continued
H2-114
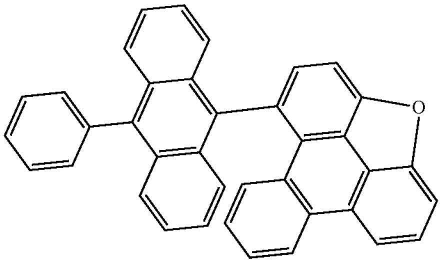
H2-115
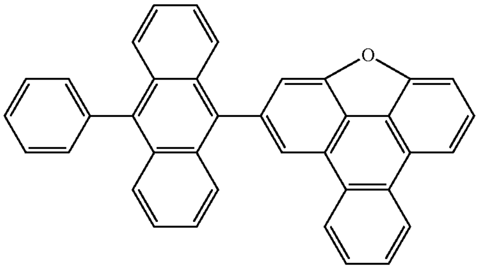
H2-116
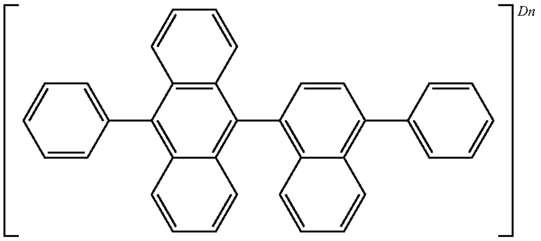
H2-117
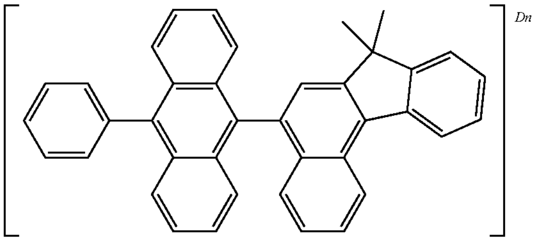
H2-118
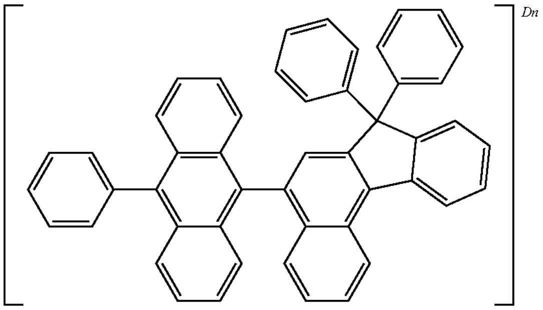
-continued
H2-119
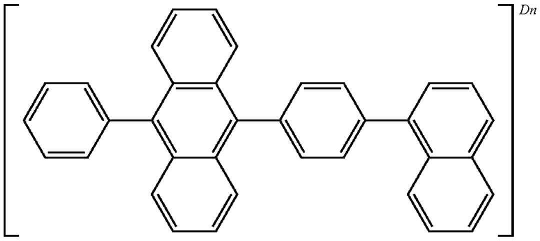
H2-120
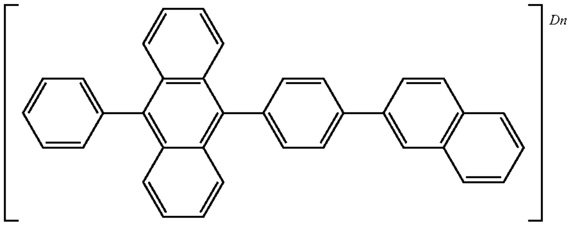
H2-121
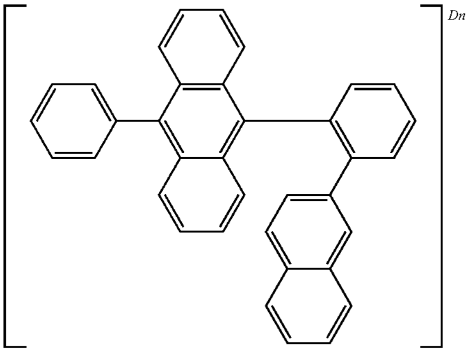
H2-122
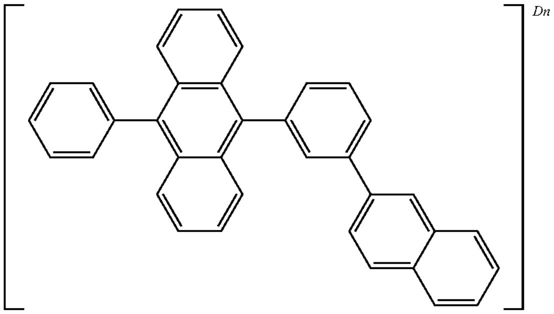
H2-123
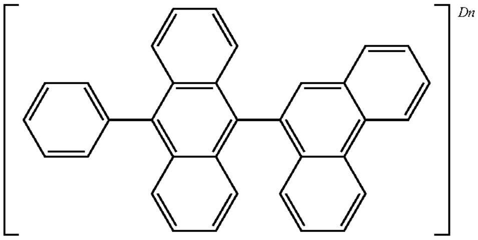

-continued
H2-124
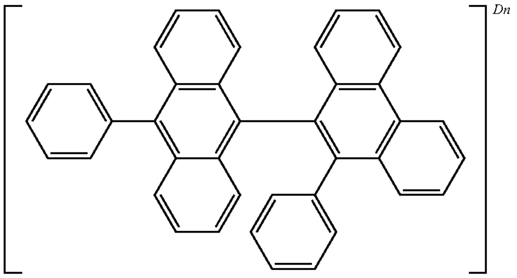
H2-125
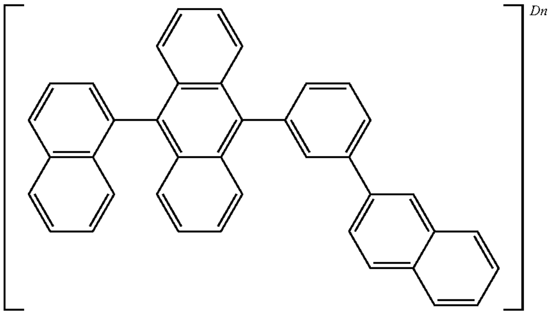
H2-126
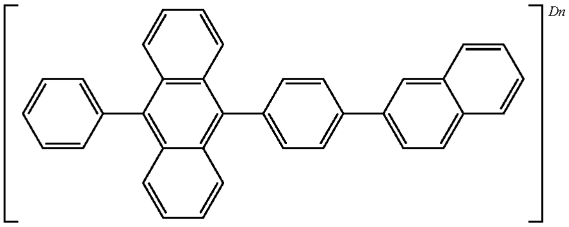
H2-127
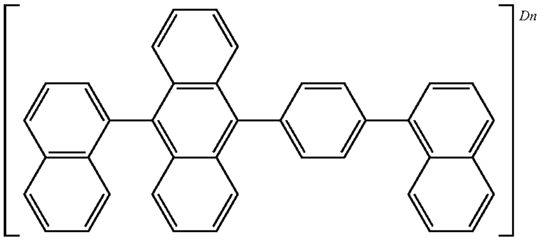
H2-128
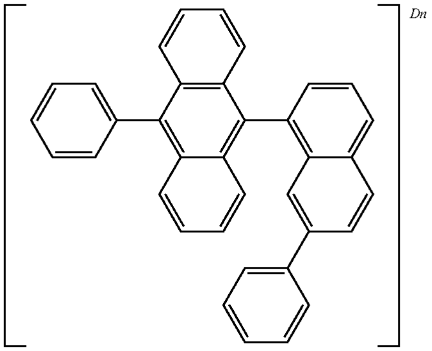
-continued
H2-129
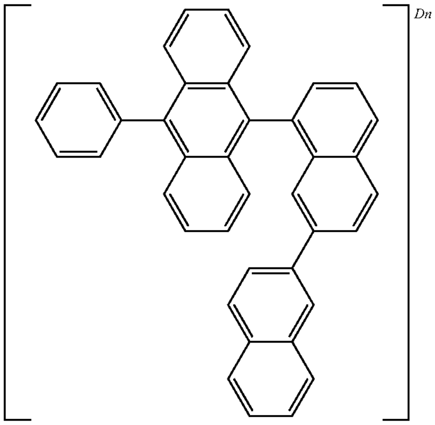
H2-130
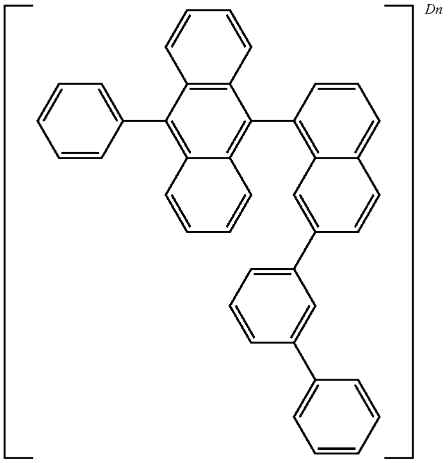
H2-131
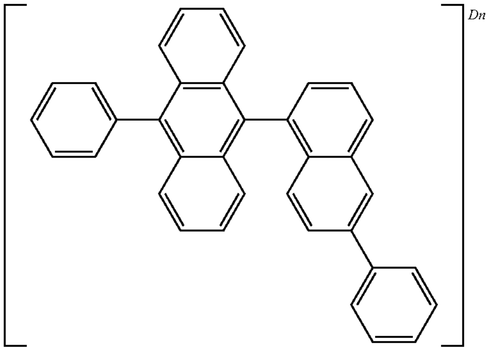

-continued
H2-132
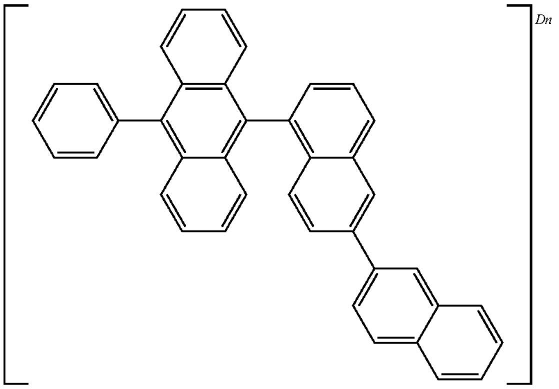
H2-133
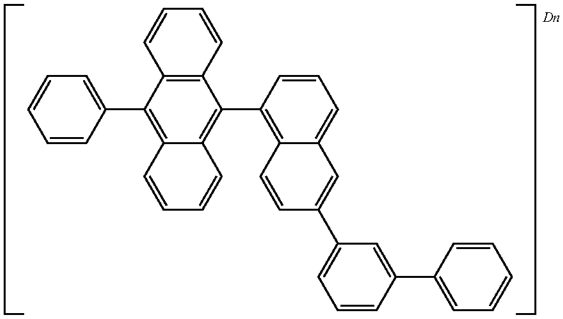
H2-134
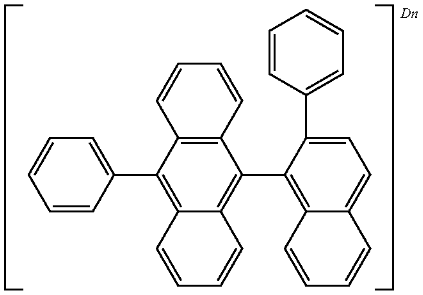
H2-135
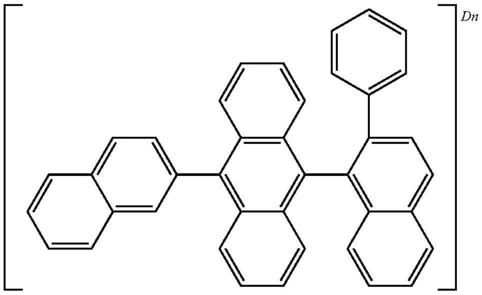
-continued
H2-136
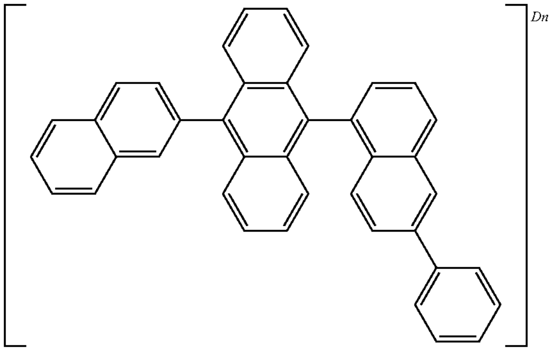
H2-137
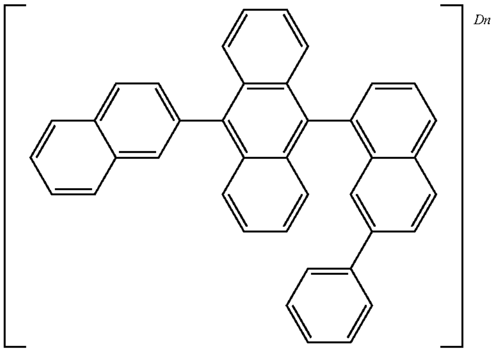
H2-138
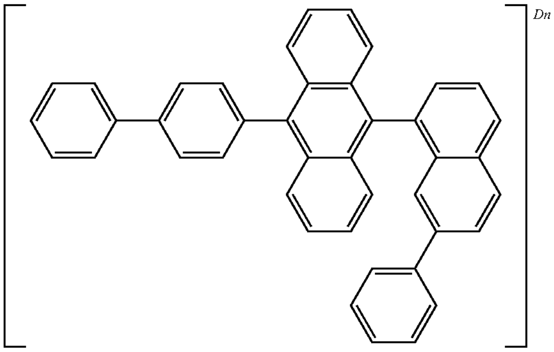
H2-139
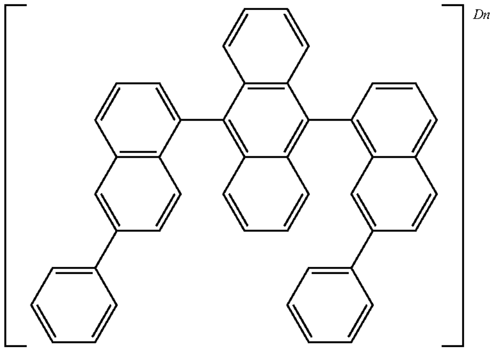

-continued
H2-140
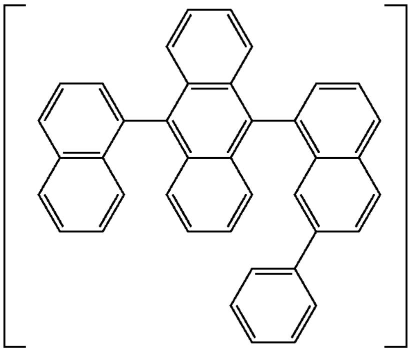
H2-141
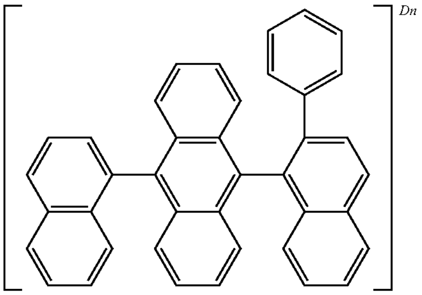
H2-142
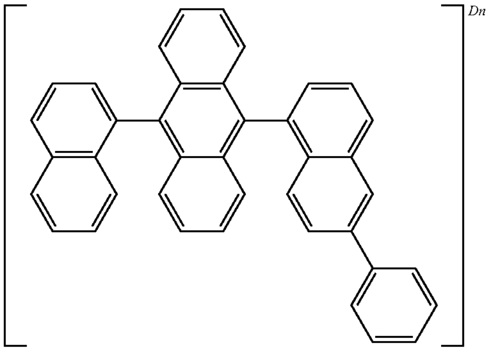
H2-143
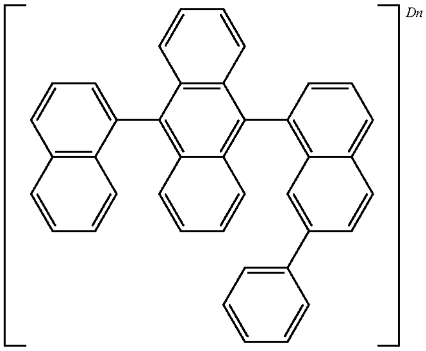
-continued
H2-144
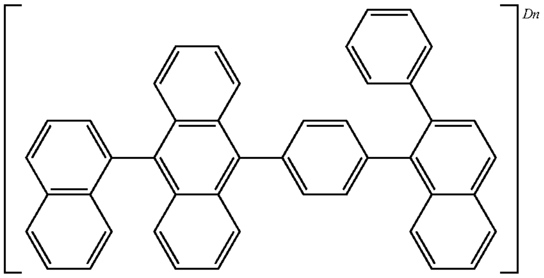
H2-145
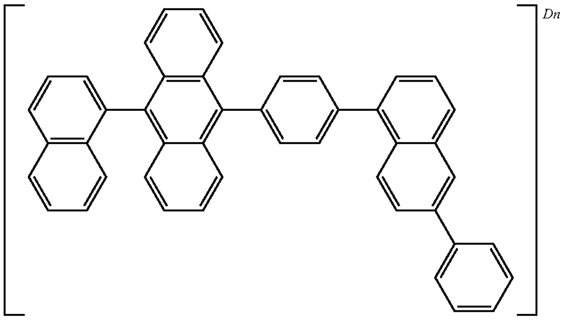
H2-146
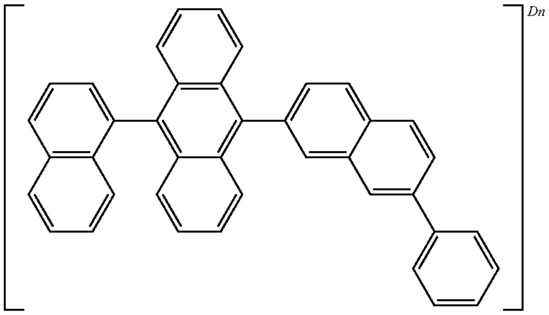
H2-147
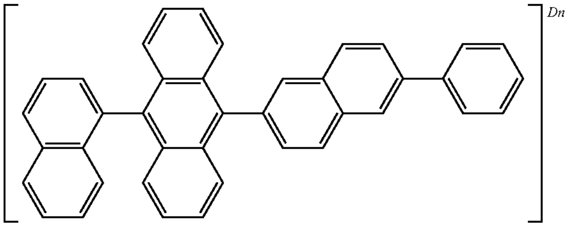
H2-148
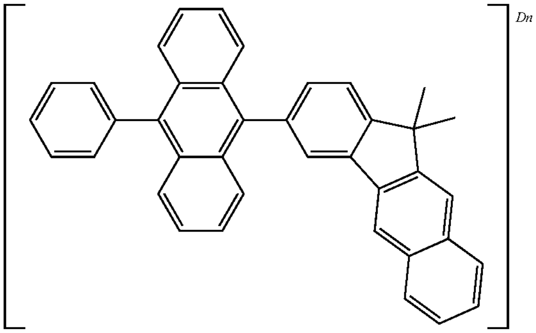

-continued
H2-149
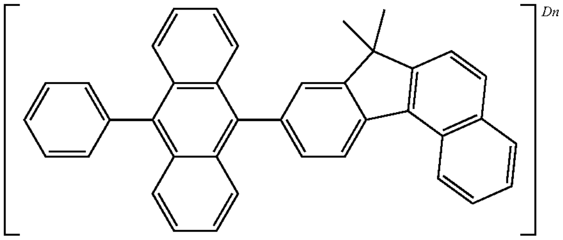
H2-150
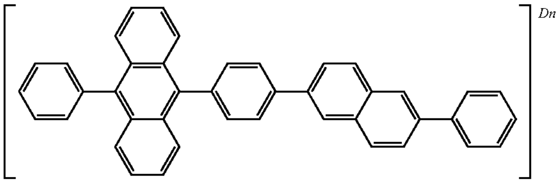
H2-151
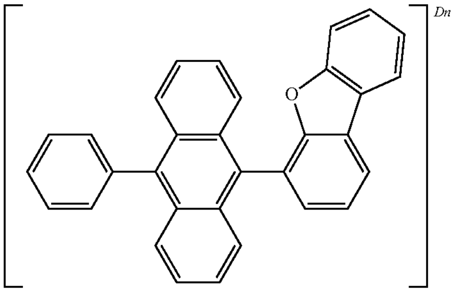
H2-152
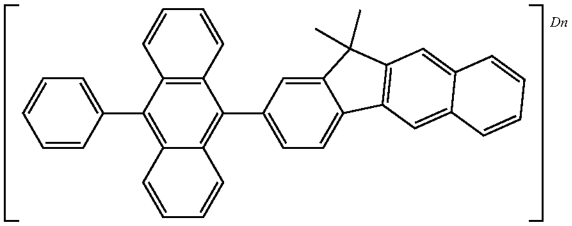
H2-153
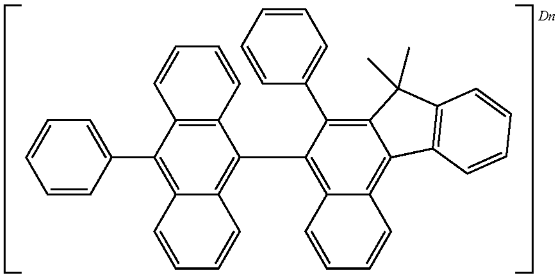
-continued
H2-154
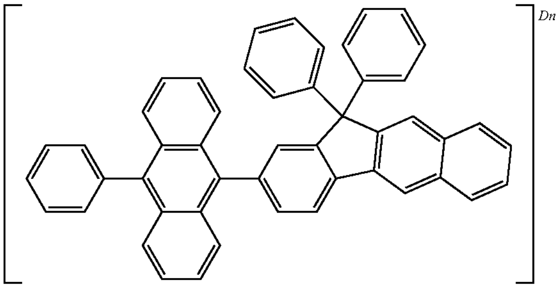
H2-155
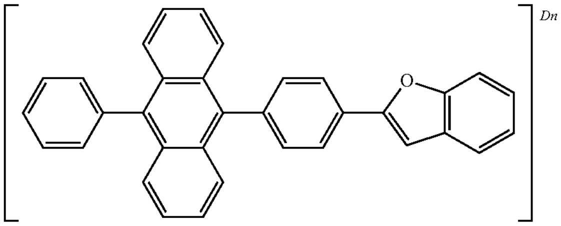
H2-156
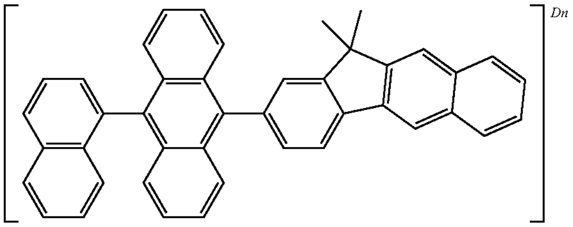
H2-157
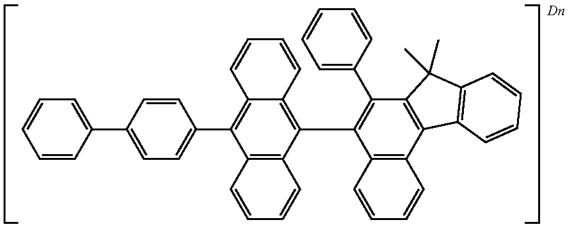
H2-158
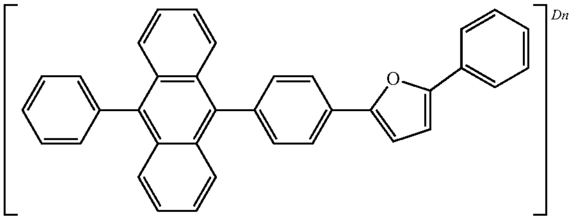
H2-159
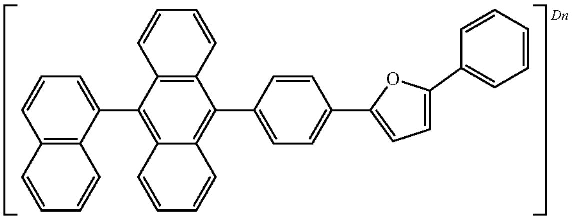

-continued
H2-160
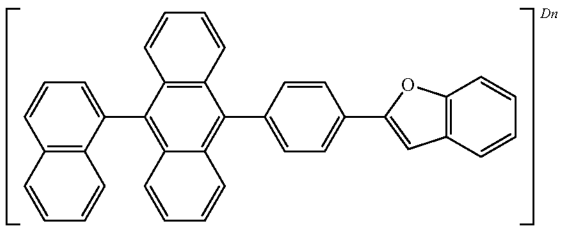
H2-161
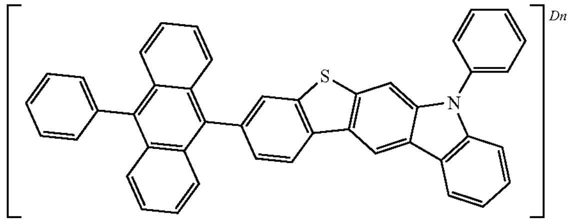
H2-162
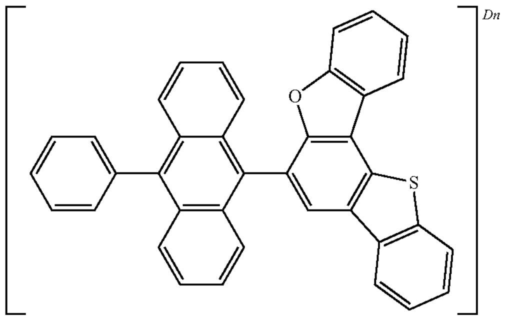
H2-163
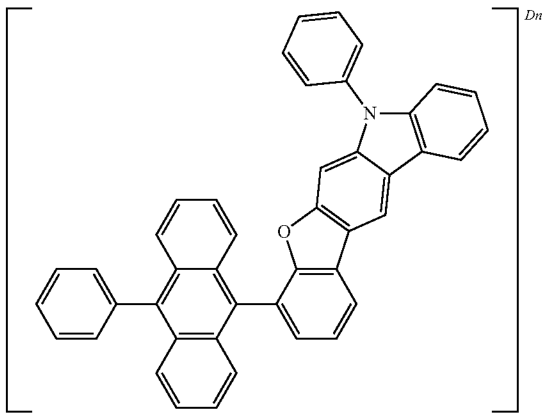
H2-164
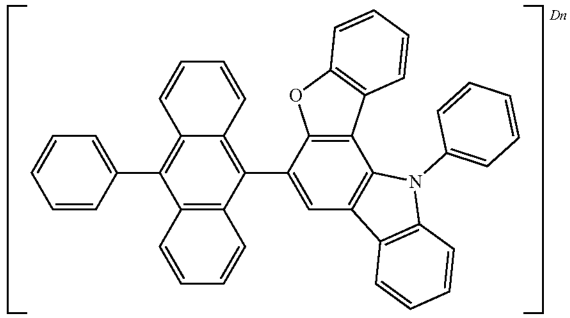
-continued
H2-165
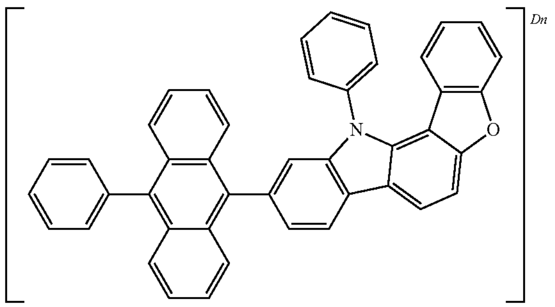
H2-166
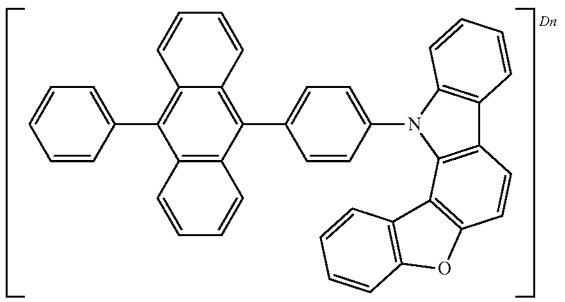
H2-167
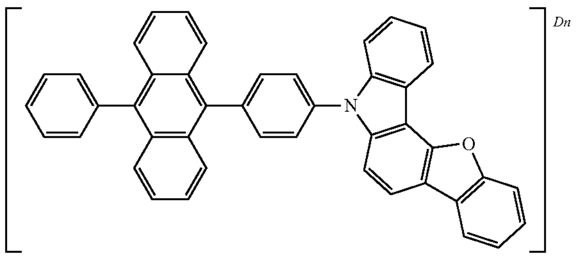
H-168
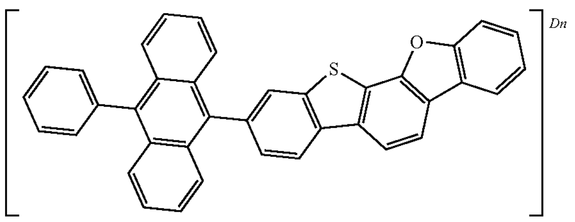
H2-169
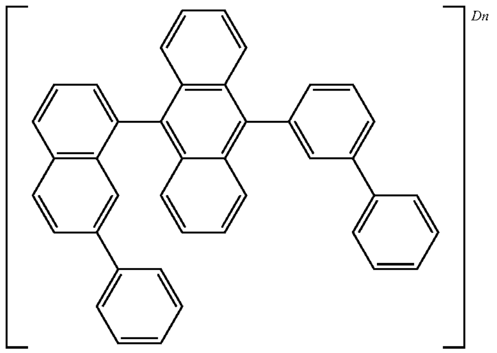

-continued
H2-170
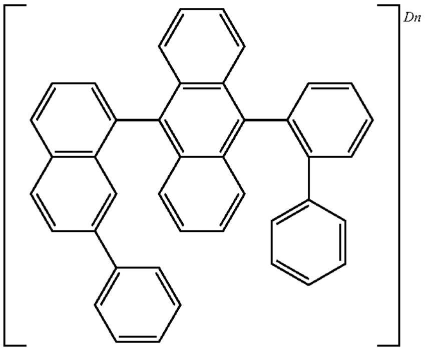
H2-171
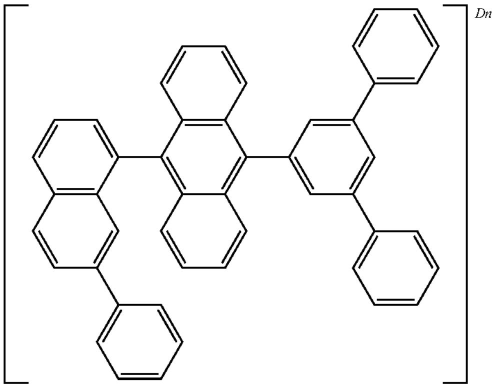
H2-172
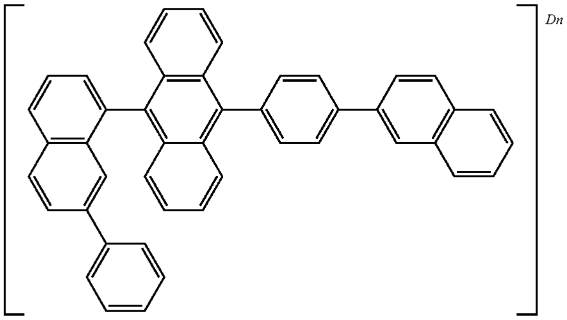
H2-173
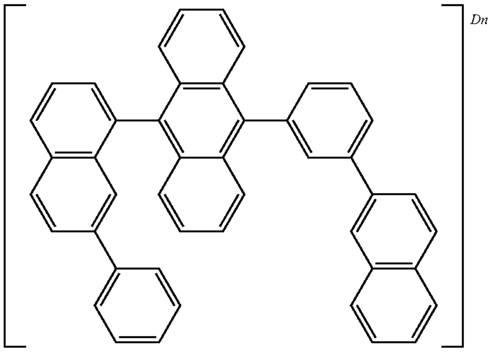
-continued
H2-174
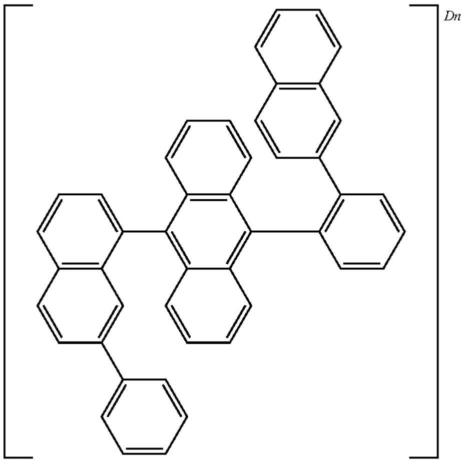
H2-175
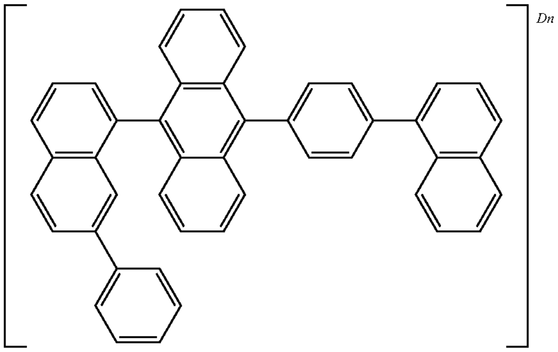
H2-176
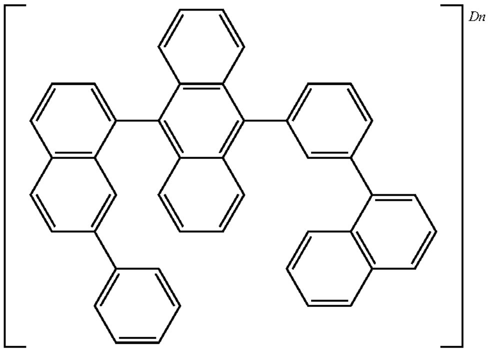
H2-177
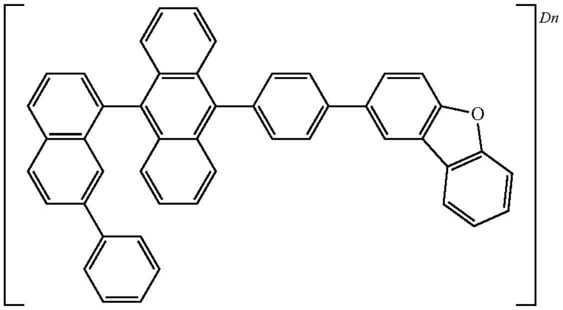

-continued
H2-178
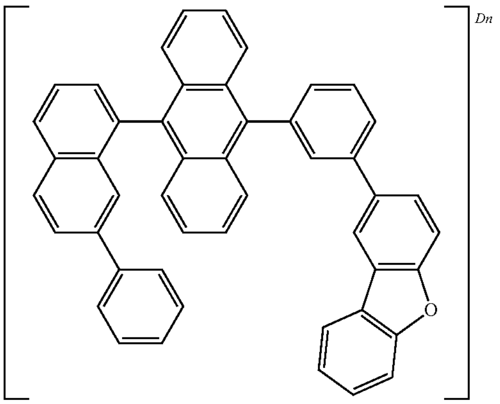
H2-179
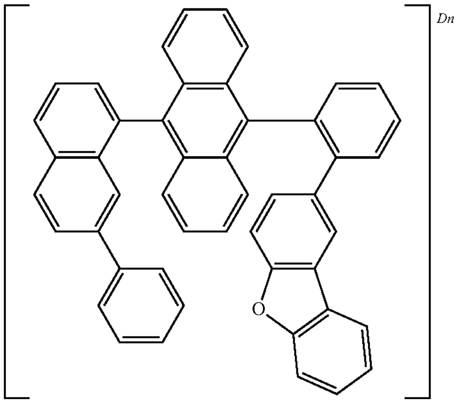
H2-180
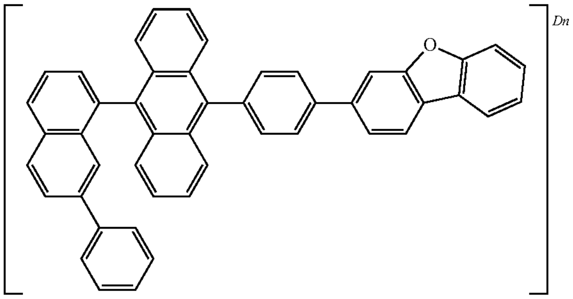
H2-181
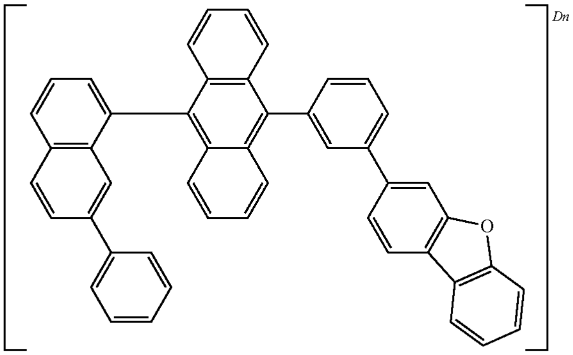
-continued
H2-182
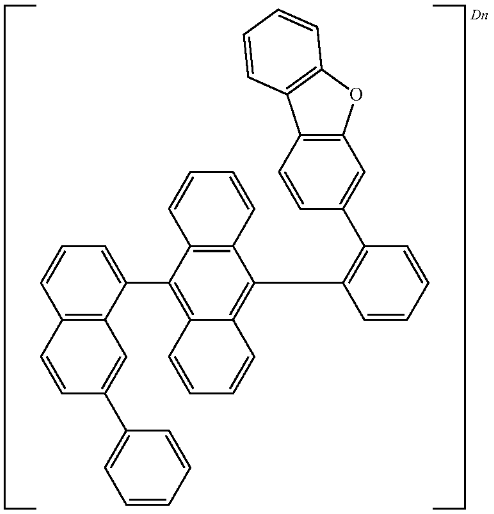
H2-183
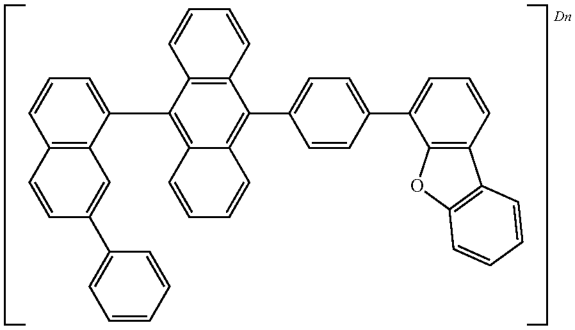
H2-184
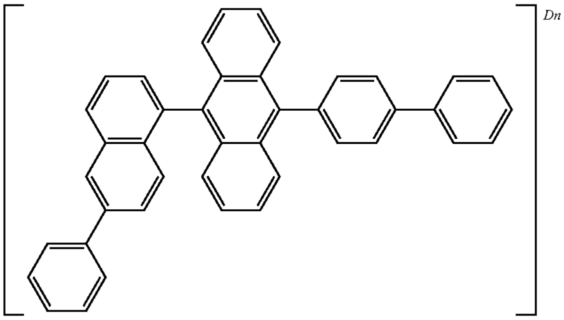
H2-185
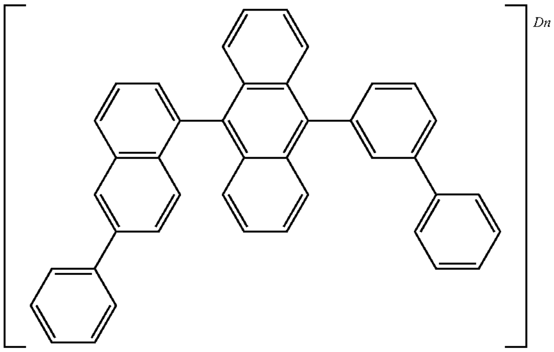

-continued
H2-186
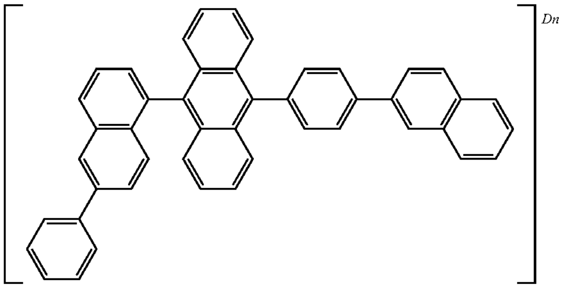
H2-187
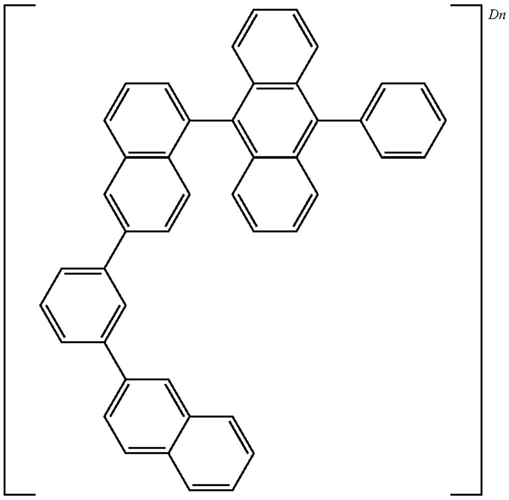
H2-188
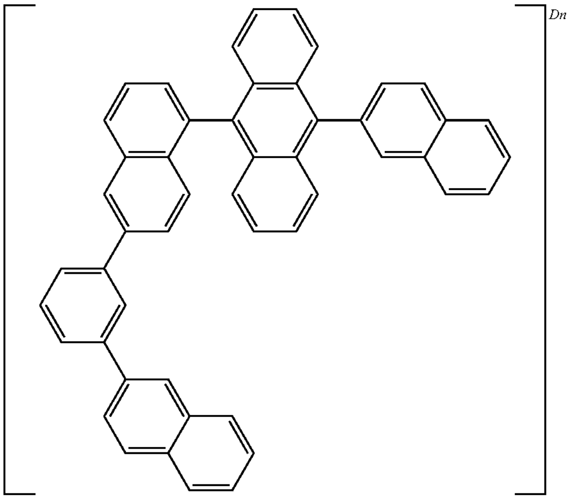
-continued
H2-189
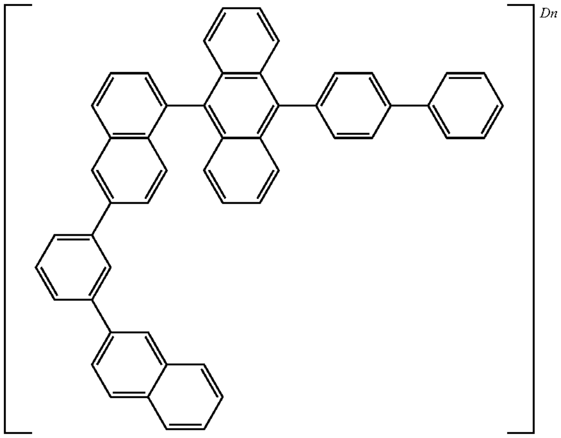
H2-190
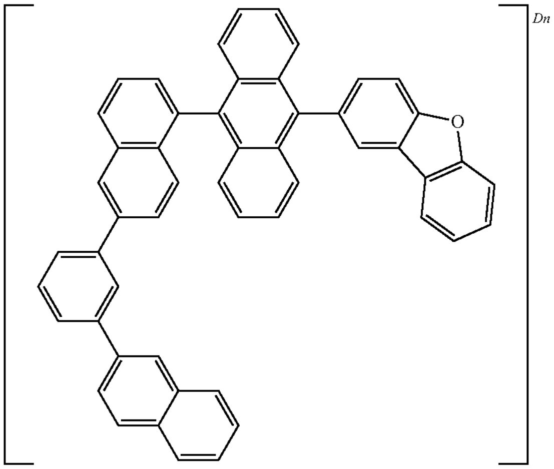
H2-191
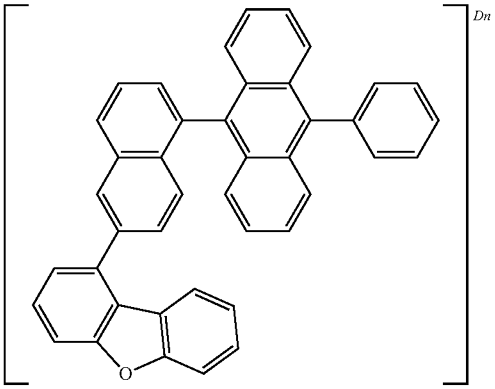
H2-192
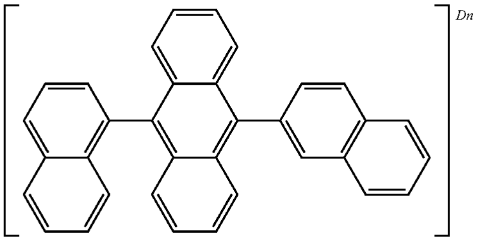

-continued
H2-193
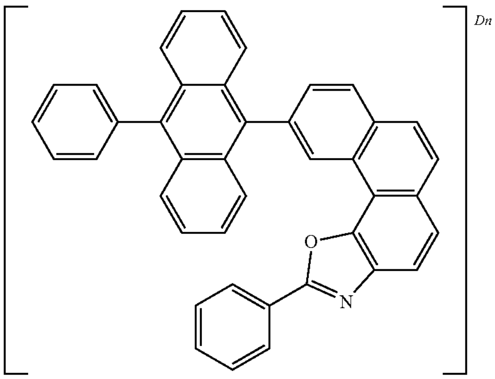
H2-194
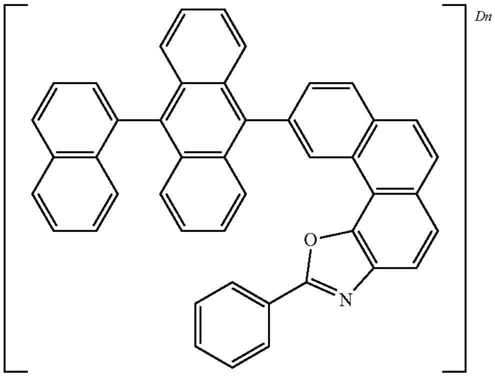
H2-195
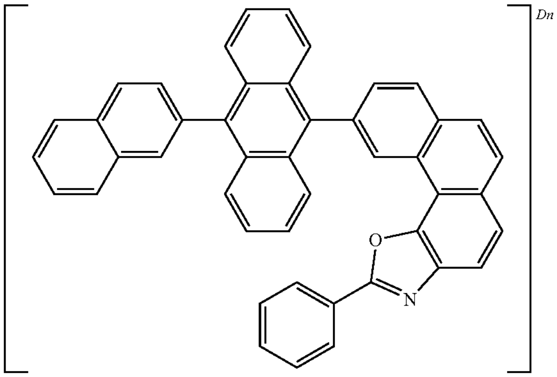
H2-196
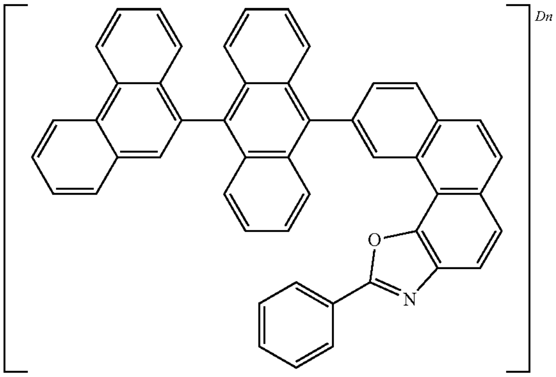
-continued
H2-197
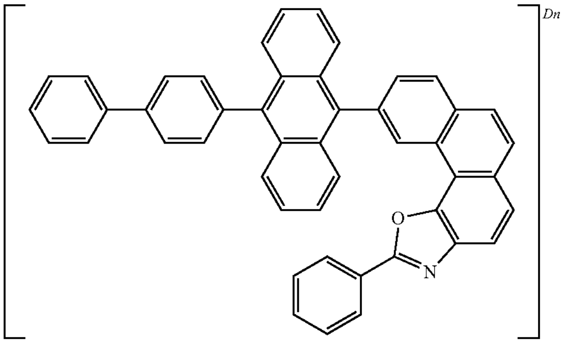
H2-198
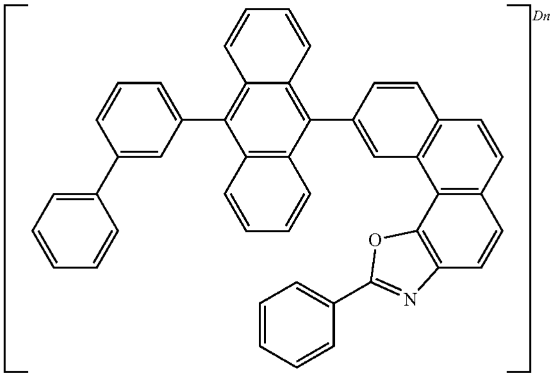
H2-199
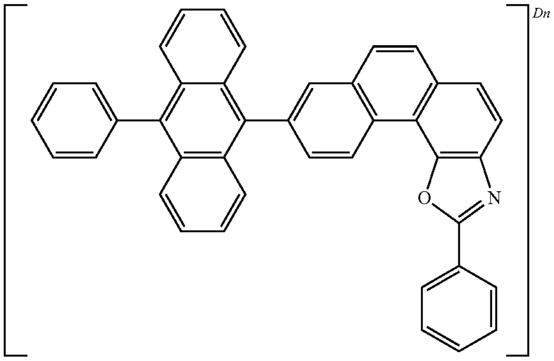
H2-200
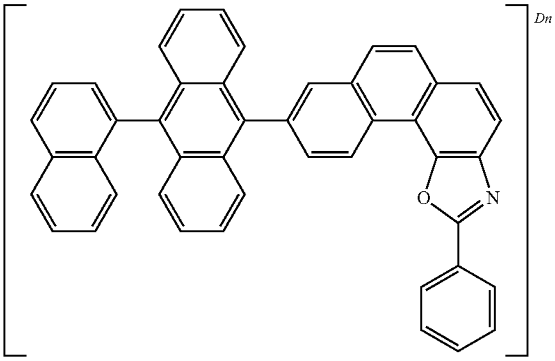

-continued
H2-201
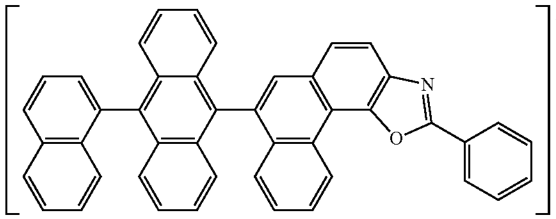
H2-202
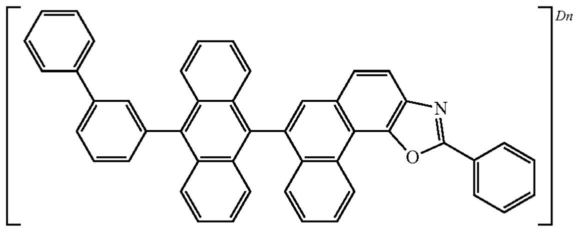
H2-203
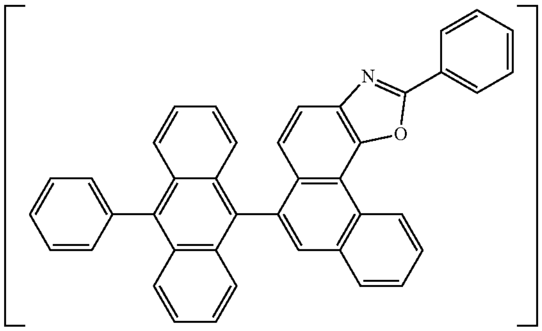
H2-204
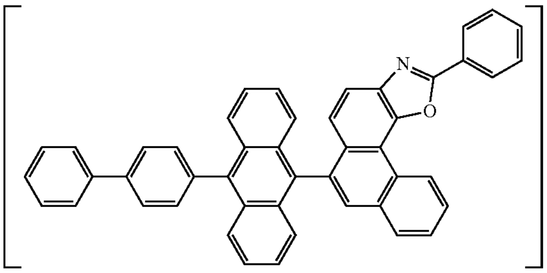
H2-205
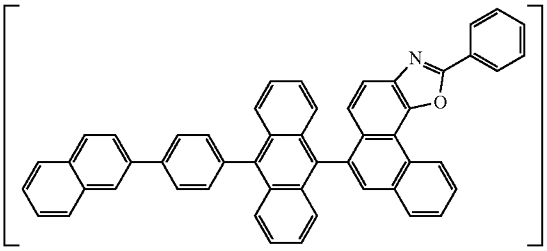
-continued
H2-206
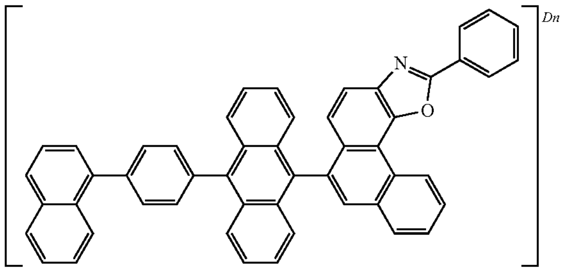
H2-207
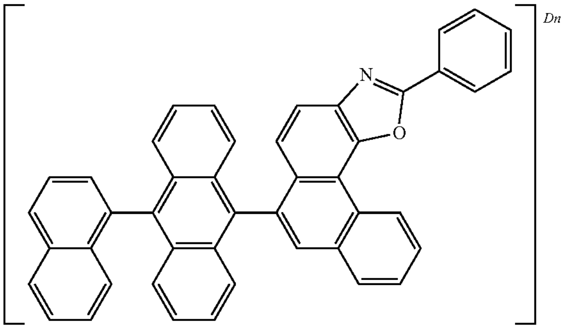
H2-208
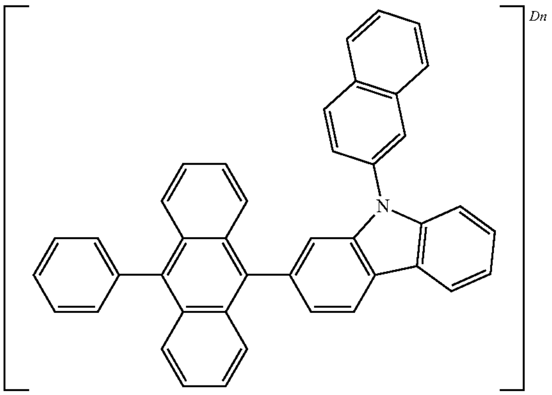
H2-209
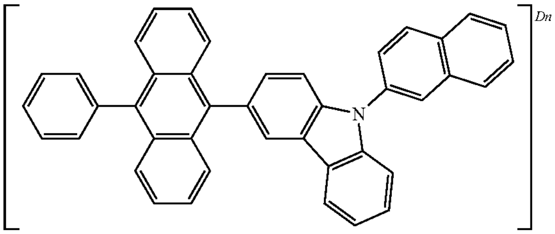

H2-210
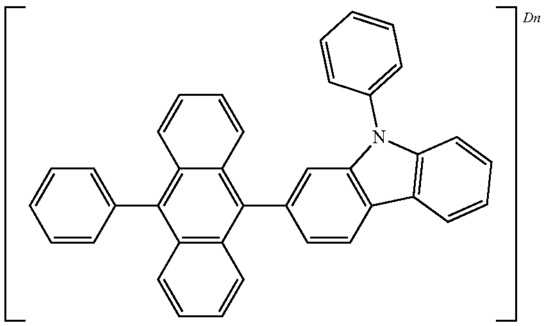
H2-211
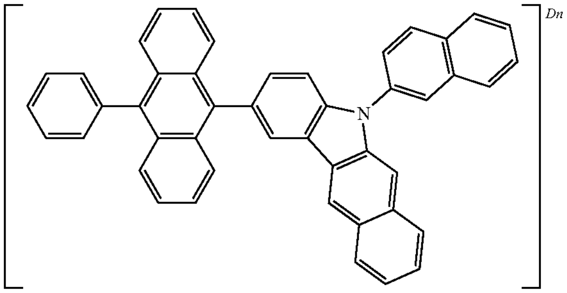
H2-212
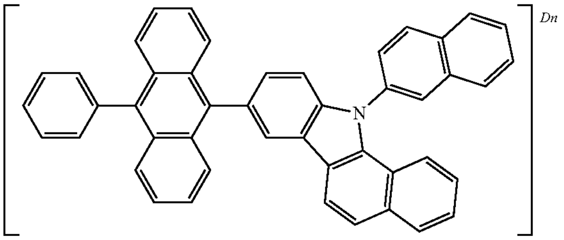
H2-213
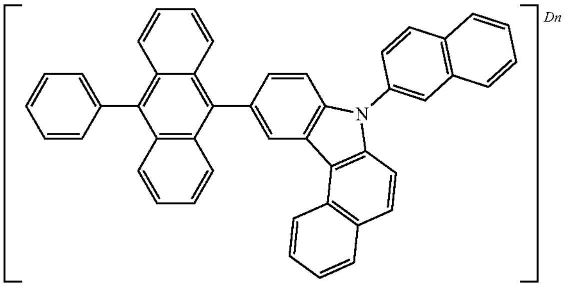
H2-214
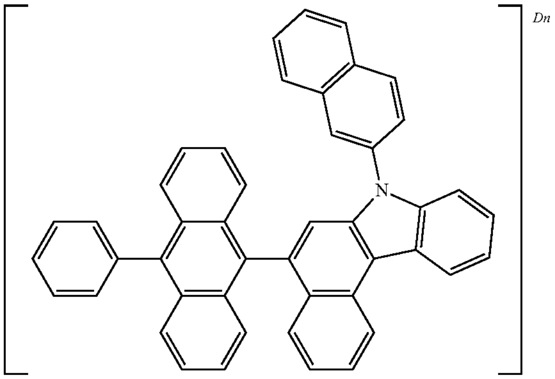
H2-215
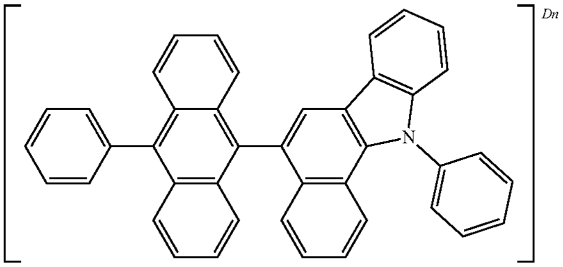
H2-216
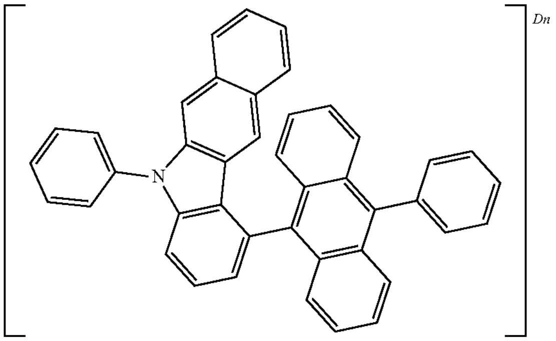
H2-217
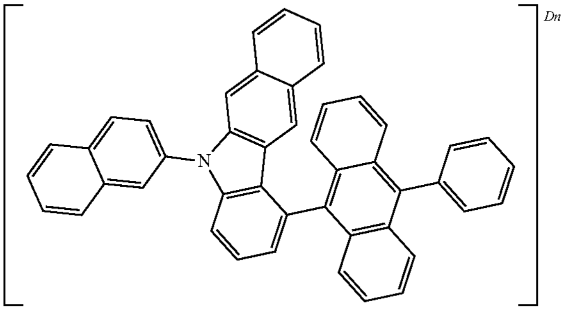
H2-218
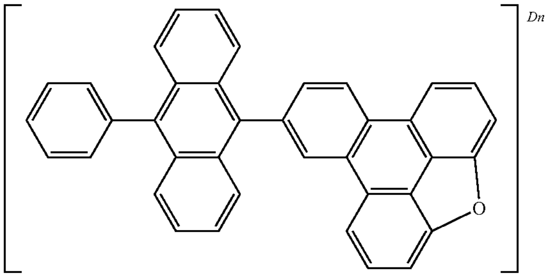
H2-219
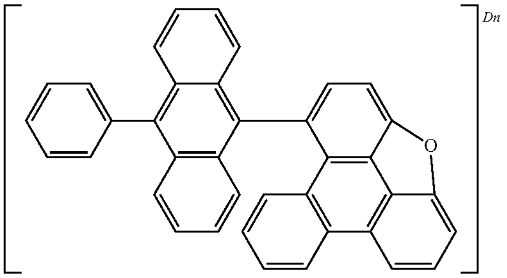

-continued

H2-220

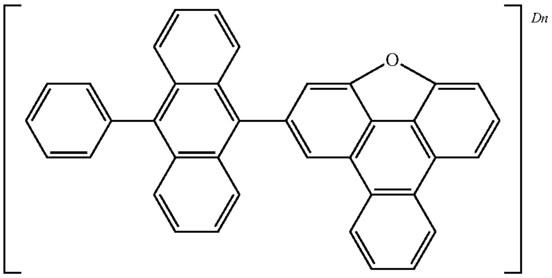

wherein

Dn means that n number of hydrogens is replaced with deuterium, wherein n represents an integer of 1 or more.

4. The organic electroluminescent device according to claim 3, wherein the light-emitting layer further comprises a compound represented by the following formula 3:

(3)

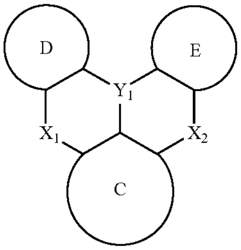

wherein

Ring C, Ring D, and Ring E each independently represent a substituted or unsubstituted (C6-C30)aryl, or a substituted or unsubstituted (3- to 50-membered)heteroaryl; or Ring D and Ring E may be linked to each other to form a fused ring;

$Y_1$ represents B;

$X_1$ and $X_2$ each independently represent NR', O, or S;

R' represents hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring of (C3-C30) aliphatic ring and (C6-C30) aromatic ring, or $-L_4-N(Ar_{13})(Ar_{14})$; or may be linked to at least one of Ring C, Ring D, and Ring E to form a ring;

$L_4$ represents a single bond, a substituted or unsubstituted (C1-C30)alkylene, a substituted or unsubstituted (C6-C30)arylene, or a substituted or unsubstituted (3- to 30-membered)heteroarylene; and $Ar_{13}$ and $Ar_{14}$ each independently represent a substituted or unsubstituted (C1-C30)alkyl, a substituted or unsubstituted (C2-C30)alkenyl, a substituted or unsubstituted (C6-C30)aryl, or a substituted or unsubstituted (3- to 30-membered)heteroaryl.

5. The organic electroluminescent device according to claim 4, wherein the compound represented by formula 3 is selected from the following compounds:

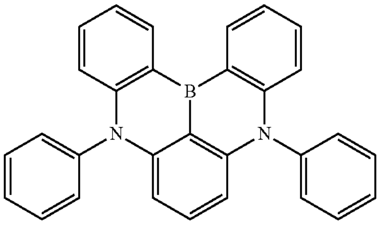

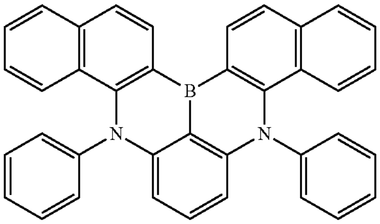

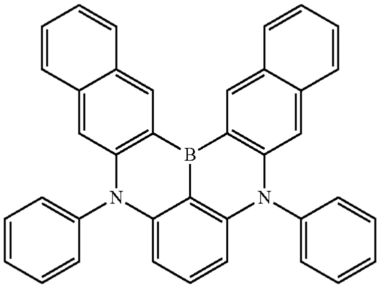

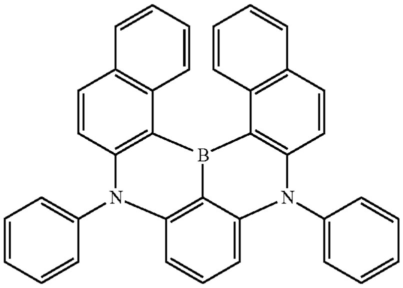

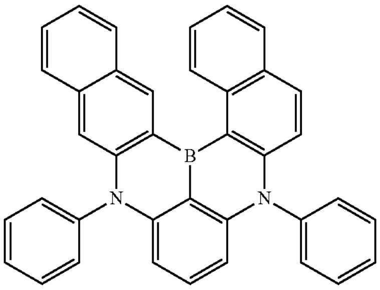

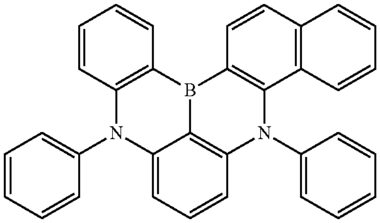

-continued
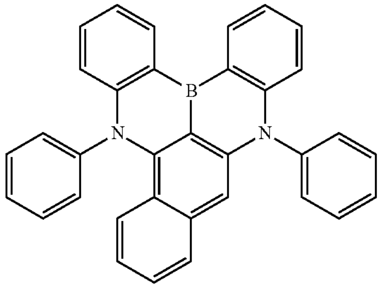
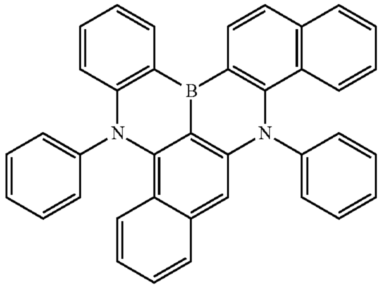
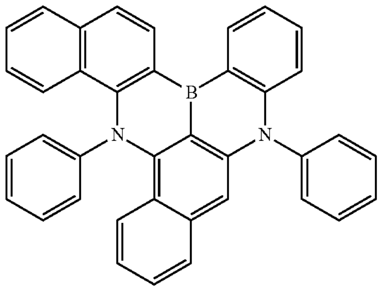
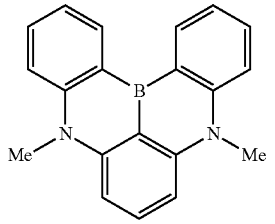
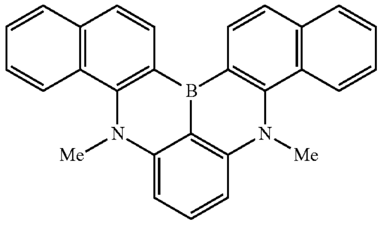
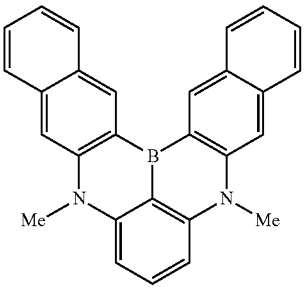
-continued
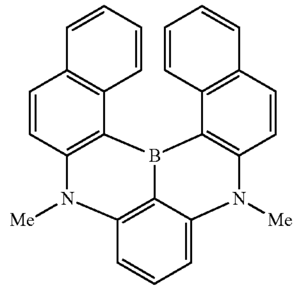
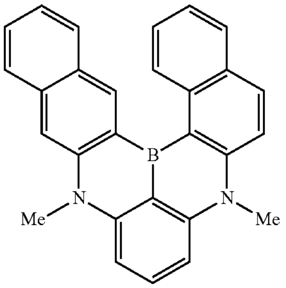
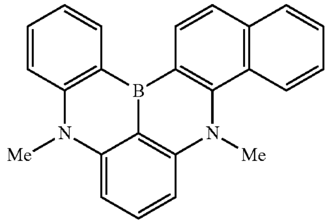
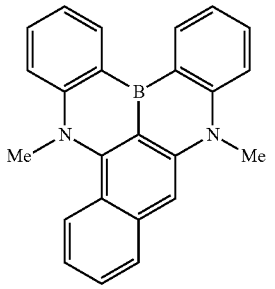
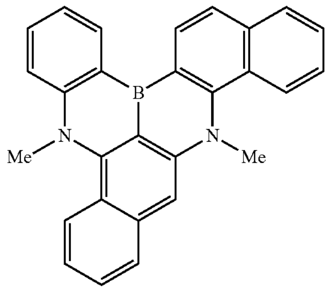
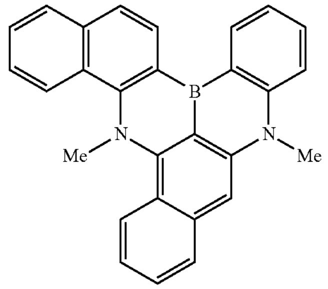

-continued
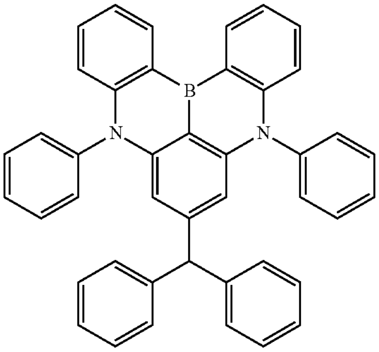
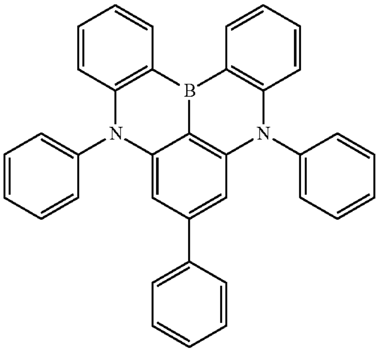
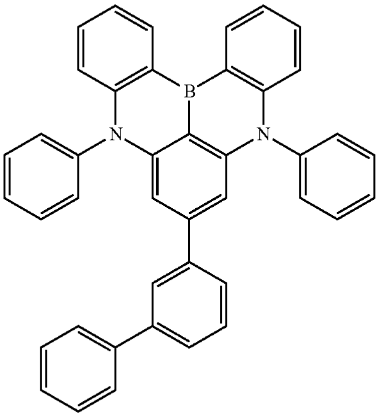
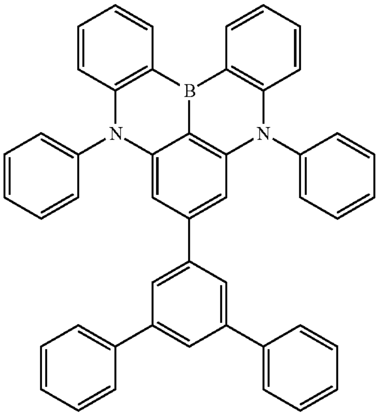
-continued
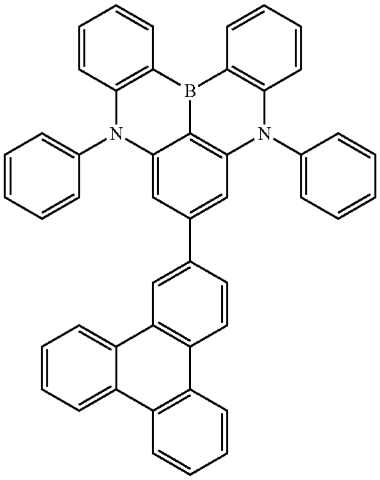
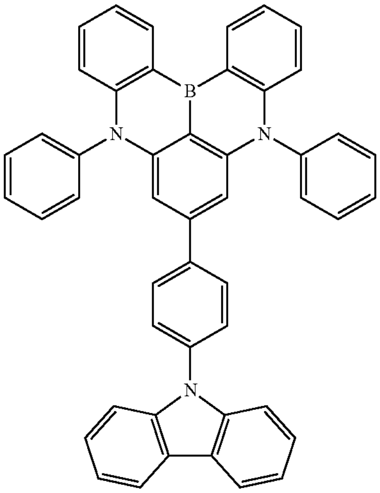
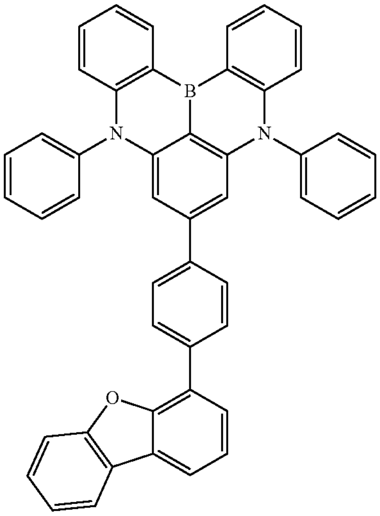

-continued
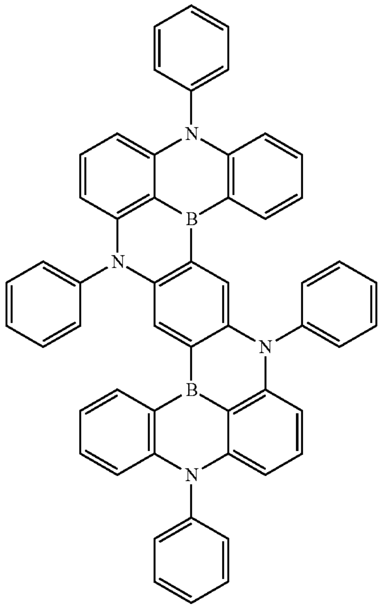
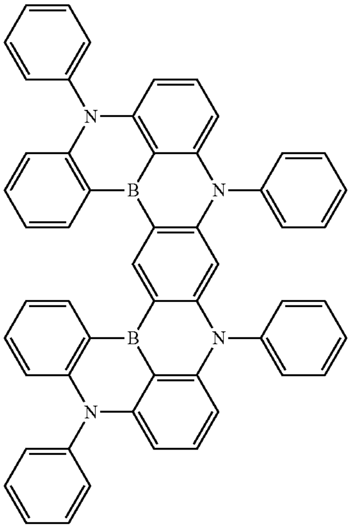
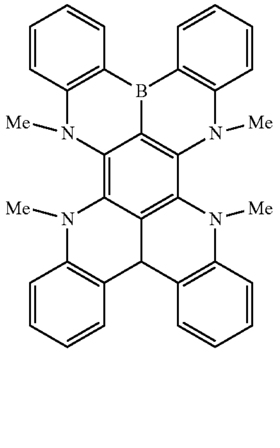
-continued
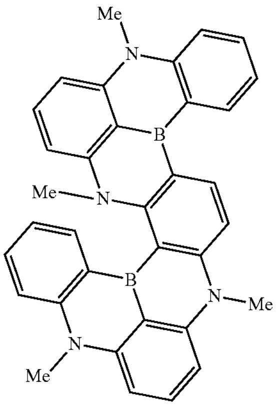
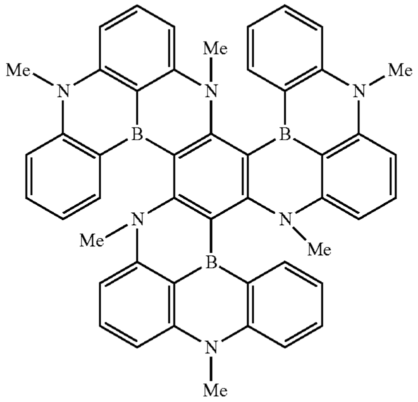
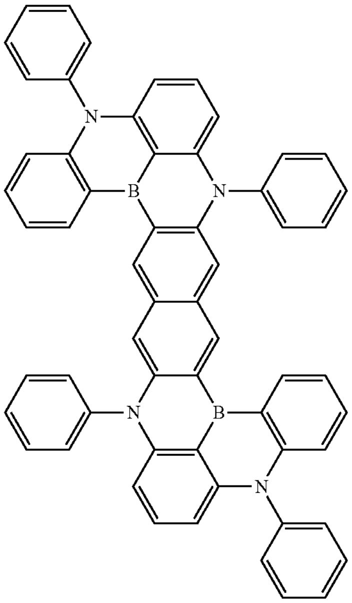

-continued
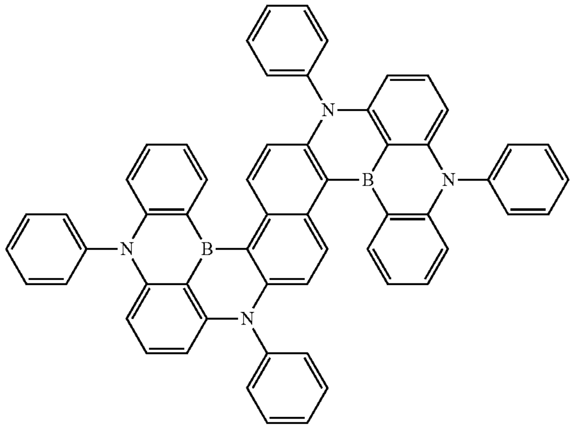
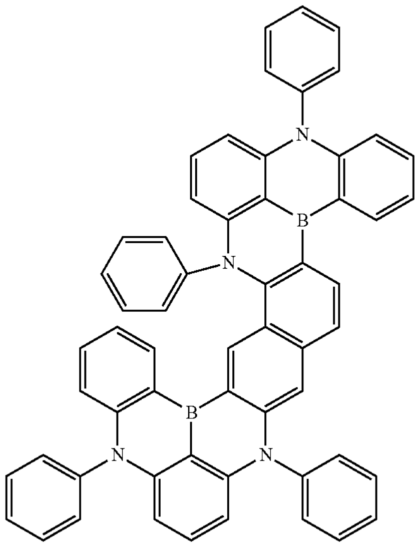
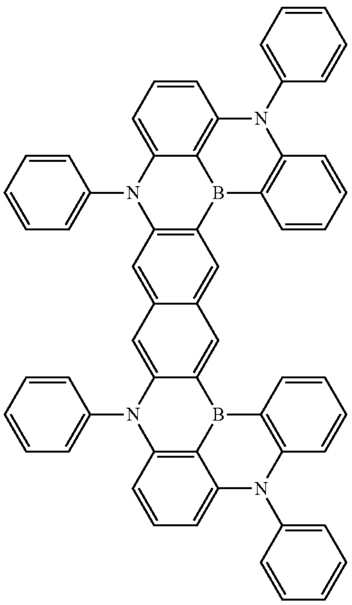
-continued
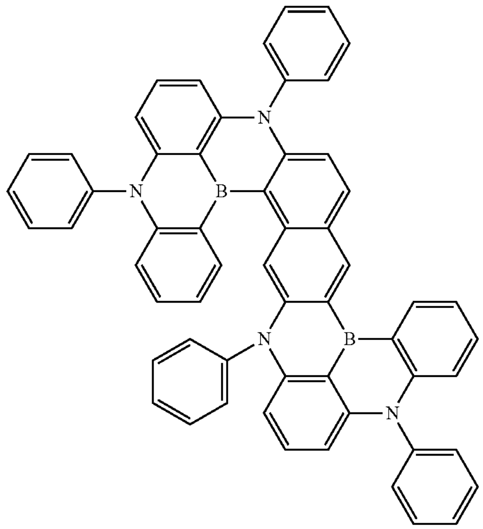
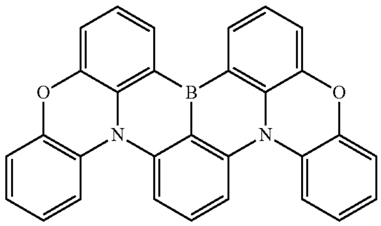
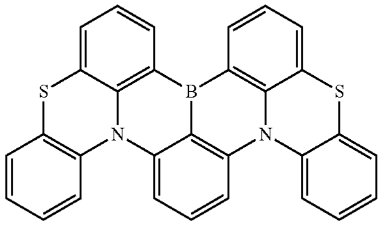
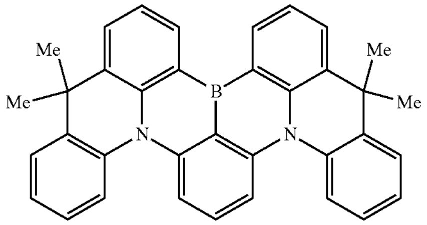
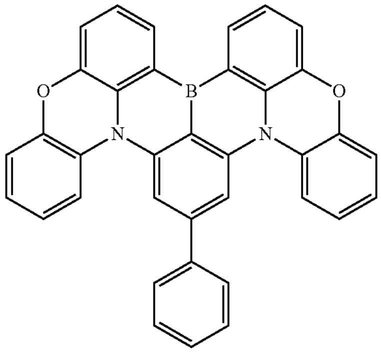

-continued
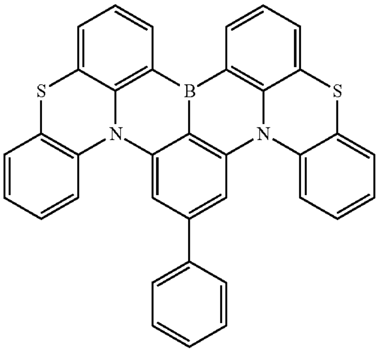
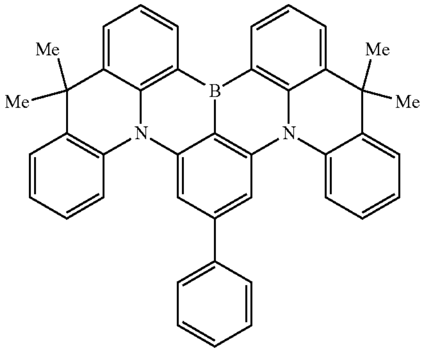
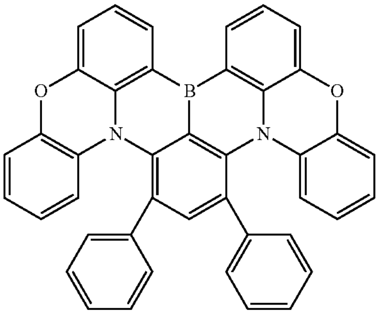
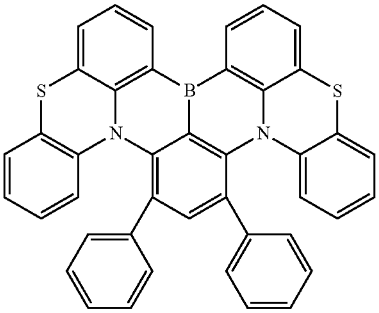
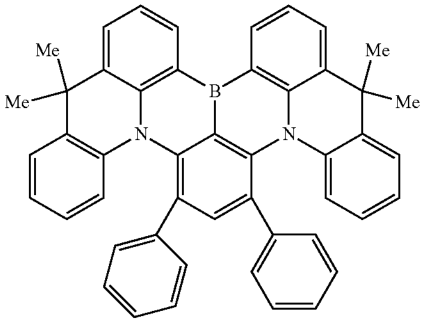
-continued
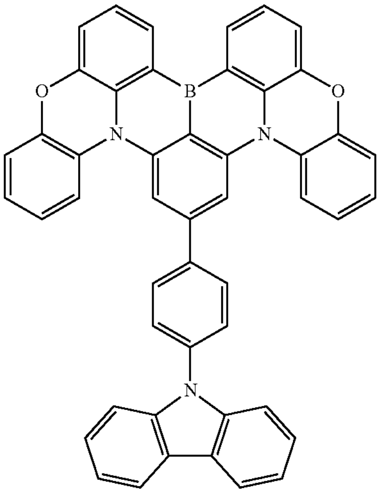
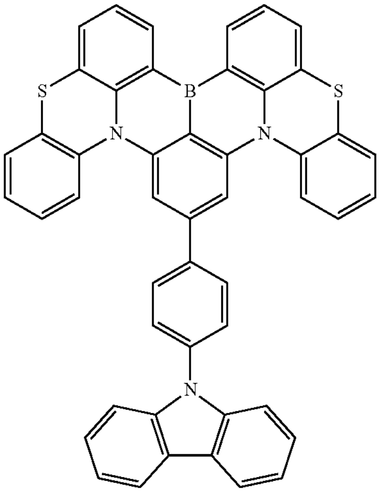
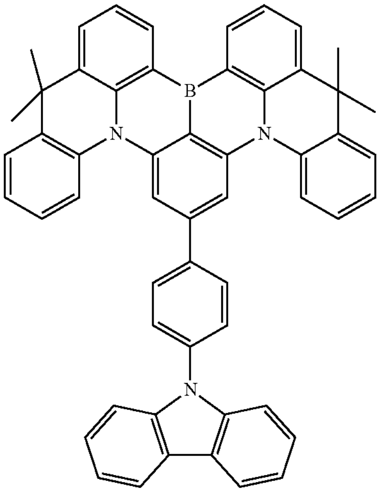
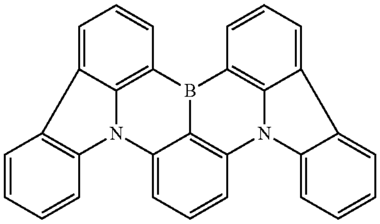

-continued
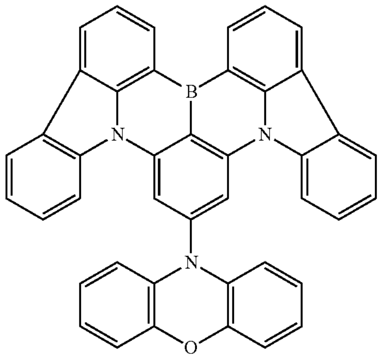
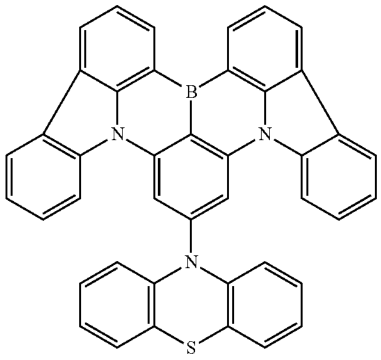
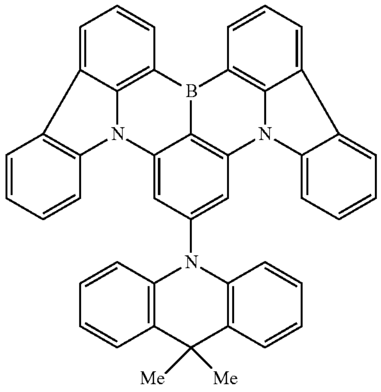
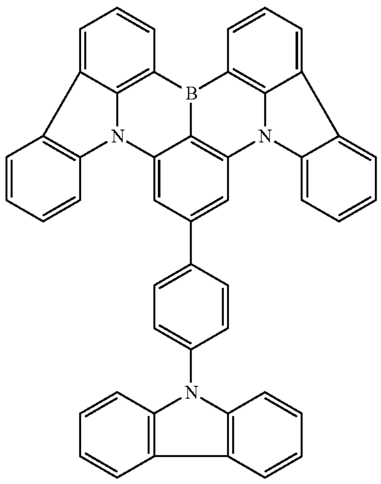
-continued
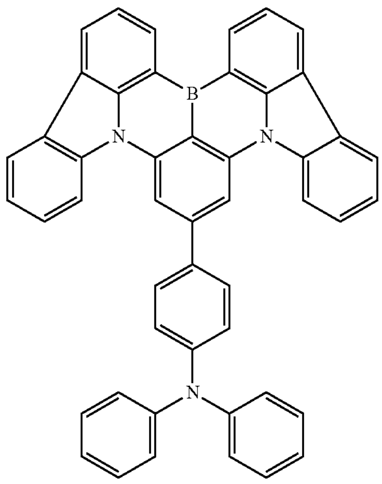
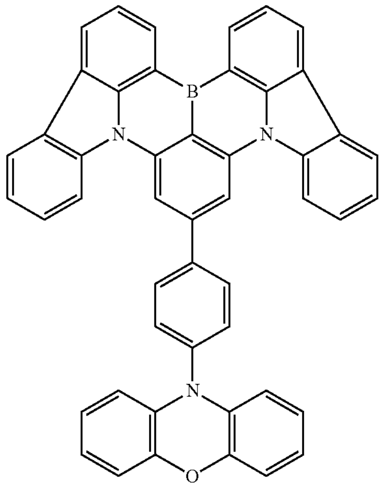
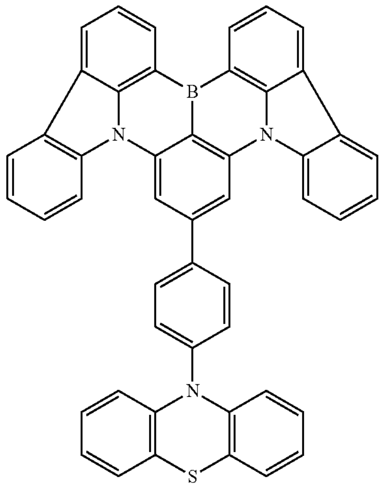

-continued
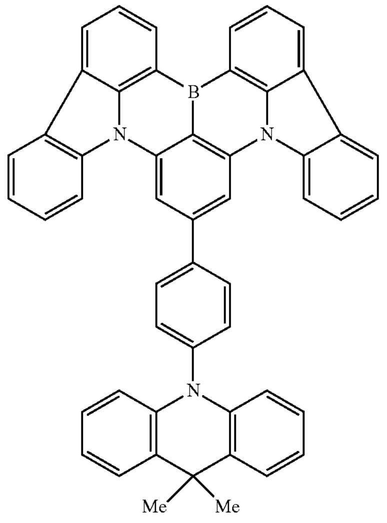
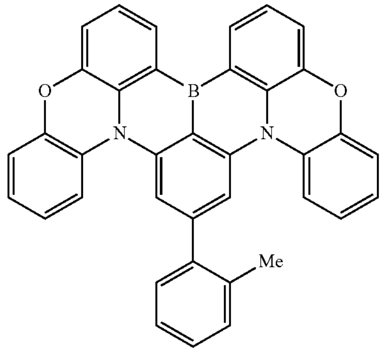
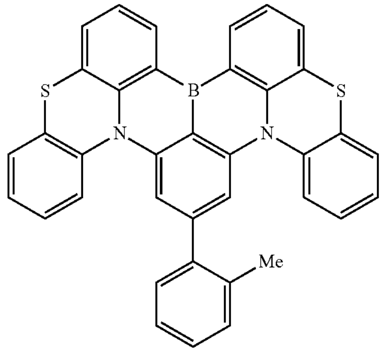
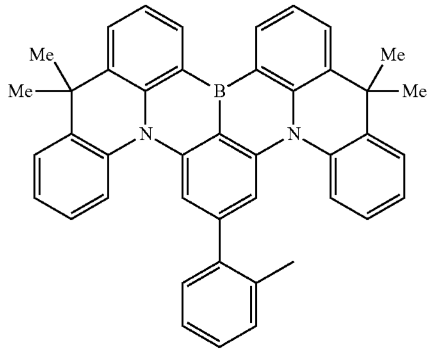
-continued
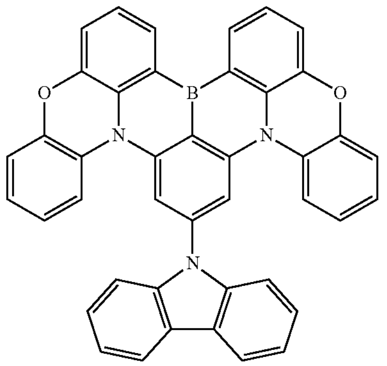
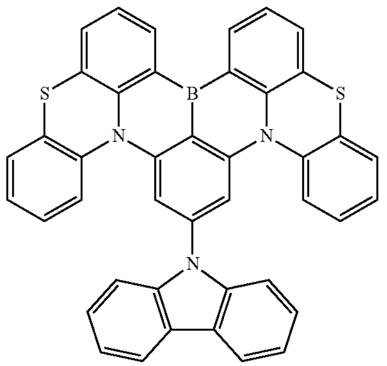
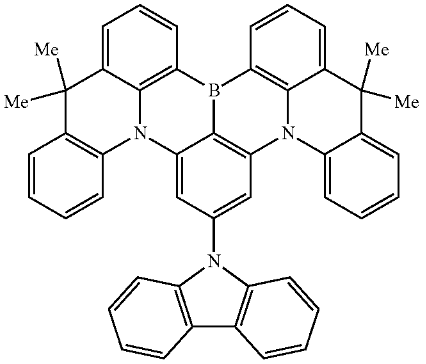
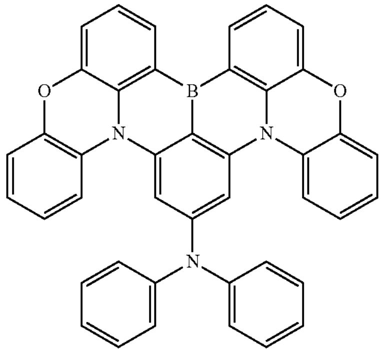

-continued
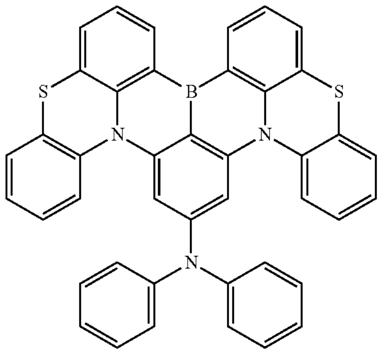
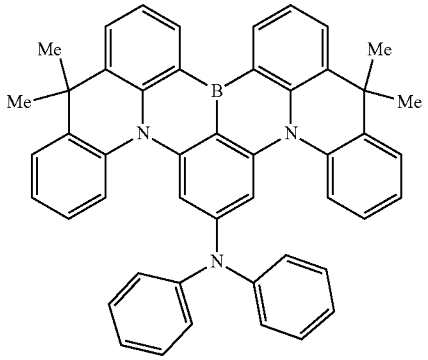
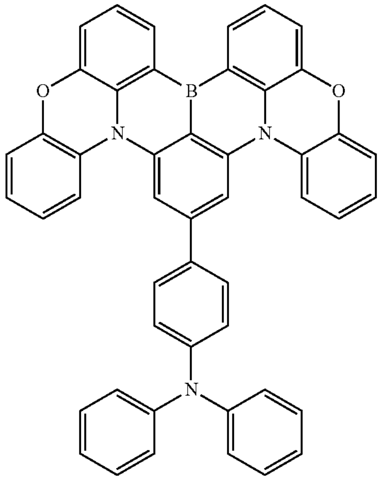
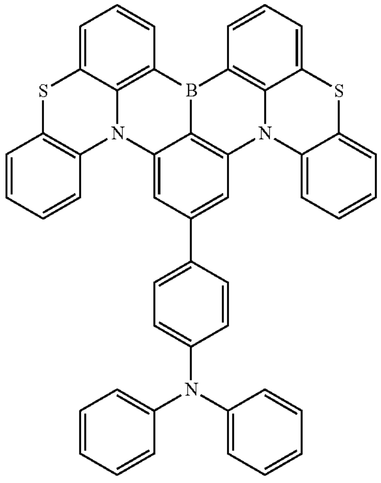
-continued
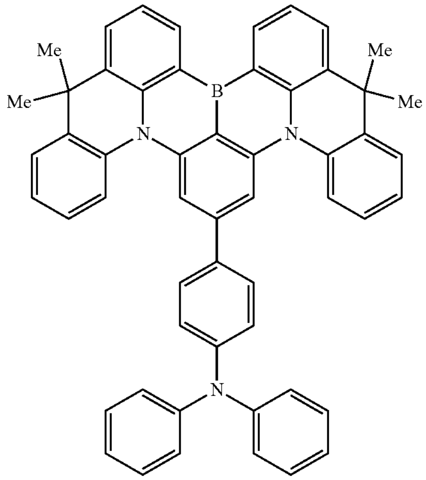
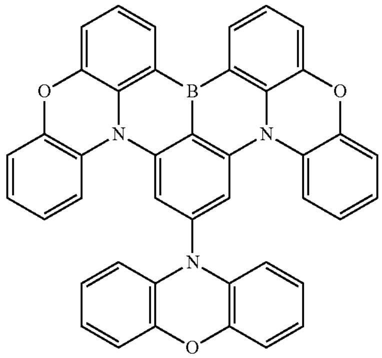
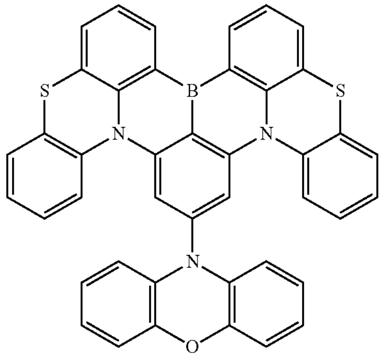
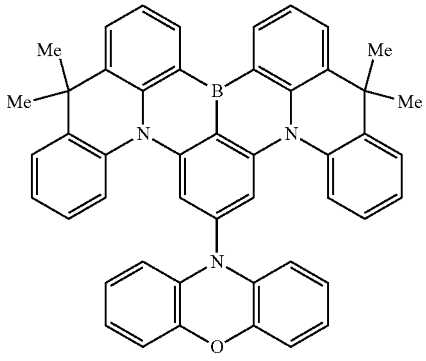

-continued
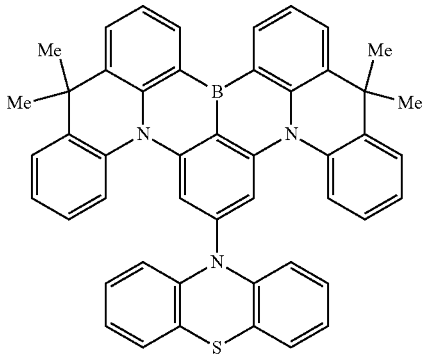
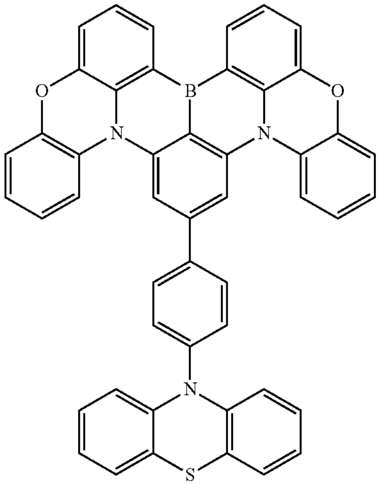
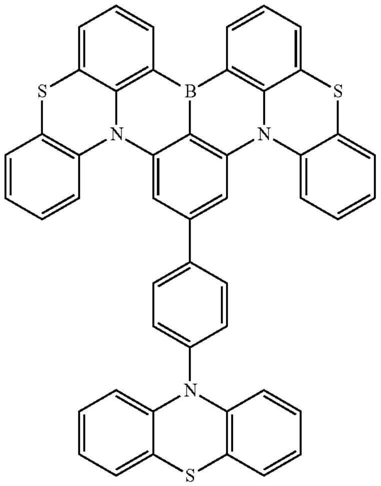
-continued
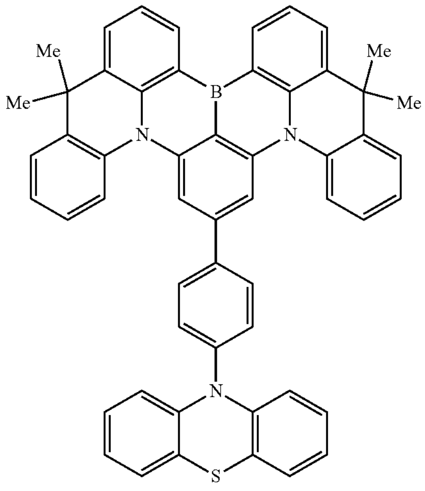
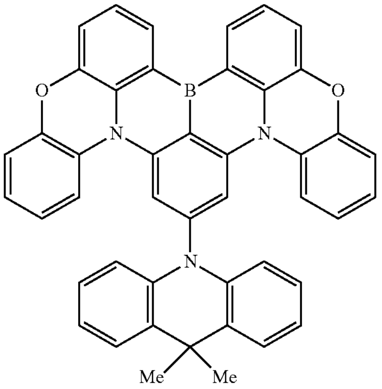
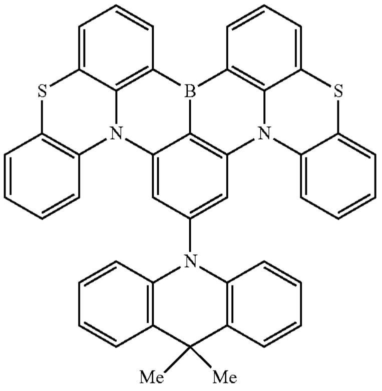
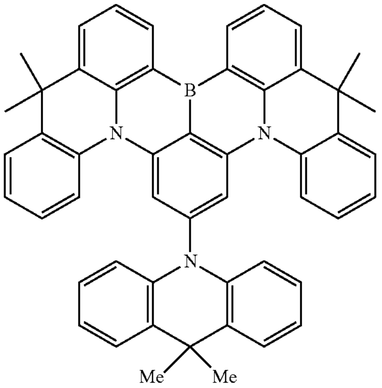

-continued
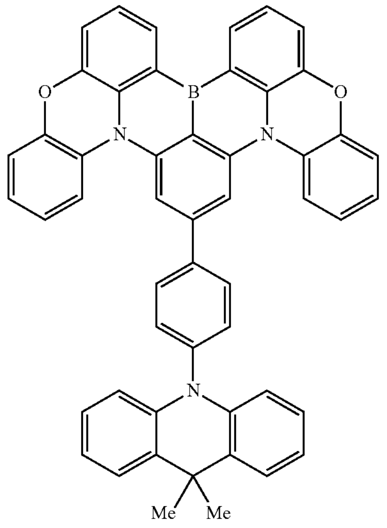
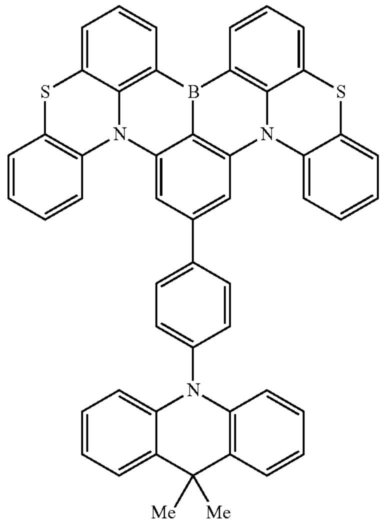
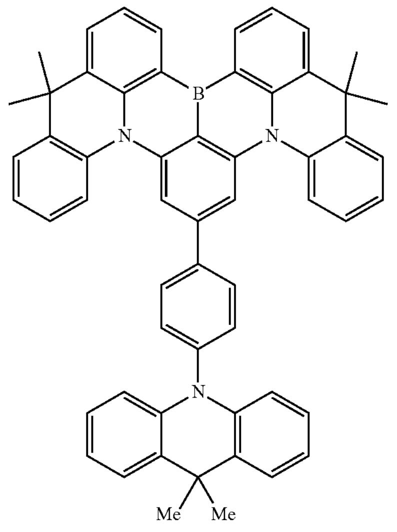
-continued
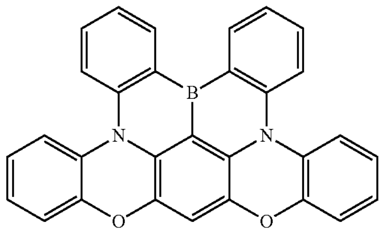
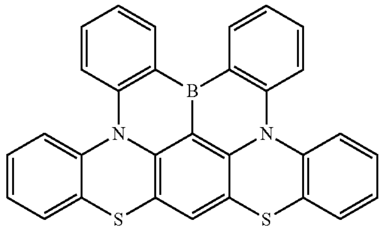
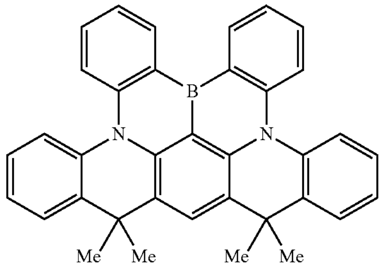
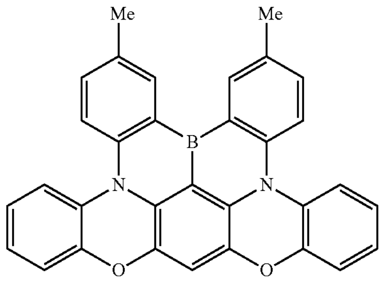
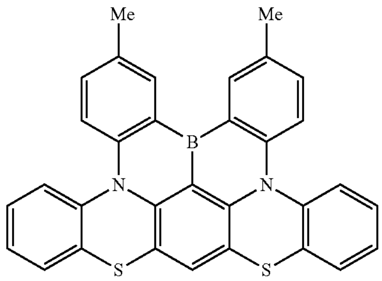
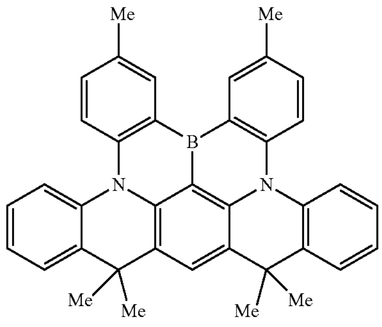

-continued
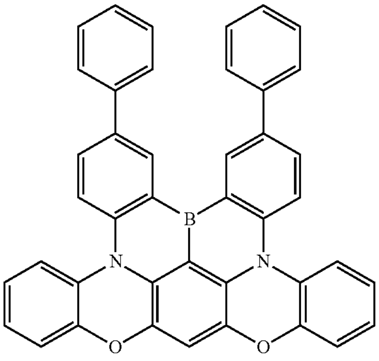
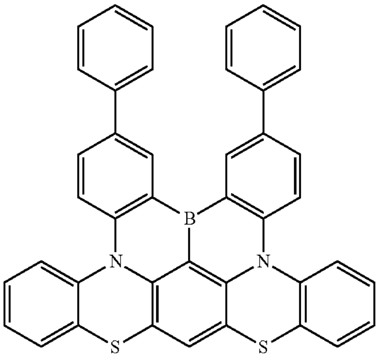
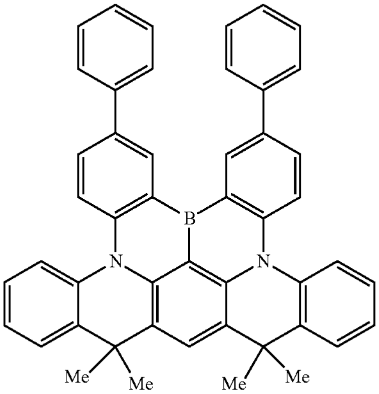
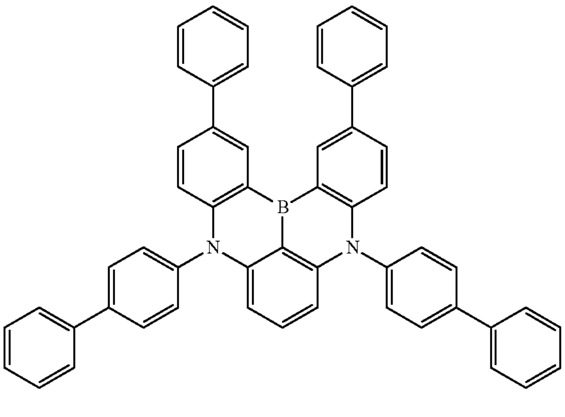
-continued
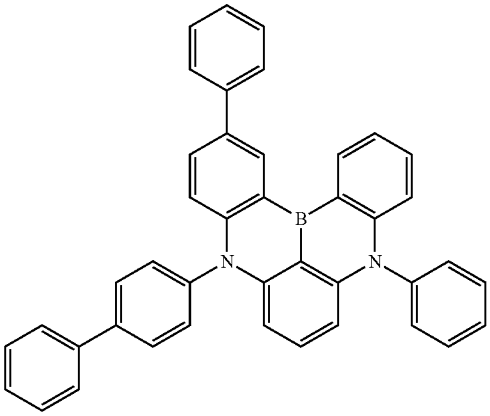
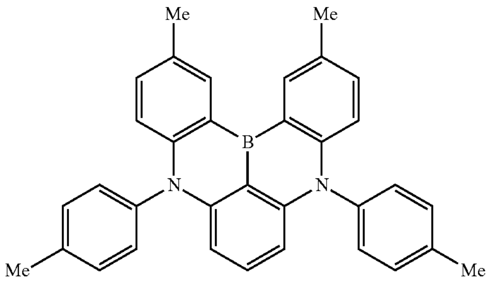
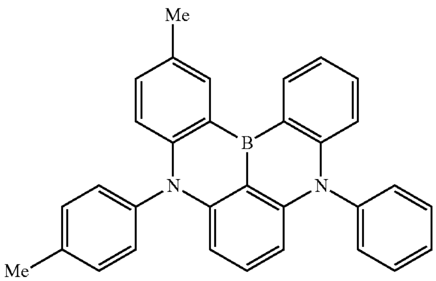
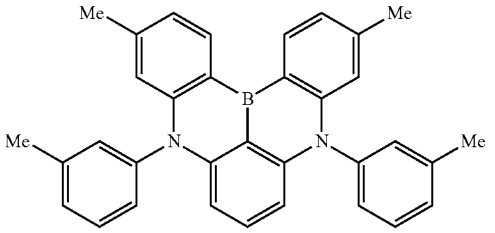
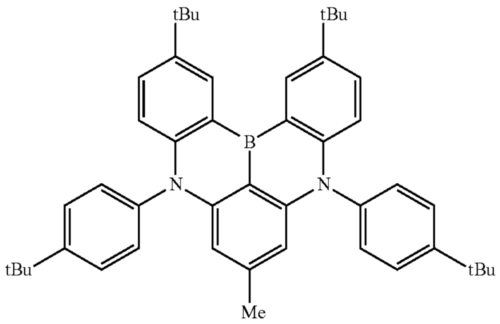

-continued
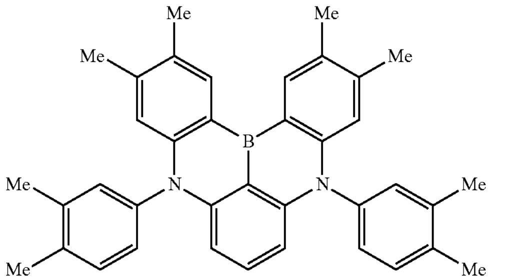
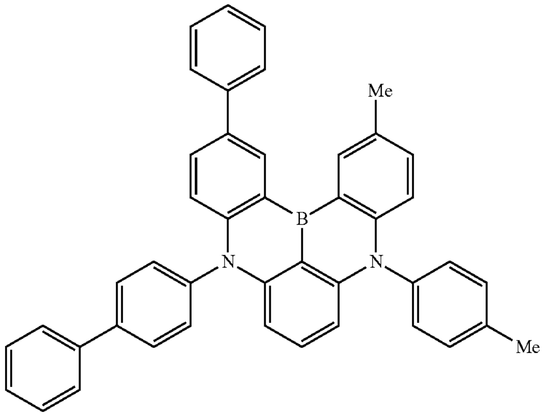
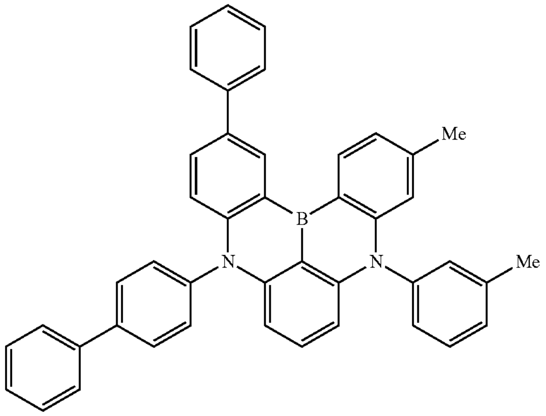
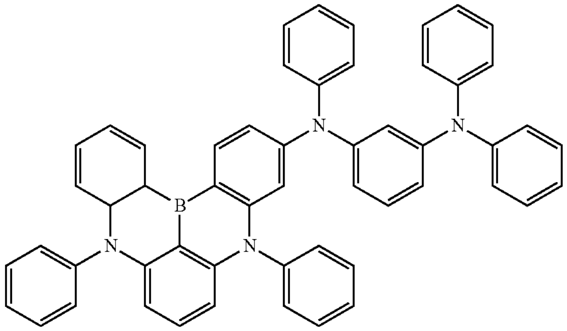
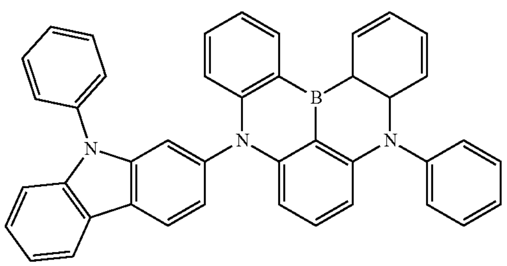
-continued
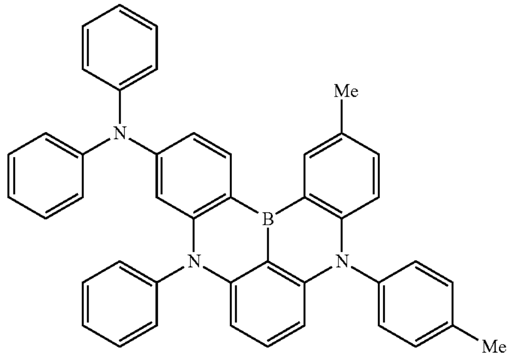
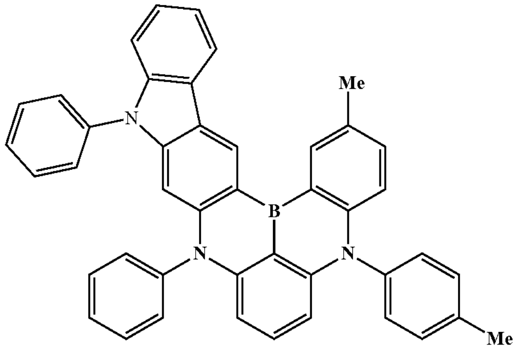
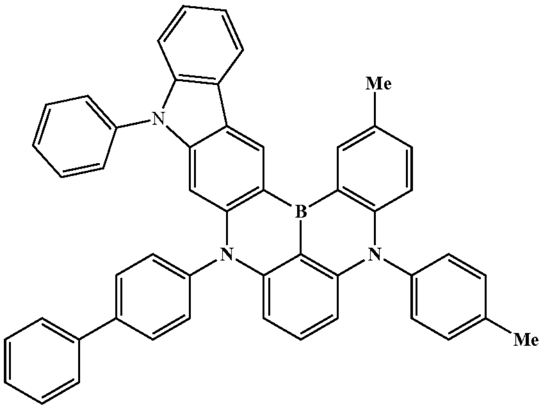
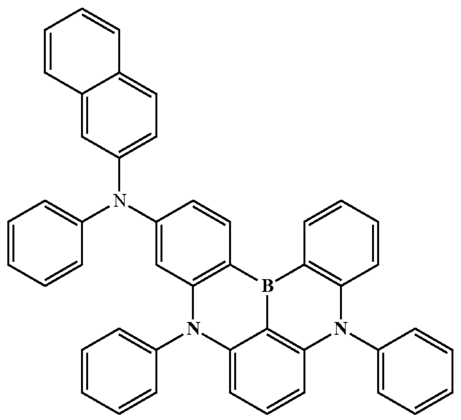

-continued
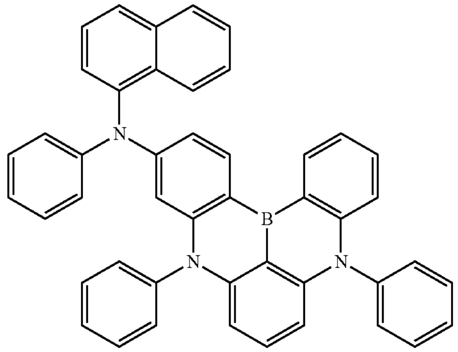
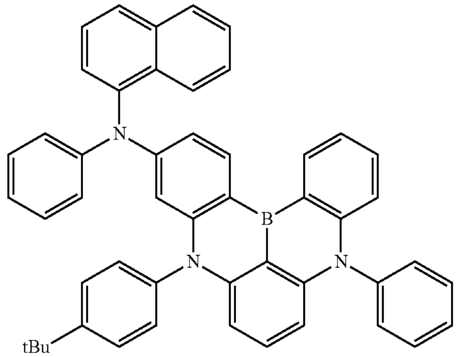
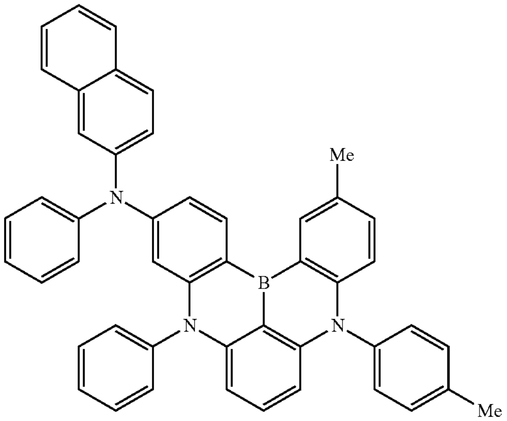
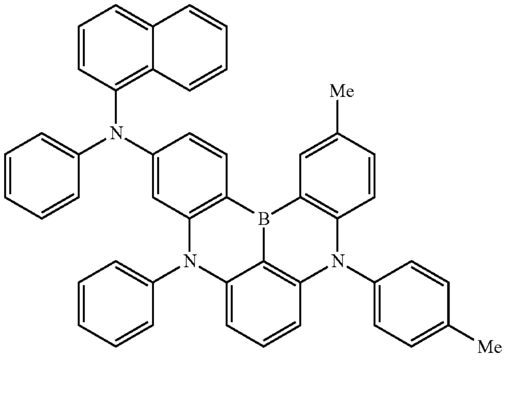
-continued
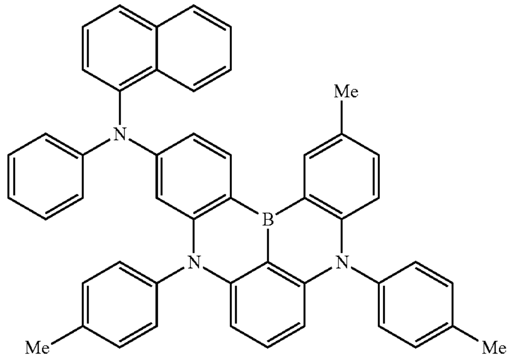
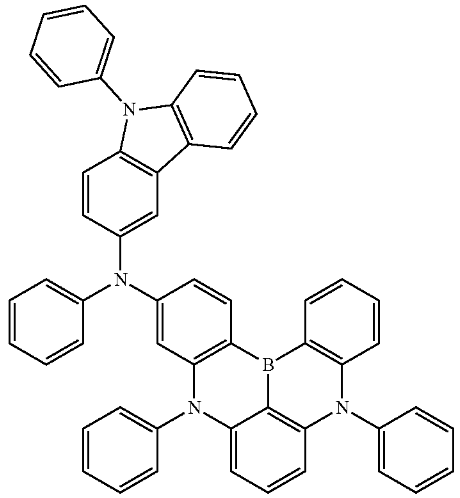
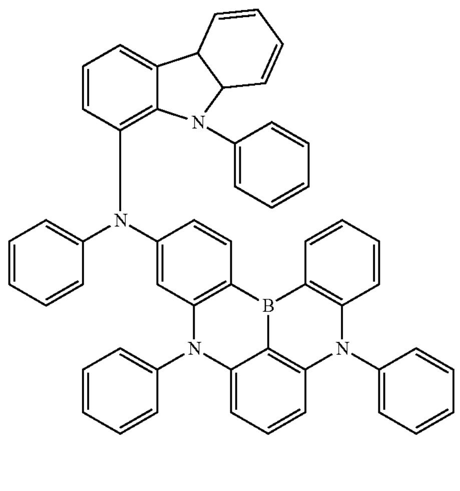

-continued
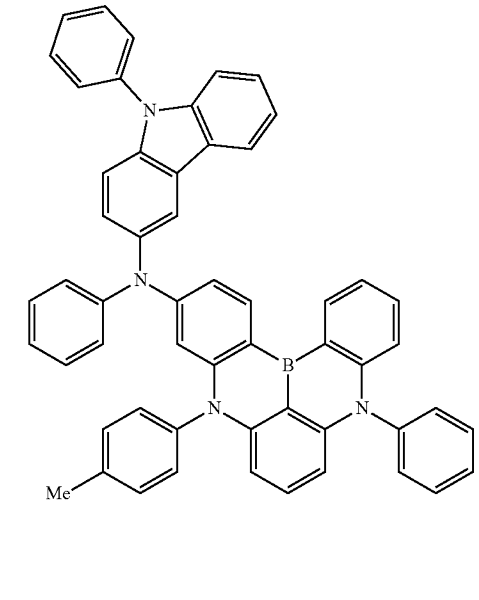
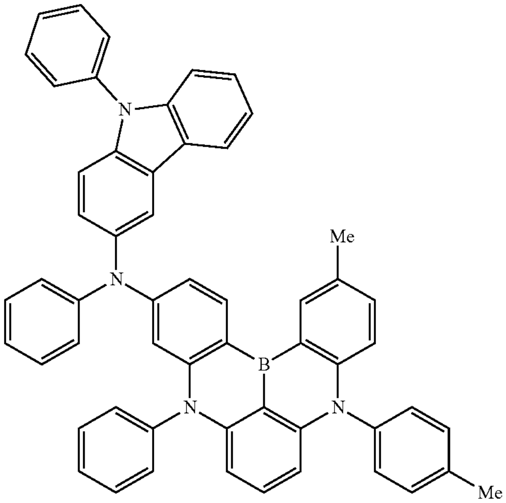
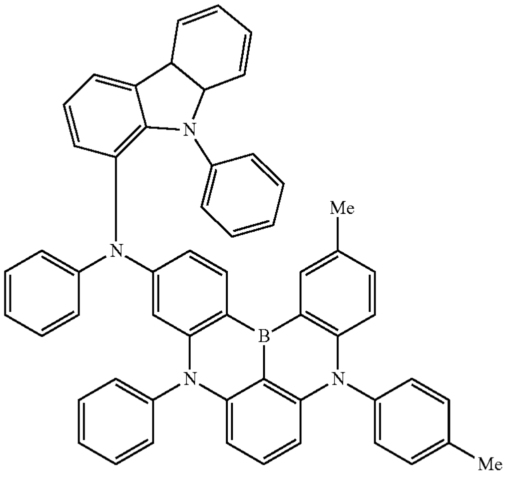
-continued
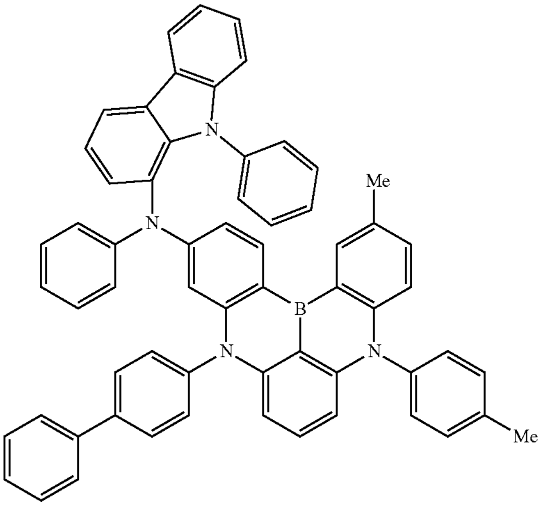
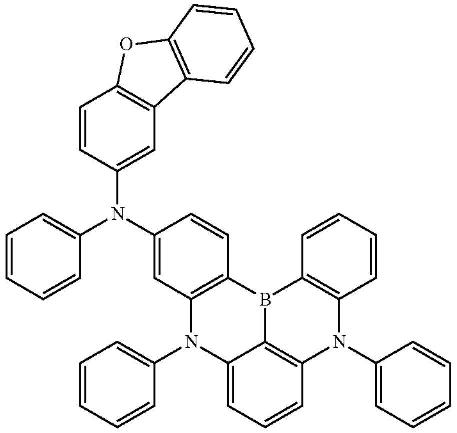
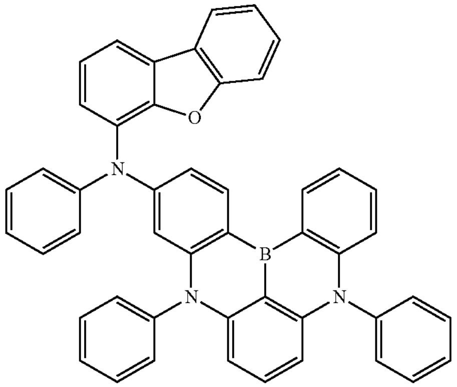

-continued
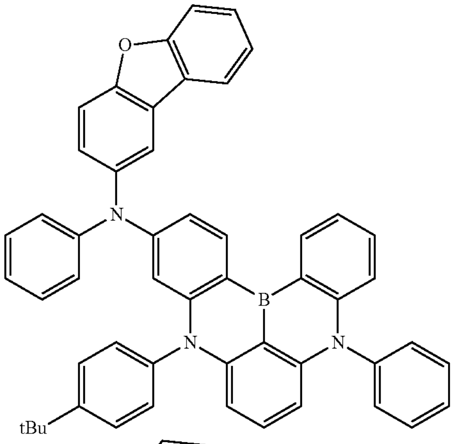
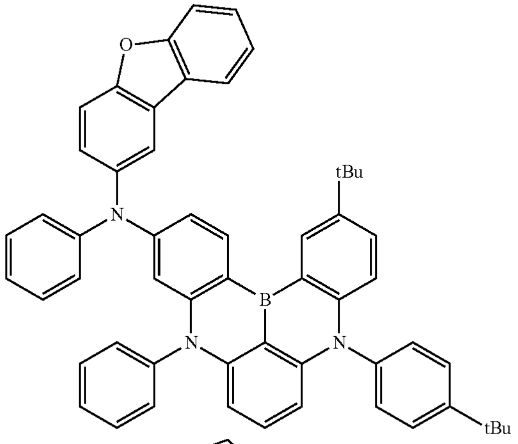
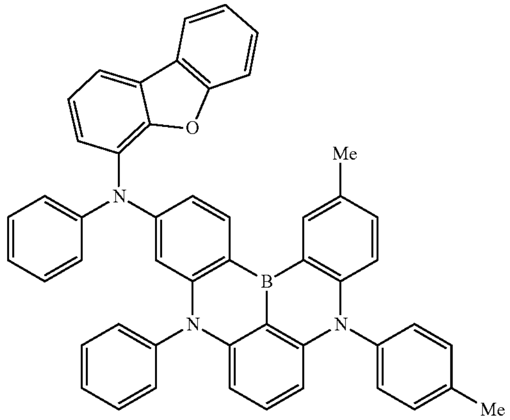
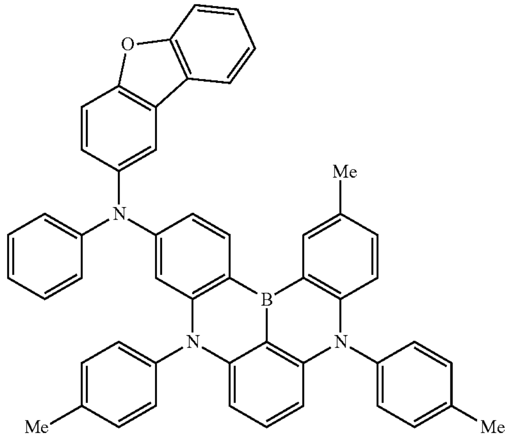
-continued
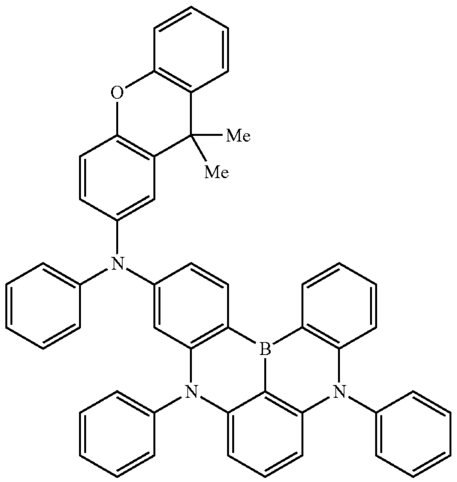
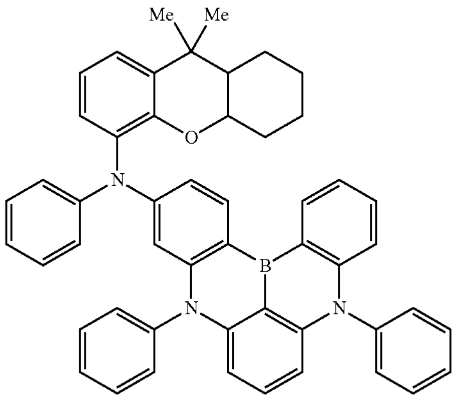
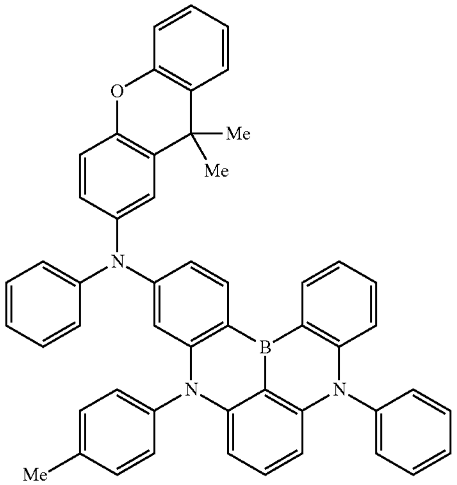

-continued
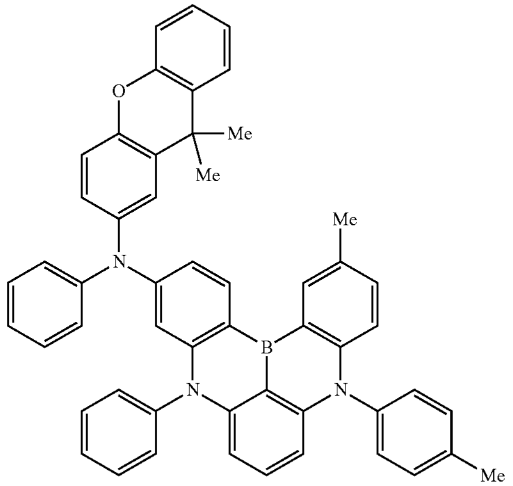
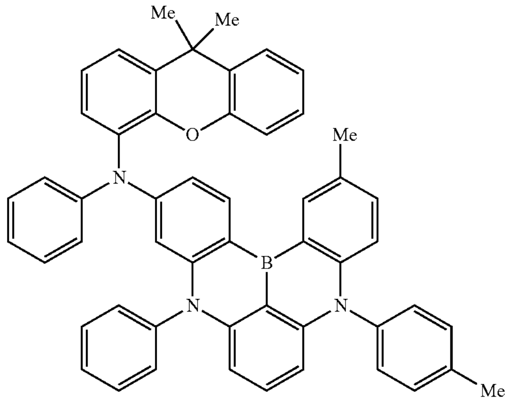
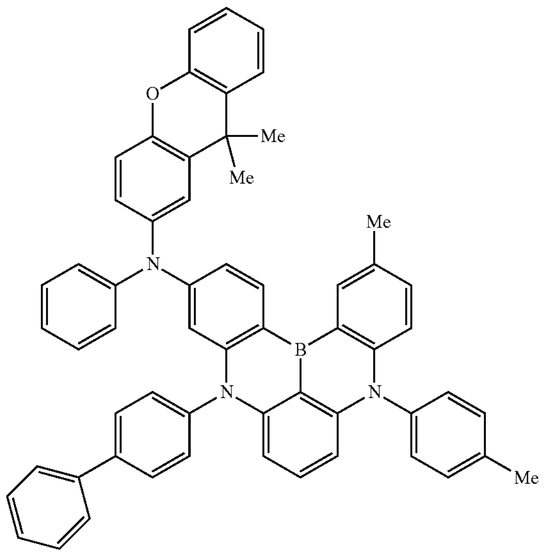
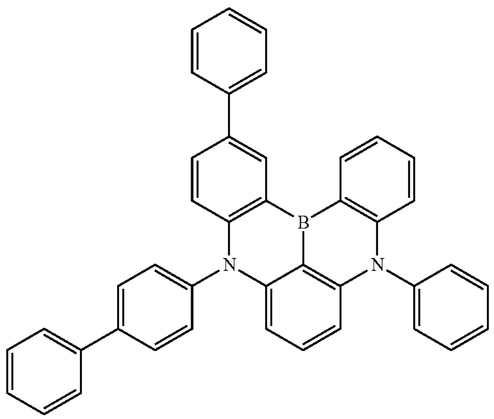
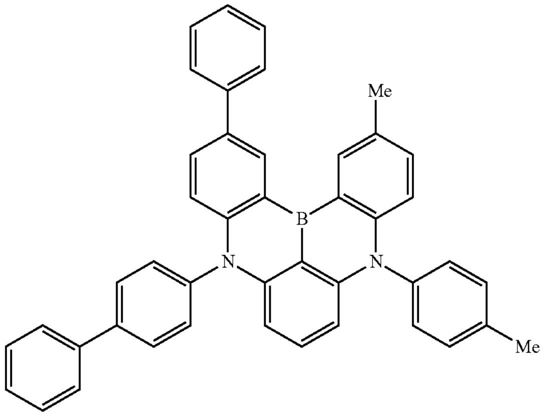
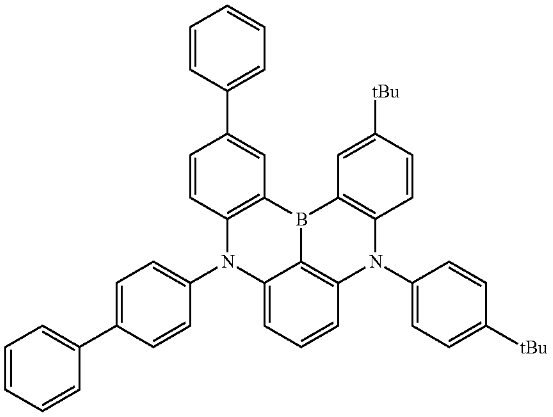
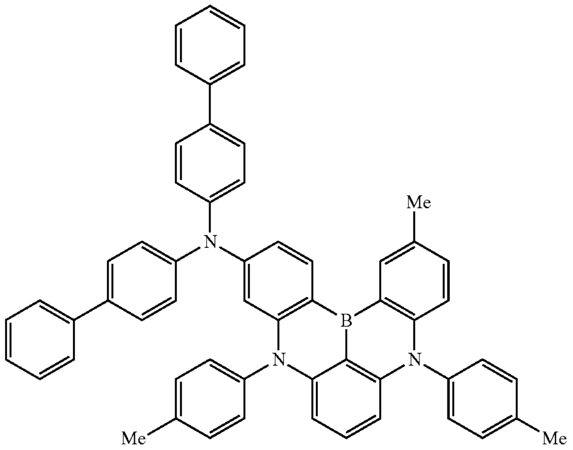

-continued
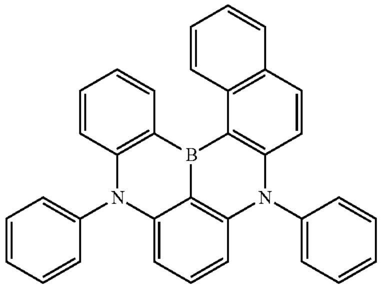
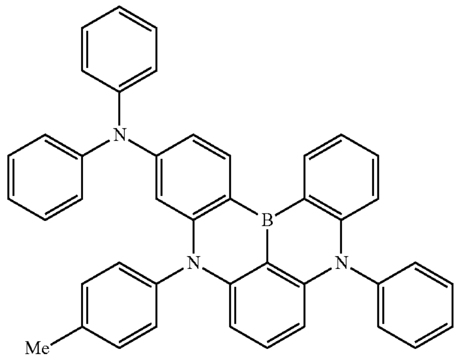
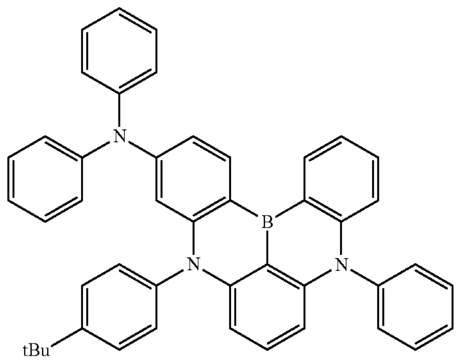
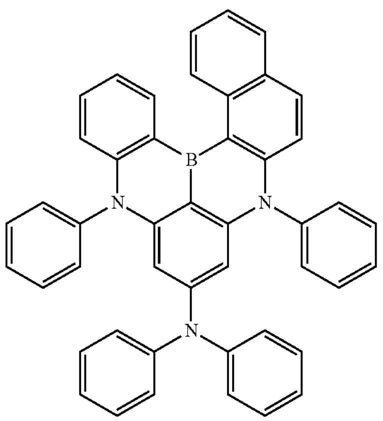
-continued
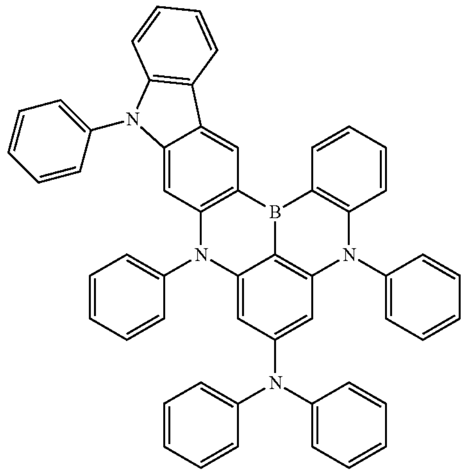
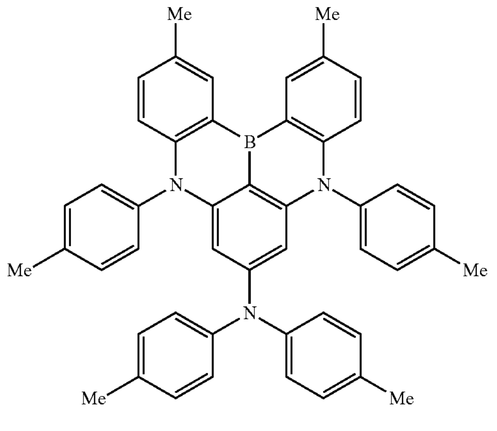
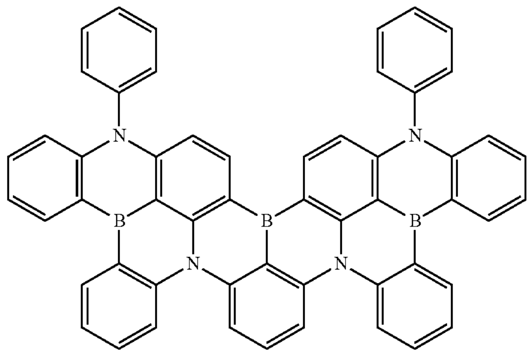
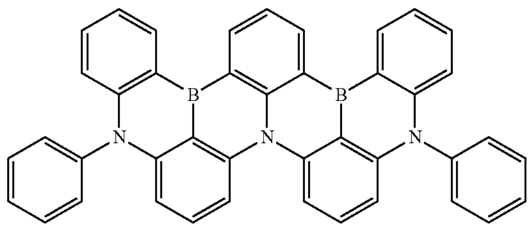

-continued
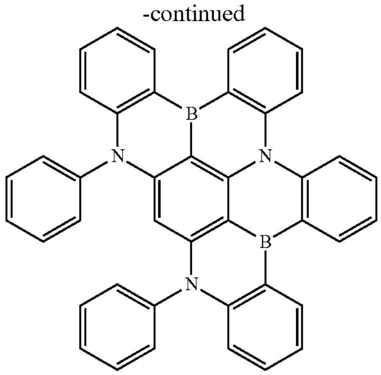
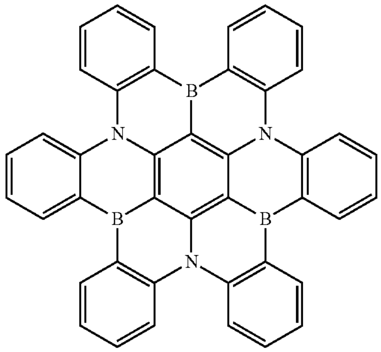
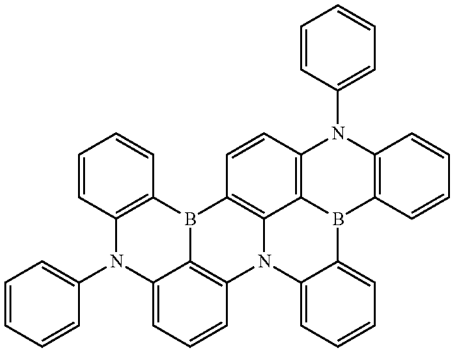
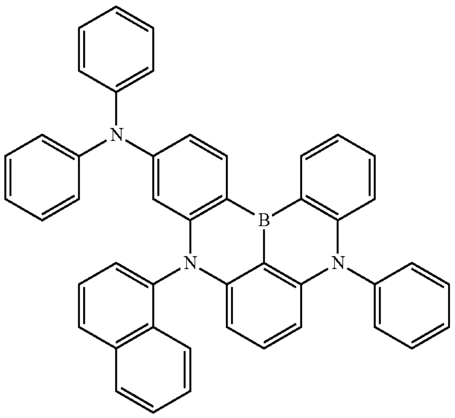
-continued
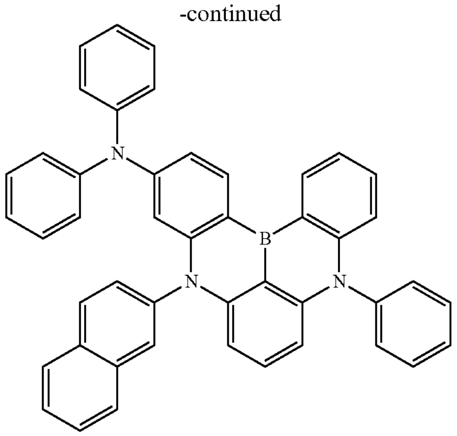
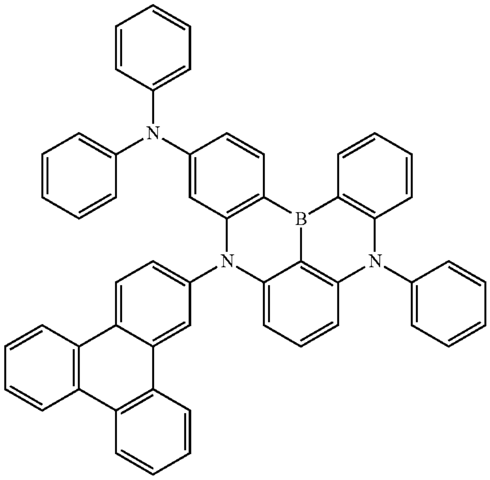
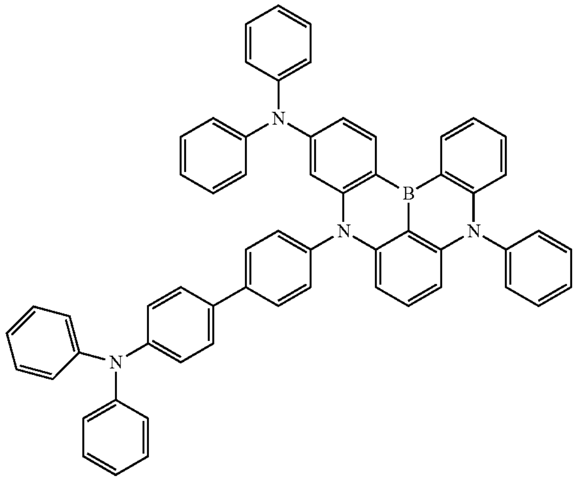
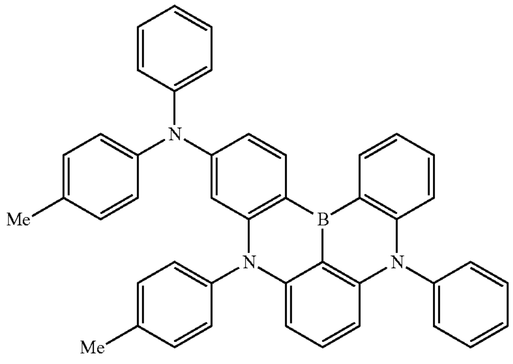

-continued
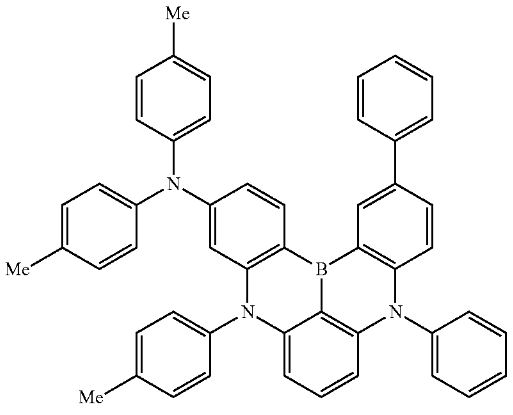
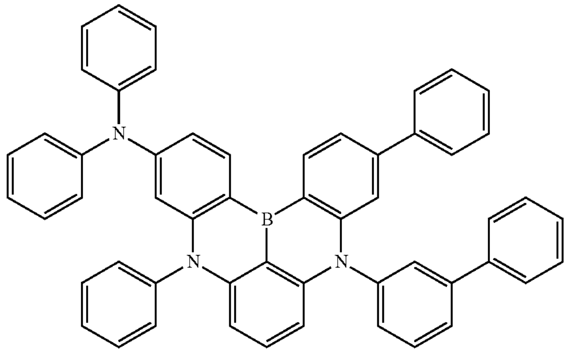
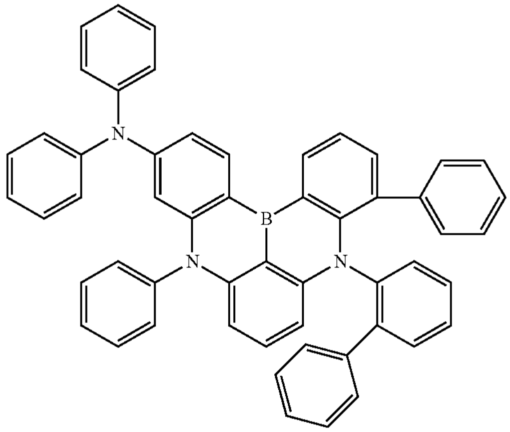
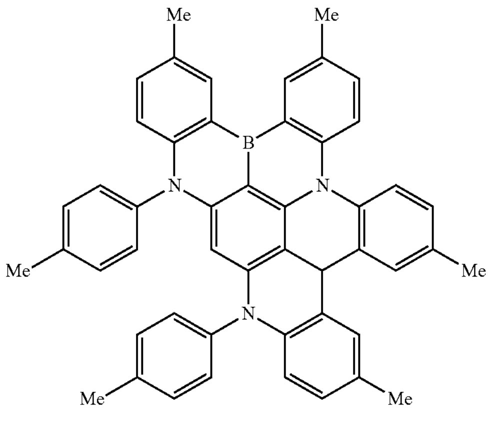
-continued
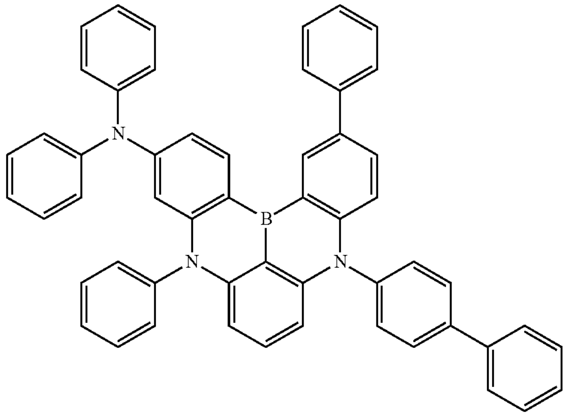
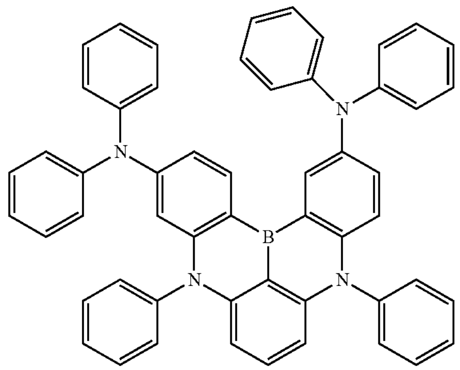
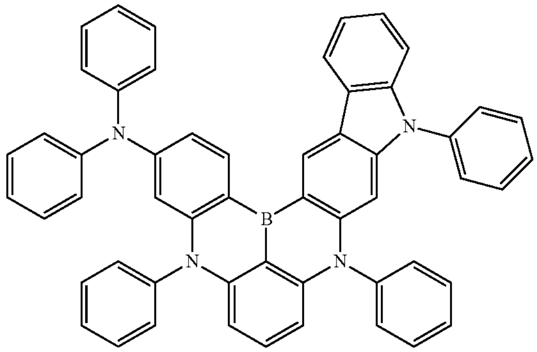
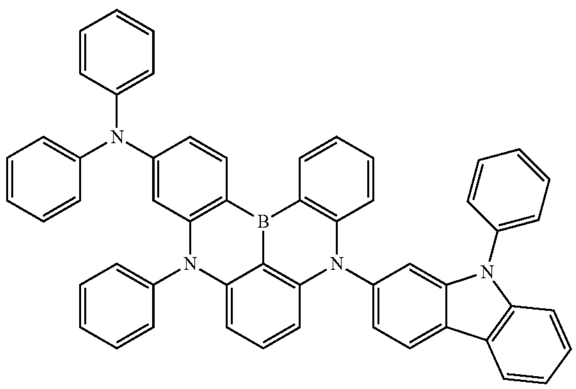

-continued
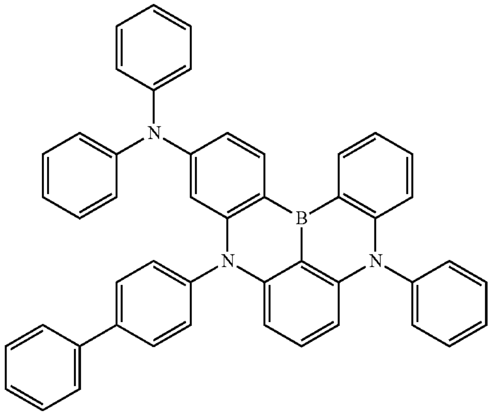
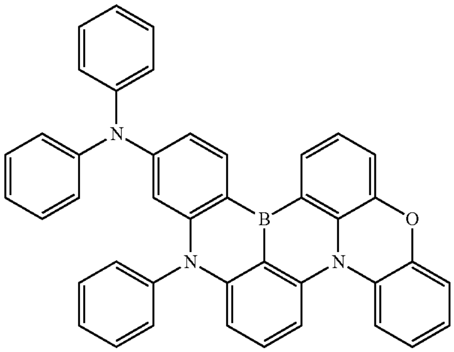
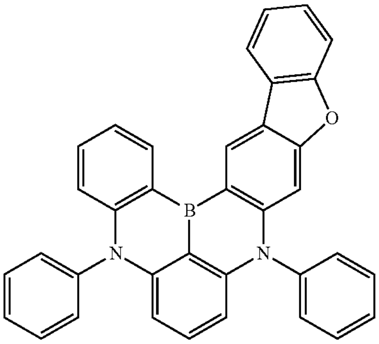
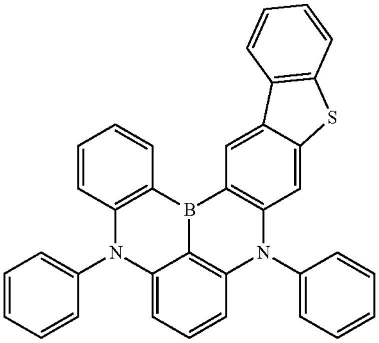
-continued
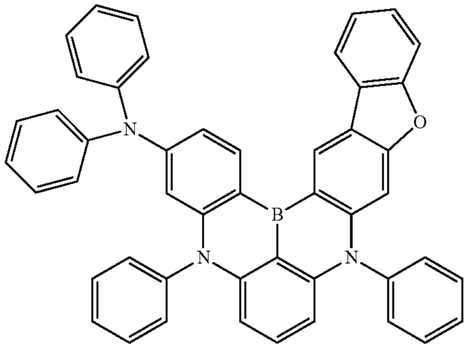
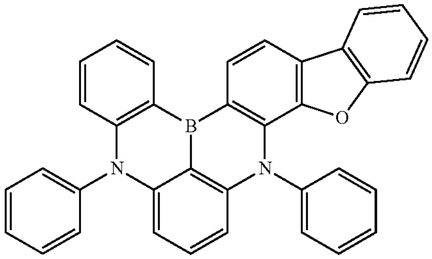
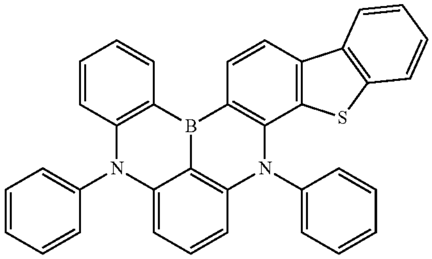
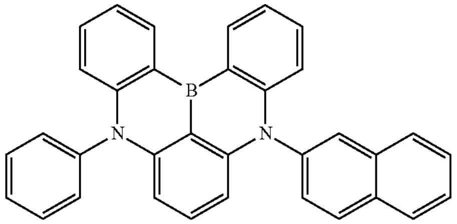
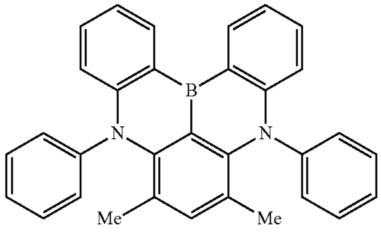
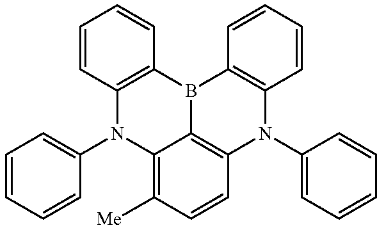

-continued
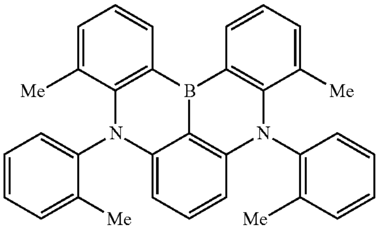
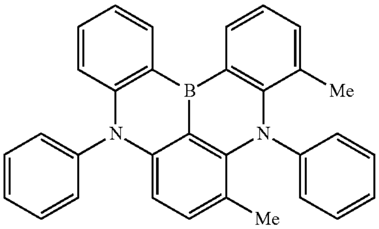
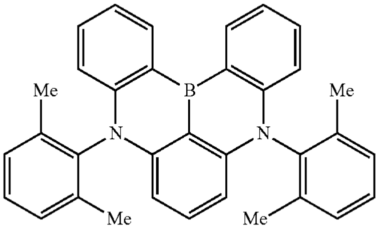
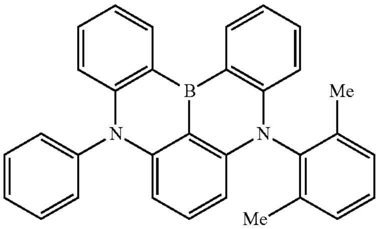
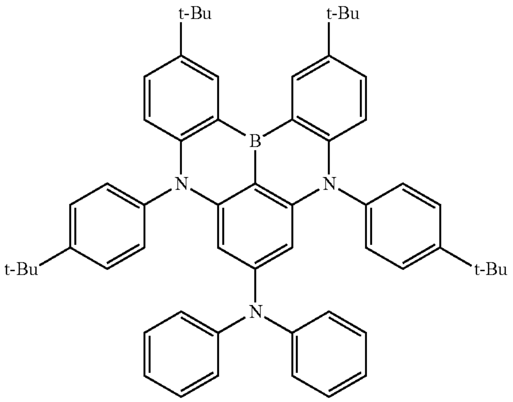
-continued
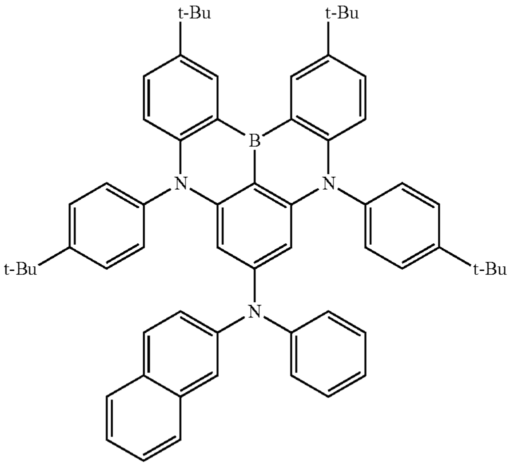
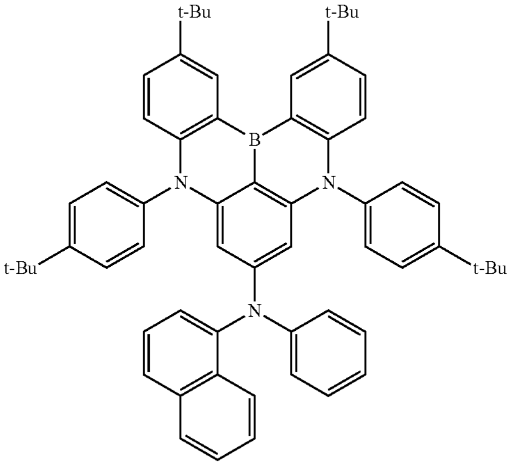
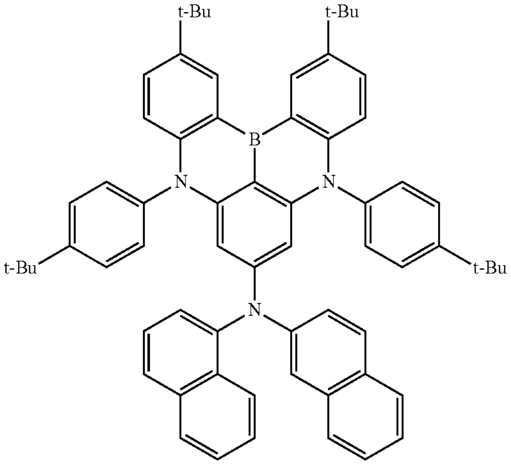

-continued
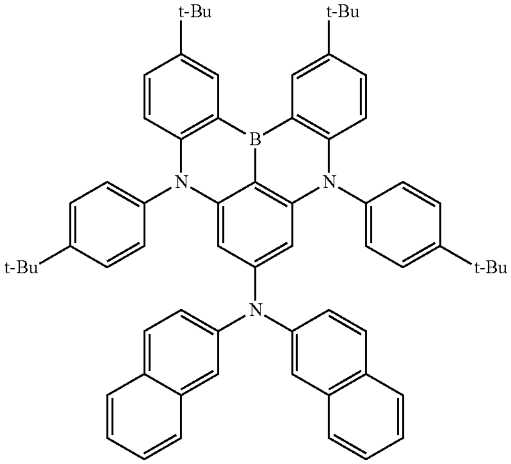
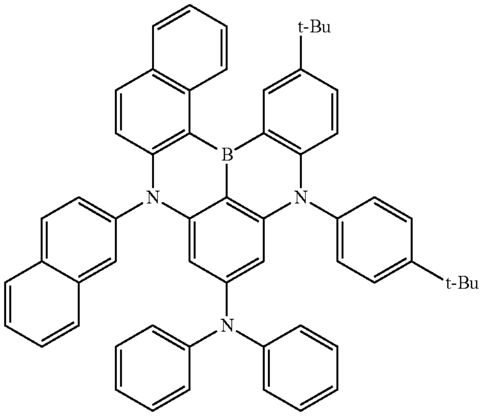
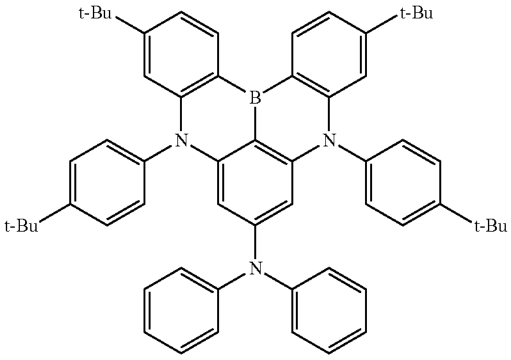
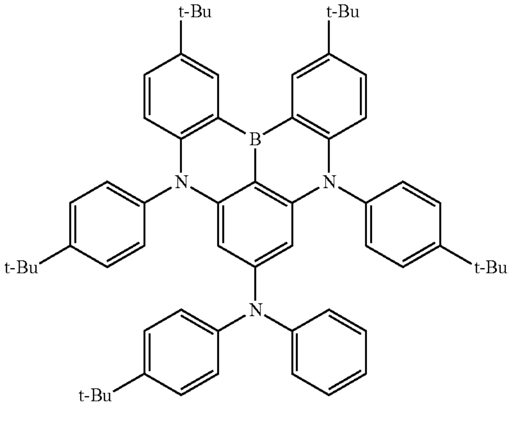
-continued
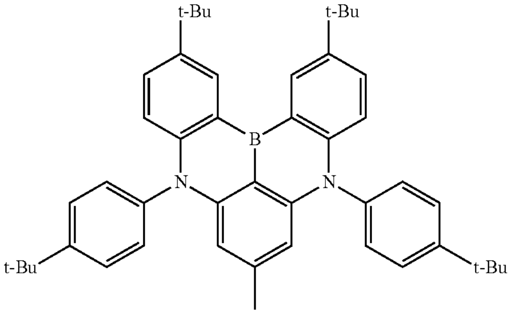
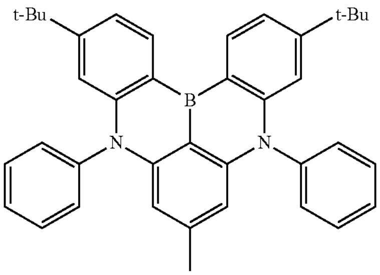
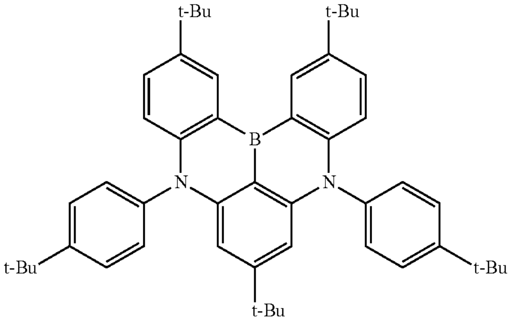
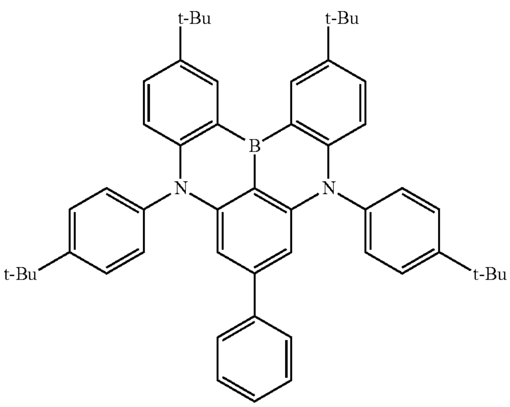

-continued
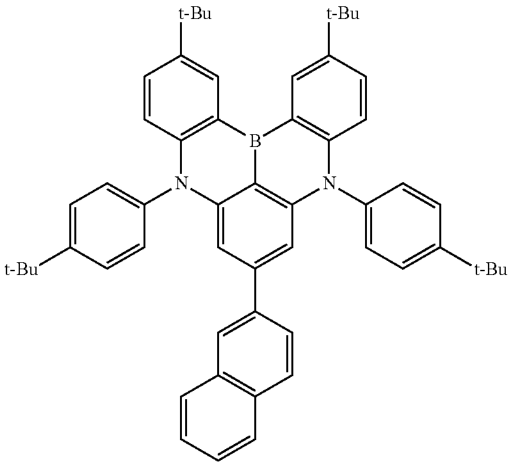
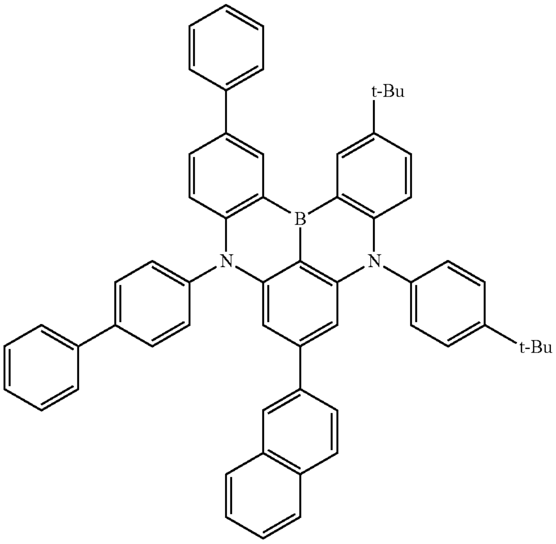
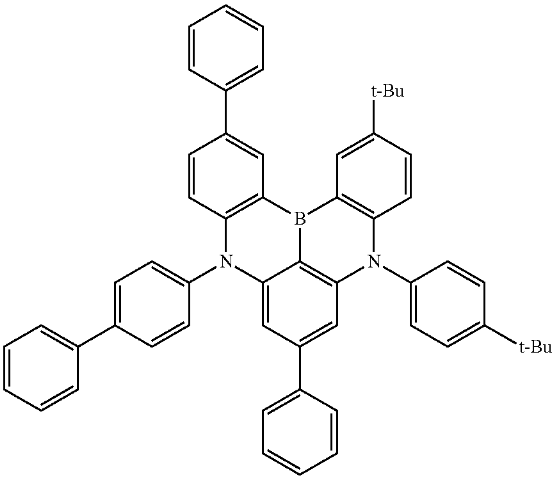
-continued
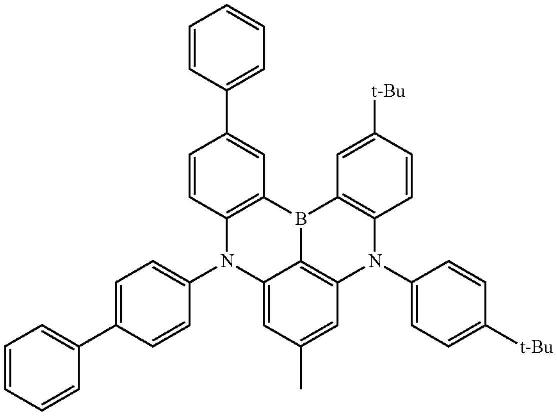
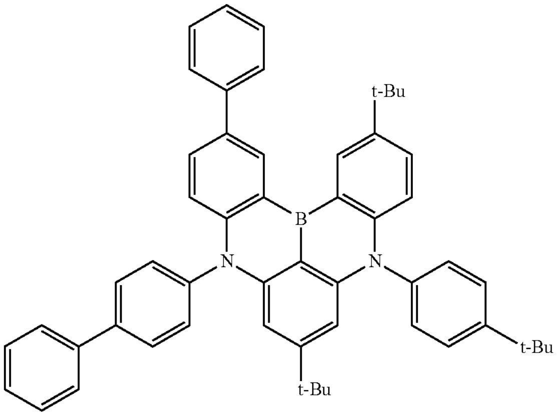
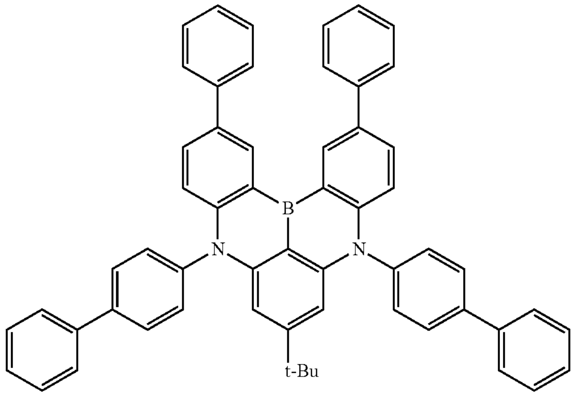
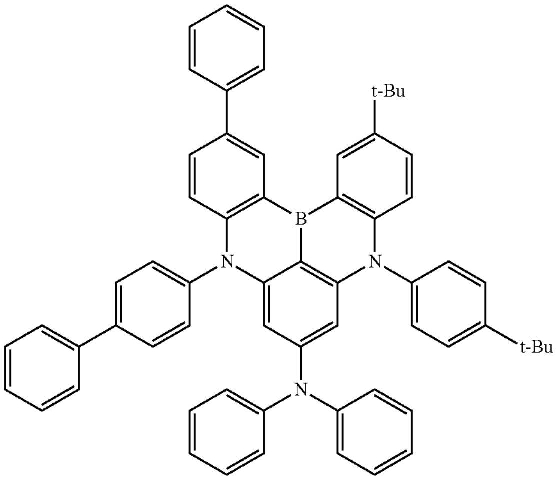

-continued
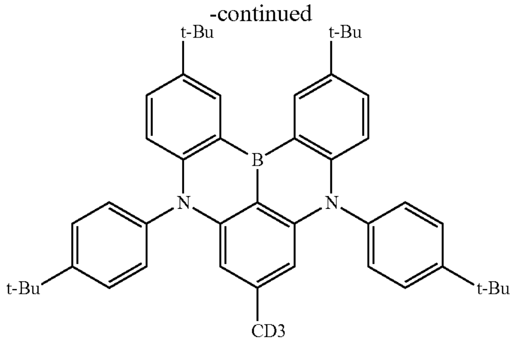
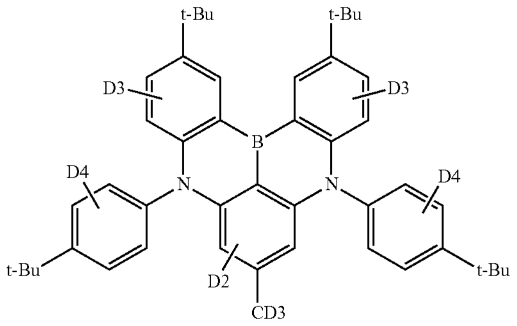
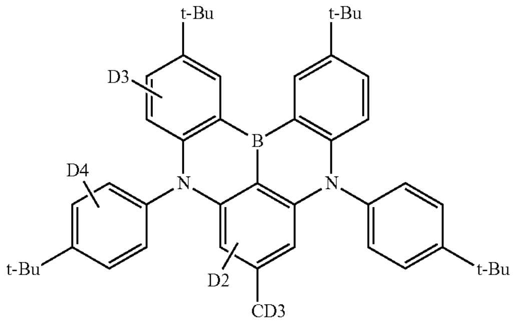
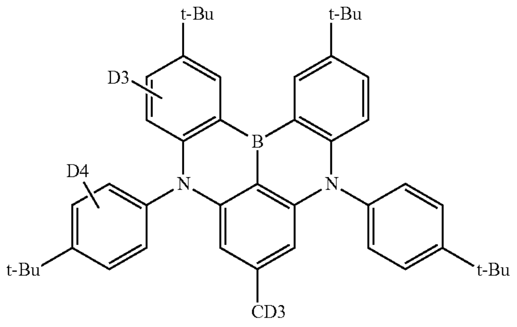
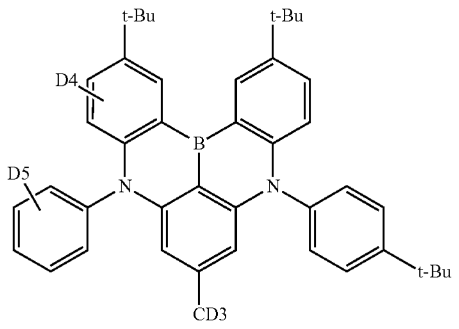
-continued
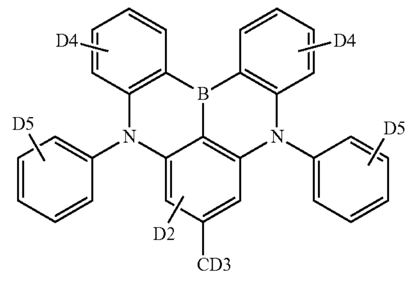
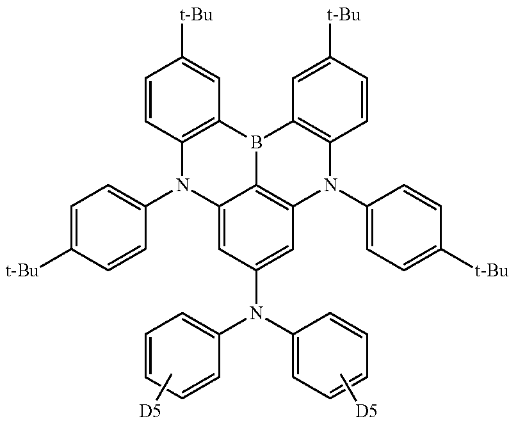
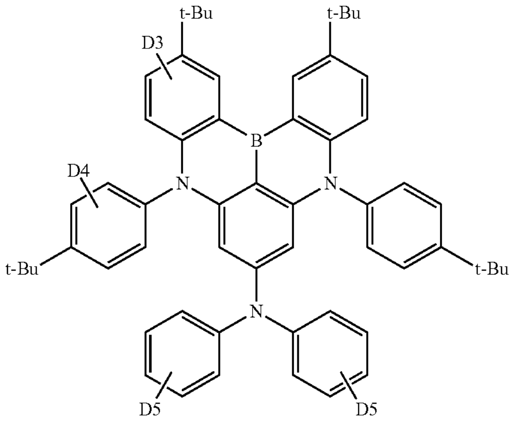
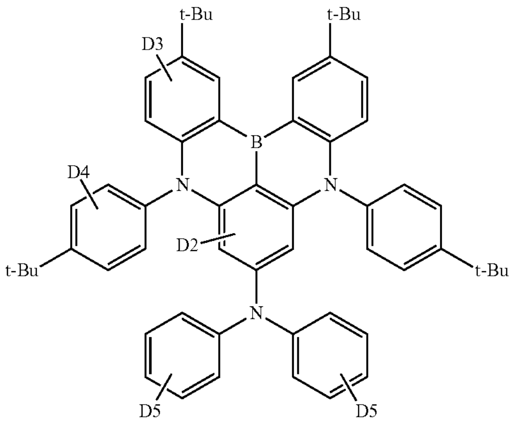

-continued
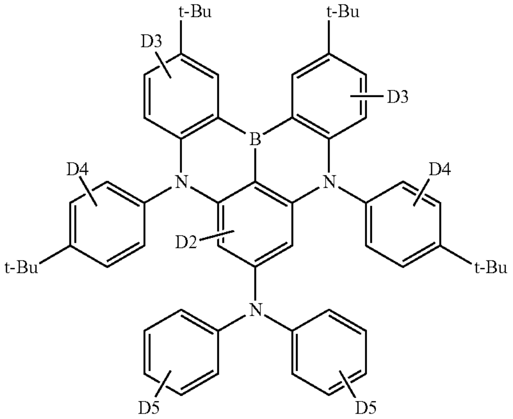
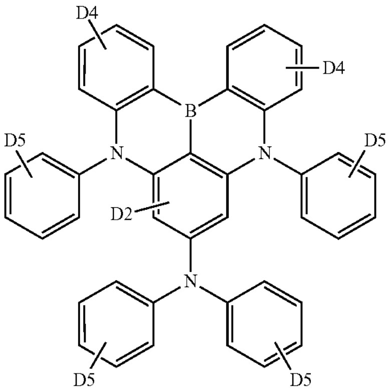
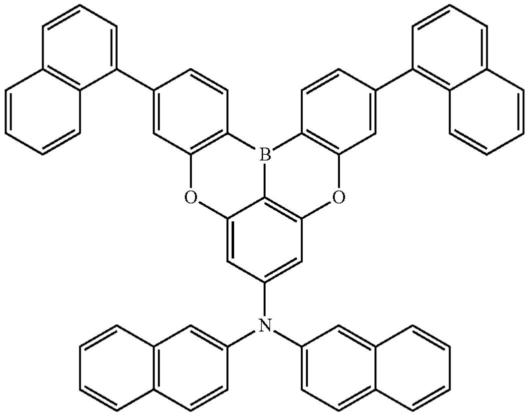
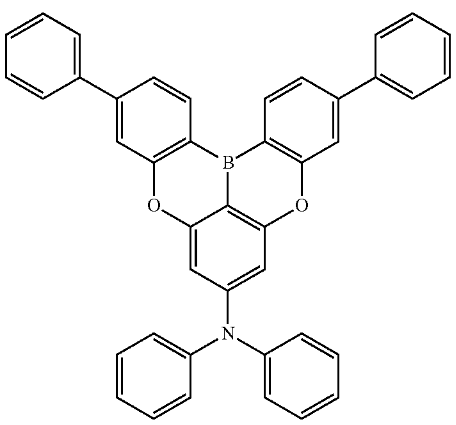
-continued
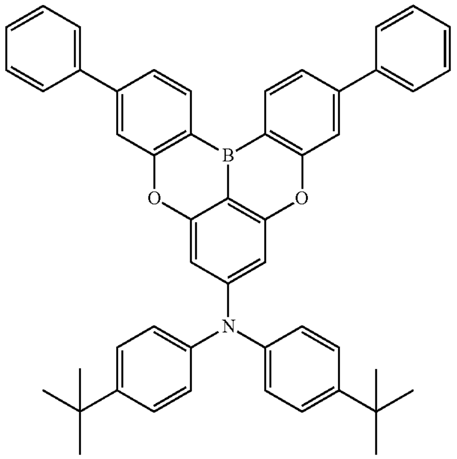
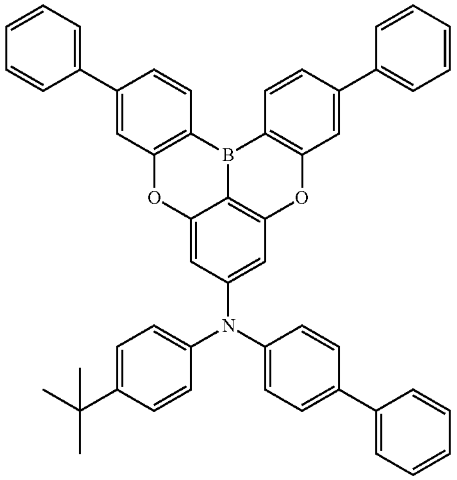
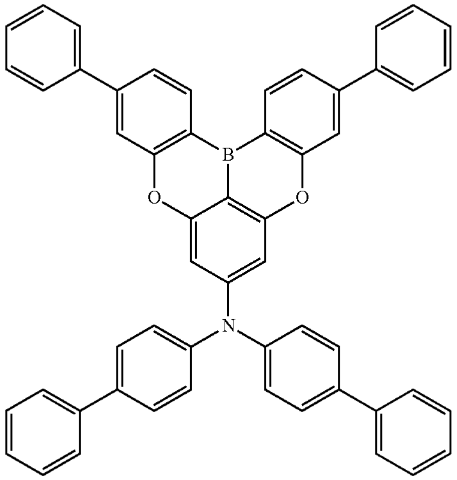

-continued
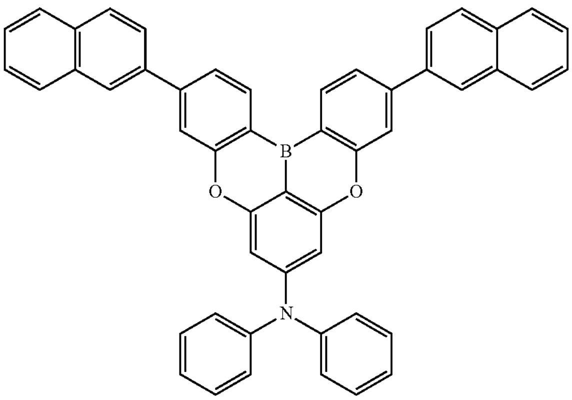
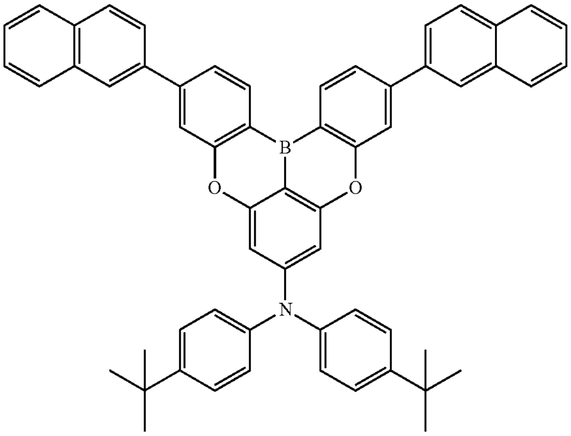
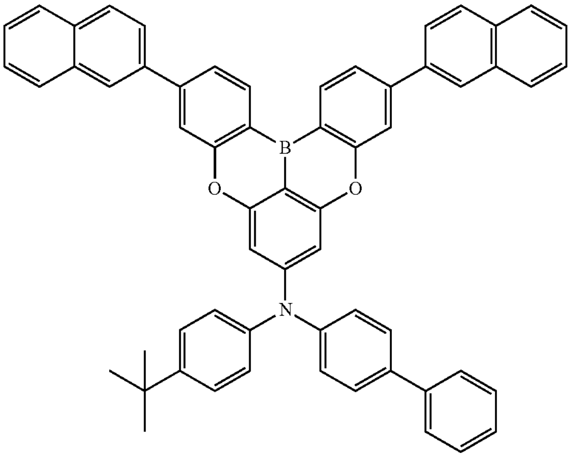
-continued
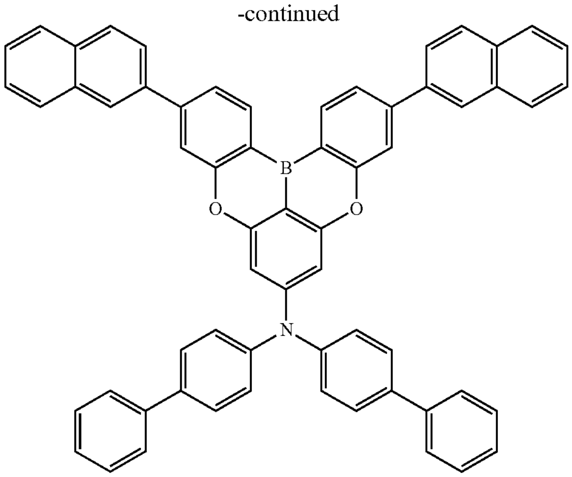
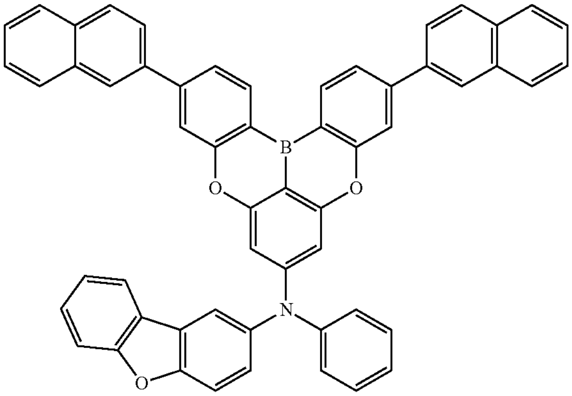
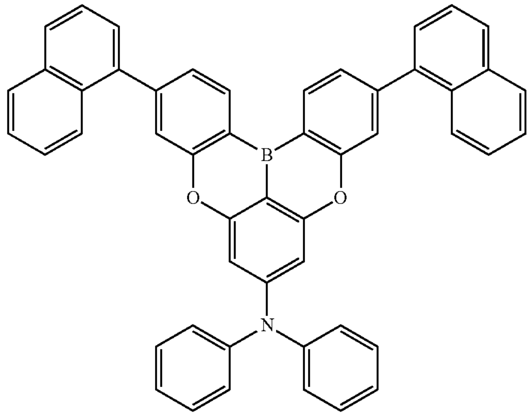
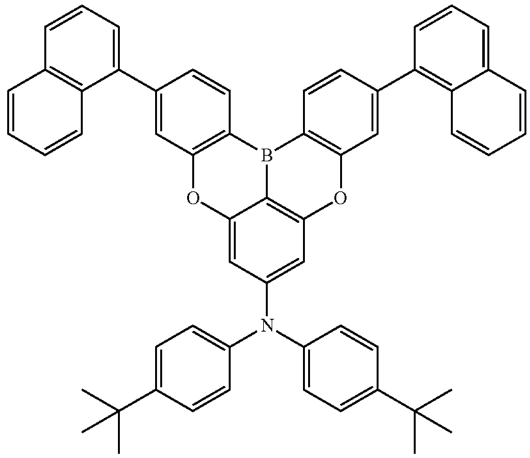

-continued
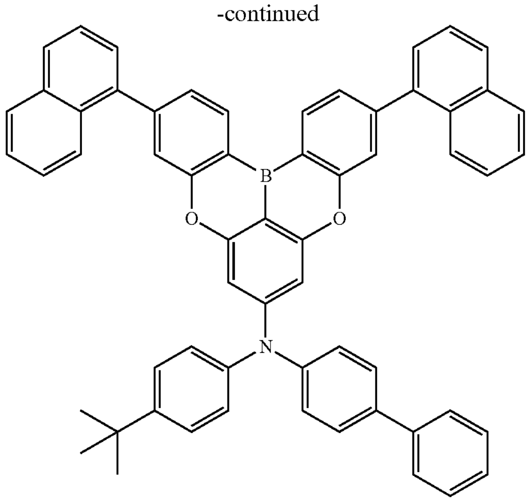
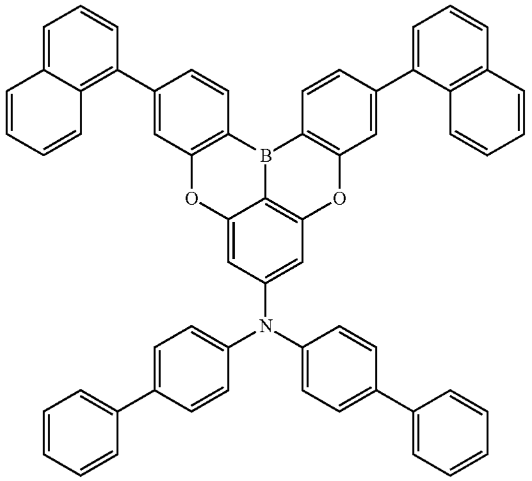
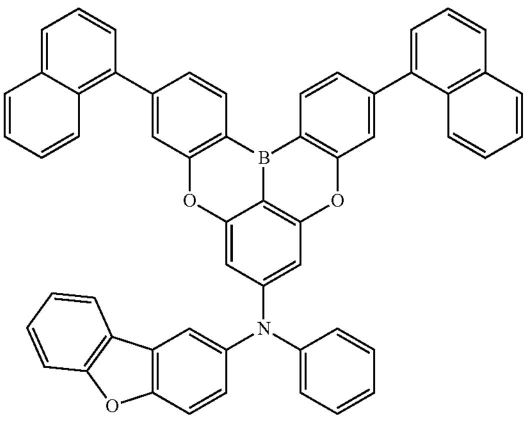
-continued
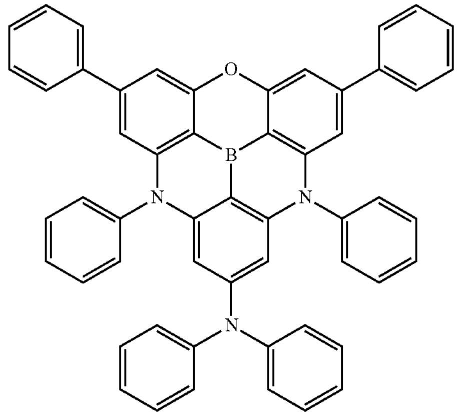
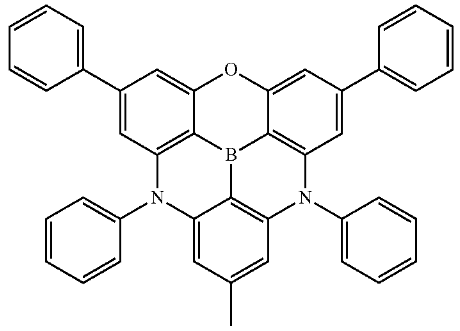
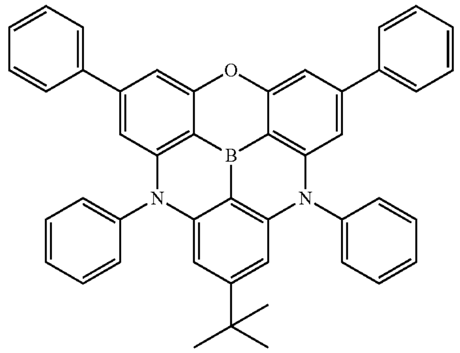
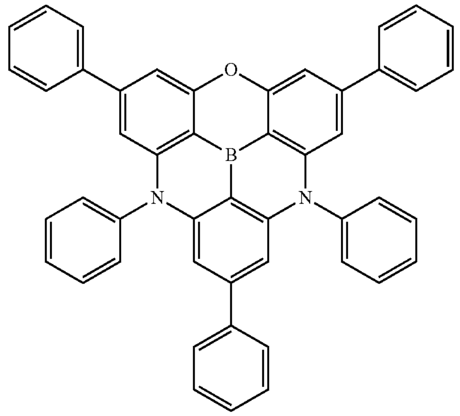

-continued

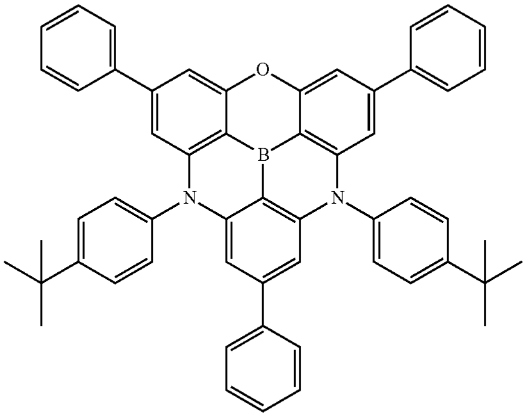

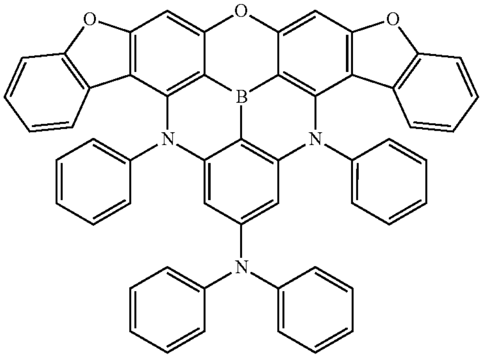

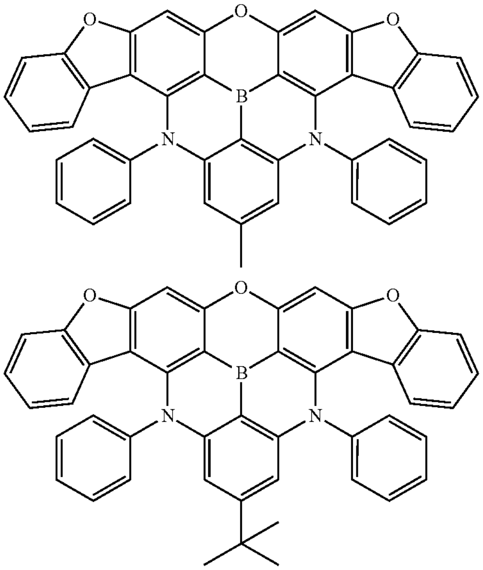

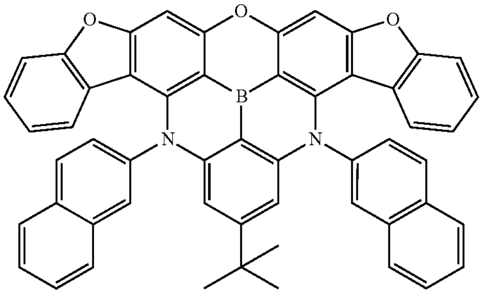

-continued

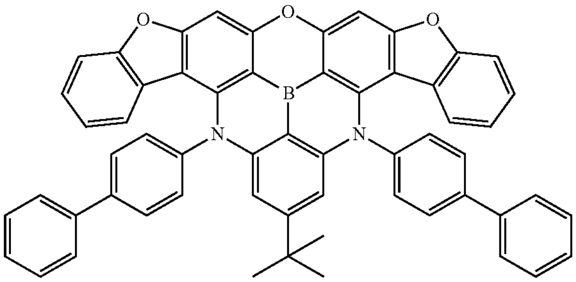

wherein

D2 to D5 represent that two to five hydrogens each have been replaced with deuterium.

6. The organic electroluminescent device according to claim 1, wherein the compound represented by formula 1-3 is selected from the following compounds:

H1-179

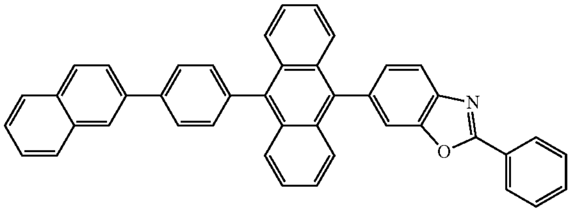

H1-180

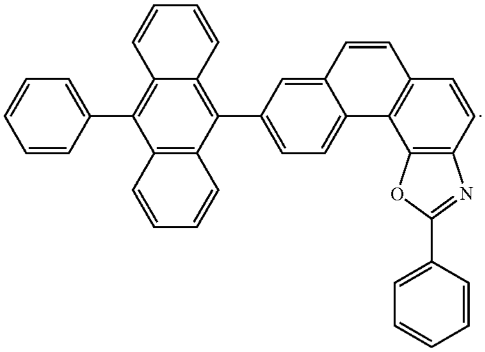

.

7. The organic electroluminescent device according to claim 1, further comprising a hole transport zone between the first electrode and the light-emitting layer, and wherein the hole transport zone includes a hole injection layer and a hole transport layer.

8. The organic electroluminescent device according to claim 1, wherein the electron transport zone includes an electron transport layer and an electron injection layer.

9. The organic electroluminescent device according to claim 1, wherein the light-emitting layer comprises a compound represented by the following formula 2:

(2)

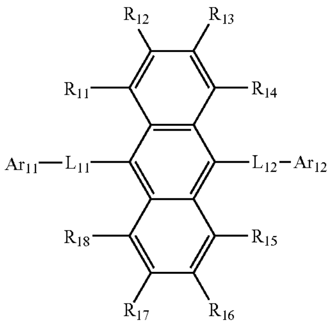

wherein $L_{11}$ and $L_{12}$ each independently represent a single bond, a substituted or unsubstituted (C6-C30)arylene, or a substituted or unsubstituted (3- to 30-membered)heteroarylene;

$Ar_{11}$ and $Ar_{12}$ each independently represent a substituted or unsubstituted (C6-C30)aryl or a substituted or unsubstituted (3- to 30-membered)heteroaryl; and $R_{11}$ to $R_{18}$ each independently represent hydrogen or deuterium;

provided that a compound represented by the following formula b is excluded from the formula 2

(b)

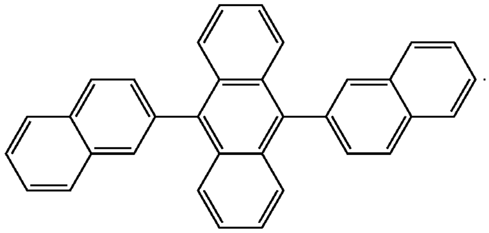

* * * * *